United States Patent
Woodgate et al.

(10) Patent No.: US 11,061,279 B2
(45) Date of Patent: Jul. 13, 2021

(54) ILLUMINATION APPARATUS

(71) Applicant: Optovate Limited, Hemel Hempstead (GB)

(72) Inventors: Graham J. Woodgate, Henley-on-Thames (GB); Jonathan Harrold, Leamington Sp (GB)

(73) Assignee: Optovate Limited, Hemel Hempstead (GB)

( * ) Notice: Subject to any disclaimer, the term of this patent is extended or adjusted under 35 U.S.C. 154(b) by 73 days.

(21) Appl. No.: 16/500,191

(22) PCT Filed: Mar. 29, 2018

(86) PCT No.: PCT/GB2018/050893
§ 371 (c)(1),
(2) Date: Oct. 2, 2019

(87) PCT Pub. No.: WO2018/185475
PCT Pub. Date: Oct. 11, 2018

(65) Prior Publication Data
US 2021/0103187 A1    Apr. 8, 2021

(30) Foreign Application Priority Data
Apr. 3, 2017  (GB) .................................. 1705364

(51) Int. Cl.
*G02F 1/13357*    (2006.01)
*G02F 1/1335*    (2006.01)

(52) U.S. Cl.
CPC .. *G02F 1/133607* (2021.01); *G02F 1/133603* (2013.01); *G02F 1/133609* (2013.01)

(58) Field of Classification Search
CPC ..................... G02F 1/133607; G02F 1/133603
(Continued)

(56) References Cited

U.S. PATENT DOCUMENTS 5,184,114 A   2/1993  Brown
5,812,105 A   9/1998  Ven
(Continued)

FOREIGN PATENT DOCUMENTS

DE    102010031945 A1   1/2012
EP        1387412 A    2/2004
(Continued)

OTHER PUBLICATIONS

International search report and written opinion of international searching authority in co-pending PCT/US2019/021570, dated May 24, 2019.
(Continued)

*Primary Examiner* — Christopher M Raabe
(74) *Attorney, Agent, or Firm* — Penny L. Lowry

(57) ABSTRACT

A switchable directional illumination apparatus comprises first and second arrays of LEDs, some of which are micro-LEDs; an aligned catadioptric micro-optic array and an aligned light guide array. In a first mode a narrow angular output is provided by a first micro-LED array and catadioptric micro-optics. In a second mode a wider angular output is provided by the second LED array and light guides. A thin and efficient illumination apparatus may be used for switching illumination in environmental lighting, display backlighting or direct display.

81 Claims, 60 Drawing Sheets

(58) Field of Classification Search
USPC .................................................... 362/97.1
See application file for complete search history.

(56) References Cited

U.S. PATENT DOCUMENTS

| | | | |
|---|---|---|---|
| 6,547,423 B2 | 4/2003 | Marshall et al. |
| 6,570,324 B1 | 5/2003 | Tutt et al. |
| 7,014,964 B1 | 3/2006 | Hsu et al. |
| 7,171,874 B1 | 2/2007 | Huang |
| 7,863,614 B2 | 1/2011 | Toyama et al. |
| 7,994,531 B2 | 8/2011 | Lin et al. |
| 9,519,153 B2 | 12/2016 | Robinson et al. |
| 10,121,772 B1 | 11/2018 | Wu et al. |
| 10,126,575 B1 | 11/2018 | Robinson et al. |
| 10,303,030 B2 | 5/2019 | Robinson et al. |
| 10,533,730 B2 | 1/2020 | Harrold et al. |
| 2004/0089935 A1 | 5/2004 | Lehner |
| 2004/0126911 A1 | 7/2004 | Kimura |
| 2004/0161871 A1 | 8/2004 | Omori |
| 2004/0218390 A1 | 11/2004 | Holman et al. |
| 2004/0239243 A1 | 12/2004 | Roberts et al. |
| 2004/0263061 A1 | 12/2004 | Ishikawa et al. |
| 2005/0111100 A1 | 5/2005 | Mather et al. |
| 2005/0219693 A1 | 10/2005 | Hartkop et al. |
| 2006/0152931 A1 | 7/2006 | Holman |
| 2006/0256255 A1 | 11/2006 | Minami |
| 2006/0290276 A1 | 12/2006 | Cok et al. |
| 2007/0007237 A1 | 1/2007 | Wu et al. |
| 2007/0019131 A1 | 1/2007 | Choi et al. |
| 2007/0047254 A1 | 3/2007 | Schardt et al. |
| 2007/0116424 A1 | 5/2007 | Ting et al. |
| 2007/0165394 A1 | 7/2007 | Chang |
| 2007/0176195 A1 | 8/2007 | Kuiseko et al. |
| 2007/0242477 A1 | 10/2007 | Yoo et al. |
| 2007/0256453 A1 | 11/2007 | Barnes et al. |
| 2008/0043466 A1 | 2/2008 | Chakmakjian et al. |
| 2008/0089093 A1 | 4/2008 | Miller et al. |
| 2008/0123350 A1 | 5/2008 | Choe et al. |
| 2008/0225523 A1 | 9/2008 | Samber et al. |
| 2008/0237612 A1 | 10/2008 | Cok |
| 2008/0258162 A1 | 10/2008 | Koung et al. |
| 2008/0315755 A1 | 12/2008 | Han |
| 2009/0001869 A1 | 1/2009 | Tanimoto et al. |
| 2009/0086508 A1 | 4/2009 | Bierhuizen |
| 2009/0109656 A1 | 4/2009 | Chang |
| 2009/0128735 A1 | 5/2009 | Larson et al. |
| 2009/0242929 A1 | 10/2009 | Lin |
| 2009/0268428 A1 | 10/2009 | Tsukada |
| 2009/0296389 A1 | 12/2009 | Hsu |
| 2010/0097809 A1 | 4/2010 | Munro et al. |
| 2010/0165635 A1 | 7/2010 | Chen et al. |
| 2010/0171215 A1 | 7/2010 | Fischer et al. |
| 2010/0195330 A1 | 8/2010 | Schaefer et al. |
| 2010/0258543 A1 | 10/2010 | Mizuno et al. |
| 2010/0295762 A1 | 11/2010 | Yeom et al. |
| 2010/0317132 A1 | 12/2010 | Rogers et al. |
| 2011/0018860 A1 | 1/2011 | Parry-Jones et al. |
| 2011/0038150 A1 | 2/2011 | Woodgate et al. |
| 2011/0090672 A1 | 4/2011 | Zhu et al. |
| 2011/0194034 A1 | 8/2011 | Shimizu |
| 2011/0255303 A1 | 10/2011 | Nichol et al. |
| 2012/0086875 A1* | 4/2012 | Yokota ............ G02F 1/133605 |
| | | 348/790 |
| 2012/0119237 A1 | 5/2012 | Leatherdale et al. |
| 2012/0140462 A1 | 6/2012 | Pickard |
| 2012/0258963 A1 | 10/2012 | Berger et al. |
| 2013/0039062 A1* | 2/2013 | Vinther .................. F21V 21/30 |
| | | 362/235 |
| 2013/0107525 A1 | 5/2013 | Woodgate et al. |
| 2013/0258663 A1 | 10/2013 | Woodgate et al. |
| 2013/0293793 A1 | 11/2013 | Lu |
| 2014/0098418 A1 | 4/2014 | Lin |
| 2014/0140654 A1 | 5/2014 | Brown et al. |
| 2014/0186979 A1 | 7/2014 | Tu et al. |
| 2014/0211462 A1 | 7/2014 | Keller et al. |
| 2014/0211503 A1 | 7/2014 | Tarsa |
| 2014/0240839 A1 | 8/2014 | Yang et al. |
| 2014/0316742 A1 | 10/2014 | Sun et al. |
| 2015/0054011 A1 | 2/2015 | Koizumi et al. |
| 2015/0062490 A1 | 3/2015 | Kwon |
| 2015/0160396 A1 | 6/2015 | Wilcox et al. |
| 2015/0268479 A1 | 9/2015 | Woodgate et al. |
| 2015/0268513 A1 | 9/2015 | Chang et al. |
| 2015/0295154 A1 | 10/2015 | Tu et al. |
| 2015/0308635 A1 | 10/2015 | Li et al. |
| 2016/0018077 A1 | 1/2016 | Mallory et al. |
| 2016/0211413 A1 | 7/2016 | Park et al. |
| 2016/0299281 A1 | 10/2016 | Robinson et al. |
| 2017/0031085 A1 | 2/2017 | Lim et al. |
| 2017/0045666 A1 | 2/2017 | Vasylyev |
| 2017/0059127 A1 | 3/2017 | Jansma et al. |
| 2017/0102127 A1 | 4/2017 | Woodgate et al. |
| 2017/0139114 A1 | 5/2017 | Woodgate et al. |
| 2017/0154919 A1 | 6/2017 | Chen et al. |
| 2017/0205959 A1 | 7/2017 | Seong |
| 2017/0248289 A1 | 8/2017 | Vasylyev |
| 2017/0261179 A1 | 9/2017 | Wu et al. |
| 2018/0014007 A1 | 1/2018 | Brown |
| 2018/0226384 A1 | 8/2018 | Park et al. |
| 2018/0321553 A1 | 11/2018 | Robinson et al. |
| 2019/0086706 A1 | 3/2019 | Robinson et al. |
| 2019/0139243 A1 | 5/2019 | You et al. |
| 2019/0220121 A1 | 7/2019 | Kim et al. |
| 2019/0250458 A1 | 8/2019 | Robinson et al. |
| 2019/0265478 A1 | 8/2019 | Cok et al. |
| 2019/0278135 A1 | 9/2019 | Woodgate et al. |
| 2019/0294004 A1 | 9/2019 | Hashimoto |
| 2019/0377067 A1 | 12/2019 | Han et al. |
| 2020/0049876 A1 | 2/2020 | Watanabe et al. |
| 2020/0159055 A1 | 5/2020 | Robinson et al. |
| 2020/0166783 A1 | 5/2020 | Roy et al. |
| 2020/0259307 A1 | 8/2020 | Sharma et al. |
| 2020/0321553 A1 | 10/2020 | Kwon et al. |

FOREIGN PATENT DOCUMENTS

| | | |
|---|---|---|
| EP | 1835550 A | 9/2007 |
| EP | 1890343 A | 2/2008 |
| EP | 1986023 A | 10/2008 |
| EP | 2182783 A | 5/2010 |
| EP | 2595295 A1 | 5/2013 |
| GB | 2464102 A | 4/2010 |
| GB | 2484711 A | 4/2012 |
| JP | 2000323755 A | 11/2000 |
| JP | 2009295309 A | 12/2009 |
| JP | 2010238846 A | 10/2010 |
| JP | 2013219397 A | 10/2013 |
| WO | 2007074932 A1 | 7/2007 |
| WO | 2010038025 A | 4/2010 |
| WO | 2010038025 A2 | 4/2010 |
| WO | 2011131200 A1 | 10/2011 |
| WO | 2012052722 A | 4/2012 |
| WO | 2012052722 A2 | 4/2012 |
| WO | 2012052723 A1 | 4/2012 |
| WO | 2013064801 A1 | 5/2013 |
| WO | 2013112435 A1 | 8/2013 |
| WO | 2014043384 A1 | 3/2014 |
| WO | 2015089517 A1 | 6/2015 |
| WO | 2017007770 A2 | 1/2017 |
| WO | 2018185475 A1 | 10/2018 |
| WO | 2018185476 A | 10/2018 |
| WO | 2018185476 A1 | 10/2018 |
| WO | 2018208618 A1 | 11/2018 |
| WO | 2019067846 A1 | 4/2019 |
| WO | 2019107826 A1 | 6/2019 |

OTHER PUBLICATIONS

EP18200530.6—European Search Report of the European Patent Office dated May 23, 2019.
International search report and written opinion of international searching authority for PCT application PCT/GB2018/050893 dated Aug. 27, 2018.

(56) References Cited

OTHER PUBLICATIONS

International search report and written opinion of international searching authority for PCT application PCT/GB2018/050894 dated Aug. 27, 2018.
International search report and written opinion of international searching authority for PCT application PCT/GB2019/050076 dated May 9, 2019.
International search report and written opinion of international searching authority for PCT application PCT/US2019/031526 dated Jul. 29, 2019.
International search report and written opinion of international searching authority for PCT application PCT/US2020/040686 dated Nov. 20, 2020.
International search report and written opinion of international searching authority for PCT application PCT/US2020/047383 dated Dec. 4, 2020.
International search report and written opinion of international searching authority for PCT application PCT/US2020/050460 dated Dec. 8, 2020.
International search report and written opinion of international searching authority for PCT application PCT/US2020/053864 dated Dec. 14, 2020.
International search report and written opinion of international searching authority for PCT application PCT/US2020/050527 dated Feb. 3, 2021.
International search report and written opinion of international searching authority for PCT application PCT/US2021/018544 dated Apr. 29, 2021.

* cited by examiner

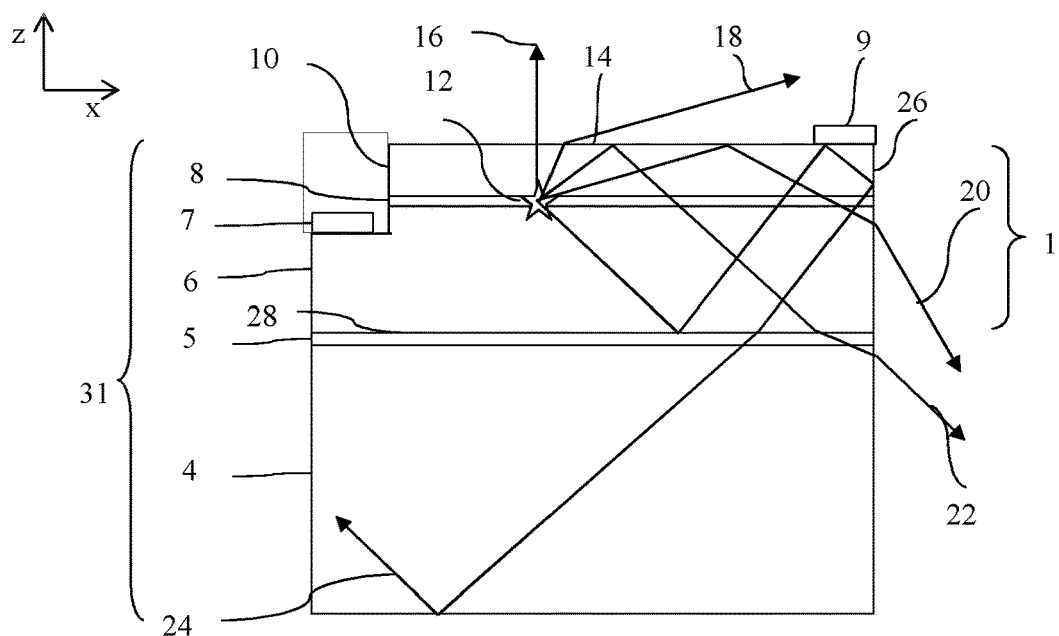
FIG. 59
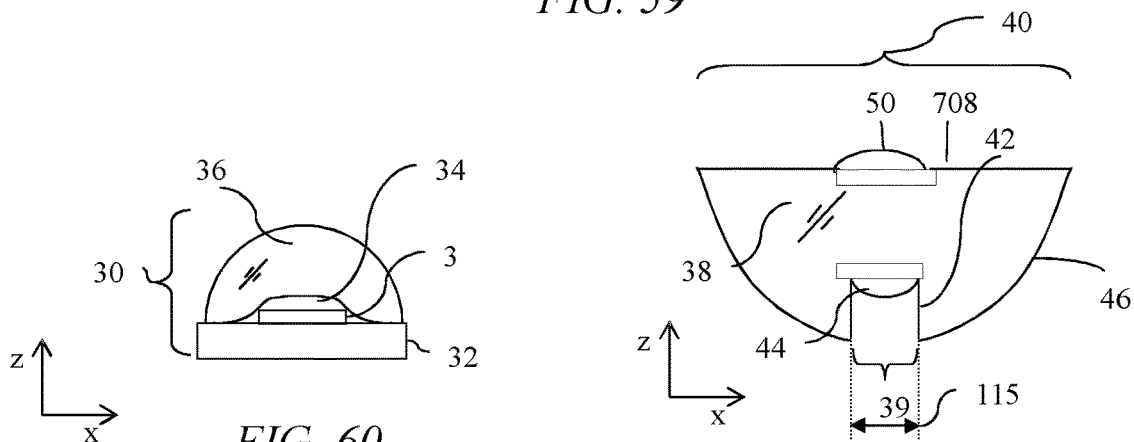
FIG. 60
FIG. 61
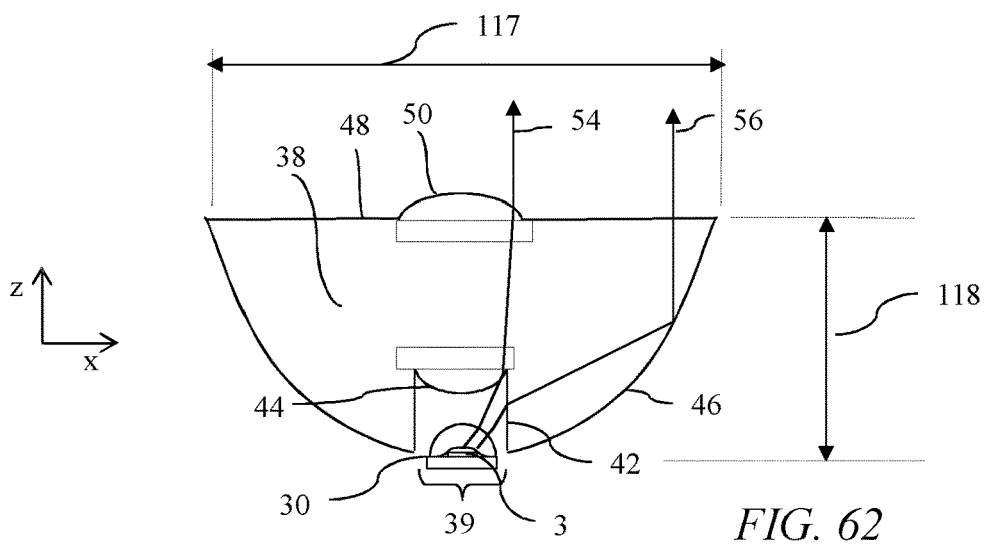
FIG. 62

ILLUMINATION APPARATUS

TECHNICAL FIELD

The present disclosure relates to an apparatus comprising a plurality of addressable light-emitting elements aligned to a plurality of optical elements. Such an apparatus may be used for switchable environmental lighting, for switchable indoor or outdoor electronic display screens, or for a switchable backlight to an LCD display.

BACKGROUND

Displays with wide directional light output distributions are typically used to achieve comfortable display viewing from many different viewing angles. Such displays are desirable for multiple users to share image content, and for displays where the viewing position is not substantially fixed in relation to the display centreline.

By way of comparison displays with narrow directional light output distributions are typically used to provide image data for the eyes of users over reduced viewing angles. Such displays are typically used to achieve privacy display (where images that may be seen by snoopers are suppressed), night time display (where ambient illumination is suppressed—for example to reduce reflections from windscreens or to reduce unsociable stray light), low power viewing (where illumination is not supplied to regions away from the eyes of users) and outdoors viewing (where high luminance is provided to a narrow range of viewing positions for no or small increases in backlight power).

In a known method, narrow directional light output distributions can be achieved by the addition of a micro louvered film. Such films can be permanently fixed on display such as for ATM cash machines for privacy viewing or automotive displays for night time operation. Alternatively, such films may be manually placed on the surface of a conventional wide directional light output distribution display by the user for private display use and removed and stored to restore a normal wide angle viewing. Micro-louver films are inefficient because they work by absorbing light from the backlight in the unwanted display angular directions. As a side effect of construction micro-louver films also significantly attenuate of the light in the wanted direction.

The viewing angle of a transmissive spatial light modulator such as an LCD (liquid crystal display) is controlled by the output light distribution of a backlight and the angular transmission properties of the LCD panel used. Typically, the backlight incorporates a light guide plate (LGP) that accepts light from sources such as LEDs (light emitting diodes) arranged at an input edge of the LGP. A structured pattern on the LGP output face provides a defined leakage of light across its face as the light propagates through the LGP.

Other known backlights incorporate an array of light emitting diodes (LEDs) in a matrix behind the LCD. The light from the LEDs is strongly diffused to create a largely uniform backlight illumination. The directional light output distribution of light from the backlight, or directional light output distribution, can be altered by the addition of fixed layers such as prismatic films and diffusers within the backlight assembly. The backlight and therefore the display angular light directional light output distribution is fixed by design at the time of manufacture.

Illumination systems for environmental lighting such as automobile headlights, architectural, commercial or domestic lighting may provide a narrow directional light output distribution, for example by means of focusing optics to provide spotlighting effects, or can achieve a wide directional light output distribution for example by means of diffusing optics to achieve broad area illumination effects.

Inorganic LEDs formed using semiconductor growth onto monolithic wafers demonstrate high levels of luminous efficiency (lm/W) and high luminous emittance (lm/mm$^2$). The source size is defined by the area of LED die, and so in principle can be made of arbitrary size up to the size of the monolithic wafer. In cooperation with light conversion layers, LEDs may provide acceptable CIE Colour Rendering Indices (CRI) or colour space coverage.

Organic light-emitting diodes (OLEDs) can be formed on arbitrarily large substrates; however luminous emittance may be more than 1000 times lower than may be achieved by inorganic LEDs.

In this specification LED refers to an unpackaged LED die chip extracted directly from a monolithic wafer, i.e. a semiconductor element. This is different from packaged LEDs which have been attached to a lead frame in order to provide electrodes and may be assembled into a plastic package to facilitate subsequent assembly.

Packaged LEDs are typically of dimension greater than 1 mm, and more typically of dimension greater than 3 mm and can be assembled by conventional Printed Circuit Board assembly techniques including pick and place methods. The accuracy of components placed by such assembly machines may typically be about plus or minus 30 microns. Such sizes and tolerances prevent application to very high resolution displays.

Micro-LEDs may be formed by array extraction methods in which multiple LEDs are removed from a monolithic wafer in parallel and may be arranged with positional tolerances that are less than 5 microns.

White LED lighting sources can be comprised of separate spectral bands such as red, green, blue and yellow, each created by a separate LED element. Such sources enable users to resolve the separate colours, and as a result of the separation of the sources in the lamp, can create coloured illumination patches. It would be desirable if the sources were homogenized so that their separation was less than the visual resolution limit.

LED Displays for outdoor use are often constructed of LED chips embedded in a black plastic resin in order to suppress background light reflections and thereby increase the overall contrast and viewing quality of the display. The black resin material absorbs a substantial amount of the emitted light, which reduces the efficiency and increases overall power consumption of the display.

BRIEF SUMMARY

Directional LED elements can use reflective optics (including total internal reflective optics) or more typically catadioptric optic type reflectors, as described for example in U.S. Pat. No. 6,547,423. Catadioptric elements employ both refraction and reflection, which may be total internal reflection or reflection from metallised surfaces.

It would be desirable to provide a switchable directional display comprising an array of catadioptric optical elements and an array of LEDs that can be controlled to provide at least two different directional light output distributions in a thin package with high efficiency and high resolution.

According to a first aspect of the present disclosure there is provided an illumination apparatus, comprising: a first plurality of LEDs, the first plurality of LEDs being arranged in a first LED array, wherein the LEDs of the first plurality of LEDs are micro-LEDs; a second plurality of LEDs, the second plurality of LEDs being arranged in a second LED array; a first optical system aligned with the LEDs of the first plurality of LEDs to provide a first directional light output distribution, the first directional light output distribution being of light output from the LEDs of the first plurality of LEDs; wherein the first optical system comprises a first plurality of optical elements arranged in a first optical element array, each of the optical elements of the first plurality of optical elements aligned in correspondence with a respective one or more of the LEDs of the first plurality of LEDs, each of the LEDs of the first plurality of LEDs being aligned with only a respective one of the optical elements of the first optical system; and a second optical system aligned with the LEDs of the second plurality of LEDs to provide a second directional light output distribution, the second directional light output distribution being of light output from the LEDs of the second plurality of LEDs; wherein the first directional light output distribution has a solid angle that is smaller than the solid angle of the second directional light output distribution; the illumination apparatus further comprising control circuitry and electrodes arranged such that they are operable to drive the first plurality of LEDs independently of the second plurality of LEDs.

Advantageously a thin and efficient directional illumination apparatus can be provided that may be switched between different directional light output distributions to achieve controllable directional environmental lighting, and switchable directional display for reduced power consumption, increased display luminance and privacy operation.

At least some of the LEDs of the second plurality of LEDs may be positioned between neighbouring LEDs of the first plurality of LEDs. At least some of the LEDs of the second plurality of LEDs may be positioned between neighbouring optical elements of the first optical element array. Advantageously, a compact and substantially uniform illumination system may be provided.

At least some of the LEDs of the second plurality of LEDs are micro-LEDs. Advantageously the LEDs of the second plurality of LEDs may be formed using the same method used to form the first plurality of LEDs, reducing cost and complexity. Further, high luminance operation may be achieved in a thin package.

At least some of the optical elements of the first plurality of optical elements may be catadioptric optical elements. Advantageously light from the micro-LEDs of the first plurality of LEDs may be directed into a small solid angle by means of both refraction and reflection by the catadioptric optical element.

The catadioptric optical element may comprise in at least one catadioptric cross-sectional plane through its optical axis a first outer surface and a second outer surface facing the first outer surface; wherein the first and second outer surfaces may comprise curved surfaces; wherein the first and second outer surfaces may extend from a first end of the catadioptric optical element to a second end of the catadioptric optical element, the second end of the catadioptric optical element facing the first end of the catadioptric element. The distance between the first and second outer surfaces at the first end of the catadioptric optical element may be less than the distance between the first and second outer surfaces at the second end of the catadioptric optical element; and at least one transparent inner surface may be arranged between the first and second ends and between the first and second outer surfaces. The transparent inner surface may comprise at least one curved surface. Advantageously light that is provided over a large solid angle may be efficiently collected by the catadioptric optical element and directed into a smaller solid angle.

The LEDs of the first plurality of LEDs may be micro-LEDs of width or diameter less than 300 microns, preferably less than 200 microns and more preferably less than 100 microns. In the at least one catadioptric cross-sectional plane, the distance between the first and second outer surfaces at the second end of the catadioptric optical element may be less than 3 mm, preferably less than 1.5 mm and more preferably less than 0.75 mm. Advantageously a thin illumination apparatus may be provided, achieving small solid angle of output with micro-LED input.

In the at least one catadioptric cross-sectional plane, the exterior angle between the first end and the first and second outer surfaces at the first end may be less than the exterior angle between the first end and the first and second outer surface at the second end. In the at least one catadioptric cross-sectional plane at least one of the transparent inner surfaces may have positive optical power. In the at least one catadioptric cross-sectional plane at least one of the transparent inner surfaces may have zero optical power. Some of the light output of LEDs of the first plurality of LEDs may be transmitted by the at least one transparent inner surface before it is reflected at the first or second outer surfaces and directed into the first directional light output distribution; and some of the light output of LEDs of the first plurality of LEDs may be transmitted by the at least one transparent inner surface and directed into the first directional light output distribution without reflection at the first or second outer surfaces. Advantageously the catadioptric optical element may direct light from a wide range of input angles into a common small solid angle across the output end of the catadioptric optical element.

A refractive optical element may be provided between the LEDs of the first plurality of LEDs and the at least one transparent inner surface. The refractive optical element may be a hemispherical lens. Advantageously, light may be extracted from the LEDs of the first plurality of LEDs with increased efficiency.

The first plurality of LEDs may comprise inorganic LEDs. The second plurality of LEDs may comprise inorganic LEDs. At least one of the first and second plurality of LEDs may further comprise a wavelength converting layer. The wavelength converting layer may comprise a phosphor material or a quantum dot material. Advantageously high luminance operation may be achieved for first and second light output distributions.

The first and second plurality of LEDs may each be arranged to provide light of substantially the same white point to the first and second optical elements. Advantageously variation of display colour with viewing direction and with switching from wide angle to narrow angle mode of operation may be reduced.

The total light output area of the LEDs of the second plurality of LEDs may be greater than the total light output area of the LEDs of the first plurality of LEDs. Advantageously the luminance of the display in a wide angle directional light output distribution may be similar to the luminance in the narrow angle directional light output distribution.

The LEDs of the first plurality of LEDs may be from a monolithic wafer arranged in an array with their original monolithic wafer positions and orientations relative to each other preserved; and wherein in at least one direction, for at least one pair of the plurality of LEDs in the at least one direction, for each respective pair there was at least one respective LED in the monolithic wafer that was positioned in the monolithic wafer between the pair of LEDs in the at least one direction and that is not positioned between them in the array of LEDs. Advantageously an illumination apparatus may be formed in an efficient manner by parallel extraction of pluralities of LEDs and efficiently aligned in correspondence with pluralities of catadioptric optical elements. Large area accurately aligned illumination apparatus may be achieved with uniform directional light output distributions across the area of the illumination apparatus. Further, large numbers of micro-LEDs may be transferred in parallel, achieving reduced micro-LED size, reduced optical element thickness and increased resolution of the illumination apparatus.

The second optical system may comprise one or more light guides. The one or more light guides may be respectively aligned in correspondence with a respective one or more LEDs of the second plurality of LEDs. Advantageously the directional light output distribution of the LEDs of the second plurality of LEDs may be efficiently directed through the first optical system.

Each of the LEDs of the second plurality of LEDs may be aligned with only a respective one of the light guides. Advantageously, the light from each of the second plurality of LEDs may be provided to a defined area of the illumination apparatus, achieving reduced cross talk.

At least one of the light guides may comprise in at least one light guide cross-sectional plane through its optical axis, a first light guide outer surface and a second light guide outer surface facing the first light guide outer surface; wherein the first and second light guide outer surfaces may extend from a first end of the light guide to a second end of the light guide, the second end of the light guide facing the first end of the light guide and a transparent light guide input surface at the first end of the light guide. The transparent input surface may be linear and the first and second outer surfaces of the light guide may be linear. The first ends of the light guides of the plurality of light guides may be interspersed with the first ends of the catadioptric optical elements of the plurality of catadioptric optical elements. Advantageously light may be directed from the LEDs of the second plurality of LEDs by the light guide through the thickness of the illumination apparatus and with low loss. Further the light guide may be conveniently manufactured.

At least some of the catadioptric optical elements of the plurality of catadioptric optical may be extended in a direction that is normal to the catadioptric cross sectional plane. Advantageously a one dimensional change in the solid angle of the directional light output distribution may be provided. Such a distribution may provide controllable illumination in the one dimension, while achieving wide luminance distribution in the orthogonal direction. In a display application, a one dimensional directional light output distribution may provide comfortable viewing for rotations of a display about a horizontal axis, and reduced solid angle for rotations about a horizontal axis. Such an arrangement may achieve comfortable display use for a centrally located observer when a narrow directional light output distribution is provided.

At least some of the light guides of the plurality of light guides may be extended in the direction that is normal to the catadioptric cross sectional plane. The light guides may be arranged parallel to the catadioptric optical elements. The light guides and catadioptric optical elements may be provided as continuous elements across the height or width of the illumination apparatus. Advantageously scatter may be reduced, and the elements formed more conveniently, reducing cost and complexity.

The first and second light guide outer surfaces may be transparent. Advantageously metal coating may not be applied, reducing cost and complexity. Further reflectivity losses at metallised surfaces may be removed so that light guide efficiency may be increased.

At least one light guide cross-sectional plane through its optical axis the distance between the first and second outer surfaces at the first end of the light guide is the same as the distance between the first and second outer surfaces at the second end of the light guide; wherein the solid angle of the second directional light output distribution is substantially the same as the solid angle of the directional light output distribution of the LEDs of the second plurality of LEDs. Advantageously a substantially Lambertian directional light output distribution may be provided, achieving wide angle viewing of the display when the LEDs of the second plurality of LEDs are illuminated.

The distance between the first and second outer surfaces at the first end of the light guide is less than the distance between the first and second outer surfaces at the second end of the light guide; wherein the solid angle of the second directional light output distribution is less than the solid angle of the directional light output distribution of the LEDs of the second plurality of LEDs. Advantageously the head on luminance of the display in the wide angle mode of operation may be increased. Further the light guides may be more conveniently manufactured as they may release from a moulding tool more conveniently during moulding.

The second ends of the light guides of the plurality of light guides may be interspersed with the second ends of the catadioptric optical elements of the plurality of catadioptric optical elements. Advantageously luminance uniformity of the output can be improved.

At least some of the light guides of the plurality of light guides may be extended in a direction that is orthogonal to the direction in which the catadioptric optical elements are extended. Advantageously the spatial resolution of the LEDs in the direction orthogonal to the direction in which the catadioptric optical elements are extended may be increased. Further reduced visibility of gaps between catadioptric optical elements is achieved.

The second end of at least one catadioptric optical element of the plurality of catadioptric optical elements may be arranged on the first side of an optical element support substrate and the second end of at least one of the plurality of light guides may be arranged on the same side of the optical element support substrate. Advantageously a support substrate may be provided in a single moulding step comprising both catadioptric optical elements and light guides, reducing cost and complexity. Further alignment between catadioptric optical elements and LEDs of the first and second pluralities of LEDs may be achieved in a single alignment step.

The first light guide outer surface may be shaped with substantially the same shape as the first outer surface of a respective neighbouring catadioptric optical element; and the second light guide outer surface may be shaped with substantially the same shape as the second outer surface of a respective neighbouring catadioptric optical element; wherein the distance between the first and second light guide outer surfaces is greatest at the first end of the light guide. The first light guide outer surface may be aligned to the first outer surface of the neighbouring catadioptric optical element with a gap; and the second light guide outer surface may be aligned to the second outer surface of the neighbouring catadioptric optical element with a gap. At least part of the second directional light output distribution may be provided by output light from LEDs of the second plurality of LEDs that is transmitted through the first light guide outer surface, and transmitted by an outer surface of the catadioptric optical element. At least part of the second directional light output distribution may be provided by output light from LEDs of the second plurality of LEDs that is reflected by total internal reflection at the second light guide outer surface.

Advantageously an illumination apparatus may be provided to achieve switching between narrow and wide directional light output distributions. The spacing of the catadioptric optical elements may be reduced, so that resolution may be increased. Further, cross talk between light emitting elements may be reduced.

The catadioptric optical elements of the plurality of catadioptric optical elements may comprise a material transparent to at least one operating wavelength of at least one element of the first plurality of LEDs. The catadioptric optical elements of the plurality of catadioptric optical elements may comprise a transparent polymeric material. The light guides of the plurality of light guides may comprise a transparent polymeric material. Advantageously the light guides may be provided by moulded optical elements, and do not require further metallisation, reducing cost and complexity of fabrication.

The light guides of the plurality of light guides may further comprise a light scattering material. Advantageously the area of LEDs of the second plurality of LEDs may be reduced, reducing cost and complexity.

The light guides of the plurality of light guides may further comprise a wavelength converting material that may comprise a phosphor or quantum dot material. Advantageously the luminous flux density at the wavelength conversion material may be reduced, reducing operating temperature and increasing lifetime of the wavelength conversion material, and achieving a more stable operating chromatic output.

The LEDs of the first and second pluralities of LEDs may be arranged on a common substrate. Advantageously the manufacturing cost and complexity may be reduced.

The control circuitry may comprise at each row and column electrode intersection, a data value store for providing at least two data values wherein one of the at least two data values is supplied to at least one LED of the first plurality of LEDs and one other of the at least two data values is supplied to at least one LED of the second plurality of LEDs. The control circuitry may comprise at each row and column electrode intersection, an electrode connected to an LED of the first plurality of LEDs and connected to an LED of the second plurality of LEDs; and may further comprise first and second control electrodes connected to the respective first and second pluralities of LEDs; wherein the control electrodes are connected to a plurality of electrode intersections. Advantageously the number of connections provided to achieve control of the first and second plurality of LEDs is reduced, reducing cost and complexity.

According to a second aspect of the present disclosure there is provided a backlight for a display apparatus comprising the illumination apparatus of the first aspect.

According to a third aspect of the present disclosure there is provided a display apparatus comprising the backlight apparatus of the second aspect and a spatial light modulator.

Advantageously a switchable backlight may be arranged with a spatial light modulator such as an LCD to achieve switching between wide angle operation and narrow angle operation that may be achieve power savings, privacy operation, reduced stray light and efficient high luminance operation.

The control system may comprise a backlight controller arranged to drive at least one of the first and second plurality of LEDs in a first region of the backlight apparatus with a higher light output than the light output in a second region of the backlight apparatus. The backlight control system may be arranged to drive regions of at least one of the first and second pluralities of LEDs in correspondence with image data provided to the transmissive spatial light modulator by a display controller. The control circuitry may further comprise means to drive the first and second pluralities of LEDs with image pixel data.

Advantageously a high dynamic range (HDR) display may be provided with addressable backlight regions. Further, the HDR performance may be provided for both wide angle and narrow angle directional light output distributions. Further part of the display area may be provided with a first directional light output distribution, and a different part of the display area may be provided with a different directional light output distribution.

According to a fourth aspect of the present disclosure there is provided a direct display apparatus comprising a switchable illumination apparatus of the first aspect and wherein the control circuitry further comprises means to drive the first and second pluralities of LEDs with image pixel data.

In comparison to a backlit spatial light modulator, thickness may be reduced and efficiency increased. Switching between wide angle operation and narrow angle operation that may advantageously achieve power savings, privacy operation, reduced stray light and efficient high luminance operation.

The LEDs of the first plurality of LEDs may be micro-LEDs of width or diameter less than 100 microns, preferably less than 50 microns and more preferably less than 25 microns. A direct display may comprise pixel micro-LEDs wherein the LEDs of the first plurality of LEDs are micro-LEDs of width or diameter less than 100 microns, preferably less than 50 microns and more preferably less than 25 microns.

The LEDs of the first plurality of LEDs may be arranged to provide a first plurality of image pixels with the first directional light output distribution; wherein the LEDs of the second plurality of LEDs are arranged to provide the first plurality of image pixels with the second directional light output distribution. Advantageously a common image may be seen independent of viewing angle, to provide a uniform display appearance for a moving observer.

In at least one catadioptric cross-sectional plane the distance between the first and second outer surfaces at the second end of the catadioptric optical element is less than 0.5 mm, preferably less than 0.25 mm and more preferably less than 0.1 mm. Advantageously high display resolution may be provided.

The second plurality of LEDs may comprise organic LEDs. Advantageously uniform illumination may be provided in the region between the micro-LEDs of the first plurality of LEDs.

The first and second plurality of LEDs may each be arranged to provide light of more than one spectral band to the first and second optical systems. Advantageously a colour display may be provided.

According to a fifth aspect of the present disclosure there is provided an illumination apparatus, comprising: a first plurality of LEDs, the first plurality of LEDs being arranged in a first LED array, wherein the LEDs of the first plurality of LEDs are micro-LEDs; a second plurality of LEDs, the second plurality of LEDs being arranged in a second LED array; and a plurality of catadioptric optical elements arranged in a catadioptric optical element array, wherein each of the catadioptric optical elements of the plurality of catadioptric optical elements comprises, in at least one cross-sectional plane through its optical axis: a first outer surface and a second outer surface facing the first outer surface; wherein the first and second outer surfaces extend from a first end of the catadioptric optical element to a second end of the catadioptric optical element, the second end of the catadioptric optical element facing the first end of the catadioptric element; wherein the distance between the first and second outer surfaces at the first end of the catadioptric optical element is less than the distance between the first and second outer surfaces at the second end of the catadioptric optical element; and at least one transparent inner surface arranged between the first and second ends and between the first and second outer surfaces; wherein each of the catadioptric optical elements of the plurality of catadioptric optical elements is aligned in correspondence with a respective one or more of the LEDs of the first plurality of LEDs, each of the LEDs of the first plurality of LEDs being aligned with only a respective one of the catadioptric optical elements of the plurality of catadioptric optical elements, the alignment in correspondence between a catadioptric optical element of the plurality of catadioptric elements and its respective one or more of the LEDs of the first plurality of LEDs comprising the respective one or more of the LEDs of the first plurality of LEDs being positioned at the first end of the catadioptric optical element and aligned with the catadioptric optical element or positioned between the first end of the catadioptric optical element and the at least one transparent inner surface of the catadioptric optical element and aligned with the catadioptric optical element; and at least some of the LEDs of the second plurality of LEDs being arranged in positions other than positioned at the first end of and aligned with any catadioptric optical element of the plurality of catadioptric optical elements, and in positions other than positioned between the first end and the at least one transparent inner surface of and aligned with any catadioptric optical element of the plurality of catadioptric optical elements; the illumination apparatus further comprising control circuitry and electrodes arranged such that they are operable to drive the first plurality of LEDs independently of the second plurality of LEDs.

At least some of the LEDs of the second plurality of LEDs may be micro-LEDs. At least some of the LEDs of the second plurality of LEDs may be positioned between neighbouring LEDs of the first plurality of LEDs. At least some of the LEDs of the second plurality of LEDs may be positioned between neighbouring catadioptric optical elements of the catadioptric optical element array. At least some of the LEDs of the second plurality of LEDs may be positioned between respective first ends of neighbouring catadioptric optical elements of the catadioptric optical element array. The illumination may further comprise one or more light guides.

The one or more light guides may be respectively aligned in correspondence with a respective one or more LEDs of the second plurality of LEDs. At least some of the one or more light guides may be positioned between respective second ends of neighbouring catadioptric optical elements of the catadioptric optical element array. The LEDs of the first plurality of LEDs may be micro-LEDs of width or diameter less than 300 microns, preferably less than 200 microns and more preferably less than 100 microns. The distance between the first and second outer surfaces at the second end of the catadioptric optical element may be less than 6 mm. The cross-section from one side to the other side of the micro-LED may be aligned within the first end of the catadioptric optical element.

At least some of the LEDs of the first plurality of LEDs may be positioned on a first LED plane and at least some of the LEDs of the second plurality of LEDs may be positioned on a second LED plane that is different to the first LED plane. Advantageously the directional light output distribution of the LEDs of the second plurality of LEDs may not be directed by the array of catadioptric optical elements, to achieve increased image resolution and efficiency for the second plurality of LEDs.

Each of the catadioptric optical elements of the plurality of catadioptric optical elements aligned in correspondence with a respective one or more of the LEDs of the first plurality of LEDs may provide a first directional light output distribution, the first directional light output distribution being of light output from the LEDs of the first plurality of LEDs. The LEDs of the second plurality of LEDs may provide a second directional light output distribution, the second directional light output distribution being of light output from the LEDs of the second plurality of LEDs; wherein the first directional light output distribution has a solid angle that is smaller than the solid angle of the second directional light output distribution. Advantageously a switchable directional light output illumination apparatus may be provided.

The second end of at least one catadioptric optical element of the plurality of catadioptric optical elements may be arranged on the first side of an optical element support substrate. Advantageously the optical element support substrate may provide accurate and reliable placement of the catadioptric optical elements of the plurality of optical elements.

The first side of the optical element support substrate may be arranged between the catadioptric optical elements and the LEDs of the second plurality of LEDs. The LEDs of the second plurality of LEDs may be arranged on the second side opposite the first side of the optical element support substrate. Advantageously the LEDs of the second plurality of LEDs may be arranged on a substrate that may be conveniently aligned to the catadioptric optical elements.

The LEDs of the second plurality of LEDs may be arranged on the first side of the optical element support substrate. Advantageously the LEDs of the second plurality of LEDs may be protected from the external environment by the support substrate.

According to a sixth aspect of the present disclosure there may be provided a backlight for a display apparatus comprising the illumination apparatus of the fifth aspect.

According to a seventh aspect of the present disclosure there may be provided a display apparatus comprising the backlight apparatus the sixth aspect and a spatial light modulator.

According to an eighth aspect of the present disclosure there may be provided a direct display apparatus comprising a switchable illumination apparatus of the fifth aspect; wherein the control circuitry further comprises means to drive the first and second pluralities of LEDs as at least one addressable matrix with image pixel data. The LEDs of the first plurality of LEDs may be arranged to provide a first plurality of image pixels with the first directional light output distribution; and the LEDs of the second plurality of LEDs may be arranged to provide the first plurality of image pixels with the second directional light output distribution. The distance between the first and second outer surfaces at the second end of the catadioptric optical element is less than 0.5 mm, preferably less than 0.25 mm and more preferably less than 0.1 mm. The direct display may comprise pixel micro-LEDs wherein the LEDs of the first plurality of LEDs are micro-LEDs of width or diameter less than 100 microns, preferably less than 50 microns and more preferably less than 25 microns.

Advantageously a switchable directional display apparatus may be provided with high resolution, thin package size, high efficiency, protected LEDs and wide viewing angle in wide angle mode. In narrow angle mode, the display may provide very high efficiency, privacy operation, power savings, outdoors operation, and low stray light operation.

According to a further aspect, an illumination apparatus may comprise: a first plurality of LEDs, the first plurality of LEDs being arranged in a first LED array, wherein the LEDs of the first plurality of LEDs are micro-LEDs; a second plurality of LEDs, the second plurality of LEDs being arranged in a second LED array; a first optical system aligned with the LEDs of the first plurality of LEDs to provide a first directional light output distribution, the first directional light output distribution being of light output from the LEDs of the first plurality of LEDs; wherein the first optical system comprises a first plurality of optical elements arranged in a first optical element array, each of the optical elements of the first plurality of optical elements aligned in correspondence with a respective one or more of the LEDs of the first plurality of LEDs; and a second optical system aligned with the LEDs of the second plurality of LEDs to provide a second directional light output distribution, the second directional light output distribution being of light output from the LEDs of the second plurality of LEDs; wherein the first directional light output distribution has a solid angle that is smaller than the solid angle of the second directional light output distribution; the illumination apparatus further comprising control circuitry and electrodes arranged such that they are operable to drive the first plurality of LEDs independently of the second plurality of LEDs.

According to a further aspect of the present disclosure the relative spatial positions of the optical elements in the array of optical elements is provided when the optical elements are formed. The first plurality of optical elements may be a monolithic array of optical elements. At least the optical elements of the first plurality of optical elements and an optical element support substrate may form an integrated body. The forming of the integrated body may comprise attaching at least the optical elements to the substrate in a manner that preserves the relative spatial positions of the optical elements. The forming of the integrated body may comprise forming at least the optical elements on the substrate.

According to a further aspect or embodiment of the present disclosure there is provided a switchable illumination apparatus, comprising a first plurality of micro-LEDs, the first plurality of micro-LEDs being arranged in a first micro-LED array; a second plurality of micro-LEDs, the second plurality of micro-LEDs being arranged in a second micro-LED array; and a plurality of catadioptric optical elements arranged in a catadioptric optical element array; wherein each of the catadioptric optical elements comprises an input end and an output end; wherein the width of the input end in at least a first direction is smaller than the width of the output end in the at least first direction; wherein each of the micro-LEDs of the first plurality of micro-LEDs is arranged at the input end; wherein the light from the micro-LEDs of the first plurality of micro-LEDs is directed by the corresponding catadioptric optical element of the plurality of catadioptric optical elements into a first directional light output distribution from the output end that is narrower in the first direction than the directional light output distribution in said first direction at the input end; and at least some of the micro-LEDs of the second plurality of micro-LEDs being arranged in positions other than at the input end; the illumination apparatus further comprising control circuitry and electrodes arranged such that they are operable to control the first plurality of micro-LEDs to emit light independently of the second plurality of micro-LEDs.

Advantageously a thin directional illumination apparatus may be provided that may achieve directional illumination into small cone angles and may be switched to achieve directional illumination with a wide cone angle. Such an apparatus may be used for control of directionality of output for environmental lighting, display backlighting and direct display applications, including for high illuminance switchable lighting, privacy display operation, reduced power with high luminance and reduced stray light.

According to a further aspect or embodiment of the present disclosure there is provided a switchable illumination apparatus, comprising: a first plurality of LEDs, wherein the first plurality of LEDs are micro-LEDs being arranged in a first LED array that is a first micro-LED array; a second plurality of LEDs, the second plurality of LEDs being arranged in a second LED array; and a plurality of catadioptric optical elements arranged in a catadioptric optical element array; wherein each of the catadioptric optical elements in at least one cross sectional plane comprises: a first outer surface and a second outer surface facing the first outer surface; wherein the first and second outer surfaces extend from a first end to a second end facing the first end; wherein the separation of the outer surfaces at the first end is less than the separation of the outer surfaces at the second end; wherein the separation of the outer surfaces at the second end is less than 6 mm; at least one transparent inner surface arranged between the first and second ends and between the outer surfaces wherein each of the micro-LEDs of the first plurality of LEDs is arranged at the first end or between the first end and the transparent inner surface; wherein the light from the micro-LEDs of the first plurality of LEDs is directed by the corresponding catadioptric optical element of the plurality of catadioptric optical elements into a first directional light output distribution from the output end that is narrower in the first direction than the directional light output distribution in said first direction at the input end; and at least some of the LEDs of the second plurality of LEDs being arranged in positions other than at the input end; the illumination apparatus further comprising control circuitry and electrodes arranged such that they are operable to control the first plurality of micro-LEDs to emit light independently of the second plurality of LEDs. At least some of plurality of LEDs of the second LED array may be micro-LEDs being arranged in a second micro-LED array.

Advantageously uniformity of output across the output area of the catadioptric optical elements may be increased in wide angle mode of operation. Illuminator and display uniformity may be increased, improving aesthetic quality and reducing Moiré and mura artefacts.

According to a further aspect or embodiment of the present disclosure there is provided a switchable illumination apparatus, comprising: a first plurality of micro-LEDs, the first plurality of micro-LEDs being arranged in a first micro-LED array; a second plurality of micro-LEDs, the second plurality of micro-LEDs being arranged in a second micro-LED array; and a plurality of catadioptric optical elements arranged in a catadioptric optical element array; wherein each of the catadioptric optical elements comprises an input end and an output end; wherein the width of the input end in at least a first direction is smaller than the width of the output end in the at least first direction; wherein the input ends are separated by intermediate regions in at least the first direction; wherein at least some of the micro-LEDs of the second plurality of micro-LEDs are arranged in the intermediate regions; and a plurality of light guiding micro-optics arranged in the intermediate regions; wherein each of the light guiding micro-optics is aligned with at least one micro-LED of the second plurality of micro-LEDs; wherein the light from the micro-LEDs of the first plurality of micro-LEDs is directed by the corresponding catadioptric optical element of the plurality of catadioptric optical elements into a first directional light output distribution from the output end that is narrower in the first direction than the directional light output distribution in said first direction at the input end; wherein the light from at least some of the micro-LEDs of the second plurality of micro-LEDs is directed by the corresponding light guiding micro-optic of the plurality of light guiding micro-optics into a second directional light output distribution that is wider in the first direction than the first directional light output distribution in said first direction; the illumination apparatus further comprising control circuitry and electrodes arranged such that they are operable to control the first plurality of micro-LEDs to emit light independently of the second plurality of micro-LEDs.

The first and second micro-LED arrays may be provided on a single substrate reducing cost and complexity. The output illumination profile of the second micro-LED array may be preserved to achieve wide angle operation.

According to a further aspect or embodiment of the present disclosure there is provided a switchable illumination apparatus, comprising: a plurality of primary LEDs; wherein the plurality of primary LEDs are micro-LEDs and are arranged in a primary LED array; a plurality of secondary LEDs, wherein the plurality of secondary LEDs are arranged in a secondary LED array; and a plurality of catadioptric optical elements arranged in a catadioptric optical element array; wherein each of the catadioptric optical elements comprises an input end and an output end; wherein the width of the input end of each of the catadioptric optical elements in at least a first direction is smaller than the width of the output end of the catadioptric optical element in the at least first direction; wherein each of the primary LEDs of the primary LED array are arranged at the input end of a corresponding catadioptric optical element of the catadioptric optical element array; wherein the light from the primary LEDs of the primary LED array is directed by the corresponding catadioptric optical element of the catadioptric optical element array into a directional light output distribution from the output end of the catadioptric optical element that is narrower in the first direction than the directional light output distribution in said first direction at the input end; and at least some of the secondary LEDs of the plurality of secondary LEDs of the second LED array being arranged in positions other than at the input end; the illumination apparatus further comprising control circuitry and electrodes arranged such that they are operable to control the plurality of primary LEDs to emit light independently of the plurality secondary LEDs.

Advantageously uniformity of output across the output area of the catadioptric optical elements may be increased in wide angle mode of operation. Illuminator and display uniformity may be increased, improving aesthetic quality and reducing Moiré and mura artefacts. The micro-LEDs may be inorganic micro-LEDs from a monolithic substrate.

Advantageously very high display luminance may be provided from small light sources. Such small sources may achieve narrow illumination angles in cooperation with catadioptric optical elements.

The secondary LEDs of the second LED array may be micro-LEDs. The secondary LEDs may be organic LEDs (OLEDs). The primary micro-LEDs may be OLEDs. Advantageously a uniform wide angle illumination profile may be provided in direct display applications.

At least some of the catadioptric optical elements of the plurality of catadioptric optical elements may be extended in a second direction orthogonal to the first direction.

Advantageously a switchable directional light output distribution may be provided in a single direction. Switchable environmental lighting of extended aspect ratio environments may be provided. Display luminance for rotation around a horizontal axis for example may be maintained while privacy or high luminance, or reduced power operation may be provided for display rotation about a vertical axis for example.

At least some of the catadioptric optical elements of the plurality of catadioptric optical elements may be extended in the first direction and may be interspersed with catadioptric optical micro-optics that are extended in the second direction.

According to a further aspect or embodiment of the present disclosure there is provided a switchable display apparatus comprising a switchable illumination apparatus of the above aspects or embodiments wherein the control circuitry further comprises means to drive the first and second pluralities of micro-LEDs with image pixel data; wherein the micro-LEDs of the first plurality of micro-LEDs are arranged to provide a first plurality of image pixels with the first directional light output distribution; wherein the micro-LEDs of the second plurality of micro-LEDs are arranged to provide the first plurality of image pixels with a directional light output distribution that is wider than the first directional light output distribution.

The control system may be arranged to provide image data to the first and second plurality of micro-LEDs.

According to a further aspect or embodiment of the present disclosure there is provided a switchable backlight apparatus comprising a switchable illumination apparatus of the above aspects or embodiments. The switchable backlight may be for a display apparatus comprising a transmissive spatial light modulator.

The control system may be arranged to provide illumination luminance and directional light output distribution of first and second regions of the backlight in correspondence with image data on the transmissive spatial light modulator.

The first directional light output distribution may be arranged to provide illumination of a first magnifying optic from a first region and illumination of a second magnifying optic from a second region.

According to a further aspect or embodiment of the present disclosure there is provided a plurality of light guiding micro-optics is arranged in intermediate regions, each comprising an input end, wherein the input end of each of the light guiding micro-optics is aligned with at least one of the micro-LEDs of the second plurality of micro-LEDs; wherein the light from at least some of the micro-LEDs of the second plurality of micro-LEDs is directed by the corresponding light guiding micro-optic of the plurality of light guiding micro-optics into a second directional light output distribution that is wider in the first direction than the first directional light output distribution in said first direction. The input ends of the light guiding micro-optics may be interspersed with the input ends of the catadioptric optical elements. The light guiding micro-optics may be extended in at least the first direction. The plurality of catadioptric optical elements and plurality of light guiding micro-optics may be extended in the second direction that is orthogonal to the first direction.

The respective first and second plurality of micro-LEDs may each comprise light emitters of more than one spectral band. The white point of the first and second plurality of micro-LEDs may be the same.

The total area of the micro-LEDs of the second plurality of micro-LEDs may be greater than the total area of the micro-LEDs of the first plurality of micro-LEDs. The light guiding micro-optics comprise a light scattering material. The light scattering material may comprise a wavelength converting material.

At least some of the plurality of light guiding micro-optics may comprise a light guiding micro-optic input end and a light guiding micro-optic output end facing the light guiding micro-optic input end. The output end of the light guiding micro-optics may be interspersed with the output end of the catadioptric optical elements.

In the first direction the width of the light guiding micro-optic input end is the same as the width of the light guiding micro-optic output end; wherein the light from micro-LEDs of the second plurality of micro-LEDs is directed by the corresponding light guiding micro-optic of the plurality of light guiding micro-optics into a directional light output distribution from the light guiding micro-optic output end that is substantially the same in the first direction as the directional light output distribution in said first direction at the light guiding micro-optic input end.

In at least one of the first direction and a second direction orthogonal to the first direction, the width of the light guiding micro-optic input end is less than the width of the light guiding micro-optic output end; wherein the light from micro-LEDs of the second plurality of micro-LEDs is directed by the corresponding light guiding micro-optic of the plurality of light guiding micro-optics into a directional light output distribution from the light guiding micro-optic output end that is narrower than the directional light output distribution from micro-LEDs of the second plurality of micro-LEDs at the light guiding micro-optic input end.

The plurality of catadioptric optical elements may be extended in a second direction orthogonal to the first direction and the plurality of light guiding micro-optics may be extended in the first direction.

At least some of the plurality of light guiding micro-optics may comprise a corrective micro-optic with an input end and shaped sides; wherein the shape of the shaped sides may be substantially the same as the shape of outer sides of the catadioptric optical elements. The sides of the corrective micro-optics and catadioptric optical elements may be aligned next to each other with a gap; wherein the gap may be substantially parallel in at least some of the region between the input and output end of the catadioptric optical elements.

The output ends of the catadioptric optical elements of the plurality of catadioptric optical elements may be arranged on the first side of a micro-optic support substrate. The first side of the micro-optic support substrate may be arranged between the catadioptric optical elements and the second plurality of micro-LEDs.

The second plurality of micro-LEDs may be formed on the second side of the micro-optic support substrate opposite the first side. The second plurality of micro-LEDs may be formed on the first side of the micro-optic support substrate.

The catadioptric optical element in at least one cross sectional plane may comprise: a first outer surface and a second outer surface facing the first outer surface; wherein the first and second outer surfaces extend from a first end to a second end facing the first end; wherein the separation of the outer surfaces at the first end is less than the separation of the outer surfaces at the second end; wherein the separation of the outer surfaces at the second end is less than 6 mm; at least one transparent inner surface arranged between the first and second ends and between the outer surfaces. The first and second outer surfaces may be curved. The slope of the outer surfaces at the first end is less than the slope of the outer surfaces at the second end.

At least one of the transparent inner surfaces may be curved. At least one of the transparent inner surfaces may have positive optical power and at least one of the transparent inner surfaces may be substantially linear.

The micro-LED may be arranged at the first end or between the first end and the transparent inner surface. Light from the micro-LED may be incident on the at least one transparent inner surface before it is incident on the first or second outer surfaces. The micro-LED may be aligned such that light from the micro-LED is refracted at the inner transparent surfaces and is reflected at the outer surfaces. The reflection at the outer surfaces may be total internal reflection. Light from the micro-LED may be directed into substantially the same directional light output distribution by (i) refraction at the at least one curved inner surface and (ii) by refraction by a surface of the at least one inner surfaces and reflection by one of the outer surfaces. A refractive micro-optic may be provided between the micro-LED and the at least one transparent inner surface.

Such an apparatus may be used for domestic or professional lighting and for display.

These and other features and advantages of the present disclosure will become apparent to those of ordinary skill in the art upon reading this disclosure in its entirety.

BRIEF DESCRIPTION OF THE DRAWINGS

Embodiments are illustrated by way of example in the accompanying figures, wherein like reference numbers indicate similar parts.

FIG. 59 is a schematic diagram illustrating in side view a prior art LED device, in accordance with the present disclosure;

FIG. 60 is a schematic diagram illustrating in side view a LED device mounted with phosphor layer and hemispherical structure, in accordance with the present disclosure;

FIG. 61 is a schematic diagram illustrating in side view a catadioptric optical element, in accordance with the present disclosure; and FIG. 62 is a schematic diagram illustrating in side view a directional LED device, in accordance with the present disclosure.

DETAILED DESCRIPTION

It would be desirable to provide a switchable illumination apparatus for display, display backlighting or for domestic or professional environmental lighting. Environmental lighting may include illumination of a room, office, building, scene, street, equipment, or other illumination environment.

Display backlighting means an illumination apparatus arranged to illuminate a transmissive spatial light modulator such as a liquid crystal display. The micro-LEDs of a display backlight may be provided with pixel information, for example in high dynamic range operation as will be described herein. However, in general pixel data is provided by the spatial light modulator.

Direct display means an illumination apparatus wherein the micro-LEDs are arranged to provide pixel image information, and no spatial light modulator is arranged between the illumination apparatus and observer.

Figure 1A:
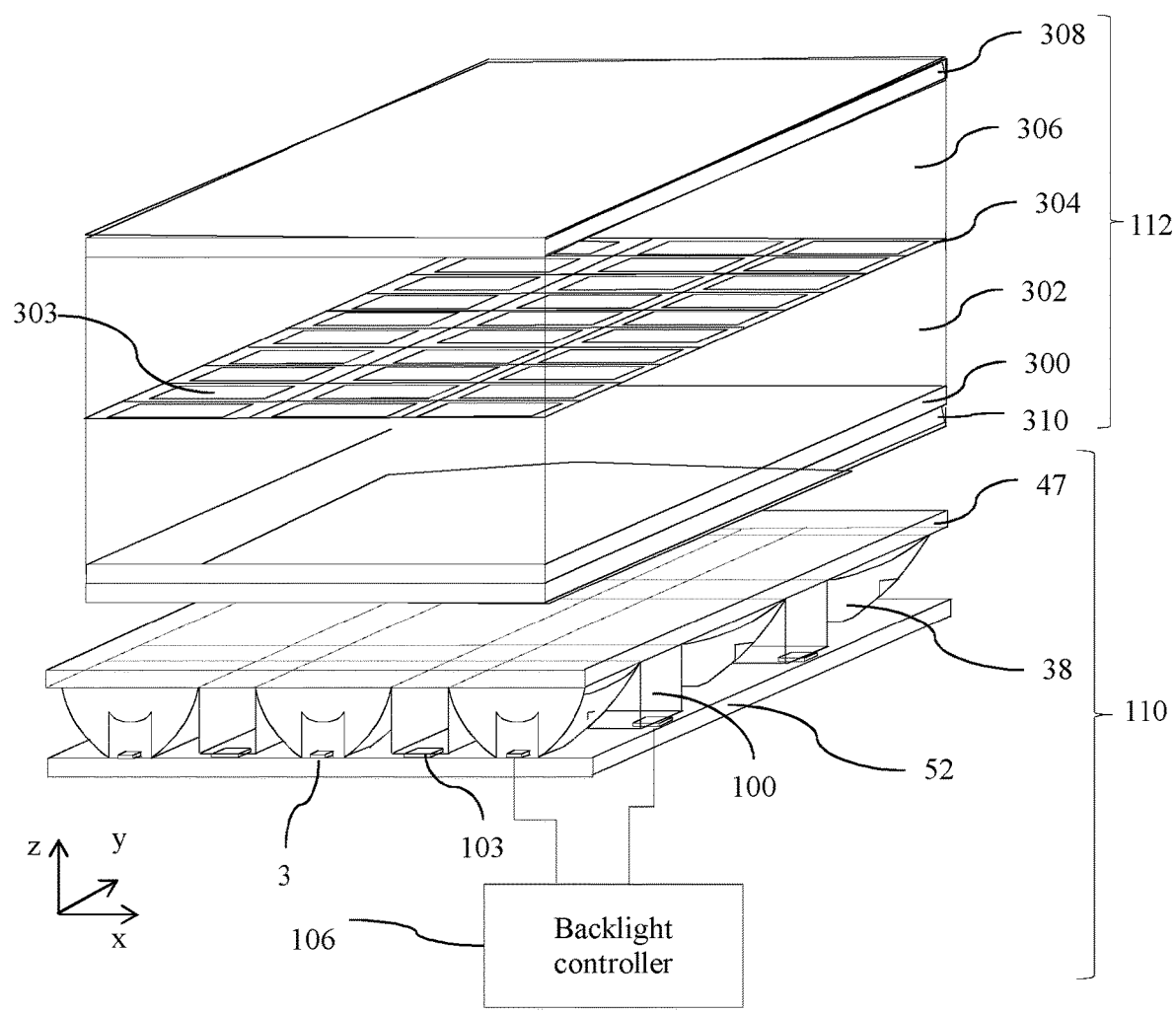
FIG. 1A is a schematic diagram illustrating in side perspective view a switchable directional display apparatus comprising a backlight with a two dimensional array of catadioptric optical elements and an array of light guides arranged to illuminate a spatial light modulator, in accordance with the present disclosure.

FIG. 1A is a schematic diagram illustrating in side perspective view a switchable directional display apparatus comprising a backlight illumination apparatus 110 with a two dimensional array of catadioptric optical elements 38 and a plurality of light guides 100 arranged to illuminate a spatial light modulator 112. The spatial light modulator 112 may comprise a liquid crystal display with a plurality of pixels 303, input polariser 300, TFT substrate 302, pixel layer 304, colour filter substrate 306 and output polariser 308. A further input optical layer 310 may comprise a reflective polariser to achieve recirculation of polarised light that is not transmitted through polariser 300, advantageously increasing system efficiency.

The first and second pluralities of LEDs 3, 103 are arranged on a common substrate 52. Backlight illumination apparatus 110 may comprise first substrate 52 on which a first array of light emitting diodes (LEDs) 3 and second array of light emitting diodes (LEDs 103) is formed.

Thus an illumination apparatus 110 may comprise a first plurality of LEDs 3, the first plurality of LEDs 3 being arranged in a first LED array, wherein the LEDs of the first plurality of LEDs are micro-LEDs and a second plurality of LEDs 103, the second plurality of LEDs 103 being arranged in a second LED array. At least some of the LEDs 103 of the second plurality of LEDs are positioned between neighbouring catadioptric optical elements 38 of the catadioptric optical element array.

A backlight for a display apparatus thus comprises the backlight illumination apparatus 110 and a display apparatus comprises the backlight illumination apparatus 110 and the spatial light modulator 112.

In a backlight illumination apparatus 110, the LEDs 3, 103 may be for example blue micro-LEDs such as gallium nitride semiconductor elements, and may further be provided with colour conversion materials such as phosphors or quantum dot materials to provide white colour output.

A second substrate comprising a transparent optical element support substrate 47 may have formed thereon a plurality catadioptric optical elements 38 that are aligned with the first array of LEDs 3. A plurality of light guides 100 may be interspersed with the array of catadioptric optical elements 30, and aligned with the second array of LEDs 103.

The backlight illumination apparatus 110 may be arranged to illuminate the spatial light modulator 112 to provide switchable directional illumination as will be described herein.

In the present disclosure, the plurality of micro-LEDs, or plurality of LEDs, or plurality of catadioptric optical elements, or plurality of light-guides, or plurality of refractive optical elements may each be arranged as one or more arrays. Such arrays may comprise an ordered series or arrangement of the components, or in some embodiments it may be desirable to provide some randomisation of spatial location of the pluralities of components, for example to reduce Moiré patterning artefacts. The present disclosure thus refers to both pluralities and arrays of optical components.

In the present embodiments, increased efficiency may achieve increased luminance for a given power consumption, may achieve reduced power consumption and/or may achieve reduced cost of components, as less area of micro-LEDs 3 and/or catadioptric optical elements 38 are required for a given output luminance.

Figure 1B:
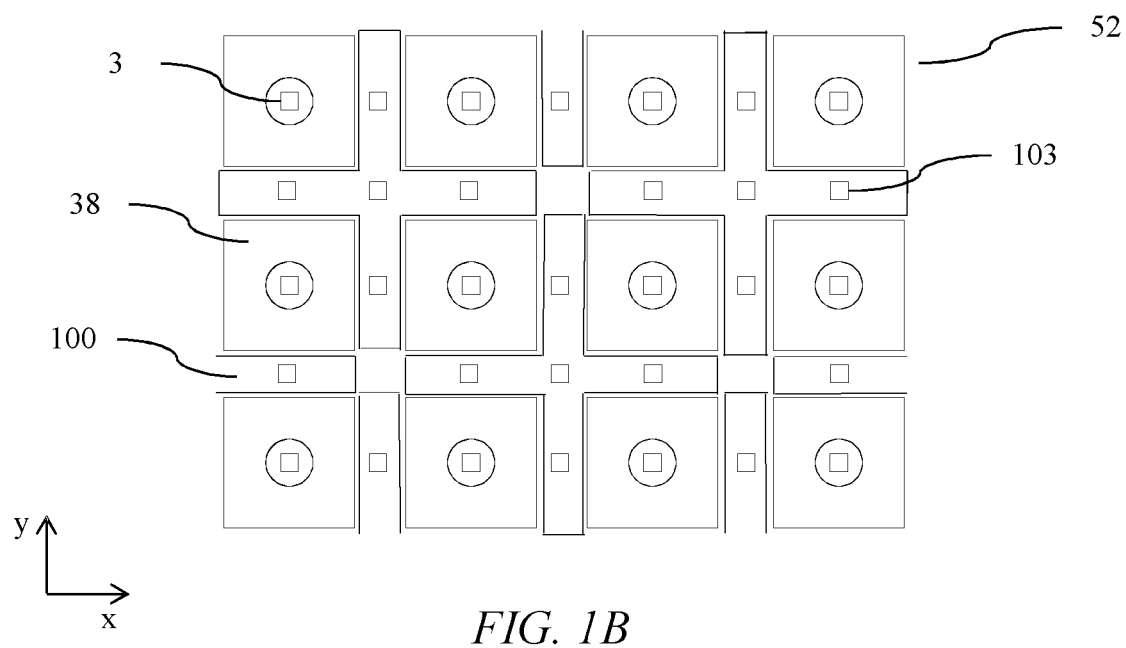
FIG. 1B is a schematic diagram illustrating in top view an arrangement of micro-LEDs, catadioptric optical elements and light guides of FIG. 1A, in accordance with the present disclosure.

FIG. 1B is a schematic diagram illustrating in top view an arrangement of micro-LEDs 3, catadioptric optical elements 38 and light guides 100 of FIG. 1A wherein the catadioptric elements 38 are arranged with a square packing. The surface 46 of the catadioptric optical element 38 may be rotationally symmetric, or may be formed from a series of planar surfaces, or may be extended in a direction as will be discussed below.

Light guides 100 are arranged between the catadioptric optical elements 38. Thus when array of micro-LEDs 3 is operated, the light output is directed through the array of catadioptric optical elements, and when array of micro-LEDs 103 is operated the light output is directed through the light guides 100. As shown, the array of light guides 100 may be interconnected in regions, or may be separated.

Advantageously the optical output of the backlight can be controlled by determining which of the arrays of micro-LEDs 3, 103 is illuminated and to which luminous flux.

Figure 1C:
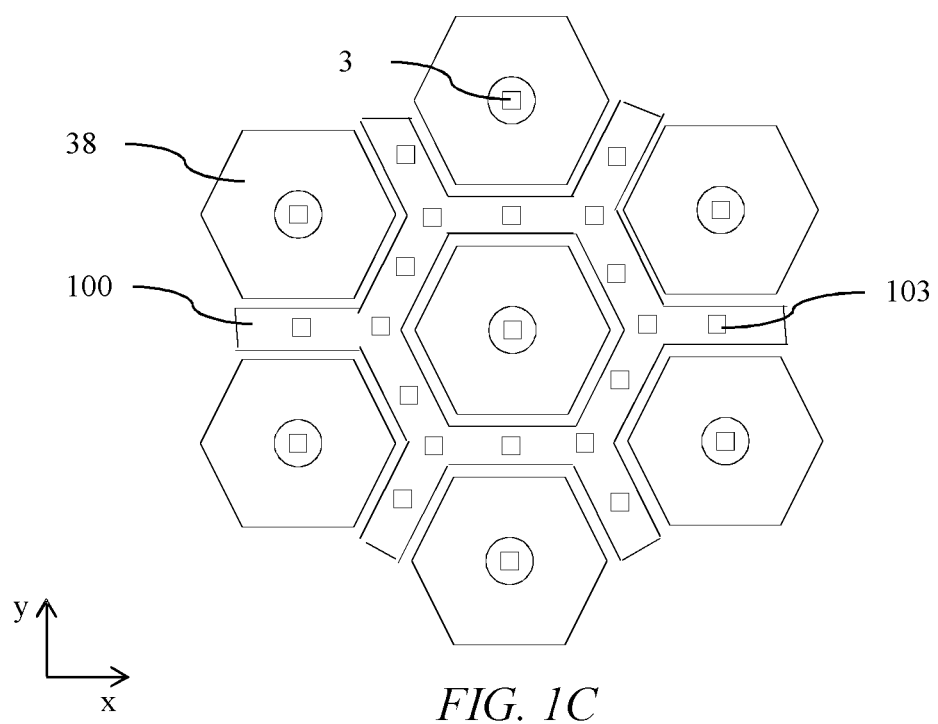
FIG. 1C is a schematic diagram illustrating in top view an arrangement of micro-LEDs, catadioptric optical elements and light guides wherein the catadioptric elements are arranged with a hexagonal packing, in accordance with the present disclosure.

FIG. 1C is a schematic diagram illustrating in top view an arrangement of micro-LEDs 3,103, catadioptric optical elements 38 and light guides 100 wherein the catadioptric elements 38 are arranged with a hexagonal packing.

In comparison to the arrangement of FIG. 1B the packing arrangement of the arrays of micro-LEDs 3,103 and arrays of optical elements 38, 100 may advantageously reduce Moiré beating between the pixels 303 of the spatial light modulator 112 and the backlight illumination apparatus 110. Further the optical surfaces of the catadioptric optical elements 38 may provide more rotationally symmetric angular output characteristics in comparison to square output shapes.

The control of arrays of micro-LEDs 3,103 will now be described. In some of the embodiments described elsewhere herein the LEDs 103 may have a maximum size that is greater than micro-LEDs described herein. However the same or similar control and driving arrangements may apply.

Figure 1D:
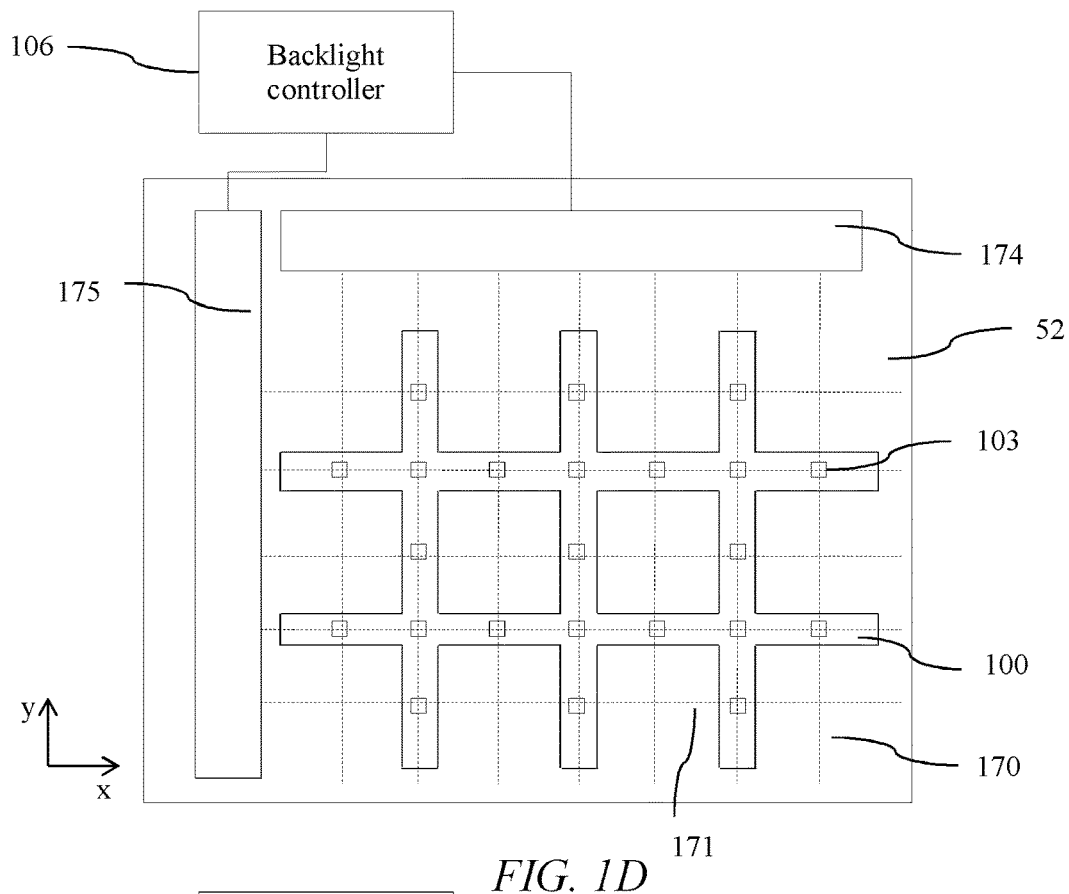
FIG. 1D is a schematic diagram illustrating in top view an arrangement of LEDs and aligned light guides further comprising addressing and control means, in accordance with the present disclosure.
Figure 1E:
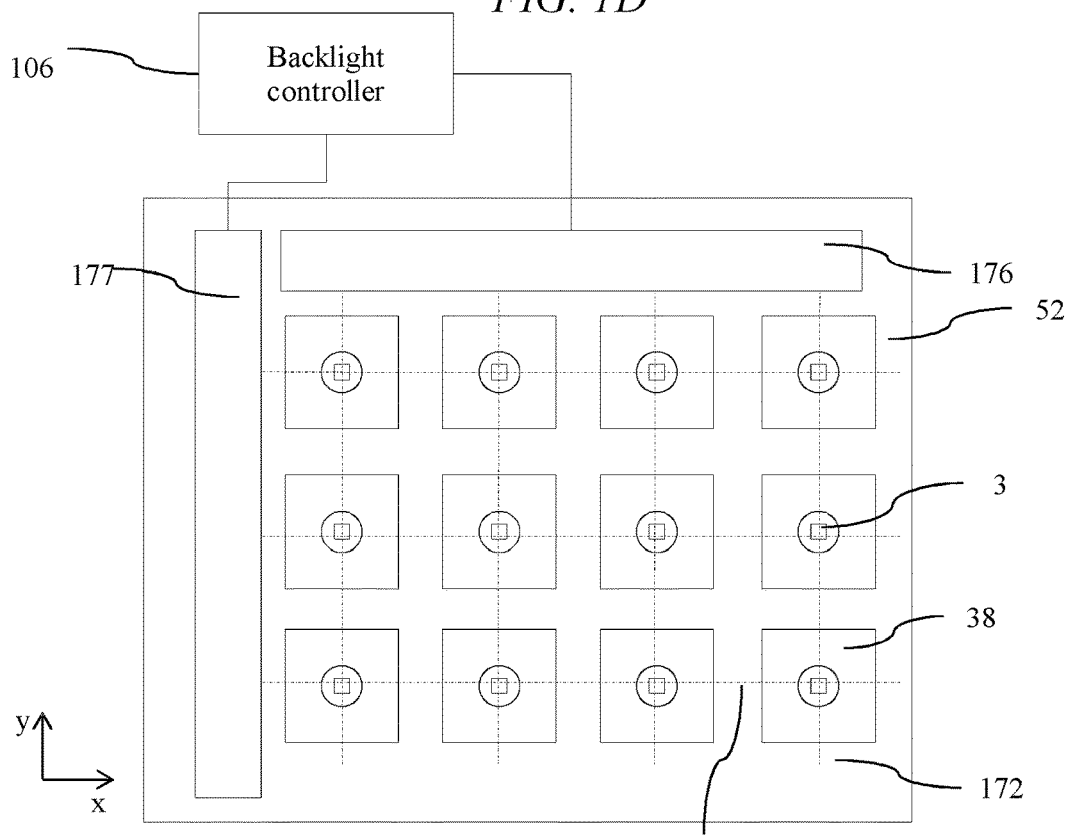
FIG. 1E is a schematic diagram illustrating in top view an arrangement of micro-LEDs and aligned catadioptric optical elements further comprising addressing and control means, in accordance with the present disclosure.

FIG. 1D is a schematic diagram illustrating in top view an arrangement of micro-LEDs 103 and aligned light guides 100 further comprising addressing and control means. FIG. 1E is a schematic diagram illustrating in top view an arrangement of LEDs and aligned catadioptric optical elements 38 further comprising addressing and control means.

The illumination apparatus 110 thus further comprises control circuitry 106 and electrodes 170, 171 arranged such that they are operable to drive the first plurality of micro-LEDs 3 independently of the second plurality of LEDs 103.

For the second array of LEDs 103, backlight controller 106 may provide control signals to column drivers 174 and row drivers 175. Column electrodes 170 and row electrodes 171 may be provided to drive the array of LEDs 103, which may be associated with TFTs for example.

For the first array of micro-LEDs 3, backlight controller 106 may provide control signals to column drivers 176 and row drivers 177, which may be the same drivers 174, 175 respectively. Column electrodes 172 and row electrodes 173 may be provided to drive the array of micro-LEDs 3, which may be associated with TFTs for example.

Advantageously addressable areas of illumination may be provided, as will be described below. The first and second arrays of micro-LEDs 3, 103 may alternatively be arranged in groups to reduce the cost and complexity of the addressing scheme.

Figure 1F:
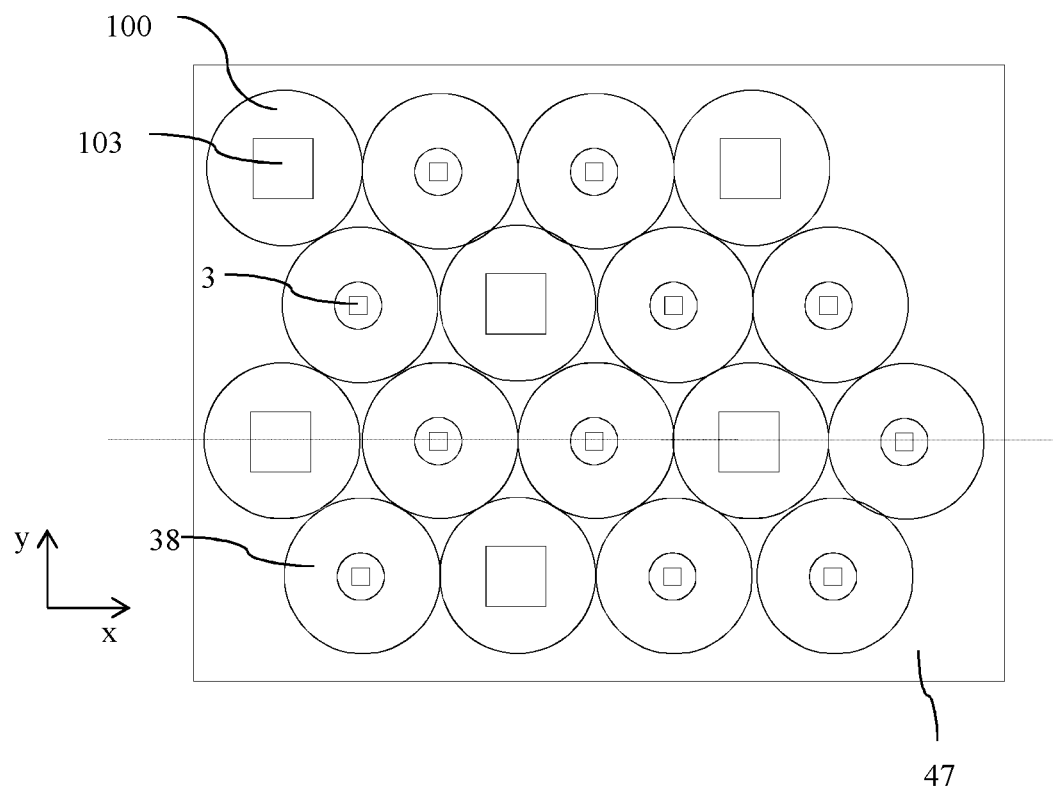
FIG. 1F is a schematic diagram illustrating in top view an arrangement of micro-LEDs, aligned catadioptric optical elements and aligned light guides, in accordance with the present disclosure.
Figure 1G:
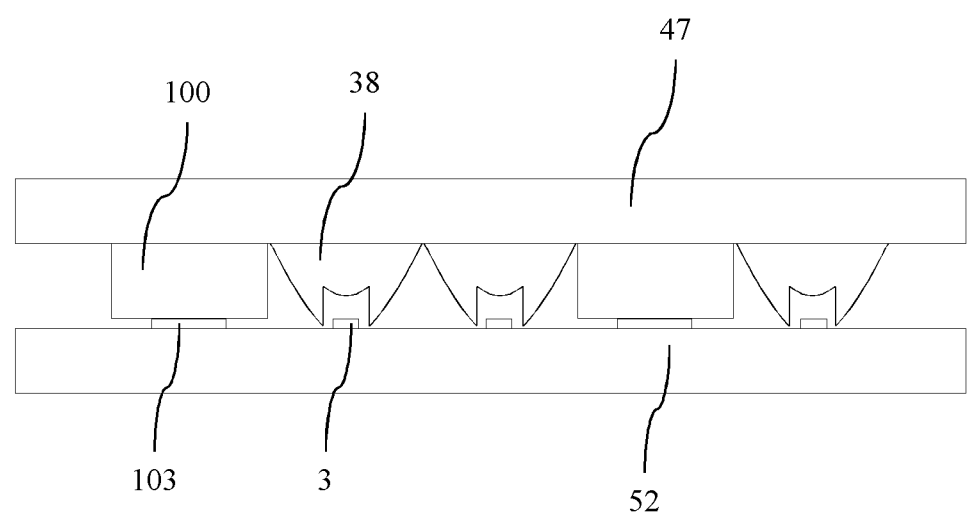
FIG. 1G is a schematic diagram illustrating in side view an arrangement of micro-LEDs; aligned catadioptric optical elements and aligned light guides, in accordance with the present disclosure.

FIGS. 1F-1G are schematic diagrams illustrating in top and side views an arrangement of micro-LEDs 3, 103, aligned catadioptric optical elements 38 and aligned light guides 100. Each of the LEDs 103 of the second plurality of LEDs are aligned with only a respective one of the light guides 100.

The total light output area of the LEDs 103 of the second plurality of LEDs may be greater than the total light output area of the micro-LEDs 3 of the first plurality of LEDs. In the illustrative example of FIG. 1C, more LEDs 103 may be provided per unit area than micro-LEDs 3. As will be described with reference to FIG. 2B, below, the LEDs 103 of the second plurality of LEDs output to a wider solid angle 183 of directional light output distribution 122 than the micro-LEDs 3 of the first plurality of LEDs. To achieve similar display luminance for first and second directional light output distributions 120, 122, the total luminous flux provided in the second directional light output distribution may be higher. Advantageously the display luminance may be maintained with viewing angle.

Further, the light emitting elements may be arranged in cylindrical light guides 100, in comparison to the linear light guides that are described elsewhere herein. Advantageously the packing density in the wide angle mode may be similar to the packing density in narrow angle mode, achieving similar luminance uniformity in backlights, direct display or other illumination applications.

The operation of the switchable directional backlight illumination apparatus 110 will now be described.

Figure 2A:
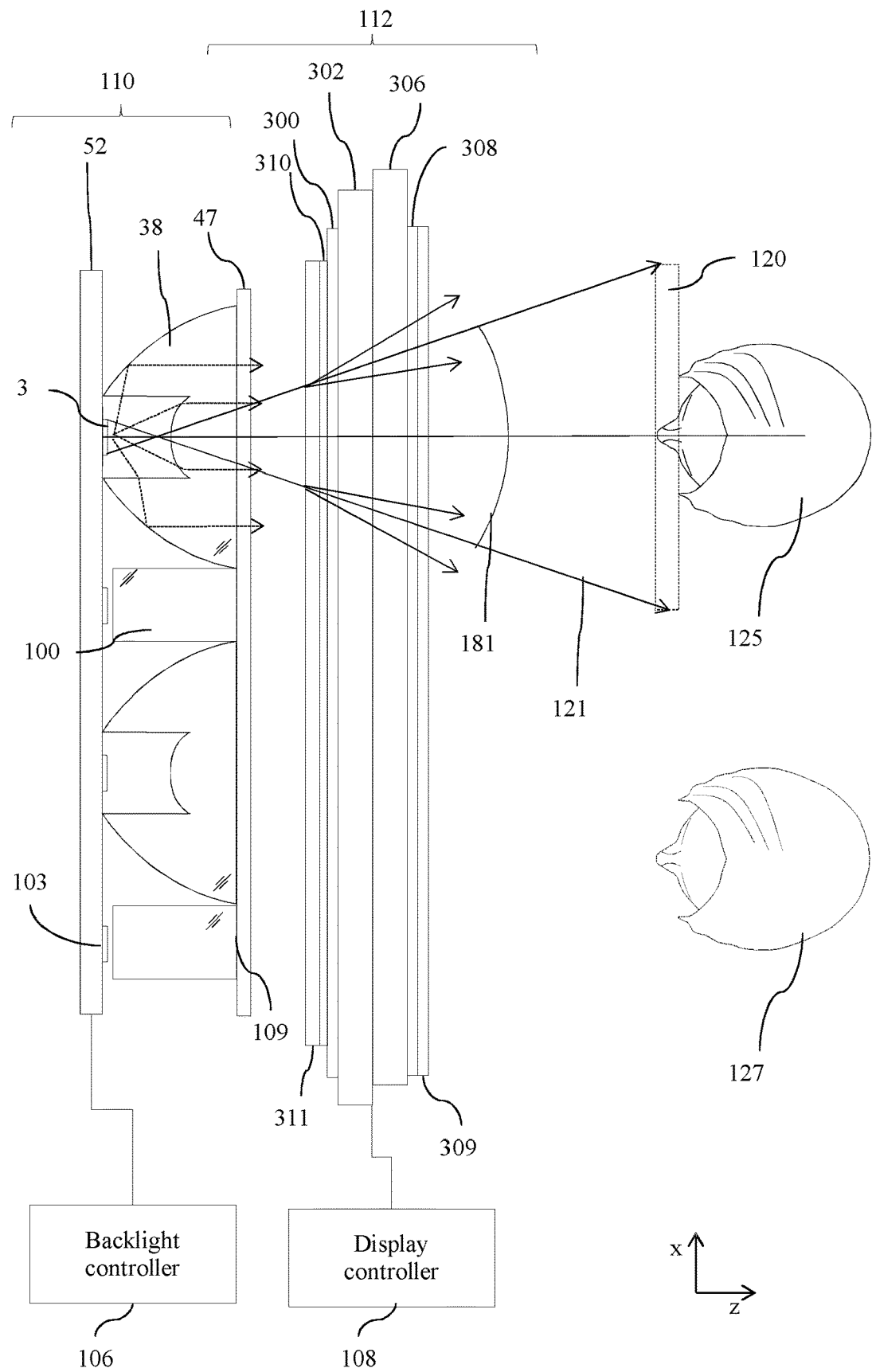
FIG. 2A is a schematic diagram illustrating in top view operation of the directional display of FIG. 1A arranged to provide a narrow directional light output distribution, in accordance with the present disclosure.

FIG. 2A is a schematic diagram illustrating in top view operation of the switchable directional display of FIG. 1A arranged to provide a narrow directional light output distribution 120.

Thus a first optical system is aligned with the LEDs 3 of the first plurality of LEDs to provide a first directional light output distribution 120, the first directional light output distribution being of light output from the LEDs 3 of the first plurality of LEDs.

The first optical system comprises a first plurality of optical elements 38 arranged in a first optical element array, each of the optical elements 38 of the first plurality of optical elements aligned in correspondence with a respective one or more of the LEDs 3 of the first plurality of LEDs, each of the LEDs 3 of the first plurality of LEDs being aligned with only a respective one of the optical elements 38 of the first optical system. At least some of the optical elements of the first plurality of optical elements may be catadioptric optical elements. 38.

Light rays 121 are provided by illumination of micro-LED 3 towards an observer 125 within a viewing window 120. Viewing window 120 may be formed by rays that are in a cone and that are imaged from across the extent of the micro-LED 3. An observer in the window 120 sees illumination from the output of the catadioptric optical element, and thus the pixels 303 of the spatial light modulator are backlit. A viewer 127 outside the window 120 does not see the display illuminated and thus, directional display operation is provided.

The catadioptric optical element 38 of the plurality of catadioptric optical elements may be arranged on the first side of the optical element support substrate 47 and the second end 109 of at least one of the plurality of light guides 100 is arranged on the first side of the optical element support substrate 47. The plurality of catadioptric optical elements 38 may typically comprise a transparent polymeric material that is moulded. Further the light guides of the plurality of light guides comprise a transparent polymeric material that may be the same material that comprises the catadioptric optical elements 38.

Further diffuser elements 311, 309 are provided on outer surfaces of the LCD. Alternatively or additionally diffuser element 311 and/or reflective polariser 310 may be provided on the transparent substrate 47. Further diffuser layers may be incorporated in the gap between the backlight 110 and spatial light modulator 112.

Diffuser layers may advantageously provide reduction of image Moiré, increased display uniformity and reduction of image mura. The word mura, derived from Japanese, and in common use in the display industry is used herein to mean a defect region, area or a patch of an otherwise generally uniform display or backlight, where an irregularity or non-uniformity is visible or detectable.

Further diffusers may achieve expansion of solid angle 181, to achieve wider viewing angle, and increase comfort of display viewing by increasing headbox size. Diffusers may further be incorporated onto the surface of the catadioptric optical elements 38 and light guides 100 for example. Such diffusers may achieve increased cone angle and reduce sharpness of penumbra of the beam shape of the directional light output distribution 120. For example, a smooth roll off may be desirable for a display apparatus in comparison to a sharp penumbra for an environmental illumination apparatus.

Advantageously the catadioptric optical elements of the present embodiments may achieve a small solid angle 181 and diffusers can be used to tune the output for desirable profile of distribution 120.

It would be desirable to arrange switchable illumination in order to provide a conventional wide angle mode of operation.

Figure 2B:
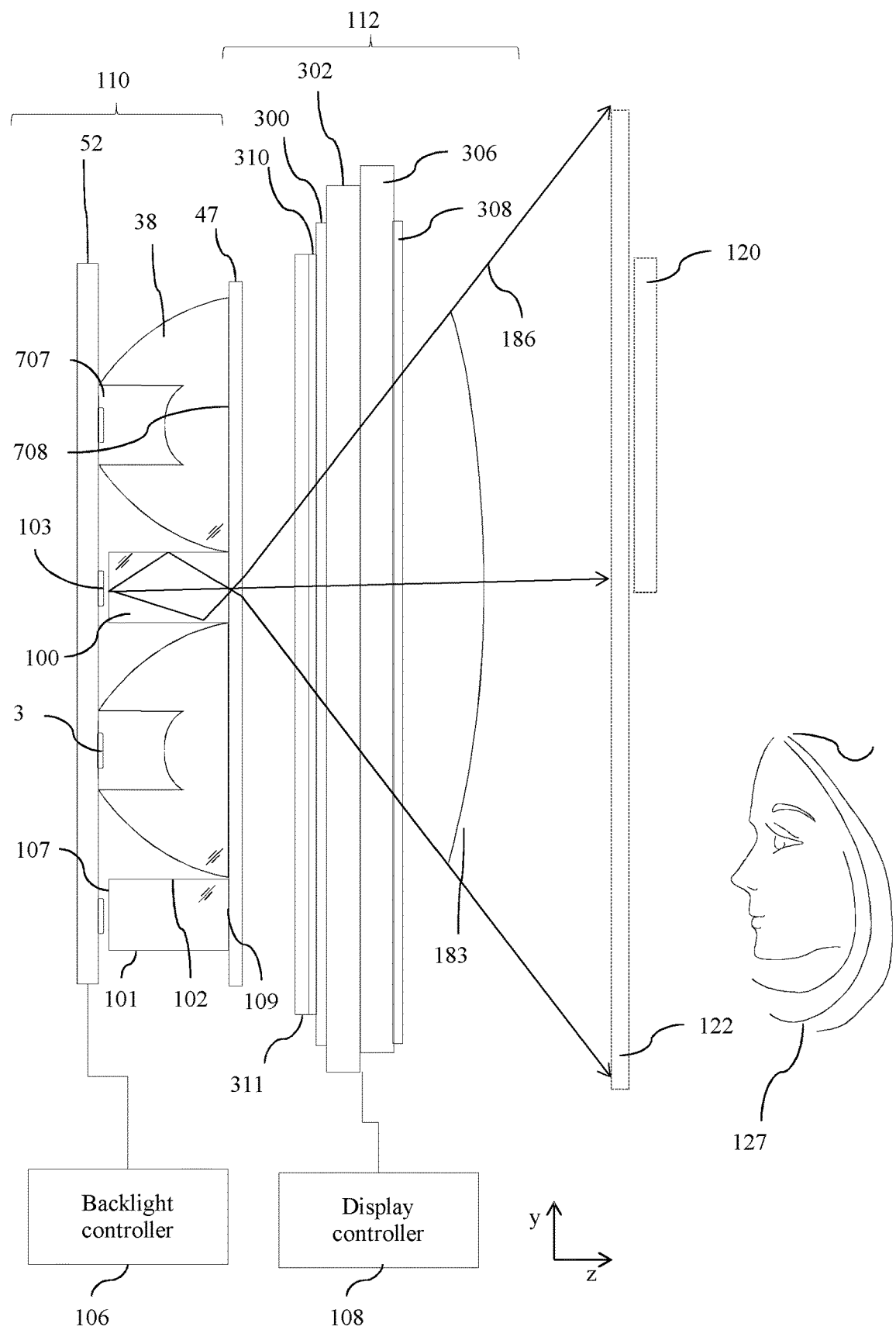
FIG. 2B is a schematic diagram illustrating in side view operation of the directional display of FIG. 1A arranged to provide a wide directional light output distribution, in accordance with the present disclosure.

FIG. 2B is a schematic diagram illustrating in side view operation of the directional display 110, 112 of FIG. 1A arranged to provide a wide directional light output distribution.

A second optical system is aligned with the LEDs 103 of the second plurality of LEDs to provide a second directional light output distribution 122, the second directional light output distribution being of light output from the LEDs 103 of the second plurality of LEDs. At least some of the LEDs 103 of the second plurality of LEDs are positioned between neighbouring LEDs 3 of the first plurality of LEDs.

The second optical system comprises one or more light guides 100. The one or more light guides 100 are respectively aligned in correspondence with a respective one or more LEDs 103 of the second plurality of LEDs. The first end 107 of the light guides 100 of the plurality of light guides is interspersed with the first end 707 of the catadioptric optical elements 38 of the plurality of catadioptric optical elements.

The first directional light output distribution 120 has a solid angle 181 that is smaller than the solid angle 183 of the second directional light output distribution 122.

The second ends 109 of the light guides 100 of the plurality of light guides 100 are interspersed with the second ends 708 of the catadioptric optical elements 38 of the plurality of catadioptric optical elements.

LEDs 103 may be controlled by controller 106 to be illuminated and light rays 186 are provided from the output of the light guide 100. The light guide may be arranged to preserve the directional characteristics of the input LED 103. In one embodiment a Lambertian emitting LED may be aligned with a light guide 100 with sides 101, 102 that are substantially parallel. The input side 107 of the element 100 may be substantially planar, so that the output of the LED 103 is coupled into a cone with angular size the same as the critical angle of the medium of the light guide 100. At the output of the light guide, the light returns into air, so a substantially Lambertian output will be provided to a viewing window 122.

Thus the first and second plurality of LEDs 3, 103 may be each arranged to provide light of substantially the same white point to the first and second optical elements. The colour of the output of the display will be preserved with change of viewing angle and output directional light output distribution 120, 122 so that the display will not appear to change colour with viewing angle.

Advantageously viewer 127 that is outside the window 120 but in the window 122 will see illumination of the pixels 303 of the spatial light modulator 112.

The area fill ratio of the LEDs 103 (that may be micro-LEDs) may be greater than the area fill ratio of the micro-LEDs 3 in order to achieve uniform wide angle luminance that has similar luminance to the luminance achieved for the light from the micro-LEDs 3. Alternatively the control system may be arranged to drive the LEDs 103 with higher current than the micro-LEDs 3, to achieve matching between the display luminance in narrow and wide angle directional light output distributions. Advantageously display luminance and roll-off characteristics can be provided by control of the relative current in LEDs 3, 103 of the first and second pluralities of LEDs.

Figure 2C:
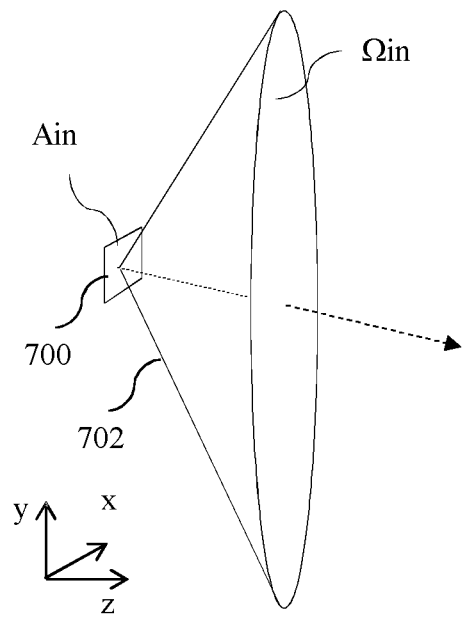
FIG. 2C is a schematic diagram illustrating in perspective view a light source with first area and first solid angle of light cone for input into an optical system, in accordance with the present disclosure.
Figure 2D:
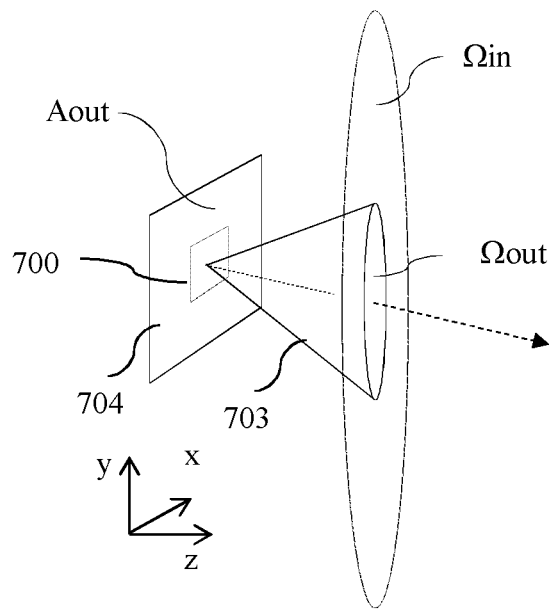
FIG. 2D is a schematic diagram illustrating in perspective view the area and solid angles for output light after light from the light source of FIG. 2C has been directed by the optical system, in accordance with the present disclosure.

FIG. 2C is a schematic diagram illustrating in perspective view a light source 700 with first area Ain and first solid angle Ωin of light cone 702 for input into an unspecified optical system (not shown); and FIG. 2D is a schematic diagram illustrating in perspective view the output surface 704 of area Aout and cone 703 of solid angle Ωout for output light after light rays from the light source of FIG. 2C has been directed by the optical system. Conservation of brightness, or étendue, means that $$A_{out}*\Omega_{out} <= A_{in}*\Omega_{in} \qquad \text{eqn. 1}$$

Figure 2E:
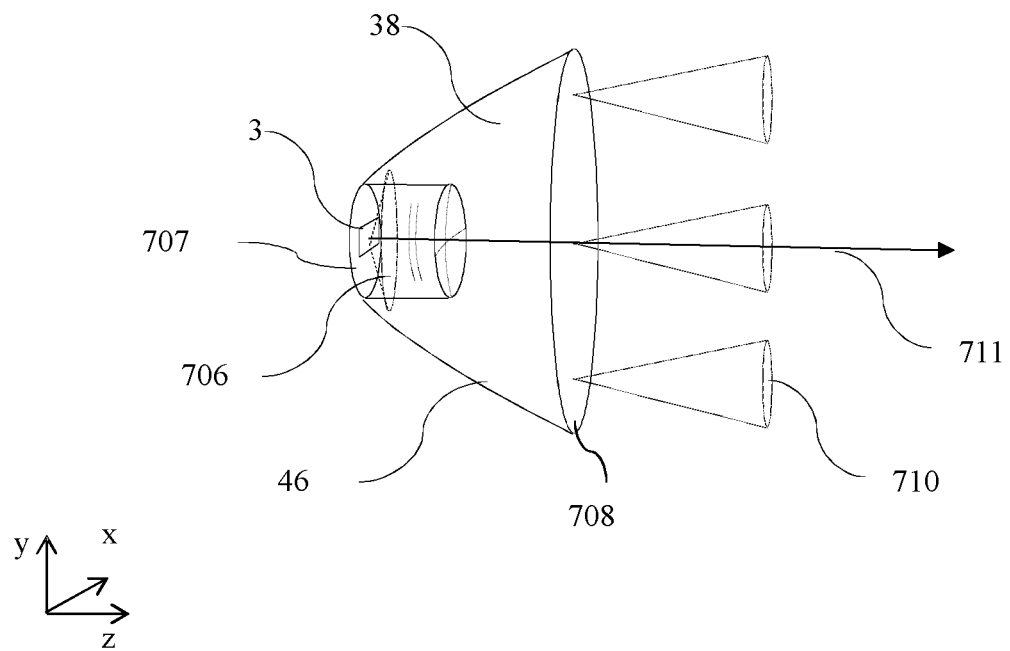
FIG. 2E is a schematic diagram illustrating in perspective view micro-LED area and solid angle and catadioptric optical element output area and solid angle, in accordance with the present disclosure.

FIG. 2E is a schematic diagram illustrating in perspective view a catadioptric optical element 38 with at a first end 707 a micro-LED 3 with an input area Ain and input solid angle Ωin in cone 706. Second end 708 of the catadioptric optical element 38 has area Aout and transmitted light cone 710 has solid angle Ωout. Equation 1 teaches that Aout is thus greater than Ain, thus in at least one dimension the output width of the catadioptric optical element is greater than the input width to provide the reduction in cone solid angle Ωout. Thus the smaller solid angle of cone 710 is achieved by increasing the output area Aout of second end 708 in comparison to the area of the micro-LED 3. The catadioptric optical element may be extended; then the width of the micro-LED 3 may be less than the width of the second end 708.

FIG. 2E further illustrates the optical axis 711 of a rotationally symmetric catadioptric optical element 38. In this embodiment, the optical axis 711 is a line along which there is rotational symmetry and is a line passing through centres of curvature of the refractive surface 42 and outer reflective surface 46 of the catadioptric optical element 38.

In embodiments in which the catadioptric optical element 38 is arranged to operate on-axis, the output luminance may be arranged to be provided in a direction normal to the output surface, for example normal to the transparent support substrate 47. In such embodiments, the optical axis 711 may be the axis of reflective symmetry of the refractive surface 42 and outer reflective surfaces 46a, 46b.

The arrangement and operation of catadioptric optical elements 38 will now be further described.

Figure 2F:
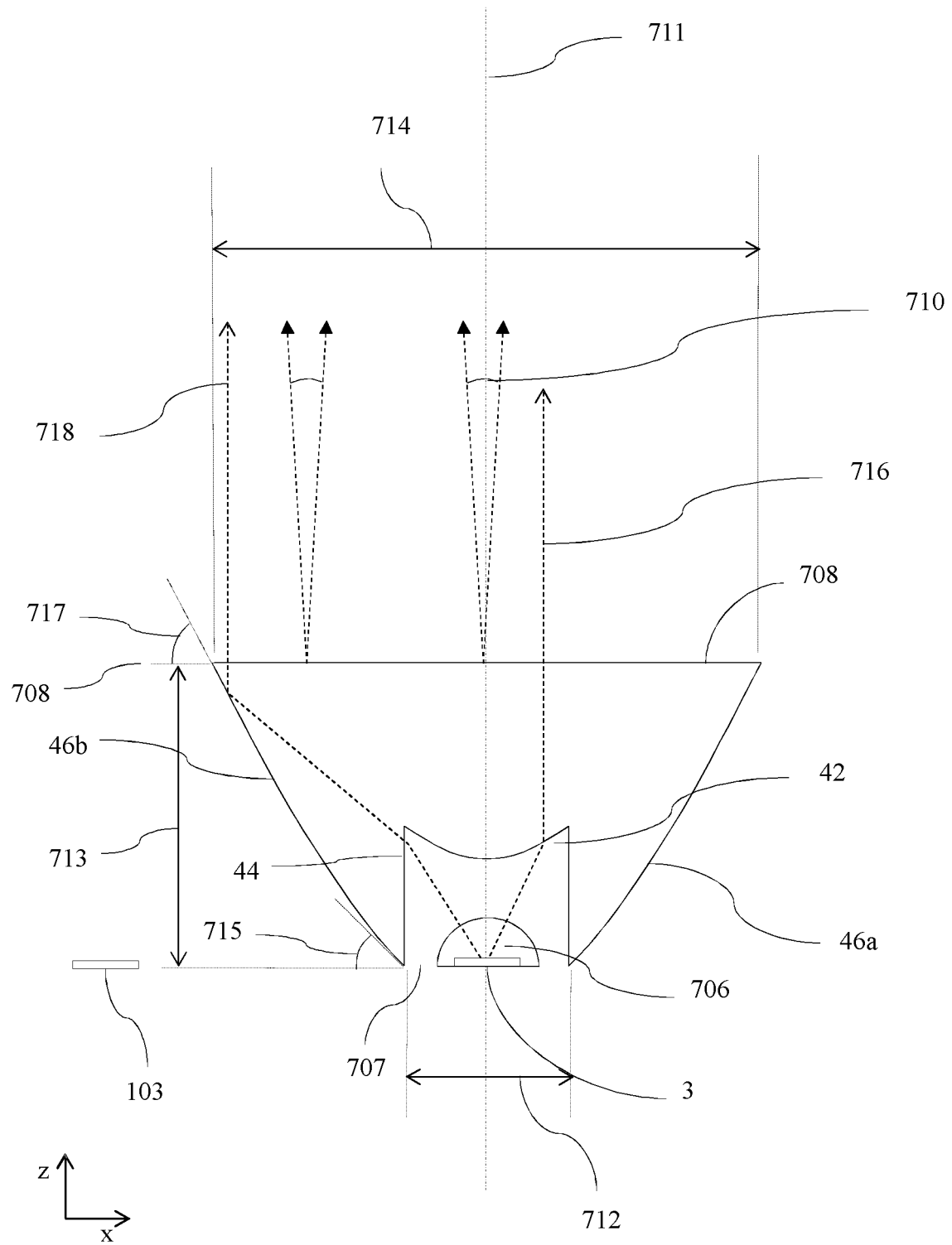
FIG. 2F is a schematic diagram illustrating in side view the input width and output width of a catadioptric optical element in at least one cross sectional plane, in accordance with the present disclosure.

FIG. 2F is a schematic diagram illustrating in side view the input width 712 and output width 714 of a catadioptric optical element 38 in at least one cross sectional plane through its optical axis 177. Thus the cross sectional plane is the x-z plane and the optical axis 711 is in the cross sectional plane.

Each of the catadioptric optical elements 38 of the plurality of catadioptric optical elements comprises, in at least one cross-sectional plane through its optical axis 711 a first outer surface 46a and a second outer surface 46b facing the first outer surface 46a. The first and second outer surfaces 46a, 46b extend from a first end 707 of the catadioptric optical element 38 to a second end 708 of the catadioptric optical element 38, the second end 708 of the catadioptric optical element 708 facing the first end 707 of the catadioptric element.

The distance 712 between the first and second outer surfaces 46a, 46b at the first end of the catadioptric optical element is less than the distance 714 between the first and second outer surfaces 46a, 46b at the second end 708 of the catadioptric optical element 38. At least one transparent inner surface 42, 44 is arranged between the first and second ends 707, 708 and between the first and second outer surfaces 46a, 46b.

End 708 may be provided by an output surface of the catadioptric optical element 38, or may be for example arranged in a layer of a moulded optical component, for example on transparent support substrate 47 of FIG. 2A.

Each of the catadioptric optical elements 38 of the plurality of catadioptric optical elements is aligned in correspondence with a respective one or more of the LEDs 3 of the first plurality of LEDs, each of the LEDs of the first plurality of LEDs being aligned with only a respective one of the catadioptric optical elements of the plurality of catadioptric optical elements. The alignment in correspondence between a catadioptric optical element 38 of the plurality of catadioptric elements and its respective one or more of the LEDs 3 of the first plurality of LEDs comprising the respective one or more of the LEDs 3 of the first plurality of LEDs is by being positioned at the first end 707 of the catadioptric optical element 38 and aligned with the catadioptric optical element 38.

The LEDs 3 may be positioned between the first end 707 of the catadioptric optical element 38 and the at least one transparent inner surface 42, 44 of the catadioptric optical element 38 and aligned with the catadioptric optical element. For example in the cross sectional plane the centre of the micro-LED 3 may be aligned with the optical axis 711 of the catadioptric optical element. In the present disclosure the terminology "at the first end of" the catadioptric optical element includes, for example, the micro-LED being a small amount under the first end 707, in the same plane as the end 707 of the catadioptric optical element 38, or in the vicinity of the end 707, or in the proximity of the end 707 or adjacent the end. In each case this may include aligned with the optical axis of the catadioptric optical element. The above description can be applied to all the embodiments.

At least some of the LEDs 103 of the second plurality of LEDs may be arranged in positions other than positioned at the first end 707 of and aligned with any catadioptric optical element of the plurality of catadioptric optical elements, and in positions other than positioned between the first end and the at least one transparent inner surface of and aligned with any catadioptric optical element of the plurality of catadioptric optical elements;

A catadioptric optical system uses both reflection and refraction of light. Further, a catadioptric optical system is one where refraction and reflection are combined in an optical system, usually via lenses (dioptrics) and curved mirrors (catoptrics). Catadioptric optical elements are sometimes referred to as RXI optical elements. An RXI optical element produces ray deflections by refraction (R), reflection from metals (X), and total internal reflection (I).

The first and second outer surfaces 46a, 46b each comprise curved surfaces that extend from a first end 707 of the catadioptric optical element to the second end 708 of the catadioptric optical element 38, the second end 708 of the catadioptric optical element facing the first end 707 of the catadioptric optical element 38. Further the transparent inner surface 42, 44 comprises at least one curved surface 42. The exterior angle 715 between the first end 707 and the first outer surface 46a at the first end 707 may be less than the exterior angle 717 between the first end 707 and the first outer surface 46a at the second end 708. Further the exterior angle between the first end 707 and the second outer surface 46b at the first end 707 is less than the exterior angle between the first end 707 and the second outer surface 46b at the second end 708.

Advantageously collimated light may be provided with a directional light output distribution that has a narrow cone angle.

The catadioptric optical element 38 may be arrange to provide substantially collimated output light from the micro-LED 3 for light that is incident on the curved outer surfaces 46a, 46b and the at least one of the transparent inner surface 44 which may have positive optical power. Further at least one of the transparent inner surfaces 44 may have zero optical power. Advantageously surfaces 44 may be conveniently provided during tooling and moulding steps of manufacture. Further, such surfaces may cooperate to provide collimated light for all light rays from micro-LED 3 over a high output solid angle, as will be described below with reference to FIG. 4C in comparison to FIGS. 4A and 4B.

Thus some of the light output illustrated by ray 718 of LEDs 3 of the first plurality of LEDs is transmitted by the at least one transparent inner surface 44 before it is reflected at the first or second outer surfaces 46a, 46b and directed into the first directional light output distribution 120; and some of the light output illustrated by ray 716 of LEDs 3 of the first plurality of LEDs is transmitted by the at least one transparent inner surface 42 and directed into the first directional light output distribution 120 without reflection at the first or second outer surfaces 46a, 46b.

FIG. 2F further illustrates that a refractive optical element 706 may be provided between the micro-LEDs 3 of the first plurality of LEDs and the at least one transparent inner surface 42, 44. The refractive optical element 706 may a hemispherical lens that is arranged to achieve increased efficiency of light output coupling from the high index materials that are typically used for inorganic micro-LEDs 3. The hemispherical lens 706 increases the effective area Ain of the source 9 comprising the LED and hemispherical lens 706, so the light from the micro-LED 3 is distributed over a larger cone angle than would be provided by the micro-LED 3 alone.

Advantageously, higher efficiency output coupling may be provided.

Returning to the description of FIG. 2A, at least some of the one or more light guides 100 may thus be positioned between respective second ends 707 of neighbouring catadioptric optical elements 38 of the catadioptric optical element array.

In at least one cross sectional plane, the present embodiments provide a reduction in the width of the output directional light output distribution to provide directionality with a directional light output distribution (as described by solid angle Stout) that is smaller than the input directional light output distribution (as described by solid angle Qin) by the catadioptric optical element.

It may be desirable to provide an off-axis illumination from the catadioptric optical elements.

Figure 2G:
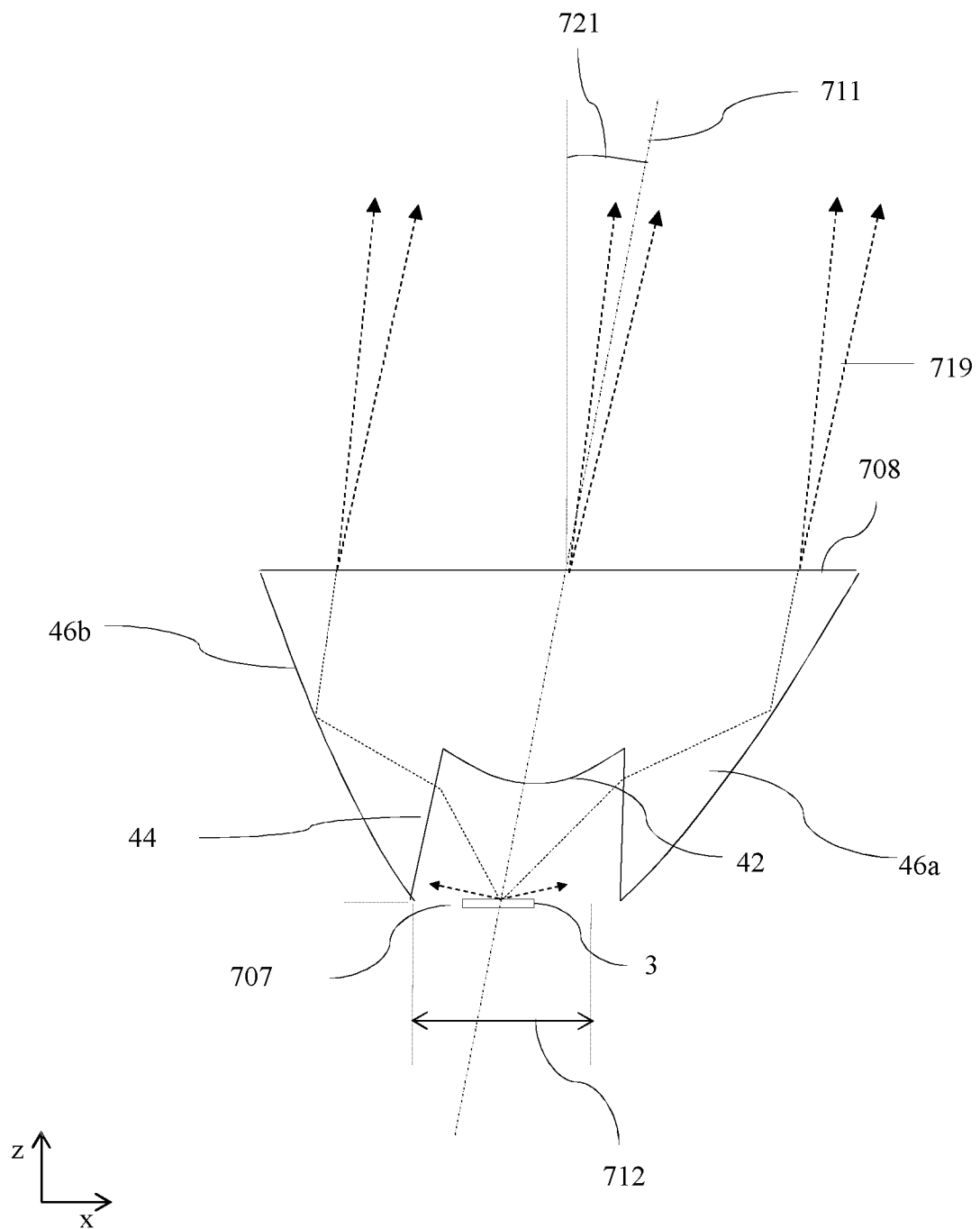
FIG. 2G is a schematic diagram illustrating in side view a catadioptric optical element arranged to provide off-axis illumination, in accordance with the present disclosure.

FIG. 2G is a schematic diagram illustrating in side view a catadioptric optical element arranged to provide off-axis illumination Optical axis 711 may for example be arranged between the centre of the refractive surface 42 and output end of the outer reflective surfaces 46a, 46b. The light cones 719 provided by the micro-LED 3 and catadioptric optical element 38 may be tilted by angle 721 with respect to the normal direction. Advantageously a narrow cone angle may be provided by the illumination apparatus for off-axis directions in a first mode of operation and a wide cone angle may be provided in a second mode of operation.

More than one plurality of off-axis catadioptric optical elements may be provided, each plurality comprising different optical axis directions. Addressing of micro-LEDs 3 aligned to each plurality of off-axis catadioptric elements may be provided. Advantageously switching between different off-axis directional light output distributions may be achieved. Thus the direction as well as solid angle of the output of the illumination apparatus may be controlled by means of the control circuitry 106.

By way of comparison known display backlights may use large area edge input light guides and optical films such as BEF from 3M Corporation and rear reflectors. Such backlights may typically have a thickness less than 8 mm, and more typically around 4 mm. The micro-optics of the present embodiments may provide reduced thickness backlights compared to conventional backlights using area light guides. Further direct switchable displays may be provided with low thickness compared to backlit LCDs and similar to the thickness that can be achieved by OLED (that is not directional).

Figure 3A:
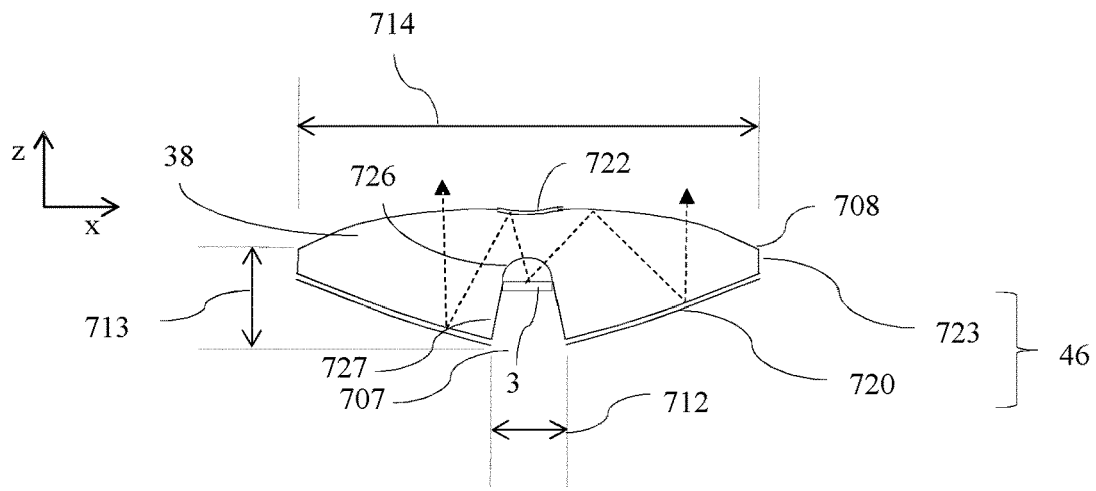
FIG. 3A-C are schematic diagram illustrating in side views further examples of shapes of catadioptric optical elements, in accordance with the present disclosure.
Figure 3B:
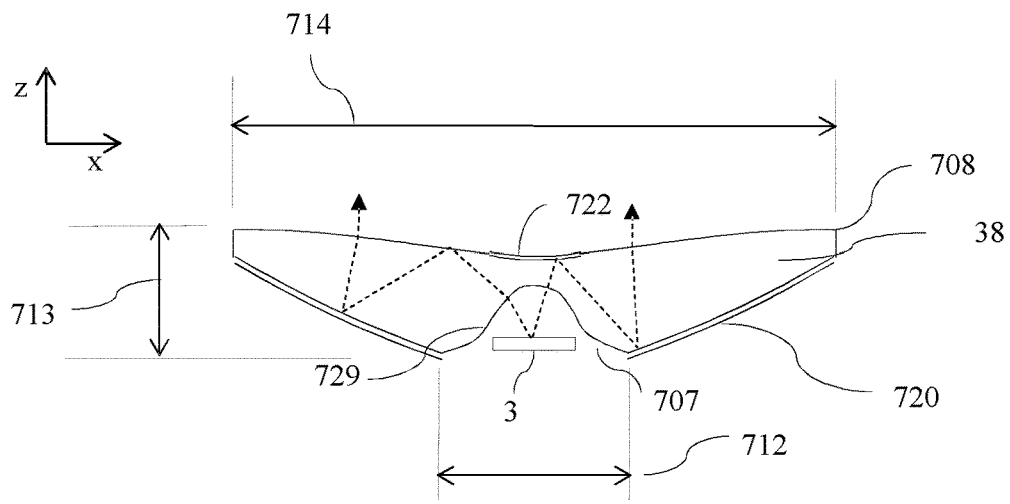
Figure 3C:
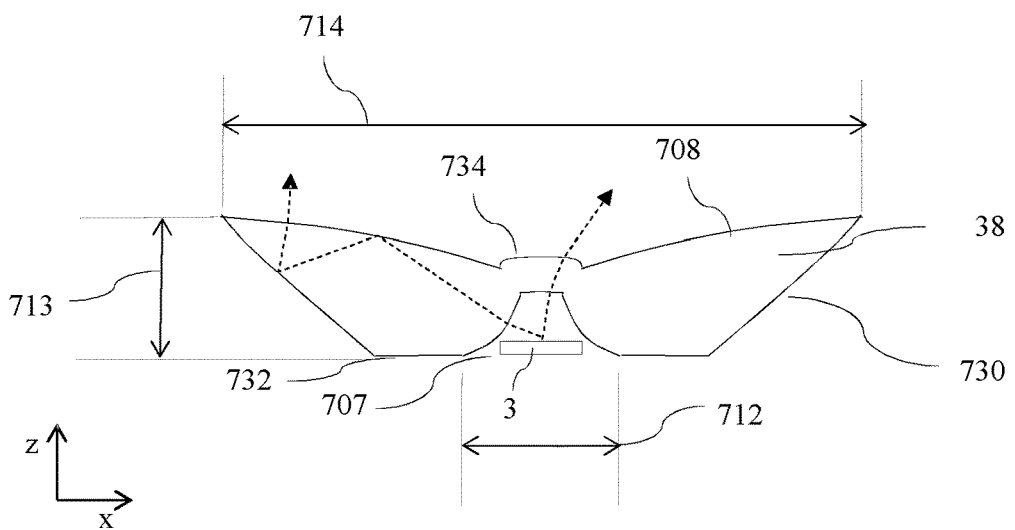

FIGS. 3A-C are schematic diagram illustrating in side views further examples of shapes of catadioptric optical elements.

FIG. 3A illustrates a low thickness catadioptric optical element 38 may be provided with outer surfaces 46 that may comprise metallised outer surface 720 and edge surface 723; transparent inner surfaces 726, 727 that are curved and linear respectively, end 708 that comprises transparent curved surfaces and metallised region 722. Advantageously the thickness 713 may be less than the thickness 713 of the catadioptric optical element 38 of FIG. 2F for example.

FIG. 3B illustrates a further catadioptric optical element 38 wherein transparent inner surface 727 may have a continuous curved shape and be arrange to direct more rays laterally than the tilted walls 727 of FIG. 3A, achieving thickness reduction.

FIG. 3C further provides a thin catadioptric optical element 38, without the use of metallised reflective region 722. Further, outer surface 730 may comprise planar and tilted portions 732, 730 respectively that extend from the input end 707 to the output end 708.

Advantageously narrow directional light output distributions can be achieved in optical elements without mixing between adjacent optical elements, providing low cross talk in display applications.

The control of output illumination by refractive optics, reflective optics and catadioptric optics will now be described.

Figure 4A:
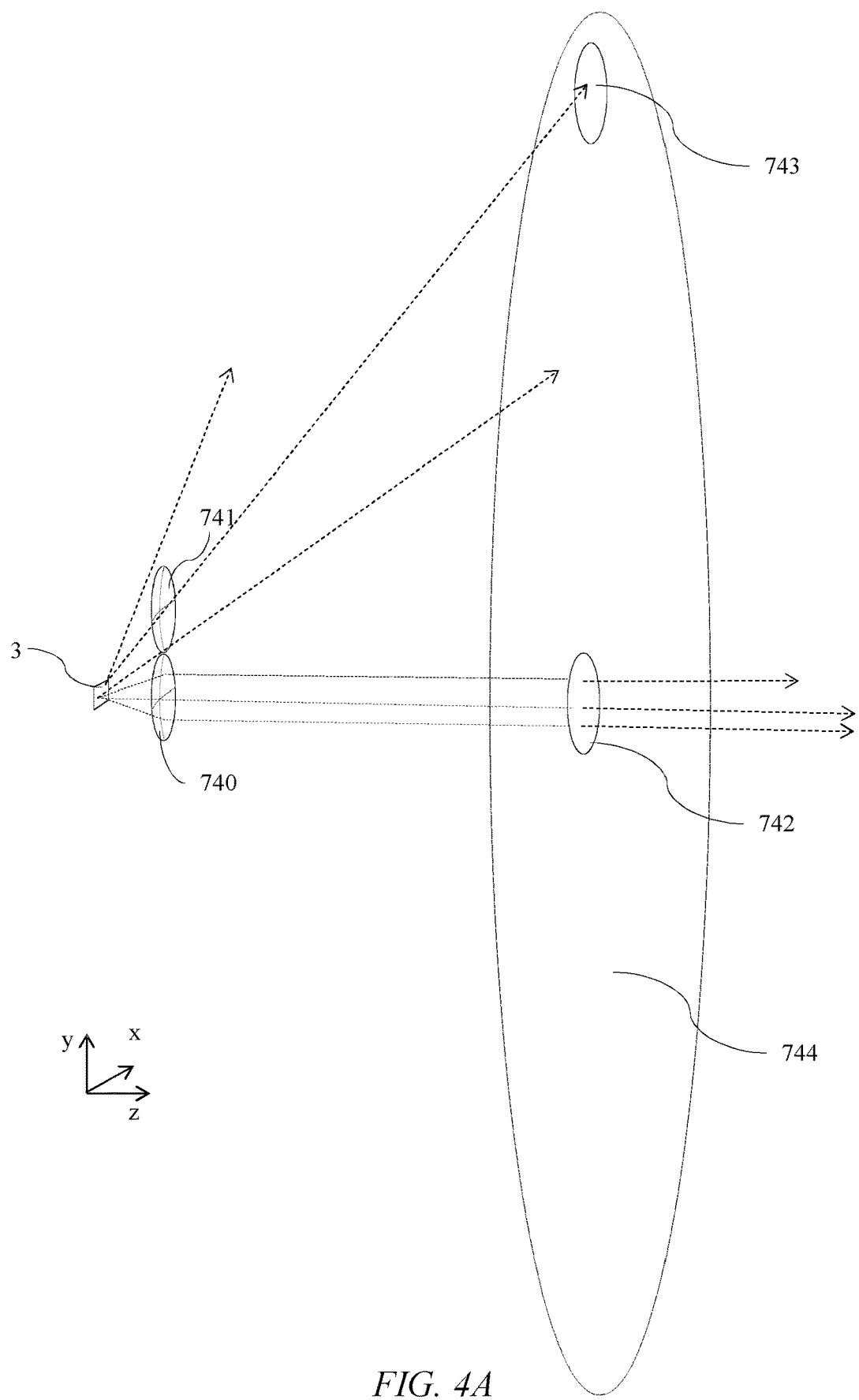
FIG. 4A is a schematic diagram illustrating in perspective view, illumination by a refractive optical element providing a background glow and a central spot beam, in accordance with the present disclosure.

FIG. 4A is a schematic diagram illustrating in perspective view illumination by a plurality of refractive optical elements 740, 741 providing a background glow 744 and central spot beams, 742, 743. Background glow 744 may be provided by light that propagates outside the refractive optical elements 740, and may have a directional light output distribution that is similar to the input light source that may be for example a micro-LED 3. The glow 744 may disadvantageously provide stray light that degrades the quality of illumination, for example increasing background privacy level for unauthorised viewers, and degrading privacy performance. Further additional spot beams 743 with high luminance may undesirably be provided.

Figure 4B:
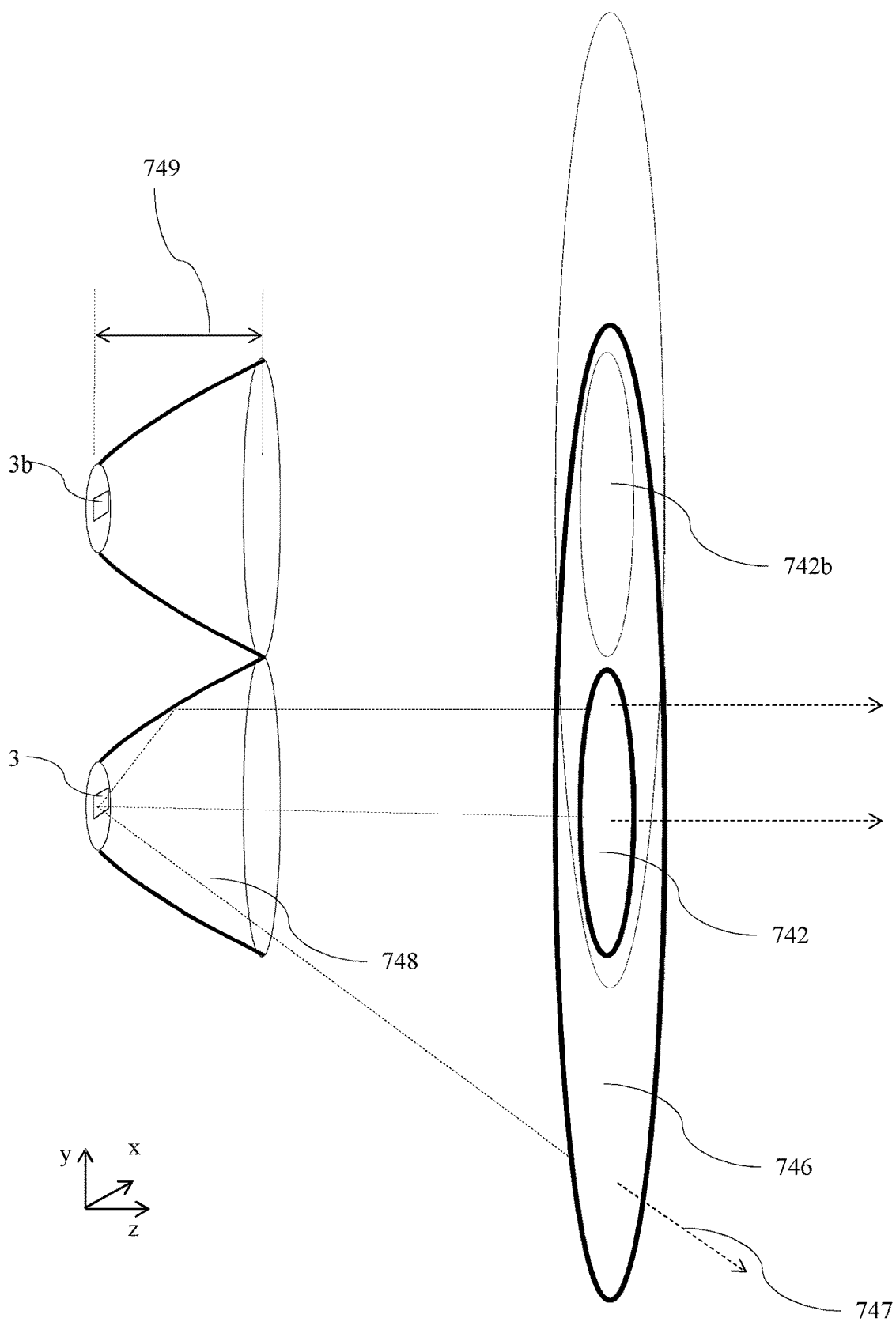
FIG. 4B is a schematic diagram illustrating in perspective view, illumination by a reflective optical element providing an outer halo and a central spot beam, in accordance with the present disclosure.

FIG. 4B is a schematic diagram illustrating in perspective view illumination by a plurality of reflective optical elements providing an outer halo 746 and a central spot beam 742. In comparison to the arrangement of FIG. 4A, the additional spot beam 743 may not be present, however undesirably the halo 746 distributes light over a wider area and degrades background illuminance level, for example reducing privacy performance. The size of the halo 746 may be reduced by increasing the length 749 of the reflective optic, however such increases device thickness.

Figure 4C:
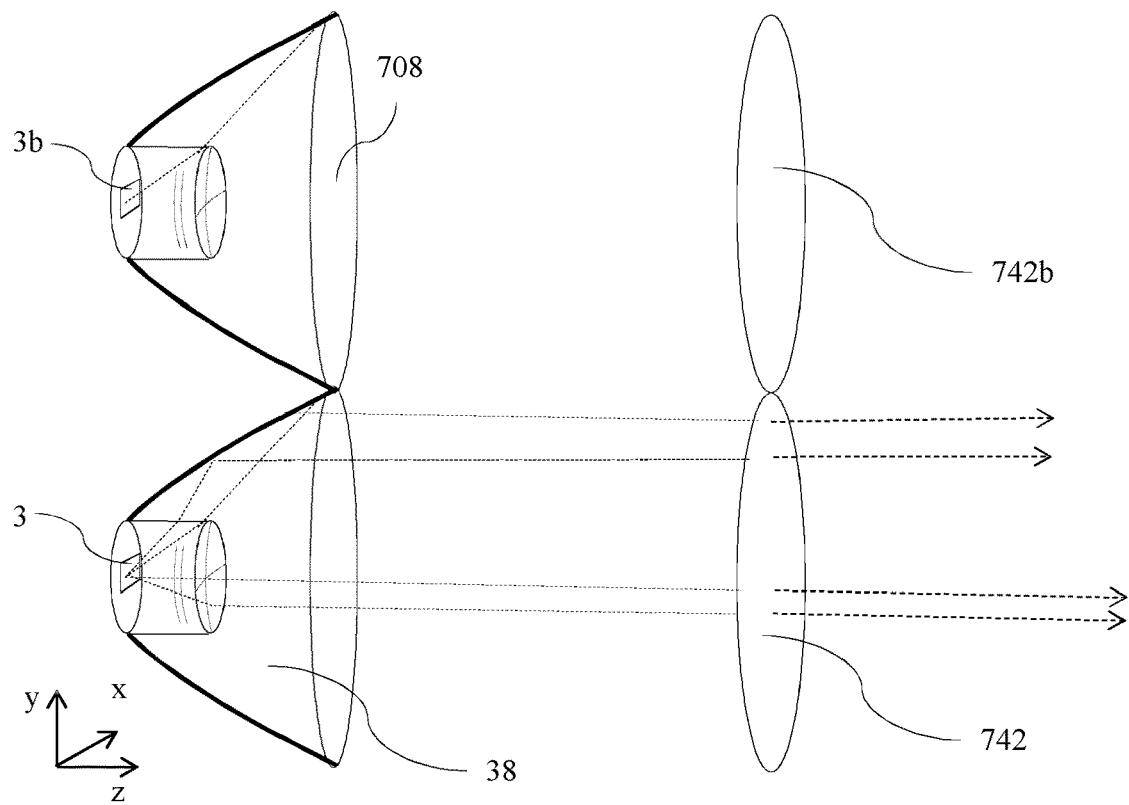
FIG. 4C is a schematic diagram illustrating in perspective view illumination by a catadioptric optical element providing a central spot beam, in accordance with the present disclosure.

FIG. 4C is a schematic diagram illustrating in perspective view illumination by a plurality of catadioptric optical elements providing a central spot beam. In comparison to the arrangements of FIGS. 2K-L, the background glow 744 or halo 746 are not present. Advantageously, low stray light can be provided in a thin package.

The operation of light guides 100 will now be described.

Figure 4D:
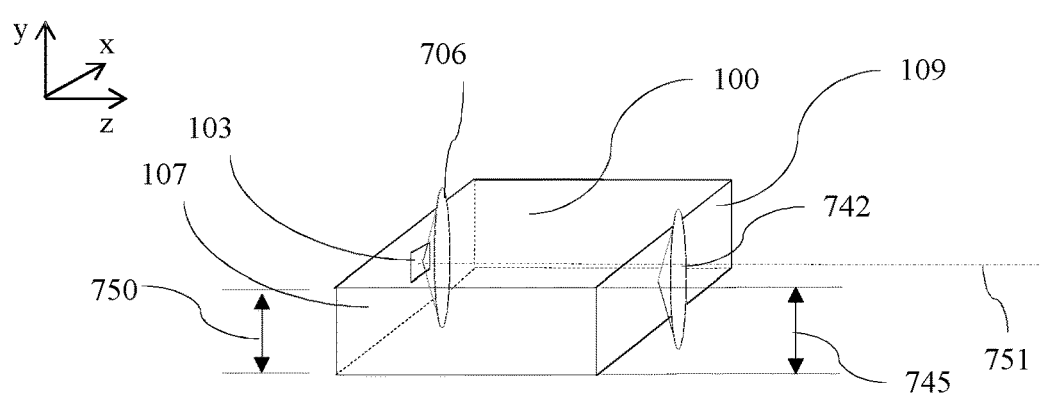
FIGS. 4D-E are schematic diagrams illustrating in perspective and side views illumination of a light guide with parallel sides, in accordance with the present disclosure.
Figure 4E:
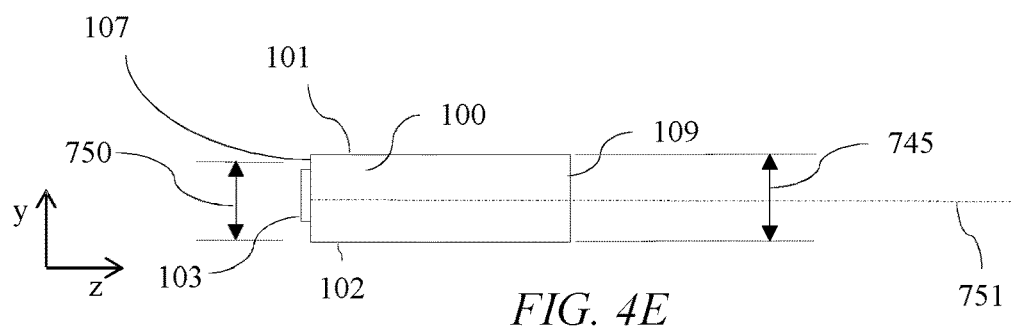

FIGS. 4D-E are schematic diagrams illustrating in perspective and side view s illumination of a light guide 100 with substantially parallel sides.

The optical axis 751 of a slab and taper type light guide of FIGS. 4D-4G may be defined as the line of symmetry from the centre of the input side 107 to the centre of the output side 109 and may be the line with the shortest path length. The light guide cross sectional plane may be a plane in the x-z axis, a plane in the y-z axis or other plane that has a normal in the x-y plane, where the z-axis is the normal to an output surface of the illumination apparatus.

At least one of the light guides 100 may comprise in at least one light guide cross-sectional plane through its optical axis 751 a first light guide outer surface 101 and a second light guide outer surface 102 facing the first light guide outer surface 101; wherein the first and second light guide outer surfaces 101, 102 extend from a first end 107 of the light guide 100 to a second end 109 of the light guide 100, the second end 109 of the light guide 100 facing the first end 107 of the light guide 100.

The light guide may typically be provided by a transparent material. If the LED 103 is arranged in air and the light guide 100 is provided by a moulded material such as a polymer, no metal coating may be required, advantageously reducing cost and complexity.

The transparent input surface may be linear such that the directionality of the LED 103 in air is preserved within the waveguide 100. The first and second outer surfaces 101, 102 of the light guide may be linear in the cross sectional planes as illustrated in FIGS. 4E and 4G. Advantageously such surfaces may conveniently be provided by known tooling and moulding methods.

The distance 750 between the first and second outer surfaces 101, 102 at the first end 107 of the light guide 100 is the same as the distance 745 between the first and second outer surfaces 101, 102 at the second end 109 of the light guide 100; wherein the solid angle 742 of the second directional light output distribution 122 is substantially the same as the solid angle 706 of the directional light output distribution of the LEDs 103 of the second plurality of LEDs. In operation the LEDs 103 may typically provide a Lambertian directional light output distribution. Advantageously the second directional light output distribution 122 may be substantially Lambertian, achieving a wide field of view of the illumination apparatus.

Light guide has an input side 743 with height 750 and area Ain at which the micro-LED 103 is arranged. The output side 745 has the same height 752 as height 750 and same area Aout as the input area Ain, and thus the solid angle Ωout of cone 742 may the same or greater than the input solid angle Ωin of input cone 706. Thus a wide directional light output distribution may be transferred from the plane of the micro-LED 103 to the output of the light guide 100. The wide directional light output distribution may for example be substantially Lambertian.

In manufacture, tooling and moulding may provide differences in height 752, 750, for example a mould release angle of a few degrees may be provided. Advantageously the output end 754 may be provided with slightly larger height 752 than height 743, achieving some small reduction of output solid angle 183 and some increase in output efficiency for head on illumination.

It may be further desirable to reduce solid angle 183 in comparison to an output Lambertian directional light output distribution.

Figure 4F:
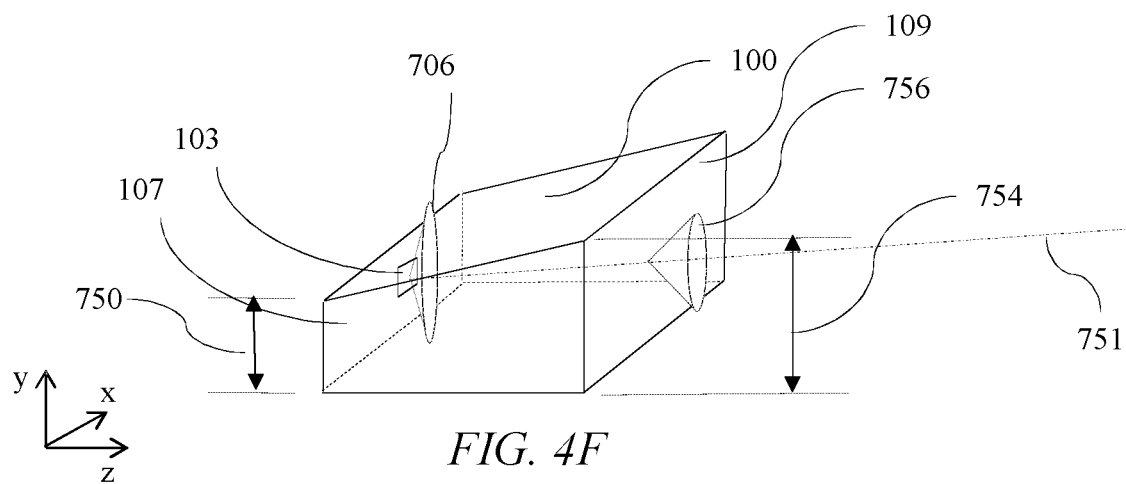
FIG. 4F-G are schematic diagrams illustrating in perspective and side views illumination of a light guide with tapered sides, in accordance with the present disclosure.
Figure 4G:
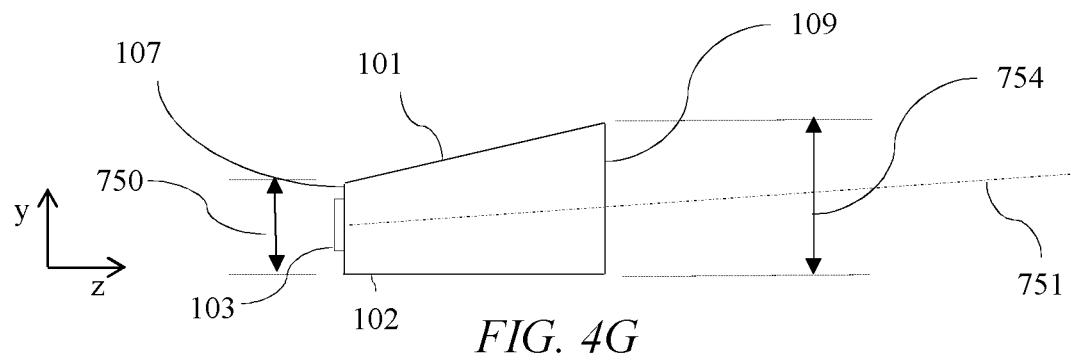

FIGS. 4F-G are schematic diagrams illustrating in perspective and side views, illumination of a light guide with tapered sides. The increase in height 754 of the output side 749 reduces the solid angle Ωout of cone 756 in the direction of the increase of height 754 of the side. In comparison to the arrangement of FIGS. 4D-E, the luminance in a central direction may be increased, for a reduced solid angle Ωout. Advantageously a more efficient wide directional light output distribution may be provided for head on viewing.

Thus distance 750 between the first and second outer surfaces 101, 102 at the first end 107 of the light guide 100 is less than the distance 745 between the first and second outer surfaces 101, 102 at the second end 109 of the light guide 100; wherein the solid angle 742 of the second directional light output distribution 122 is less than the solid angle 706 of the directional light output distribution of the LEDs 103 of the second plurality of LEDs. In comparison to the arrangement of FIGS. 4D-E, more efficient luminance may be achieved for on-axis output of the display apparatus.

In the present embodiments, the light guide 100 may have first and second light guide outer surfaces that are transparent. Advantageously no coating of surfaces of the light guide may be provided, reducing cost and complexity. Further efficiency may be improved in comparison to coated light guides, as light guiding may be by means of total internal reflection.

At least some of the LEDs of the second plurality of LEDs may be micro-LEDs.

The viewing cones and viewing windows from displays will now be described.

Figure 5A:
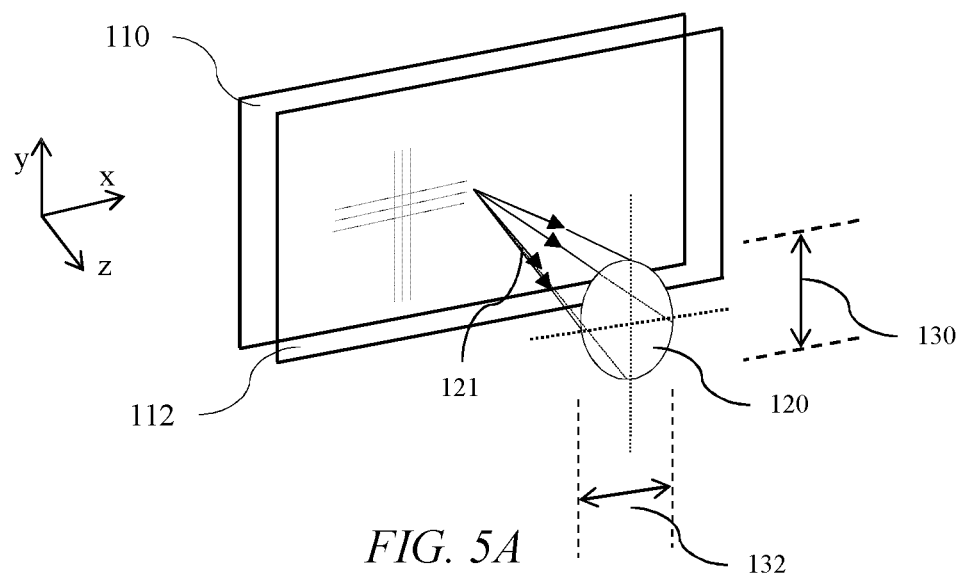
FIG. 5A is a schematic diagram illustrating in perspective front view operation of the directional display of FIG. 1A arranged to provide a narrow directional light output distribution, in accordance with the present disclosure.
Figure 5B:
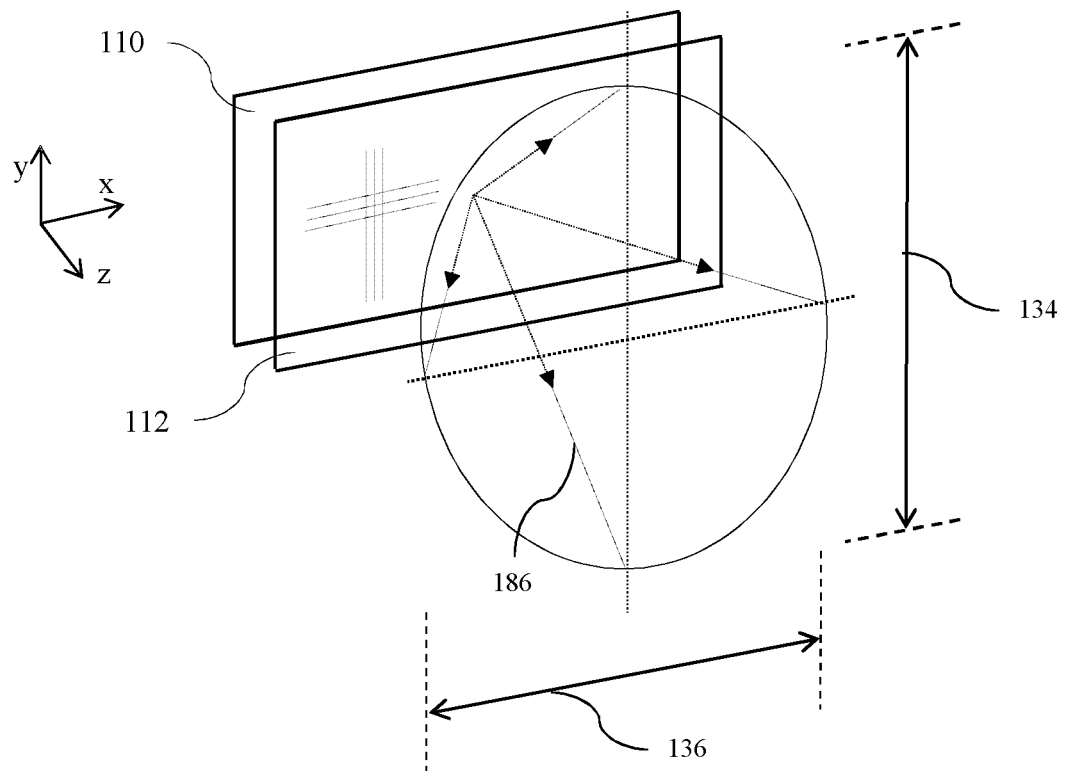
FIG. 5B is a schematic diagram illustrating in perspective front view operation of the directional display of FIG. 1A arranged to provide a wide directional light output distribution, in accordance with the present disclosure.

FIG. 5A is a schematic diagram illustrating in perspective front view operation of the directional display of FIG. 1A arranged to provide a narrow directional light output distribution; and FIG. 5B is a schematic diagram illustrating in perspective front view operation of the directional display of FIG. 1A arranged to provide a wide directional light output distribution.

A narrow directional light output distribution is provided by light rays 121 that are directed to viewing window 120 with width 132 and height 130 by a two dimensional array of catadioptric optical elements 38. An observer with eyes within window 120 sees at least some of the pixels 303 of the transmissive spatial light modulator 112 illuminated.

A wide directional light output distribution is provided by light rays 186 that are directed to viewing window 122 with width 136 and height 134 by a plurality of light guides 100. An observer with eyes within window 122 sees at least some of the pixels 303 of the transmissive spatial light modulator 112 illuminated. If the output of the display in wide angle mode is Lambertian, the window 122 may comprise a substantially 2π steradian viewing cone, and the display will advantageously be viewable from all angles with equal luminance.

The arrangement of viewing windows 120 across the area of the display apparatus will now be described.

Figure 5C:
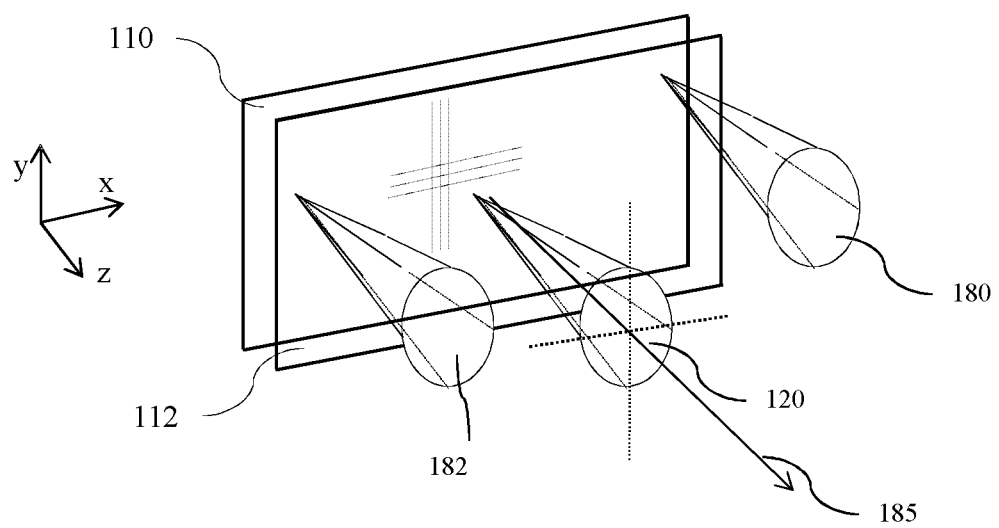
FIG. 5C is a schematic diagram illustrating in perspective front view operation of the directional display of FIG. 1A arranged to provide a narrow directional light output distribution wherein the directional light output distributions are provided to be the same across the area of the display, in accordance with the present disclosure.

FIG. 5C is a schematic diagram illustrating in perspective front view operation of the directional display 110, 112 of FIG. 1A arranged to provide a narrow directional light output distribution wherein the directional light output distributions are provided to be the same across the area of the display. Thus viewing widows 120, 180, 182 may be directed into the same direction 185.

An observer moving away from the centre of the display will observe the area of the display that is closest to them to be brighter. This is the appearance of conventional displays and advantageously appears to be natural variation of display luminance with observer 125 movement.

The arrangement of FIG. 5C provides a varying luminance for a display user as each part of the display is observed at a different cone angle.

It may be desirable to provide increased display uniformity for a display user.

Figure 5D:
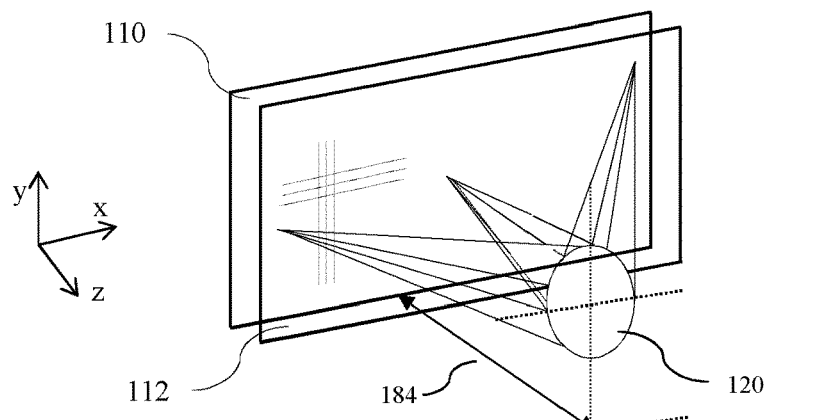
FIG. 5D is a schematic diagram illustrating in perspective front view operation of the directional display of FIG. 1A arranged to provide a narrow directional light output distribution wherein the directional light output distributions are provided to be directed towards a common window location in a window plane, in accordance with the present disclosure.

FIG. 5D is a schematic diagram illustrating in perspective front view operation of the directional display of FIG. 1A arranged to provide a narrow directional light output distribution wherein the directional light output distributions are provided to be directed towards a common window location 120 in a window plane 187. Such an arrangement may be achieved by offsetting the alignment of the centre of the micro-LEDs 3 to the centre of the catadioptric optical elements 3 across the area of the backlight illumination apparatus 110.

Advantageously, increased uniformity for the display user 125 may be provided.

It would be desirable to provide control of the viewing cone in wide angle mode of operation.

Figure 5E:
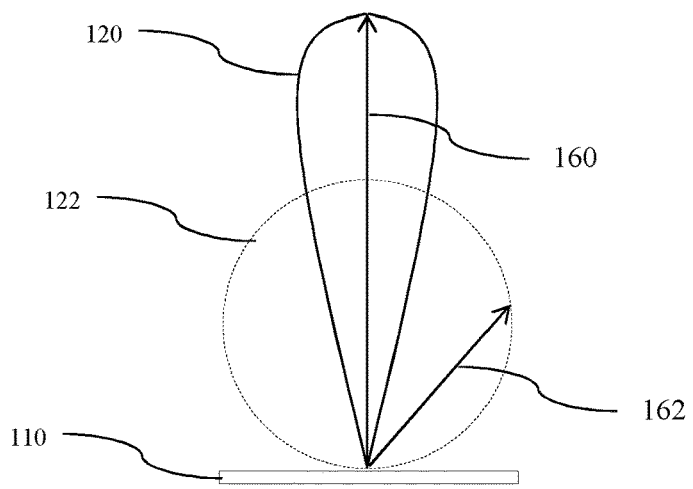
FIG. 5E is a schematic diagram illustrating directional light output distributions from a switchable directional display of FIG. 1A, in accordance with the present disclosure.

FIG. 5E is a schematic diagram illustrating directional light output distributions from a switchable directional display of FIG. 1A. Thus backlight illumination apparatus 110 may provide light cones into respective windows 120, 122. The luminance within a window varies with viewing direction, thus light ray 160 in narrow angle mode has a greater luminous intensity than light ray 162. In narrow angle mode, window 122 may be unused, that is LEDs 103 may not be illuminated.

In wide angle mode, a Lambertian output may be obtained by providing illumination to only array of LEDs 103. However, it may be desirable to provide a wide angle viewing cone that is between Lambertian and narrow angle mode. In one embodiment both arrays of LEDs 3, 103 may be illuminated.

Advantageously, a wide angle illumination profile may be provided with higher efficiency than illumination of only LEDs 103. Further illumination from the catadioptric optical elements may be provided, increasing display uniformity.

Figure 5F:
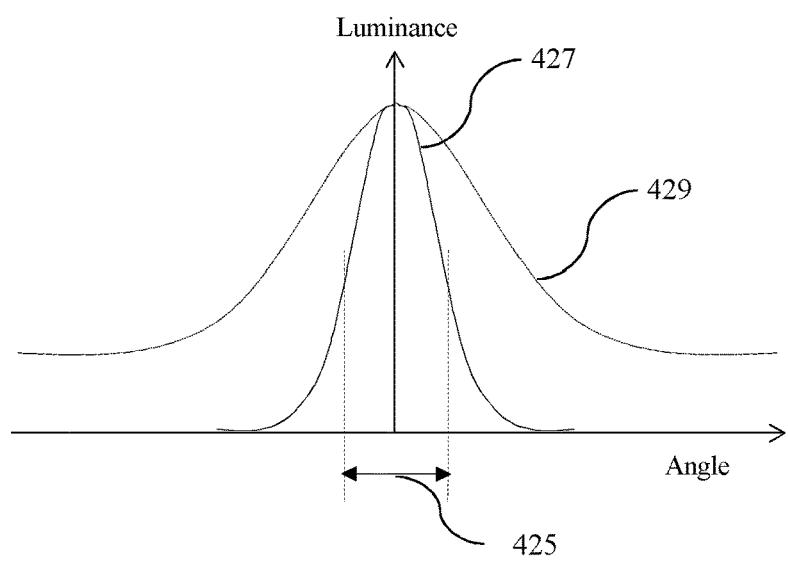
FIG. 5F is a schematic diagram illustrating a graph of luminance against output angle for the directional display comprising catadioptric optical elements and micro-LEDs of FIG. 1A, in accordance with the present disclosure.

FIG. 5F is a schematic diagram illustrating a graph of luminance against output angle for the directional display 110, 112 comprising catadioptric optical element 38 and micro-LED 3 of FIG. 1A. Directional light output distribution 427 may have an angular profile with a full width half maximum FWHM width 425. The shape of the profile may be provided with a desirable roll off by means of design of LED shape, catadioptric optical element shape and diffuser arrangements.

In wide angle mode a directional light output distribution 429 may be provided for example. The profile may be formed by light from output from micro-LEDs 3 and micro-LEDs 103 for example. The peak luminance may be tuned by means of adjustment of output luminous flux of the respective pluralities of micro-LEDs to match the peak luminance in privacy mode of operation. The profile may be arranged to be the same across the area of the illumination apparatus, or may vary with location across the illumination apparatus.

A known luminaire for environmental lighting may comprise a small number (for example less than 10) macroscopic square LEDs that each have a semiconductor chip width of 1 mm and are attached to a lead frame with solder electrodes before packaging in plastic. The packaged LEDs are then provided on a support substrate by a pick-and-place fabrication method.

A rotationally symmetric catadioptric optical element may be provided in alignment with each macroscopic LED. The distance 714 of the second end 708 of the catadioptric optical element may be 20 mm, and the thickness 713 may be 10 mm. An optional hemispherical refractive optical element may be provided on the macroscopic LED.

The directional light output distribution may have a rotationally symmetric full width half maximum (FWHM) 425 of typically 6 degrees.

A known display backlight may use large-area edge-input light-guides and optical films such as BEF from 3M Corporation and rear reflectors. Such backlights may typically have a thickness that is less than 8 mm, and more typically around 3 mm. The directional light output distribution may have a typical rotationally symmetric full width half maximum 425 of 50 degrees.

Illustrative examples will now be described to provide examples of dimensions for illumination and display embodiments of the present disclosure.

By way of comparison, the present embodiments for environmental illumination, display backlighting and direct display may comprise micro-LEDs 3.

The inventors have considered that it might be possible to achieve superior performance for directional lighting systems with arrays of microscopic scale elements as will be described. In this specification such microscopic elements are referred to as micro-LEDs. The inventors have appreciated that high precision array fabrication process methods suitable for the light-emitting element arrays and aligned optical element arrays are required to achieve such microscopic directional lighting and illumination apparatus.

Micro-LEDs 3 may be provided by array extraction methods and may be extracted in parallel from a monolithic wafer as described below. The micro-LEDs 3 of the plurality of micro-LEDs may be from a monolithic wafer arranged in an array with their original monolithic wafer positions and orientations relative to each other preserved; and wherein in at least one direction, for at least one pair of the plurality of micro-LEDs 3 in the at least one direction, for each respective pair there was at least one respective micro-LED 3 in the monolithic wafer that was positioned in the monolithic wafer between the pair of micro-LEDs in the at least one direction and that is not positioned between them in the array of micro-LEDs.

The micro-LEDs 3 of the present embodiments may have a width or diameter of less than 300 microns, preferably less than 200 microns, and more preferably less than 100 microns. As will be described herein large area array extraction methods may be provided, improving placement accuracy, reducing overall placement time, and reducing cost and complexity of fabrication in comparison to pick-and-place methods.

In display applications a FWHM angle 425 of 12 to 24 degrees may be desirable for the directional light output distribution 427 from the display apparatus to provide a comfortable viewing freedom while achieving privacy, power savings or reduced stray light operation.

A micro-LED 3 of width 300 microns and aligned catadioptric optical element 38 may achieve a 12 degrees FWHM width 425 using a distance 714 of 3 mm for example and may have thickness 713 of 1.5 mm. Similarly, a micro-LED of width 100 microns and aligned catadioptric optical element 38 may achieve a 24 degrees FWHM width 425 using a catadioptric optical element distance 714 of 0.5 mm for example and may have a thickness 713 of 0.25 mm.

Thus in display backlighting applications the distance 714 between the first and second outer surfaces 46a, 46b at the second end 708 of the catadioptric optical element may be less than 3 mm, preferably less than 1.5 mm and more preferably less than 0.75 mm. Advantageously display Moiré and mura artefacts may be minimised. The thickness t1, t2, or t3, t4 of substrates 52, 47 will be describe with reference to FIGS. 57A-B below and may for example be between 100 and 500 microns.

Advantageously very thin backlights 110 for illumination of spatial light modulators 112 may be achieved. Further the thickness of the illumination apparatus may be less than the thickness of conventional waveguide type backlights.

In another illustrative embodiment the pixels 303 of a spatial light modulator 112 may be arranged on a pitch of 25 microns×75 microns and the distance 714 may be 0.3 mm, with a micro-LED width or diameter of 60 microns.

Advantageously display Moiré and mura artefacts may be minimised. Further the thickness of the illumination apparatus may be less than the thickness of conventional waveguide type backlights.

In direct display embodiments in which the micro-LEDs are driven with image pixel data, the pitch of the catadioptric optical elements may determine the resolution of the display in at least one direction. The distance 714 between the first and second outer surfaces 46a, 46b at the second end 708 of the catadioptric optical element may be less than 0.3 mm, preferably less than 0.15 mm and more preferably less than 0.1 mm. The micro-LEDs 3 of the present direct display embodiments may have a width or diameter of less than 60 microns, preferably less than 30 microns, and more preferably less than 20 microns.

In environmental illumination applications a FWHM angle 425 of 6 degrees may be desirable for the directional light output distribution 427 for a narrow beam angle. The distance 714 between the first and second outer surfaces 46a, 46b at the second end 708 of the catadioptric optical element may be less than 6 mm.

Figure 6A:
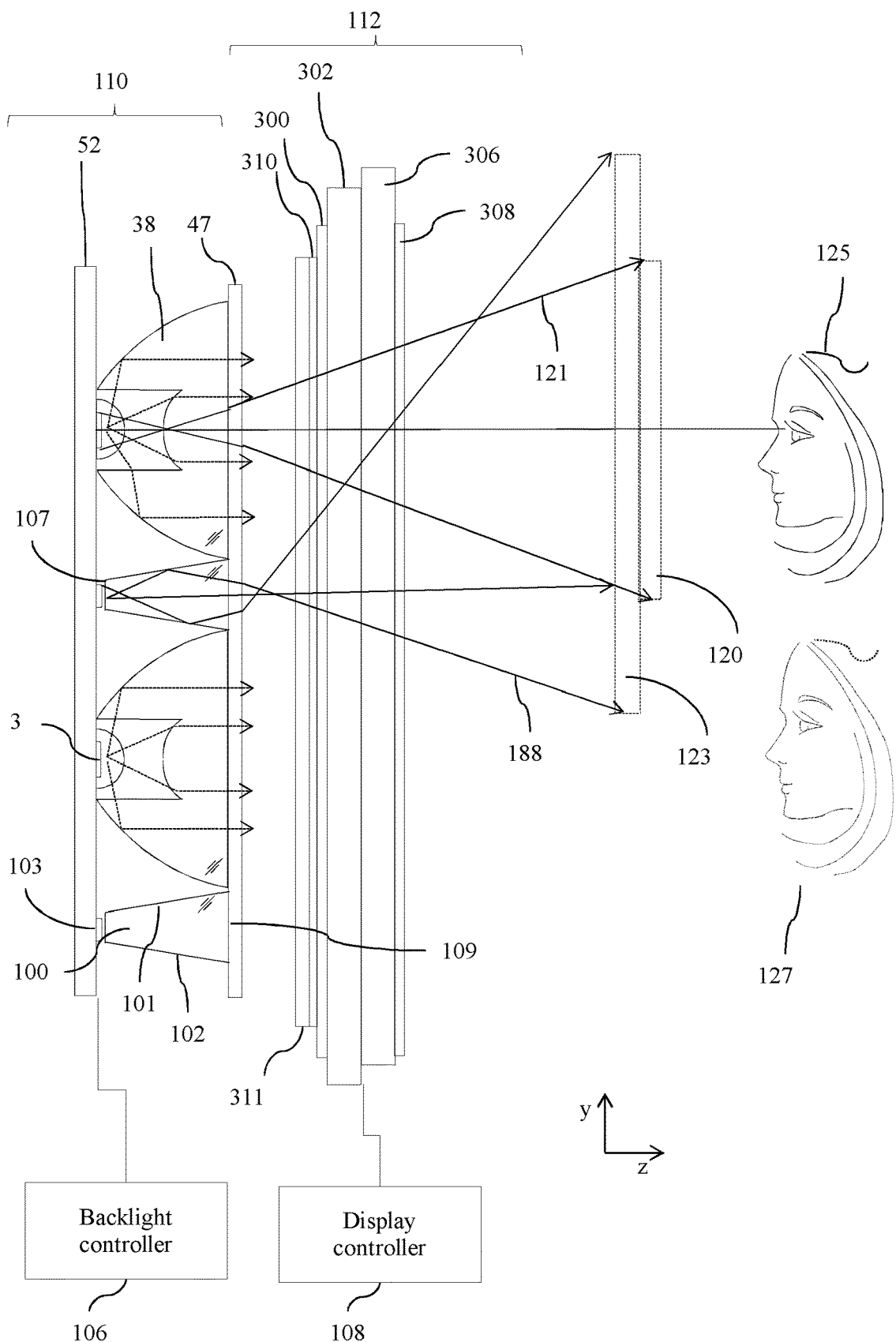
FIG. 6A is a schematic diagram illustrating in side view operation of a directional display wherein the cone angle of the wide directional light output distribution is smaller than the directional light output distribution provided by the light guides of FIG. 2B, in accordance with the present disclosure.

FIG. 6A is a schematic diagram illustrating in side view operation of a directional display wherein the cone angle of the wide directional light output distribution is smaller than the directional light output distribution provided by the parallel sided light guides 100 of FIG. 2B. Advantageously, the head on luminance efficiency of the illumination apparatus can be increased by reducing off-axis luminance.

Figure 6B:
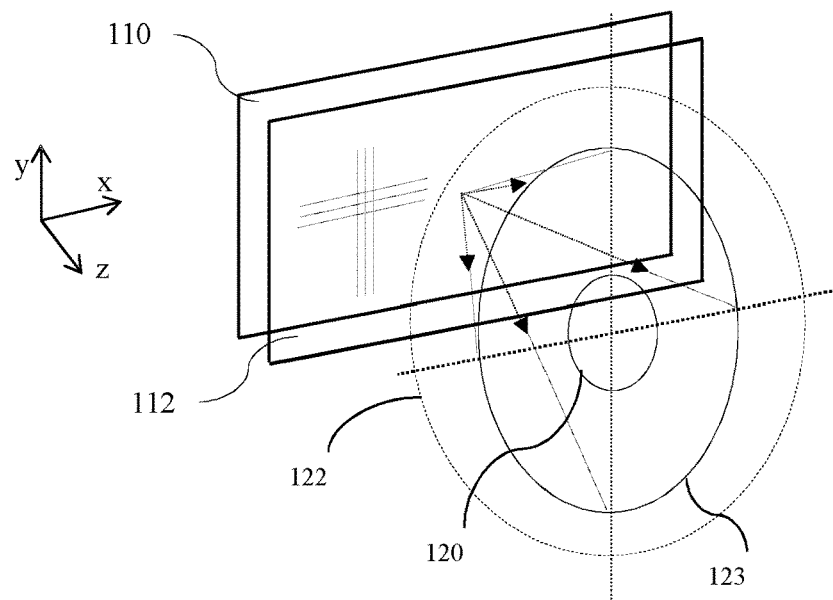
FIG. 6B is a schematic diagram illustrating in perspective front view operation of a directional display arranged to provide a switchable directional light output distribution between wide and narrow modes, in accordance with the present disclosure.

FIG. 6B is a schematic diagram illustrating in perspective front view operation of a directional display arranged to provide a switchable directional light output distribution between wide and narrow modes.

Thus sides 101, 102 of light guide 100 may be non-parallel and provided with an expanding taper, so that the output end 109 has a larger size than the input side 107. Such an arrangement provides a narrow cone angle of output, and a viewing window 123 may be provided by light rays 188 that is smaller than the cone angle of viewing window 122.

Advantageously, display efficiency may be increased in wide viewing angle mode.

In use, it is often preferable to rotate displays, such as mobile displays, around a horizontal axis to obtain the best viewing angle, whereas in the lateral direction a central viewing location is normally preferable, particularly for narrow angle operation.

Figure 6C:
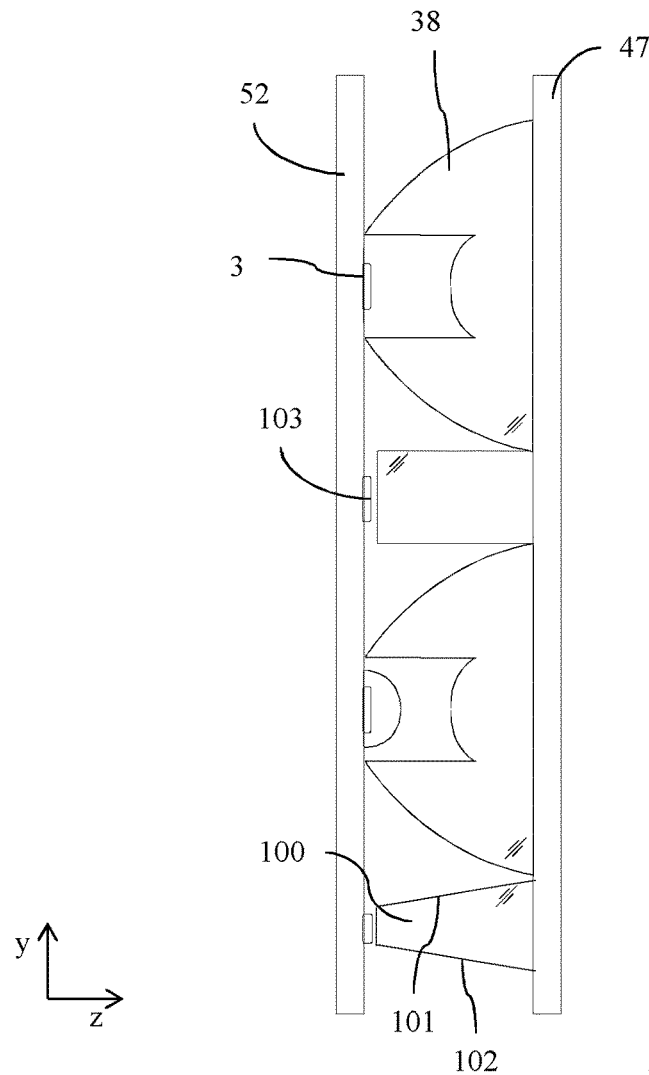
FIG. 6C is a schematic diagram illustrating in side view a directional illumination apparatus comprising different shaped light guides and catadioptric optical elements, in accordance with the present disclosure.

FIG. 6C is a schematic diagram illustrating in side view operation of a directional illumination apparatus comprising different shaped light guides and catadioptric optical elements. Advantageously directional light output distribution of the combined light guides 100 and catadioptric optical elements can be more finely adjusted in comparison to the arrangement of FIG. 6A for example.

It would thus be desirable to provide display illumination that has a large range of vertical viewing angles, with a smaller lateral viewing directional light output distribution. For the present embodiments, the x-axis is termed the lateral direction and the y-axis is termed the orthogonal direction.

Figure 7A:
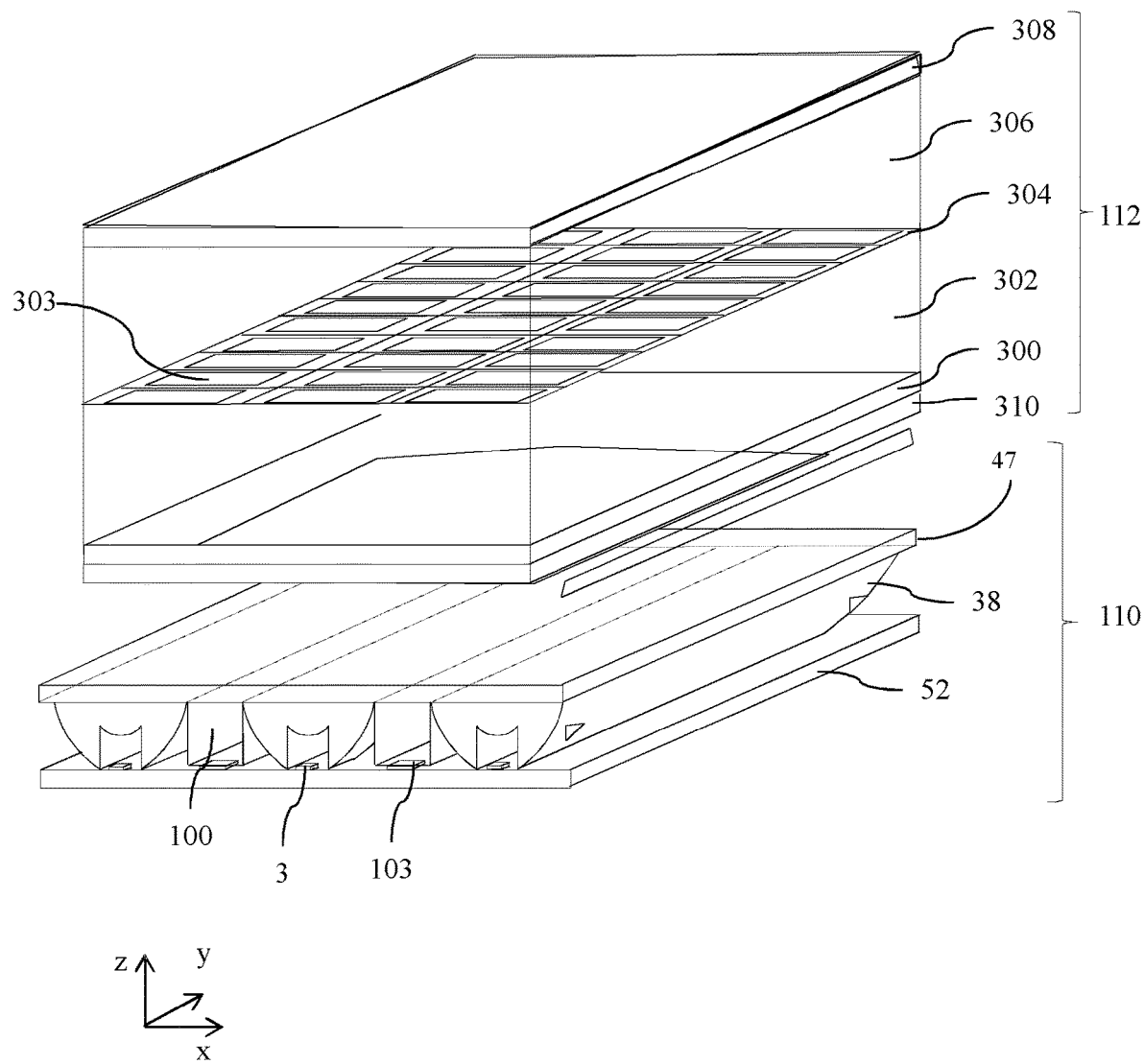
FIG. 7A is a schematic diagram illustrating in side perspective view a switchable directional display apparatus comprising a backlight with an array of catadioptric optical elements and an array of light guides that are both extended in the same direction arranged to illuminate a spatial light modulator, in accordance with the present disclosure.

FIG. 7A is a schematic diagram illustrating in side perspective view a switchable directional display apparatus comprising a backlight with a plurality of catadioptric optical elements 38 and a plurality of light guides 100 that are both extended in the orthogonal direction arranged to illuminate a spatial light modulator 48. Thus at least some of the catadioptric optical elements 38 of the plurality of catadioptric optical are extended in a direction that is normal to the catadioptric cross sectional plane, for example as illustrated in FIG. 2F. Further at least some of the light guides 100 of the plurality of light guides are extended in the direction that is normal to the catadioptric cross sectional plane and thus are parallel to the extended catadioptric optical elements.

In embodiments wherein the catadioptric optical element 38 is extended, for example to provide cylindrical refractive surfaces 42, then the optical axis may be a line in a plane that is the axis of symmetry of the catadioptric optical element 38 for the refractive and reflective surfaces.

In comparison to the embodiment of FIG. 1A, the catadioptric optical elements 38 are cylindrical, that is they are extended in the orthogonal direction (y-axis). A plurality of light guides 100 is arranged along columns along the same orthogonal direction and are interspersed with columns of catadioptric optical elements 38. Advantageously a one dimensional switchable directional light output distribution may be provided.

The operation for observers 121, 125 of FIG. 7A is substantially the same as illustrated in top view in FIG. 2A.

The catadioptric optical elements 38 may be extended along a locus that has a wobble or varying direction to advantageously achieve some lateral diffusion.

It may be desirable to mix the outputs of the catadioptric optical elements 38 and light guides 100 to provide a backlight with reduced visibility of gaps between catadioptric optical elements 38 and light guides 100.

Figure 7B:
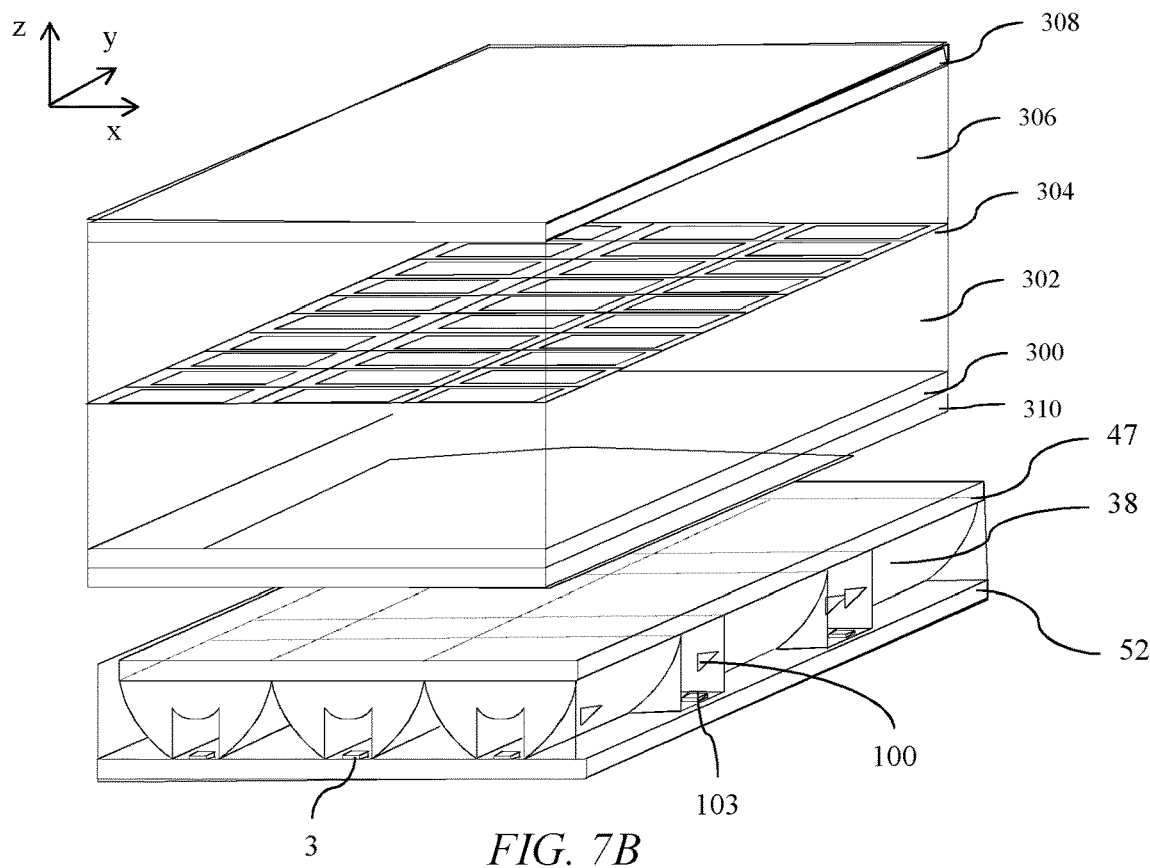
FIG. 7B is a schematic diagram illustrating in side perspective view a switchable directional display apparatus comprising a backlight with an array of catadioptric optical elements and an array of light guides arranged to illuminate a spatial light modulator, in accordance with the present disclosure.

FIG. 7B is a schematic diagram illustrating in side perspective view a switchable directional display apparatus comprising a backlight with a plurality of catadioptric optical elements 38 and a plurality of light guides 100 arranged to illuminate a spatial light modulator with a narrow directional light output distribution in the lateral direction.

A plurality of light guides 100 is arranged along rows along the lateral direction that are interspersed with rows of catadioptric optical elements 38. Advantageously reduced visibility of gaps between catadioptric optical elements 38 and light guides 100 is achieved.

Figure 8:
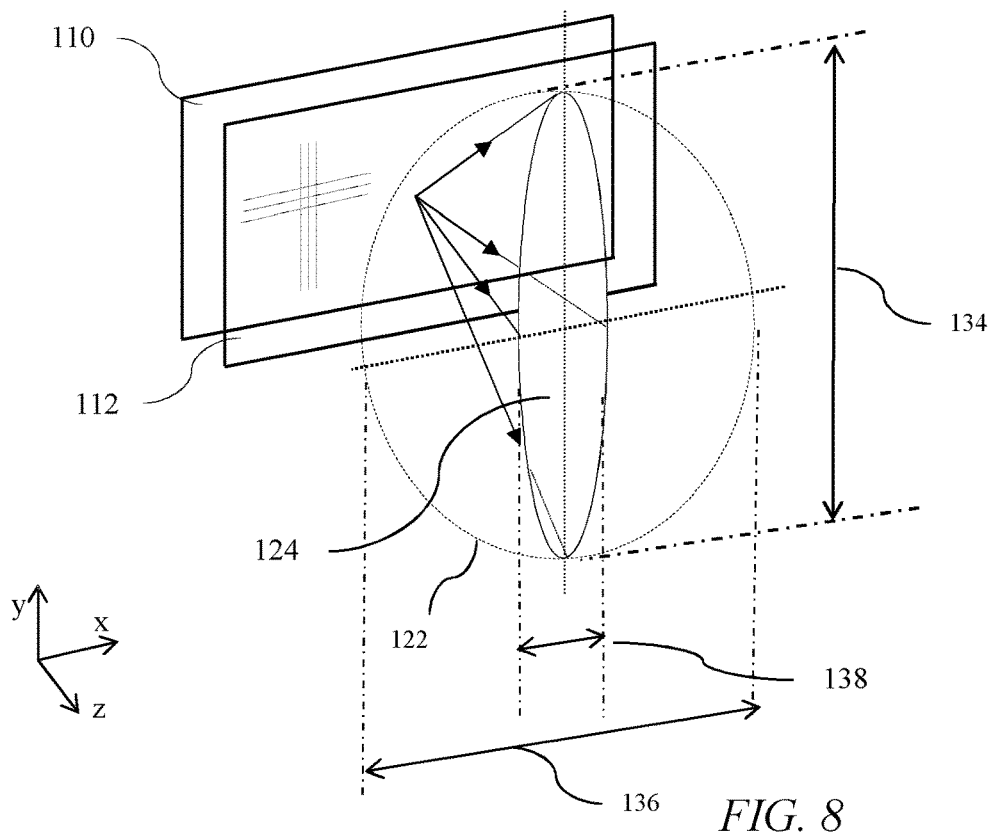
FIG. 8 is a schematic diagram illustrating in perspective front view directional light output distribution from the display of FIGS. 7A-B, in accordance with the present disclosure.

FIG. 8 is a schematic diagram illustrating in perspective front view directional light output distribution from the display 110, 112 of FIGS. 7A-B. In this arrangement the lateral direction is horizontal and the orthogonal direction is vertical. Illumination of micro-LEDs 3 provides a viewing window 124 with a large vertical height 134, and narrow lateral width 138. Illumination of LEDs 103 provides a viewing window 122 with the same vertical height 134, and wide lateral width 136.

Advantageously a display 110, 112 may be provided that can be switched between a narrow and wide lateral viewing window. The vertical viewing window height may be substantially the same so that the display may be conveniently rotated about a horizontal axis for viewing comfort.

The structure of the catadioptric optical elements 38 and light guides 100 of FIG. 7B will now be described in more detail.

Figure 9A:
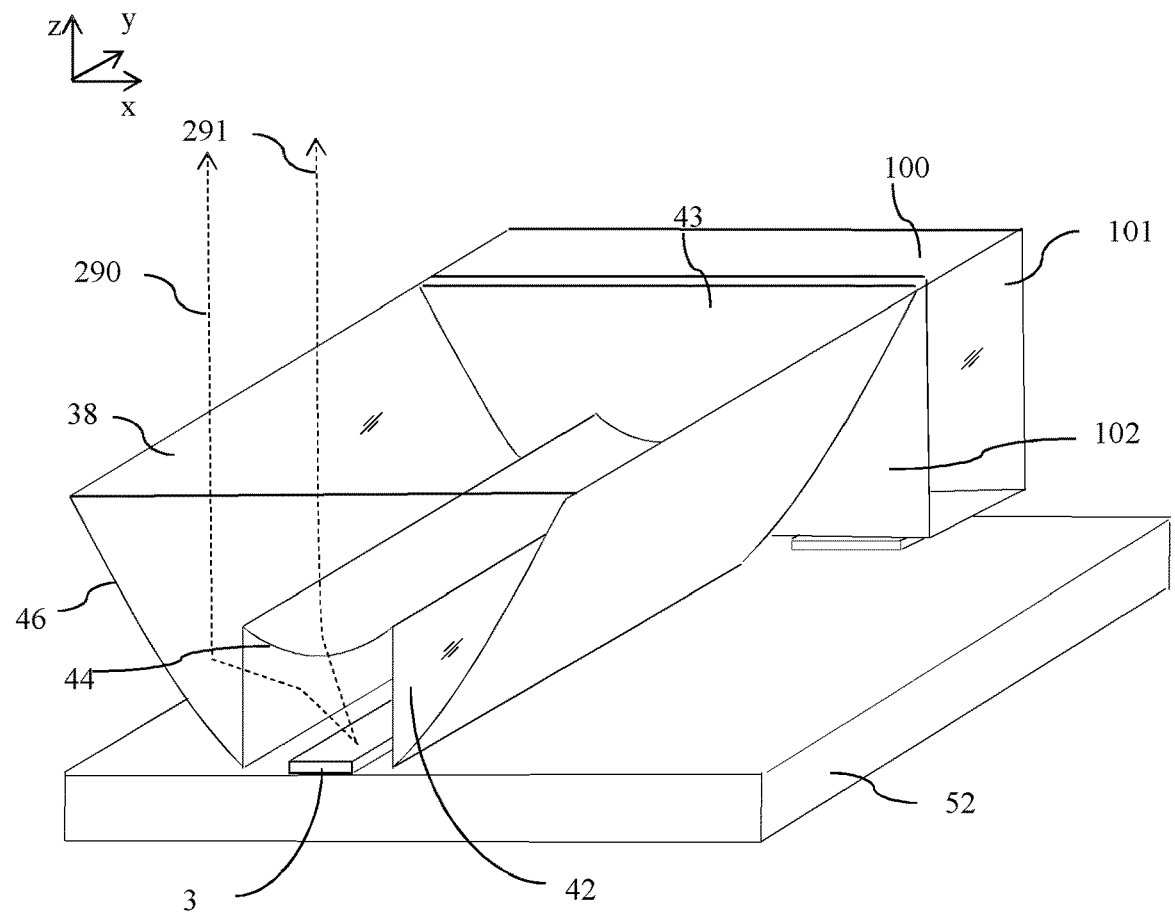
FIG. 9A is a schematic diagram illustrating in perspective side view a light emitting element aligned with a vertically extended catadioptric optical element, in accordance with the present disclosure.

FIG. 9A is a schematic diagram illustrating in perspective side view a light emitting element aligned with a vertically extended catadioptric optical element. Thus at least some of the light guides 100 of the plurality of light guides are extended in a direction that is orthogonal to the direction in which the catadioptric optical elements 38 are extended.

The catadioptric optical element 38 may comprise refracting walls 42, lens surface 44 and shaped reflecting surface 46. Light rays 290, 292 are refracted by side walls 42 or lens surface 44 and may be reflected by total internal reflection at reflecting surface 46.

End 43 may be arranged with an air gap between side 102 of light guide 100. Thus light within the catadioptric optical element 38 may be reflected by side wall 43 about the orthogonal direction, with the same lateral directional light output distribution.

Figure 9B:
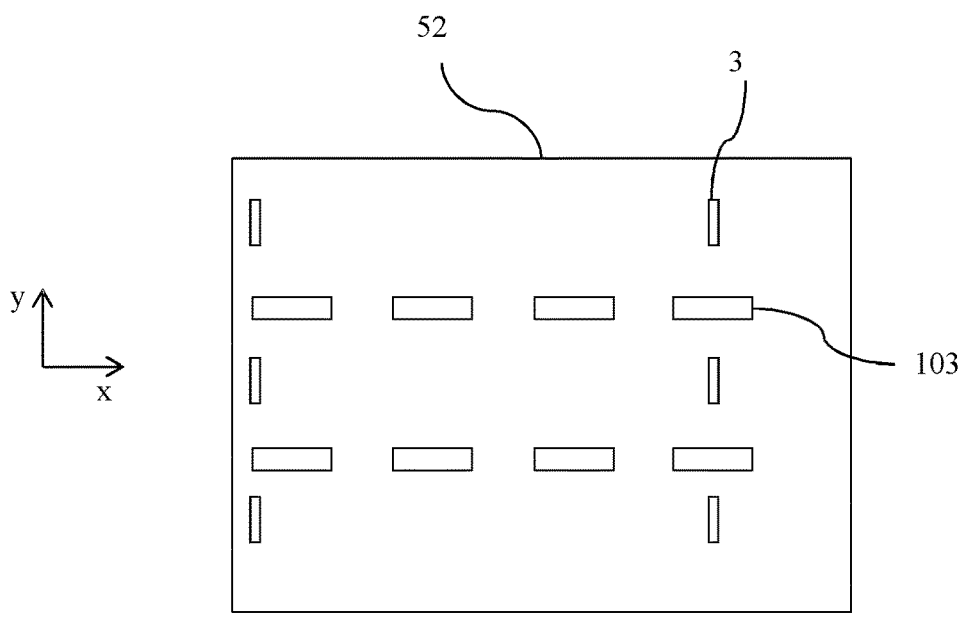
FIG. 9B is a schematic diagram illustrating in top view an array of LEDs, in accordance with the present disclosure.

FIG. 9B is a schematic diagram illustrating in top view a plurality of LEDs. Micro-LEDs 3 may be extended in the orthogonal direction, whereas LEDs 103 may be extended in the lateral direction. The number and area of the LEDs 3, 103 may be different. In particular, for the same display luminance more surface area of LEDs 103 may be desirable compared to area of micro-LEDs 3 because of the amount of light required to fill the larger cone angles for the wide angle mode of operation.

It would be desirable to reduce the visibility of the apertures of the catadioptric optical elements 38 and light guides 1 when illuminating the pixels 303 of the spatial light modulator 112. Further it would be desirable to reduce Moiré patterning between the two structures.

Figure 10:
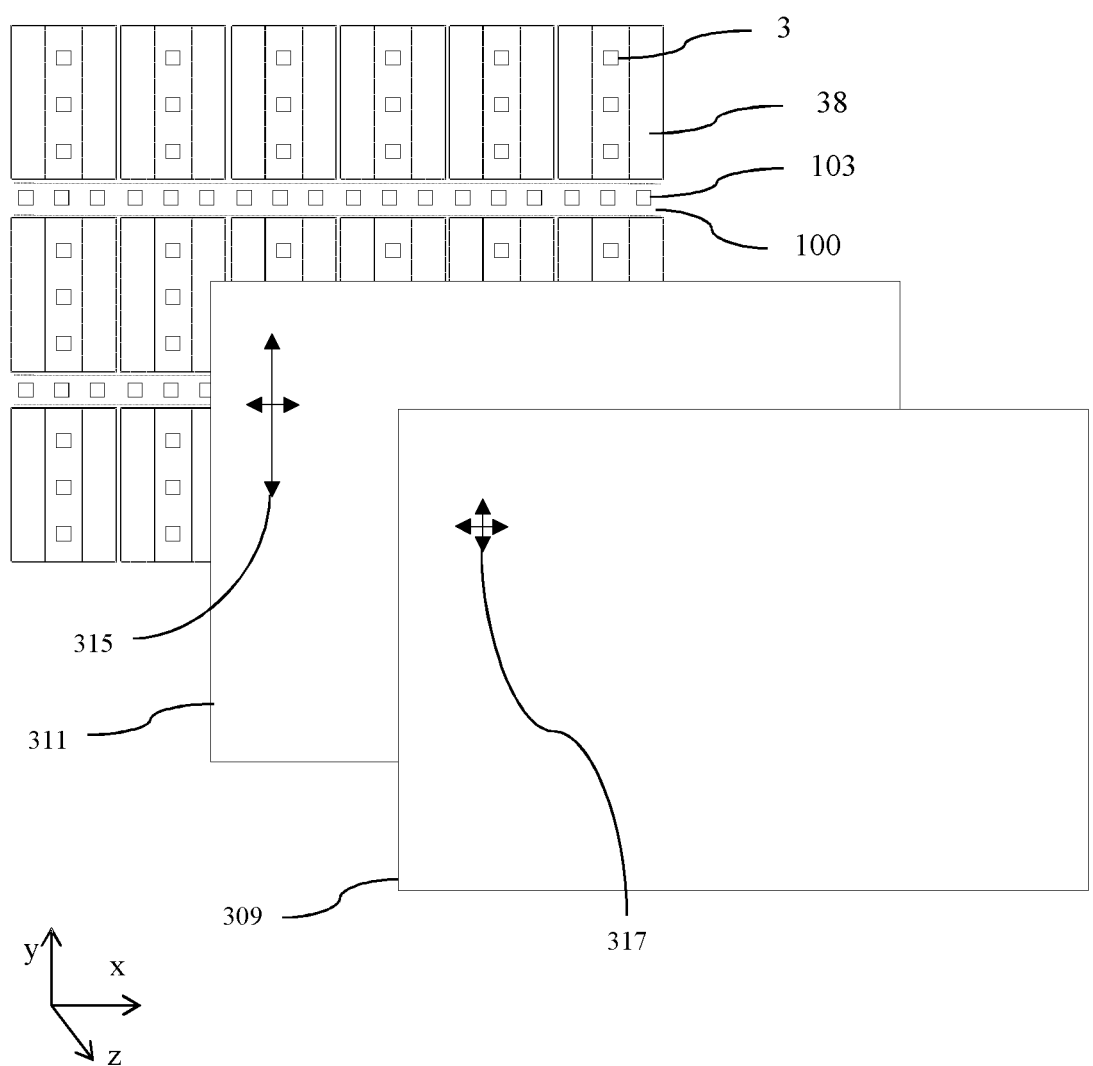
FIG. 10 is a schematic diagram illustrating in perspective front view an array of LEDs for a switchable directional display and diffuser elements of a spatial light modulator, in accordance with the present disclosure.
Figure 11:
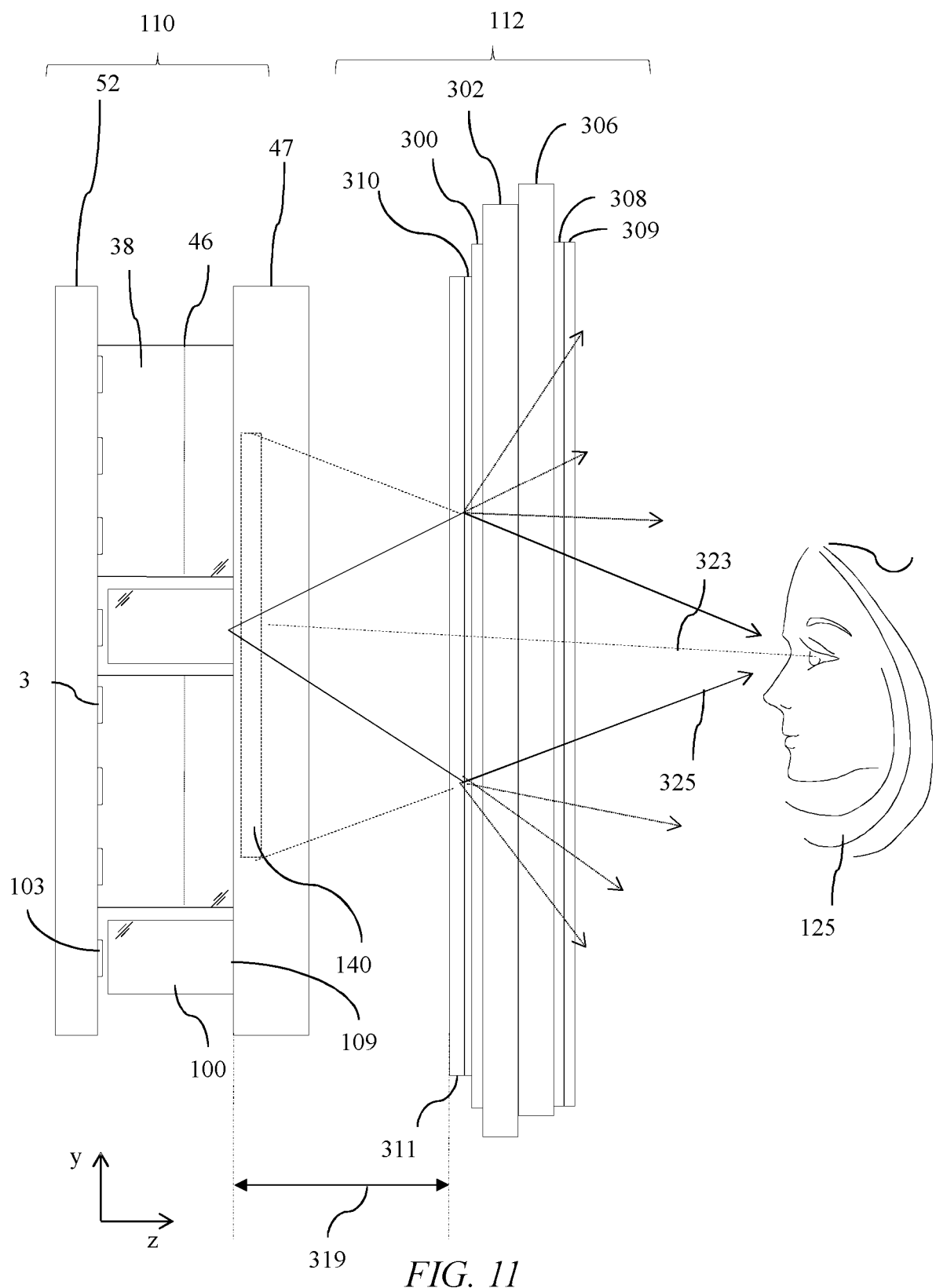
FIG. 11 is a schematic diagram illustrating in side view operation of diffuser elements for a switchable directional display, in accordance with the present disclosure.

FIG. 10 is a schematic diagram illustrating in perspective front view a plurality of LEDs 3, 103 for a switchable directional display and diffuser elements 311, 309 of a spatial light modulator 112; and FIG. 11 is a schematic diagram illustrating in side view operation of diffuser elements for a switchable directional display.

As shown in FIG. 10, rear diffuser 311 may be provided with increased diffusion 315 in the orthogonal direction compare to the lateral direction, whereas diffusion 317 of the front diffuser 309 may be substantially symmetric.

As shown in FIG. 11, the gap 319 and diffusers 311, 309 provide mixing of the light from the output 109 of the light guide 100. Thus light rays 323 from the aperture 107 are combined with diffused light rays 325, that together form an expanded region 140 from which the light from the light guide 100 appears to originate. Thus, the light guide may appear to be distributed across the area of the catadioptric optical elements 38, despite its smaller output size. The cone angle from the catadioptric optical elements 38 is smaller than the cone angle from the light guides 100 and thus the amount of diffusion that can be provided in the orthogonal direction is reduced. However, the relatively small width of the light guides provides a smaller area for diffusion and filling of the gaps between the catadioptric optical elements.

Advantageously, arranging the light guides in rows that are extended in the lateral direction can provide improved uniformity due to the larger diffusion that can be used in the orthogonal direction.

It would be desirable to provide different viewing angle characteristics from different regions of the display. For example, it may be desirable to provide a privacy function for part of a display area while the remainder of the display is more widely visible.

Figure 12:
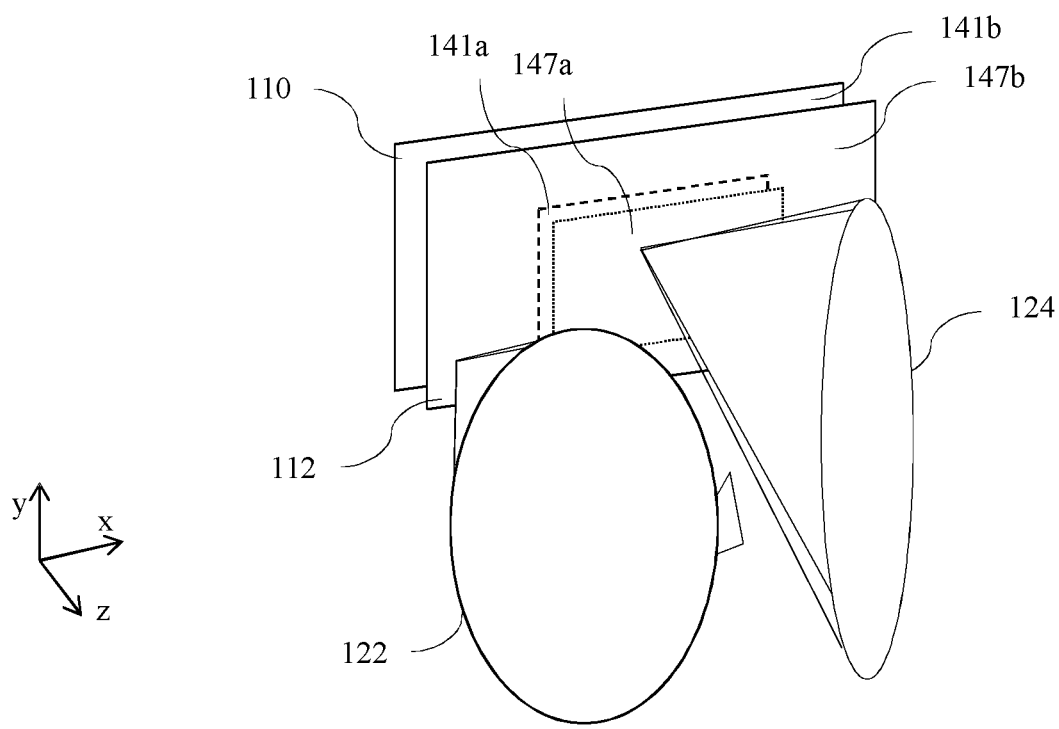
FIG. 12 is a schematic diagram illustrating in perspective front view a switchable directional display with addressable regions with different directional light output distributions, in accordance with the present disclosure.

FIG. 12 is a schematic diagram illustrating in perspective front view a switchable directional display with addressable regions with different directional light output distributions. As illustrated and described for FIGS. 1D-1E for example, LEDs 3, 103 may be individually addressed or addressed as groups. Thus some regions 141a may be provided with illumination of micro-LEDs 3 only whereas regions 141b may be provided with illumination of LEDs 103 or illumination of both LEDs 3, 103.

Further the data that is provided in regions 147a, 147b may be adjusted to correspond with the illumination function. For example secure data may be shown in region 147a, whereas more public information may be shown in region 147b.

Figure 13:
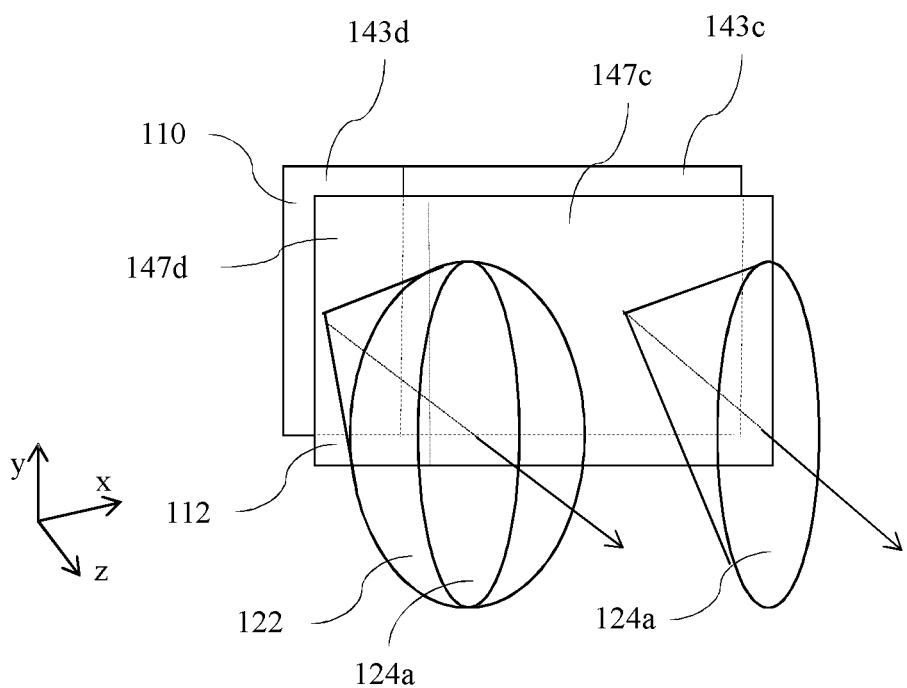
FIG. 13 is a schematic diagram illustrating in perspective front view a switchable directional display comprising a backlight with addressable regions with different directional light output distributions, in accordance with the present disclosure.

FIG. 13 is a schematic diagram illustrating in perspective front view a switchable directional display comprising a backlight with addressable regions with different directional light output distributions. In region 143c, the display may be arranged to provide only narrow lateral angle of operation with window 124a, whereas in region 143d, the display may be switchable between a narrow window 124a and a wide window 122 and aligned with respective image data 147c, 147d.

Advantageously light guides 100 may be eliminated in region 143c and displays may be configured with increased aperture ratio and increased uniformity. Alternatively, the catadioptric elements may be eliminated in some regions of the display to provide increased wide angle uniformity.

It may be desirable to provide a switchable directional display with high dynamic range operation, to achieve high levels of image contrast in both narrow and wide directional modes of operation.

Figure 14:
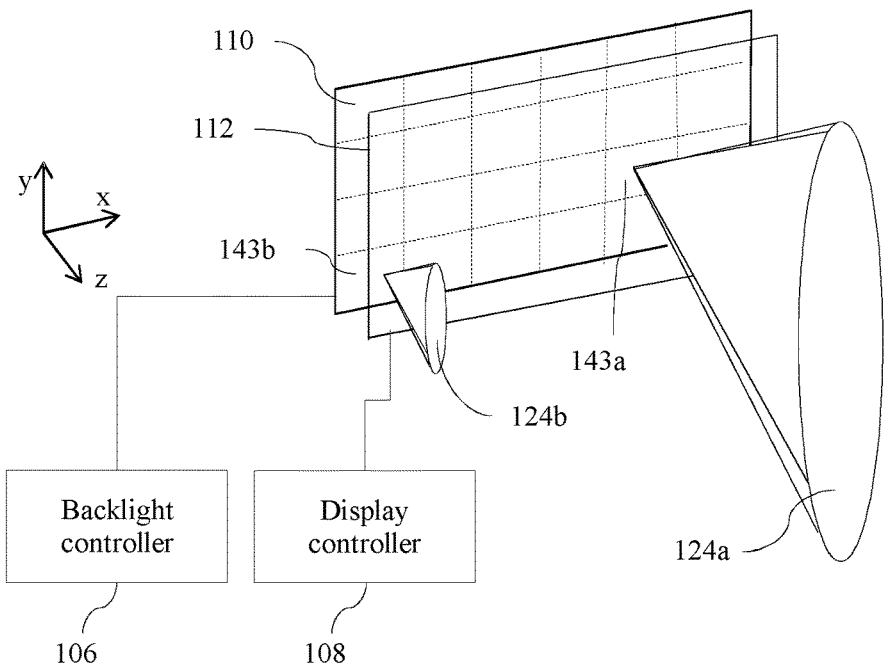
FIG. 14 is a schematic diagram illustrating in perspective front view a switchable directional display arranged to provide high dynamic range operation in directional mode of operation, in accordance with the present disclosure.
Figure 15:
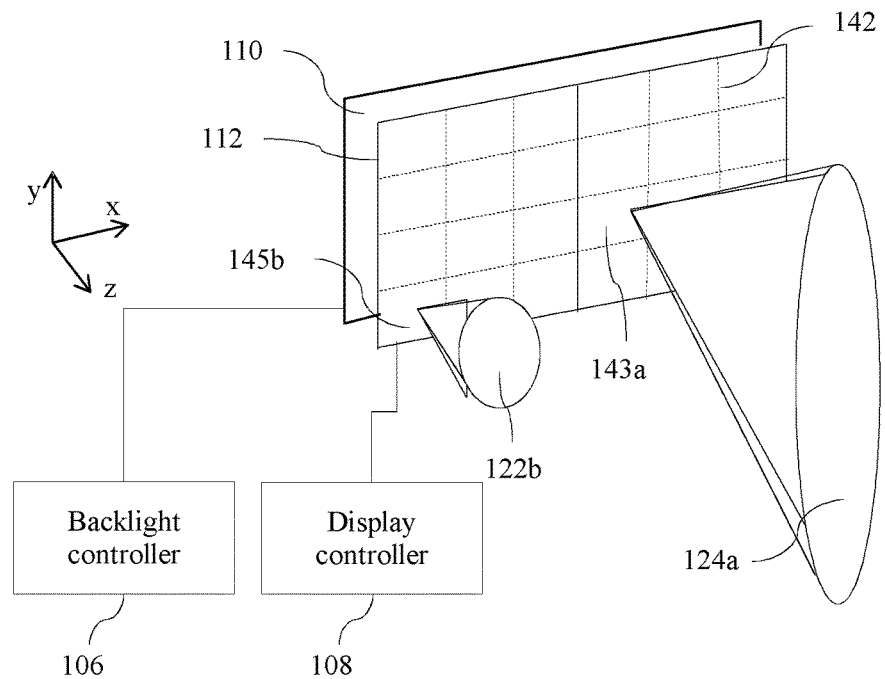
FIG. 15 is a schematic diagram illustrating in perspective front view a switchable directional display arranged to provide high dynamic range operation in both narrow and wide directional modes of operation, in accordance with the present disclosure.

FIG. 14 is a schematic diagram illustrating in perspective front view a switchable directional display arranged to provide high dynamic range operation in a directional mode of operation; and FIG. 15 is a schematic diagram illustrating in perspective front view a switchable directional display arranged to provide high dynamic range operation in both narrow and wide directional modes of operation. Thus a control system comprises a backlight controller 106 arranged to drive at least one of the first and second plurality of LEDs 3, 103 in a first region of the backlight apparatus 110 with a higher light output than the light output in a second region of the backlight apparatus 110. The backlight controller 106 is arranged to drive regions of at least one of the first and second pluralities of LEDs in correspondence with image data provided to the transmissive spatial light modulator 112 by a display controller 108.

As shown in FIG. 14, the backlight may be addressed as regions of micro-LEDs 3 so that micro-LEDs 3 in region 143a (corresponding to a high luminance of input image data) may be provided with a high luminous flux, whereas the micro-LEDs 3 in region 143b (corresponding to a low luminance of input image data) may be provided with a small luminous flux. In this manner, the contrast of the image may be increased in directional mode of operation.

As shown in FIG. 15, in region 143a (corresponding to a high luminance of input image data) micro-LEDs 3 may be provided with a high luminous flux, whereas the LEDs 103 in region 143b (corresponding to a low luminance of input image data) may be provided with a small luminous flux. In this manner, the contrast of the image may be increased in both narrow and wide modes of operation simultaneously on the same display.

The backlit display embodiments of the present disclosure comprise spatial light modulators 112 that reduce the efficiency and increase the thickness of the display apparatus in comparison to the backlight alone. It would be desirable to increase the efficiency and to reduce the thickness and complexity of a switchable display apparatus.

The operation of a direct directional display will now be described. A direct display is a display in which the pixel data is provided by the light emitters of the display, and does not comprise a separate light blocking spatial light modulator 112. By way of comparison with the embodiments of FIGS. 1A-17, pixel data is provided directly by the LEDs that are arranged in alignment with optical element arrays; rather than by pixels 303 of spatial light modulator 112.

Figure 16:
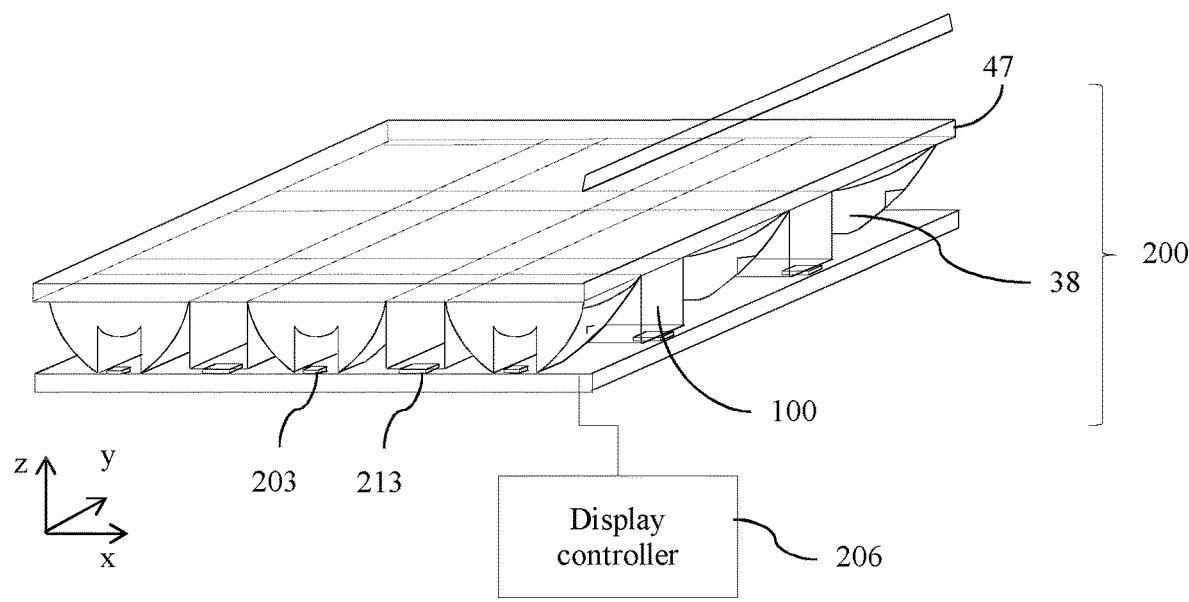
FIG. 16 is a schematic diagram illustrating in side perspective view a switchable directional display apparatus comprising a two dimensional array of catadioptric optical elements and an array of light guides, in accordance with the present disclosure.
Figure 17:
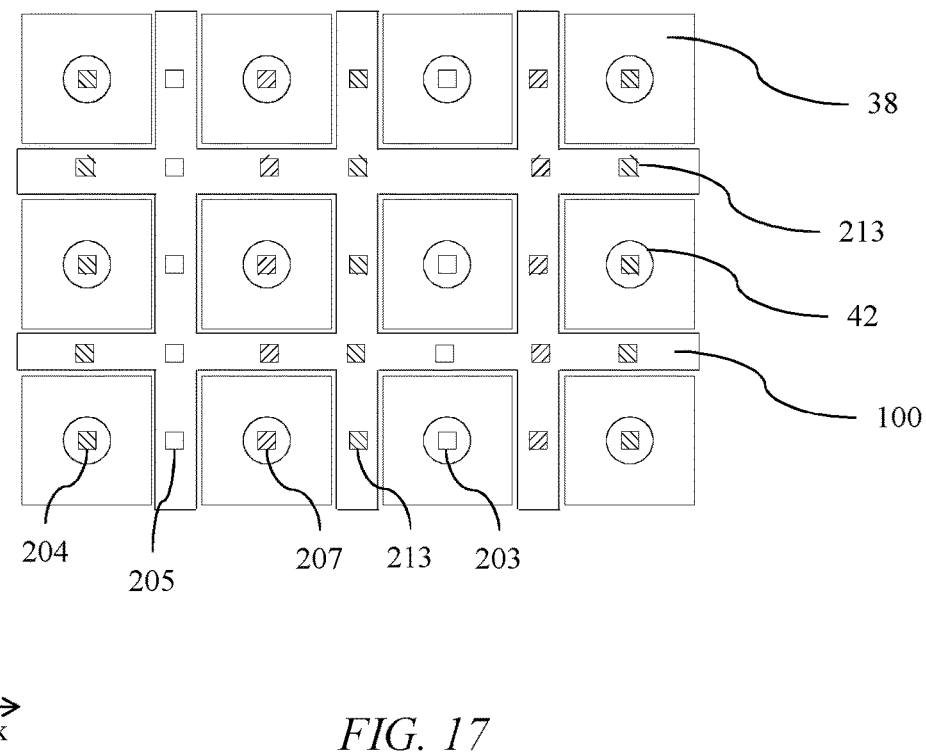
FIG. 17 is a schematic diagram illustrating in top view an arrangement of LEDs, catadioptric optical elements and light guides of FIG. 16, in accordance with the present disclosure.

FIG. 16 is a schematic diagram illustrating in side perspective view a switchable directional direct display apparatus 200 comprising a two dimensional array of catadioptric optical elements 38 and a plurality of light guides 100. Pixel micro-LEDs 203 and pixel LEDs 210 (that may be pixel micro-LEDs) are aligned with catadioptric optical elements 38 and light guides 100 respectively. FIG. 17 is a schematic diagram illustrating in top view an arrangement of LEDs, catadioptric optical elements 38 and light guides 100 of FIG. 16.

Thus a direct display apparatus may comprise a switchable illumination apparatus of embodiments described previously wherein control circuitry 206 further comprises means to drive the first and second pluralities of LEDs, that are pixel LEDs 203, 213 respectively, with image pixel data.

The image resolution of a direct display apparatus 200 may be determined by the pitch of the catadioptric optical elements 38. It would be desirable to provide high image resolution with switchable directionality. Referring again to FIG. 2F, in the at least one catadioptric cross-sectional plane of the catadioptric optical elements 38, the distance 714 between the first and second outer surfaces 46a, 46b at the second end 708 of the catadioptric optical element 38 may be less than 0.5 mm, preferably less than 0.25 mm and more preferably less than 0.1 mm. The width of the pixel micro-LEDs 203 may be less than 100 micrometres, preferably less than 50 micrometres, and more preferably less than 25 micrometres. The solid angle 181 of the narrow directional light output distribution 120 may be wider than that can be achieved in environmental apparatus for example, thus the ratio of catadioptric optical element 38 width 714 to pixel LED 203 width may be reduced, providing a larger pixel LED 203 width for a given display resolution. Advantageously high direct display resolution may be provided using pixel micro-LEDs 203 of larger minimum size, reducing manufacturing complexity and cost.

By way of comparison with the backlight apparatus of FIG. 1A, the pixel LEDs 203, 103 may each have a spectral output that is tuned for either red 204, green 205 or blue 207 colour appearance. Colour pixels (not shown) may additionally be provided such as yellow or cyan to expand the colour space further.

The light emitting element may formed from blue emitting elements such as gallium nitride semiconductor elements or from direct red or green emitting semiconductor materials. The elements may further be provided with colour conversion materials such as phosphors or quantum dot materials to provide colour conversion into the desired colour band.

The pixel LEDs 203, 213 may be provided in columns or rows or in other tessellations to provide desirable image fidelity. As illustrated in FIG. 1C the catadioptric optical elements 38 may be provided with hexagonal rather than square packing.

It would be desirable to increase the efficiency of a switchable landscape-portrait directional display apparatus and further to provide a switchable illumination apparatus.

Figure 18A:
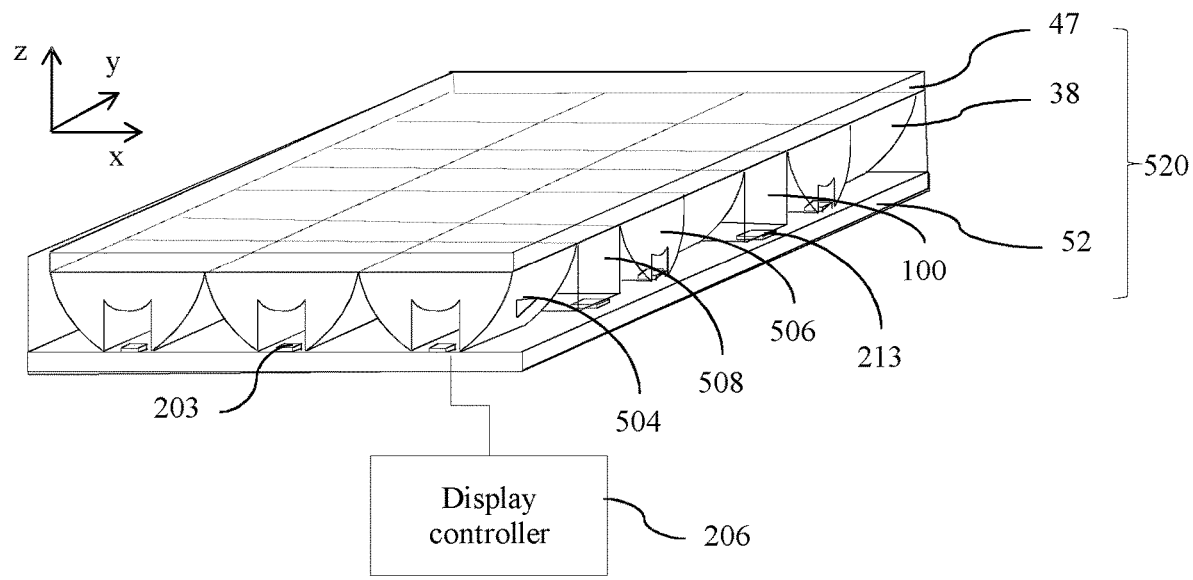
FIG. 18A is a schematic diagram illustrating in side perspective view a switchable directional display apparatus comprising first and second arrays of catadioptric optical elements and an array of light guides arranged to provide first and second narrow directional light output distributions and a third wide distribution, in accordance with the present disclosure.
Figure 18B:
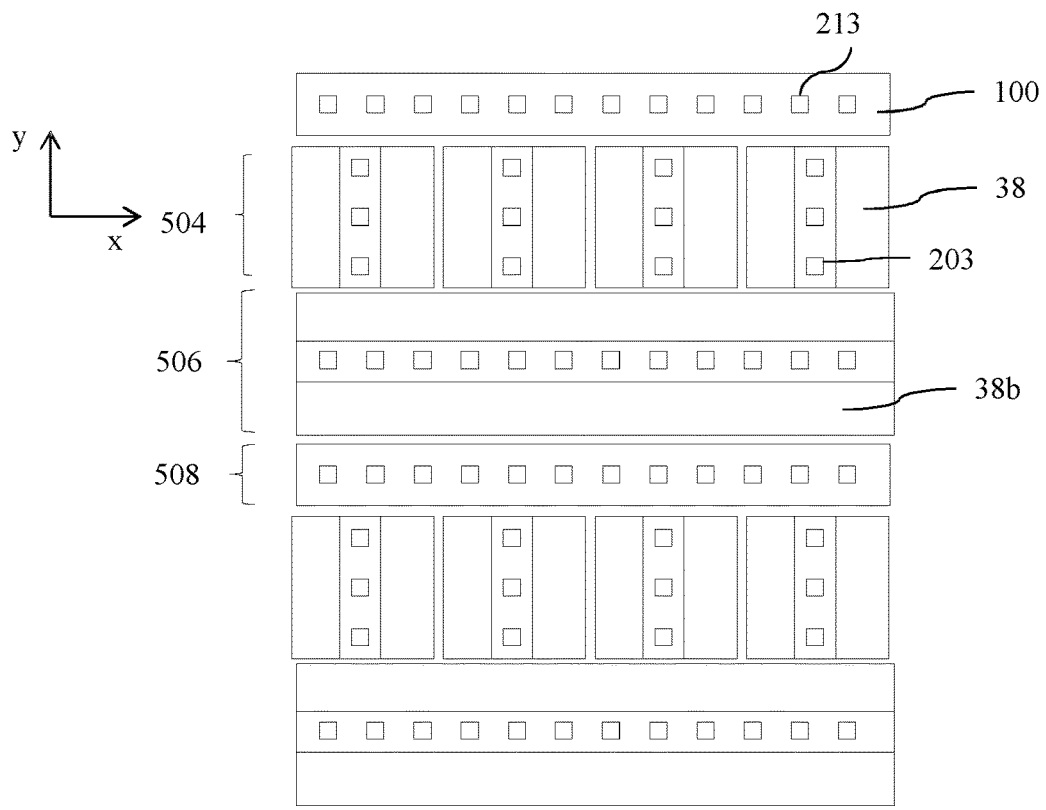
FIG. 18B is a schematic diagram illustrating in top view an array of LEDs and aligned catadioptric elements of FIG. 18A, in accordance with the present disclosure.

FIG. 18A is a schematic diagram illustrating in side perspective view a switchable directional display apparatus comprising first and second arrays of catadioptric optical elements 504, 506 and a plurality of light guides 100 arranged to provide first and second narrow directional light output distributions 124, 524 and a wide angle distribution 122. FIG. 18B is a schematic diagram illustrating in top view a plurality of LEDs and aligned catadioptric elements of FIG. 18A.

Operation of the display is similar to the arrangement as will be described with reference to FIG. 47, with wide angle mode provided by light guides 100 in comparison to the light guides of FIG. 47 and as described elsewhere herein.

Advantageously the light guides 100 may be arranged on the substrate 47 and thus the assembly method may have reduced complexity compared to that described in FIGS. 41A-D, below.

It would be desirable to address an array of micro-LEDs 3 in an efficient way. It would also be desirable to address the wide angle and the privacy micro-LEDs 3 with a reduced number of column electrode 800 and row electrodes 802.

Figure 19A:
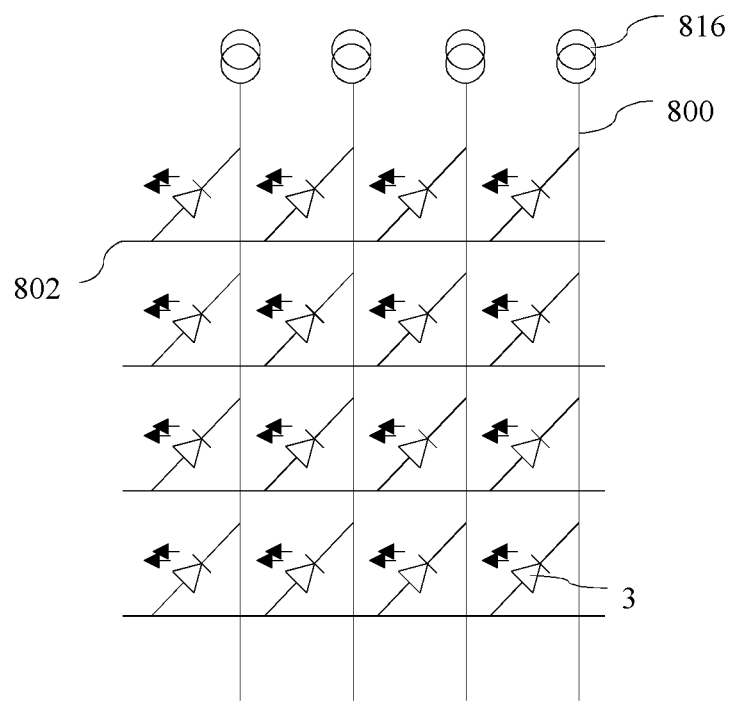
FIGS. 19A-19E are schematic diagrams illustrating an addressing system for the plurality of LEDs, in accordance with the present disclosure.

FIG. 19A is a schematic diagram illustrating an addressing system for the plurality of LEDs. The electrodes 8 of each of the micro-LEDs 3 of the plurality micro-LEDs 3 are respectively connected to one column addressing electrode 800 and one row addressing electrode 802 to form a matrix. The electrodes 8 of the micro-LEDs 3 are termed the anode and the cathode respectively. The anode potential is preferably greater than the cathode potential by the forward voltage drop (Vf) of the micro-LED so the micro-LED 3 is preferably forward biased. In this embodiment an array of current sources 816 is used to drive the addressing electrodes 800. The voltage on each of the row electrodes 802 is pulsed in sequence to scan or address the array of micro-LEDs 3. A current source 816 may be provided for each column electrode 800 or may be time multiplexed (shared) amongst a set of column electrodes 700. The micro-LEDs 3 have a relatively sharp voltage vs. current curve and can be operated with very short pulses without cross-talk between them. The array of micro-LEDs 3 forms an addressable backlight or a display without the need for additional active components such as TFTs or integrated circuits at each pixel. Advantageously the addressing matrix is simple and low cost.

Figure 19B:
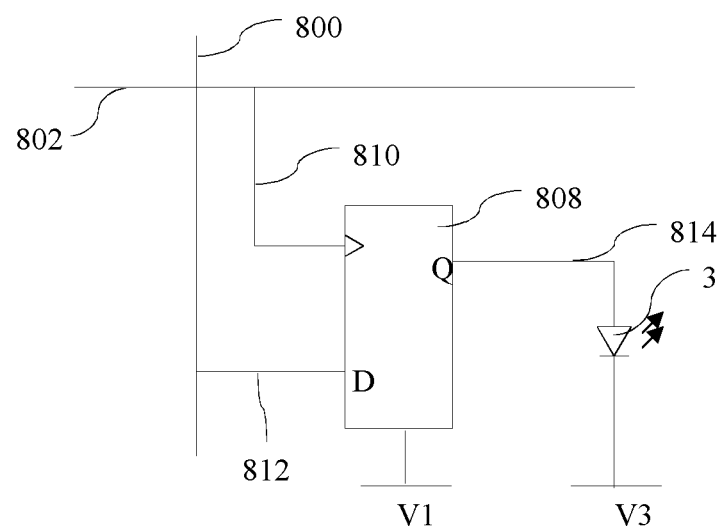

FIG. 19B is a schematic diagram illustrating another addressing embodiment for the plurality of LEDs. The micro-LEDs 3 of the plurality micro-LEDs 3 are addressed by column addressing electrodes 800 and row addressing electrodes 802 to form a 1 dimensional or 2-dimensional matrix. For clarity only one micro-LED 3 and one column electrode 800 and one row electrode 802 of the matrix is shown. FIG. 19B differs from FIG. 19A in that each micro-LED 3 has associated with it an integrated circuit 808 which includes a storage or memory or latching function. The integrated circuit 808 may be an analog or digital circuit and may be embodied as a separate chip deposited as described in U.S. Pat. No. 8,985,810 or may be embodied with thin film transistors (TFTs). The integrated circuit 808 may be provided with one or more additional supply potentials V1, V2 (only V1 shown). When the row electrode 802 is pulsed the clock input 810 of integrated circuit 808 stores the column electrode 800 voltage connected to the Data input 812. The output 814 of the integrated circuit 808 drives the micro-LED 3. The other end of the micro LED is connected to supply potential V3. The integrated circuit 808 may include a voltage to current converter. The potential V3 and anode and cathode connections of the micro-LED 3 may be altered so that the micro-LED is forward biased and emits light. The integrated circuit 808 provides drive to the micro-LED 3 for longer than the duration of the addressing pulse on row electrode 802 and the peak current drive to the micro-LEDs 3 is reduced. Advantageously the peak current in each micro-LED 3 may be reduced.

Figure 19C:
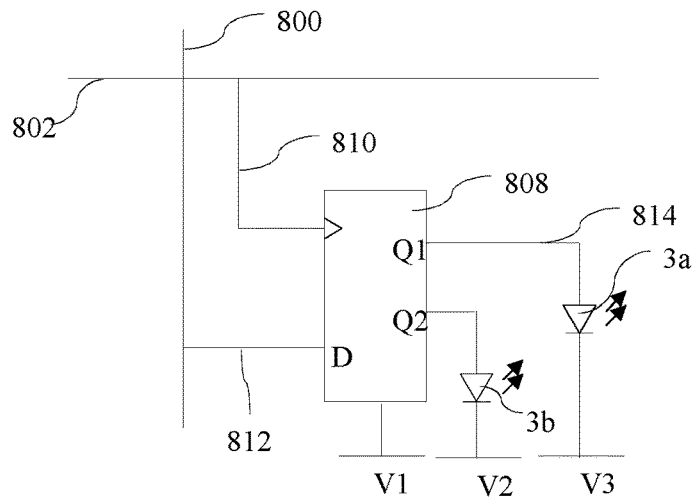

FIG. 19C is a schematic diagram illustrating another addressing system for the plurality of LEDs.

The control circuitry comprises at each row electrode 802 and column electrode 800 electrode intersection, a data value store 808 for providing at least two data values wherein one of the at least two data values is supplied to at least one LED 3a of the first plurality of LEDs and one other of the at least two data values is supplied to at least one LED 3b of the second plurality of LEDs. The micro-LEDs 3 of the plurality micro-LEDs 3 are addressed by column addressing electrodes 800 and row addressing electrodes 802 to form a 1 dimensional or 2-dimensional matrix. FIG. 19C differs from FIG. 19B in that one integrated circuit store 808 may store the values for more than one micro-LED 3. In this case two are illustrated. When the row electrode 802 is pulsed the first time, the clock input 810 of integrated circuit store 808 stores the column electrode 800 voltage connected to the Data input 812 which drives the output Q1. When the row electrode 802 is pulsed the next time, the clock input 810 of integrated circuit store 808 stores the column electrode 800 voltage connected to the Data input 812, which now drives the output Q2. The addressing process is then repeated so that the whole display is addressed sequentially with odd and even fields. The micro-LEDs 3 potentials V2 and V3 may be the same or may different for example when the micro-LEDs 3 are embodied from different technologies such as organic LED (OLED) and inorganic LED, or for micro-LEDs 3 of different colours for example RGB. In a further example Q1 may drive the micro-LEDs 3 for wide angle mode and Q2 may drive micro-LEDs 3 for privacy mode. The display matrix may be arranged to comprise integrated circuits 808 of more than one type. For example the types illustrated in FIG. 19A and FIG. 19B may be arranged to drive 1 or 2 micro-LEDs 3. Advantageously fewer addressing electrodes 800, 802 are needed compared to that of FIG. 19A. The cost and complexity of the electrode arrangement and control system is reduced.

Figure 19D:
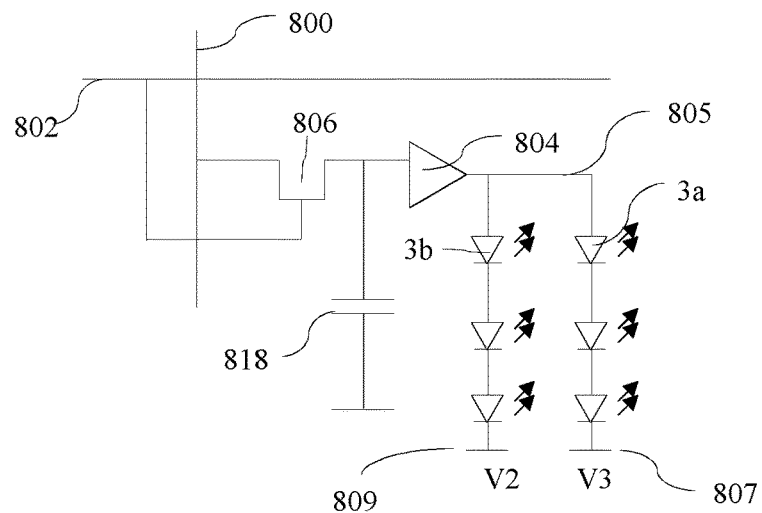

FIG. 19D is a schematic diagram illustrating another addressing embodiment for the plurality of LEDs. The control circuitry comprises at each row electrode 802 and column electrode 800 electrode intersection, an electrode 805 connected to an LED 3a of the first plurality of LEDs and to an LED 3b of the second plurality of LEDs; and further comprises first and second control electrodes 807, 809 connected to the respective first and second pluralities of LEDs; wherein the control electrodes 807, 809 are connected to a plurality of electrode intersections.

The micro-LEDs 3 of the plurality micro-LEDs 3 are addressed by column addressing electrodes 800 and row addressing electrodes 802 to form a 1 dimensional or 2-dimensional matrix or array. In this embodiment row electrodes 802 is connected to the gate of TFT 806 and when the row addressing electrode 802 is pulsed, the data from column addressing electrode 800 is stored on capacitor 818. Capacitor 818 may be small compared to that typically used in a matrix to drive an LCD panel, and may be provided by the input capacitance of amplifier 804. The amplifier 804 may drive one or more micro-LEDs 3. Amplifier 804 may be provided with 1 or more supply voltages (not shown). Amplifier 804 may include a voltage to current converter circuit. In this example two strings of 3 micro-LEDs 3 are illustrated. The micro-LEDs 3 potentials V2 and V3 may be the same or different and each potential may vary in phases synchronised with addressable image frames of the display or backlight. Control of the potentials V2 and V3 provides an option for the amplifier 804 to control and illuminate either or both strings of micro-LEDs 3 with the same data value. For example, if the voltage output from amplifier 804 is not greater than voltage V2 by the forward voltage drop (Vf) of the string of micro-LEDs 3 connected, then the micro-LEDs 3 will not illuminate. Therefore one string, for example connected to V2 may for example be privacy micro-LEDs 3 and the other string connected to V3 may be wide angle micro-LEDs 3 and by control of V2 and V3 one or both strings of micro-LEDs 3 can be controlled. V2 may be a common electrode for many micro-LEDs 3 at their respective intersection of row electrode 802 and column electrode 800. Similarly V3 may be an independent common electrode for many micro-LEDs 3 at their respective intersection of row electrode 802 and column electrode 800. Therefore control of potential of V2 and V3 may globally control which set of LEDs is illuminated with the data supplied by means of the addressing electrodes 800, 802.

Advantageously fewer addressing electrodes 800, 802 are needed compared to that of FIG. 19A. Further a data store is not provided at the intersection, multiple addressing cycles are not used. The cost and complexity of the electrode arrangement and control system is reduced.

It would be desirable to provide some resilience of the display or backlight to failure of individual micro-LEDs 3. The failure may be an open circuit which may be caused for example by misplacement in manufacture, or may be a short circuit for example from damaged electrode wiring.

Figure 19E:
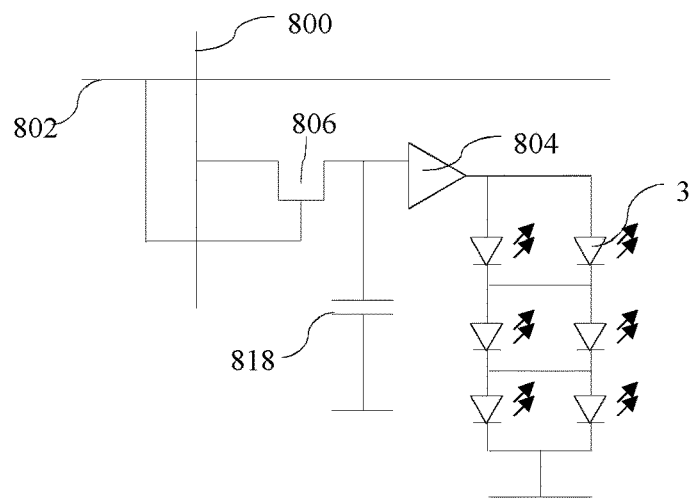

FIG. 19E is a schematic diagram illustrating another addressing system for the plurality of LEDs. The micro-LEDs 3 of the plurality micro-LEDs 3 are addressed by column addressing electrodes 800 and row addressing electrodes 802 to form a 1 dimensional or 2-dimensional matrix. In this embodiment the micro-LEDs 3 are arranged in bridged strings. This configuration provides some immunity to individual micro-LED 3 being open circuit or short circuit. Advantageously the display or backlight can fault tolerant and more reliable.

Figure 20:
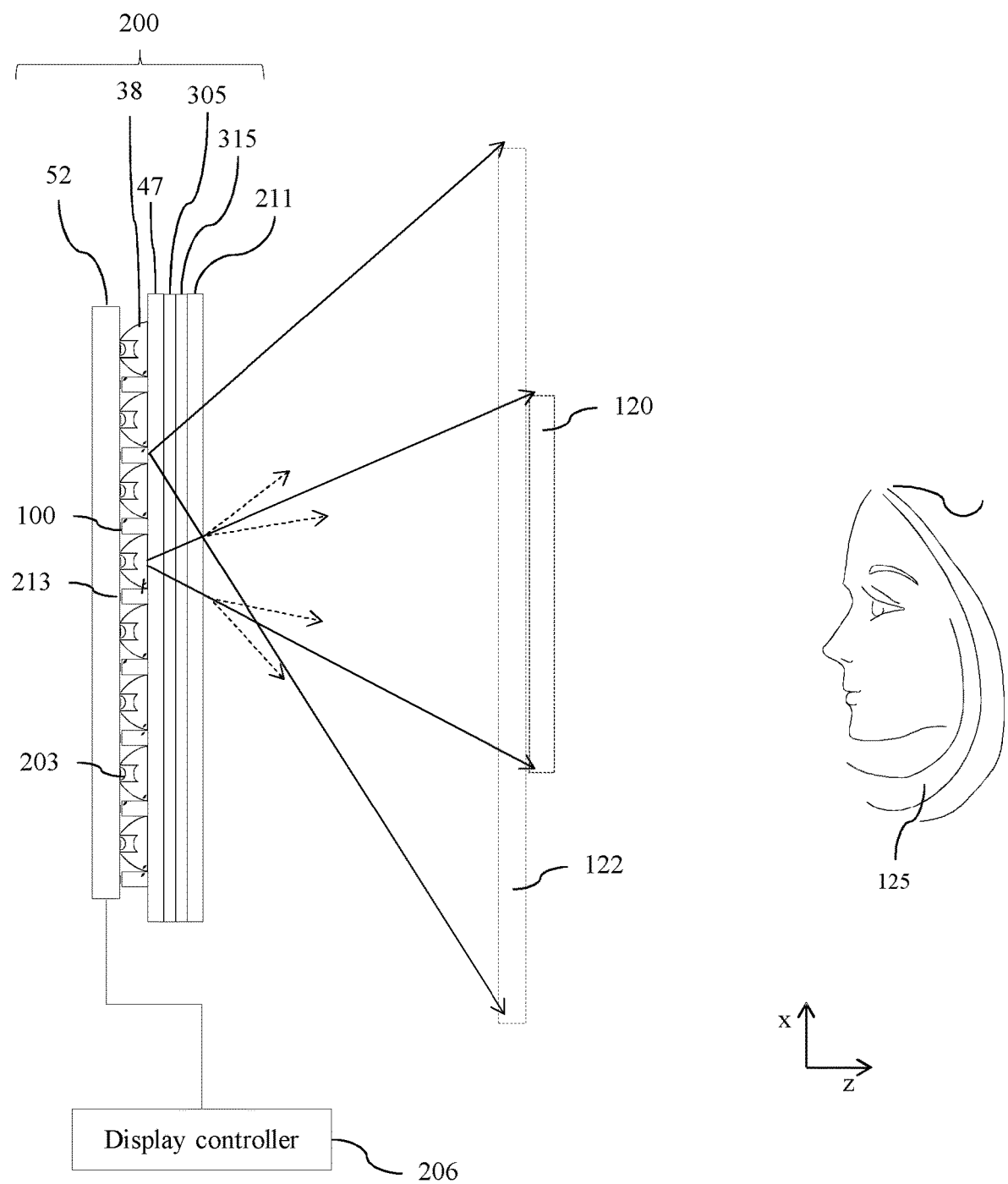
FIG. 20 is a schematic diagram illustrating in side view a switchable directional display, in accordance with the present disclosure.

FIG. 20 is a schematic diagram illustrating in side view a switchable directional direct display. The operation of the directional display is similar to that described for FIG. 2B, to provide switchable viewing windows 120, 122 from catadioptric optical element array 38 and light guide 100 respectively. Diffuser element 211 may be provided on the front surface of the transparent substrate 47 so as to provide angular diffusion of the viewing windows, producing smoother and/or wider roll-off in narrow angle mode than may be achieved by the catadioptric optical elements 38.

In operation, ambient light sources may reflect from optical components in the display structure, undesirably reducing display contrast. Polariser 315 and retarder 305 layers may further be provided to reduce frontal reflections by providing optical isolation to ambient light. Ambient light that is transmitted by polariser 315 may have its polarisation state modified such that ambient light that is reflected from optical components such as catadioptric optical elements 38, light guides 100 and backplane 52 is absorbed in polariser 315. Retarder 305 may for example comprise a quarter waveplate or other retarders or retarder stacks. Advantageously the visibility of frontal reflections may be reduced and display contrast improved.

In operation, the LEDs 203 of the first plurality of LEDs are arranged to provide a first plurality of image pixels with the first directional light output distribution 120 and the LEDs 213 of the second plurality of LEDs are arranged to provide the first plurality of image pixels with the second directional light output distribution 122.

Diffusers or wider pixel LEDs may additionally be provided to increase the cone angle of the narrow angle directional mode.

Advantageously a high resolution switchable directional direct display may be provided. In comparison to the directional display of FIG. 1A, the thickness of the display may be substantially reduced.

Further a spatial light modulator 112 such as an LCD in FIG. 1A may have a transmission efficiency of less than 10% and more typically less than 5%. By way of comparison, the efficiency and luminance of the direct display 200 of FIG. 20 may be advantageously between ten and twenty times greater than the efficiency and luminance of the backlit display of FIG. 1A.

It may be desirable to provide a one dimensional narrow directional light output distribution for a switchable directional direct display.

Figure 21:
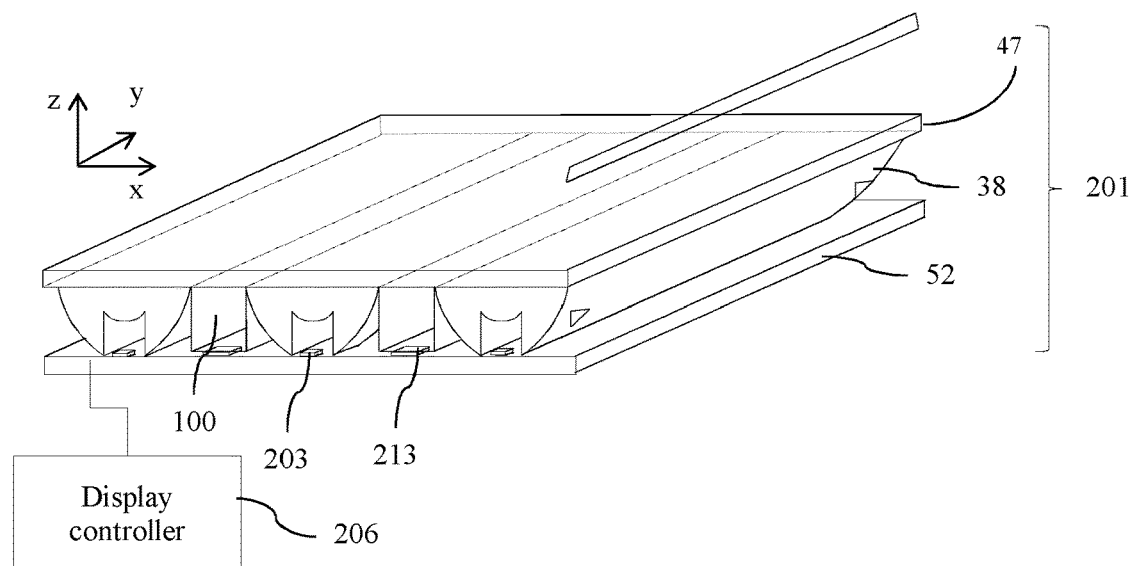
FIG. 21 is a schematic diagram illustrating in side perspective view a switchable directional direct display apparatus comprising a one dimensional array of catadioptric optical elements and a one dimensional array of light guides, in accordance with the present disclosure.

FIG. 21 is a schematic diagram illustrating in side perspective view a switchable directional direct display apparatus comprising a one dimensional array of catadioptric optical elements and a one dimensional array of light guides. Thus the catadioptric optical elements and light guides are extended in the orthogonal direction (y axis) and are arrayed in the lateral direction (x-axis).

In comparison to the backlight of FIG. 7B, the gaps between the catadioptric optical elements 138 in the lateral direction can be increased as the apparatus is not arranged to provide uniform output to minimise image Moiré.

Advantageously, the LEDs may be arranged in vertical stripes, providing increased image fidelity for images with straight lines. Further the fabrication complexity of the arrays of optical elements 38, 100 is reduced.

By way of comparison, if the light guide arrangement of FIG. 9A were to be used in a display apparatus, then reflected light from wall 43 would result in an appearance of mixing of image data between adjacent rows of pixels, that may degrade image contrast. Advantageously the pixel arrangement of FIG. 21 provides increased image contrast.

Figure 22:
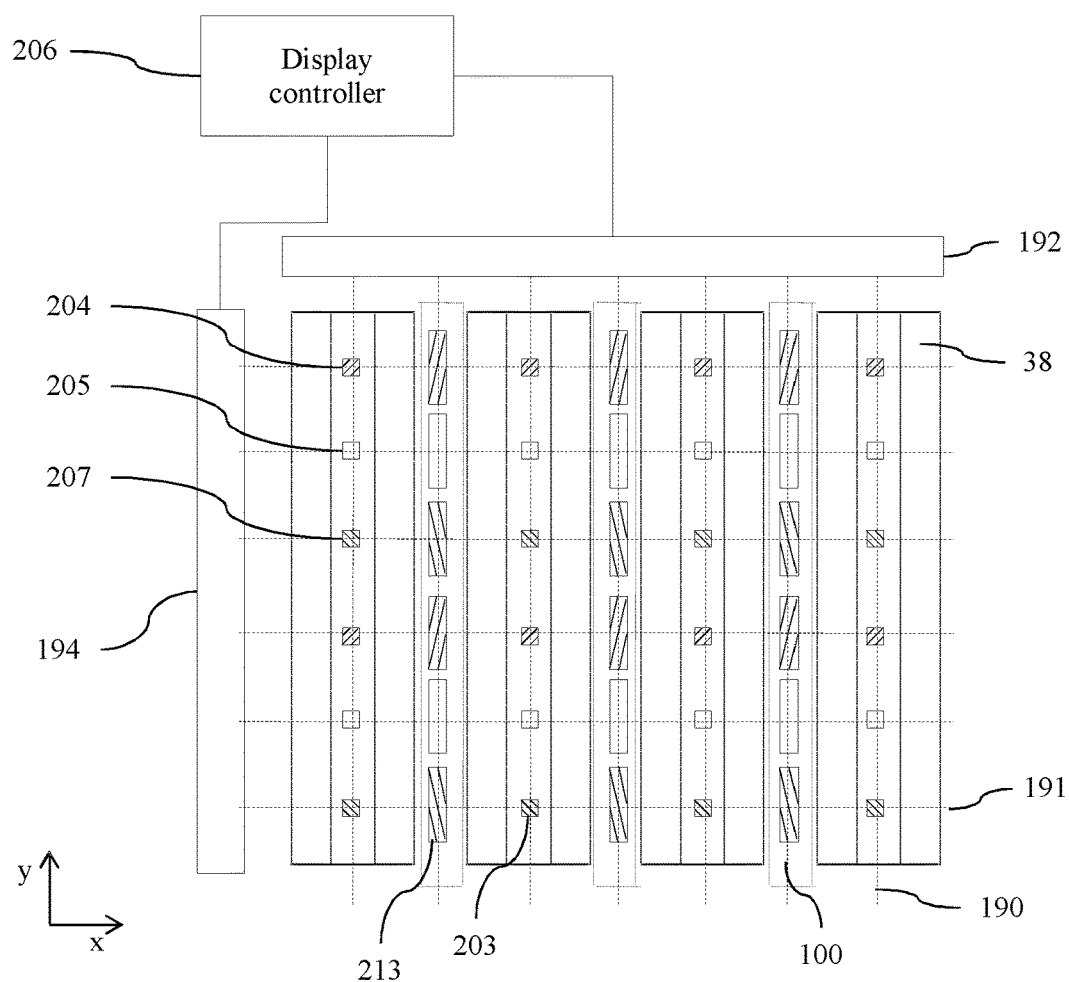
FIG. 22 is a schematic diagram illustrating in top view an arrangement of LEDs, catadioptric optical elements and light guides of FIG. 21, in accordance with the present disclosure.

FIG. 22 is a schematic diagram illustrating in top view an arrangement of LEDs, catadioptric optical elements and light guides of FIG. 21. Display controller 206 is arranged to provide both display data and directionality control through selection of luminous flux for pixel LEDs 203, 213 respectively by means of column driver 192 and row driver 194 and column and row electrodes 190, 191 respectively.

Figure 23:
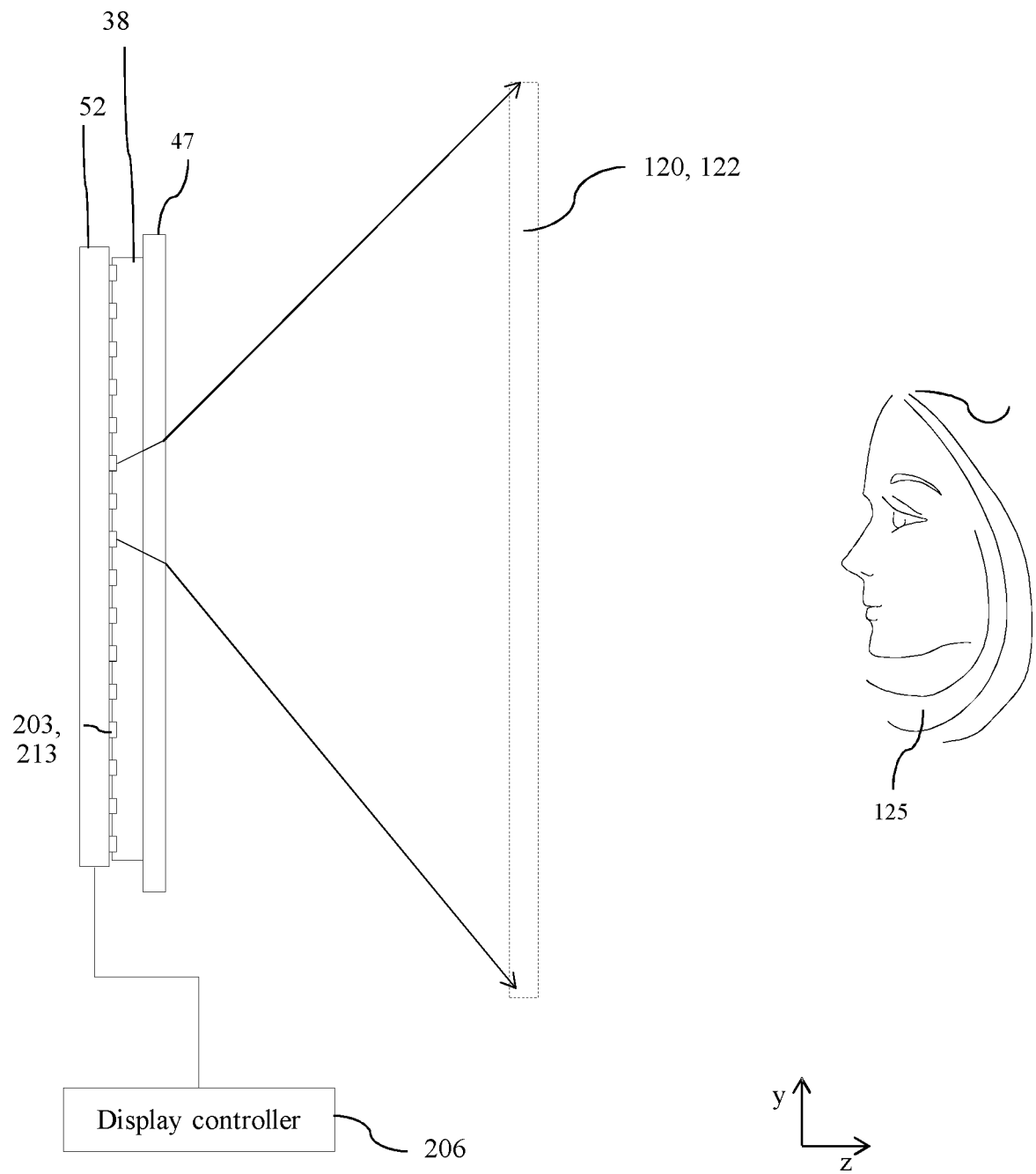
FIG. 23 is a schematic diagram illustrating in side view operation of the switchable directional display of FIG. 21 in both wide and narrow directional light output distributions, in accordance with the present disclosure.
Figure 24:
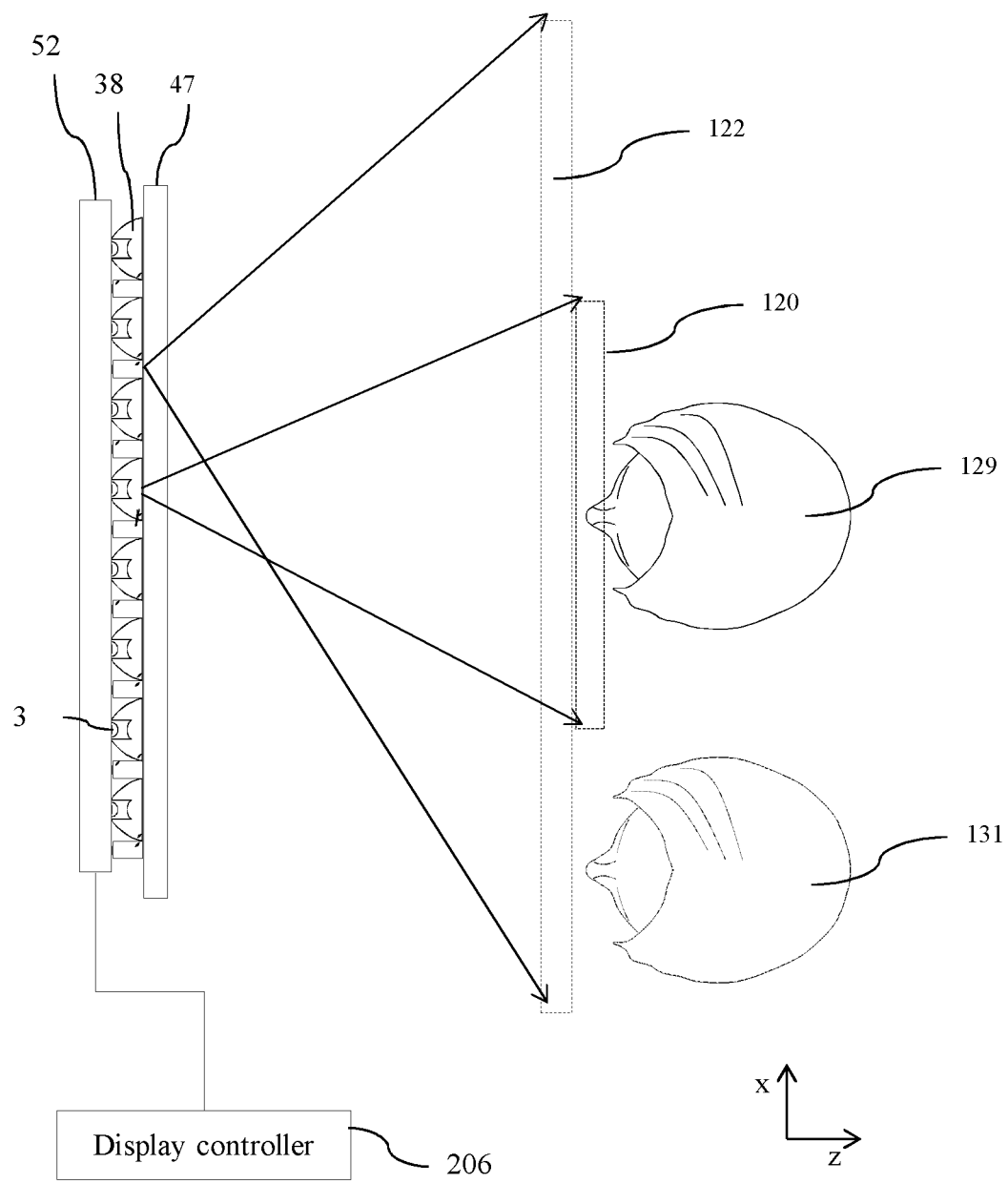
FIG. 24 is a schematic diagram illustrating in top view operation of the switchable directional display of FIG. 21 for wide and narrow directional light output distributions, in accordance with the present disclosure.

Advantageously the electrode arrangements have reduced complexity. The size and shape of pixels for the wide angle mode pixel micro-LEDs 203 may be greater FIG. 23 is a schematic diagram illustrating in side view directional light output distributions of the switchable directional direct display of FIG. 21 for both wide and narrow directional light output distributions; and FIG. 24 is a schematic diagram illustrating in top view operation of the switchable directional display of FIG. 21 for wide and narrow directional light output distributions. Light from both columns of pixel micro-LEDs 203, 213 is directed into a large vertical cone angle. Thus the directional light output distributions 120, 122 in the vertical direction may be the same when the illumination apparatus is provided in narrow angle and wide angle modes in the lateral direction. Advantageously the vertical viewing angle of the panel is large in orthogonal direction providing convenient rotation of the panel about the x axis for viewing comfort.

FIG. 24 further illustrates that the angular properties of the switchable directional direct display 200 may provide narrow and wide viewing windows for lateral movement of an observer.

Advantageously controllable directional illumination may be provided with high efficiency with low thickness.

It may be desirable to provide display shapes that are not conventionally rectangular, for example for use in wearable applications, automotive applications or other environments that may have design and functionality improved by irregular display formats.

Figure 25:
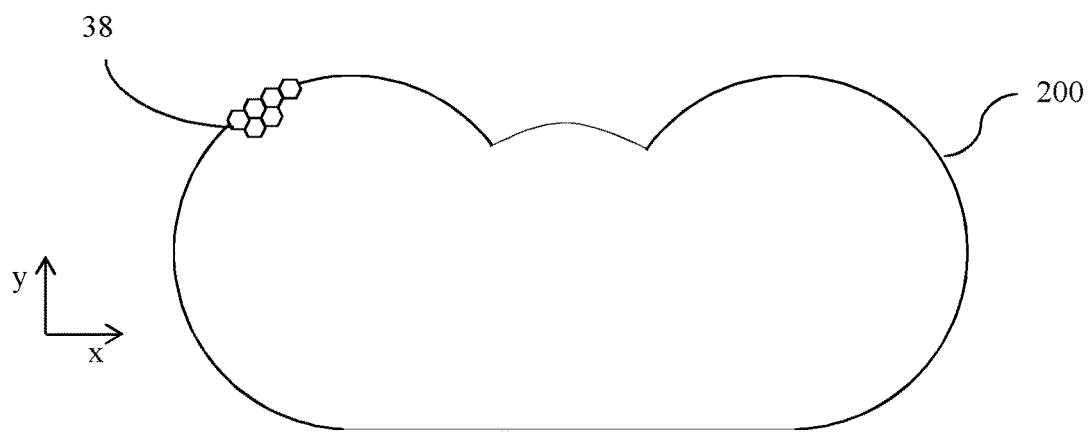
FIG. 25 is a schematic diagram illustrating in front view a free-form switchable directional display comprising a two dimensional catadioptric optical element array, in accordance with the present disclosure.
Figure 26:
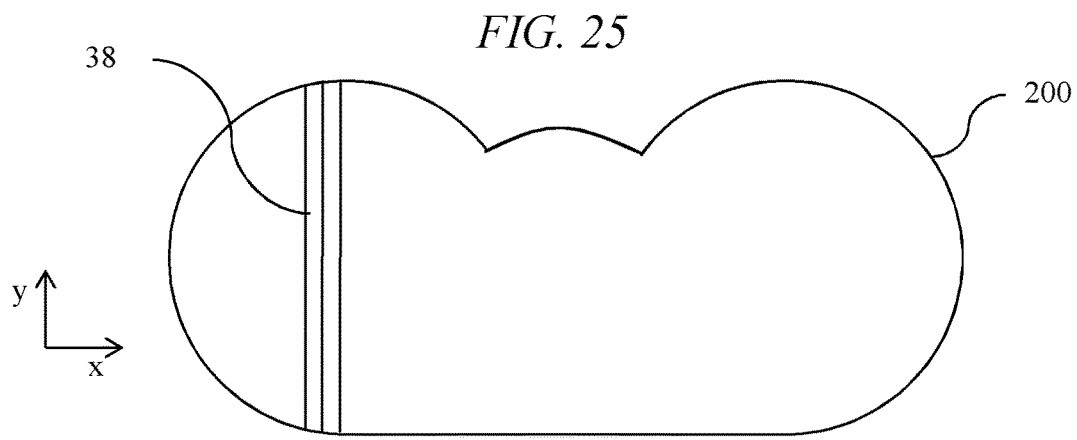
FIG. 26 is a schematic diagram illustrating in front view a free-form switchable directional display comprising a one dimensional catadioptric optical element array, in accordance with the present disclosure.
Figure 27:
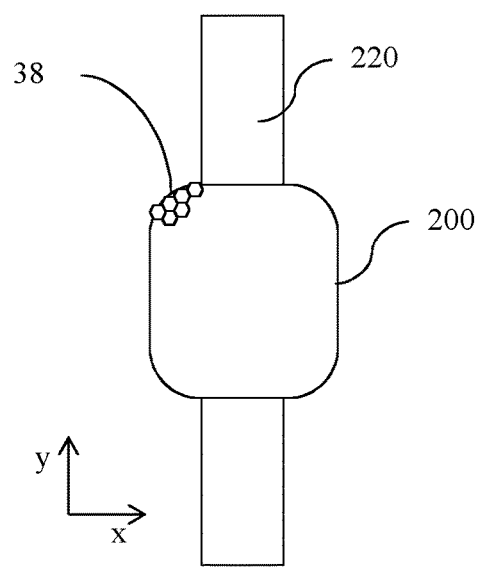
FIG. 27 is a schematic diagram illustrating in front view a wearable free-form switchable directional display comprising a two dimensional catadioptric optical element array, in accordance with the present disclosure.

FIG. 25 is a schematic diagram illustrating in front view a free-form switchable directional display comprising a two dimensional catadioptric optical element array; FIG. 26 is a schematic diagram illustrating in front view a free-form switchable directional display comprising a one dimensional catadioptric optical element array; and FIG. 27 is a schematic diagram illustrating in front view a wearable free-form switchable directional display comprising a two dimensional catadioptric optical element array.

Advantageously the switchable directional direct displays 200 and backlights 110 of the present embodiments may have non rectangular shapes and may be formed by means of extracting arrays from mothersheet manufactured elements and are thus well suited to non-standard form factors. Such manufacturing processes will be described below.

Figure 28:
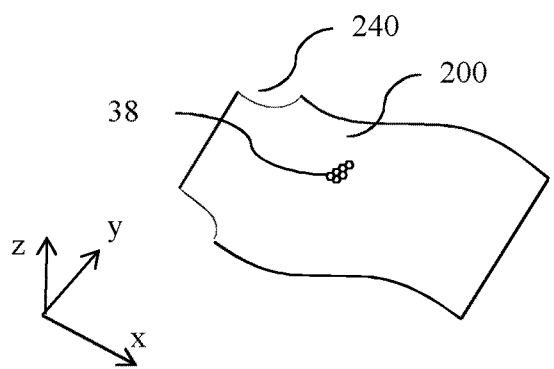
FIG. 28 is a schematic diagram illustrating in front view a flexible free-form switchable directional display comprising a two dimensional catadioptric optical element array, in accordance with the present disclosure.

FIG. 28 is a schematic diagram illustrating in front view a flexible free-form switchable directional display comprising a two dimensional catadioptric optical element array.

As will be described below, the switchable directional direct display 200 of the present embodiments, may be have low thickness and not contain liquid crystal materials. Further flexible materials may be used for backplane 52 and transparent substrate 47.

Advantageously switchable directional displays may be arranged to be flexible as well as free form shape for both backlight and direct display applications.

An environmental lighting apparatus that can be arranged to switch between a narrow angle and wide angle illumination will now be described.

Figure 29:
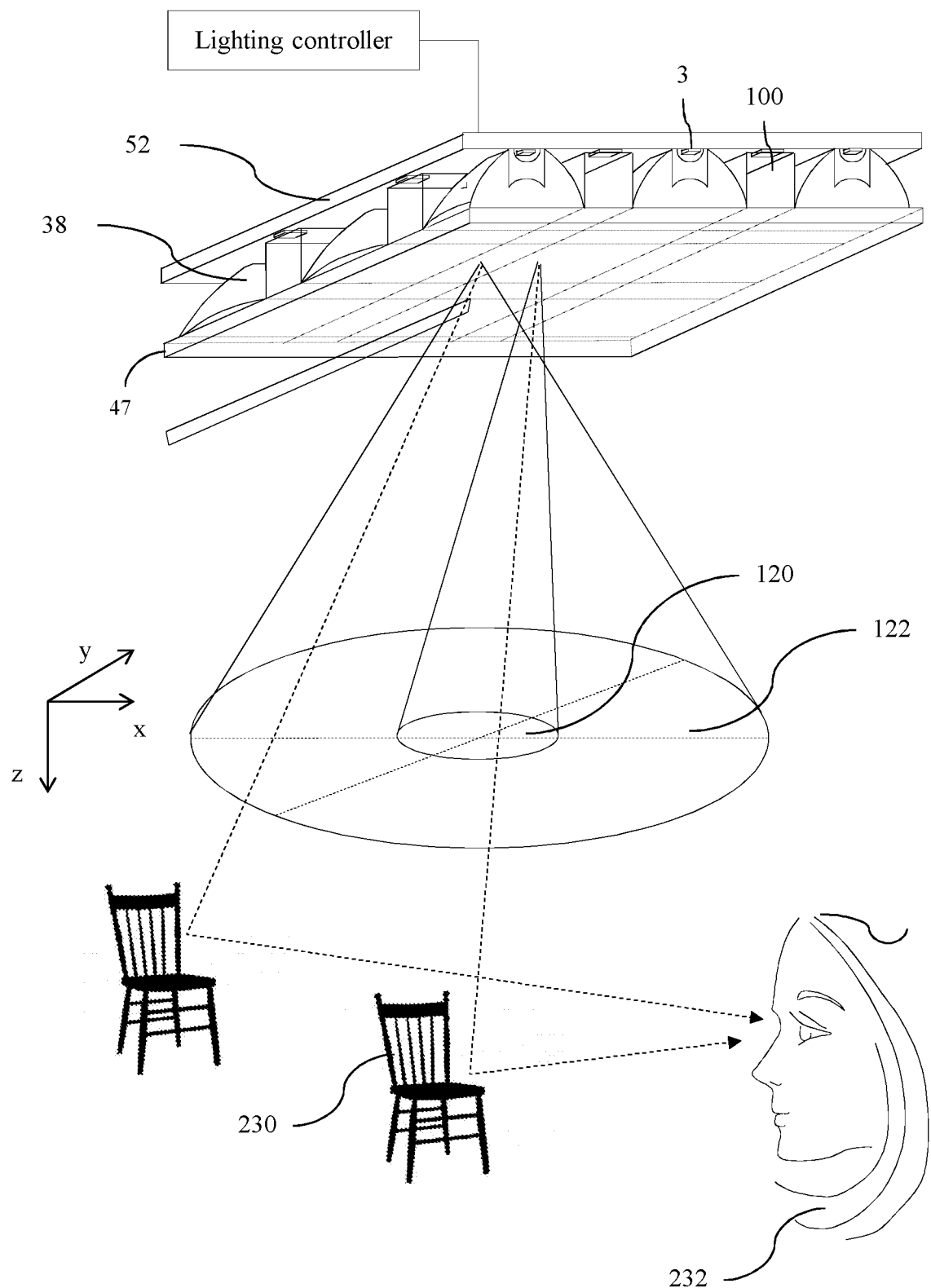
FIG. 29 is a schematic diagram illustrating in perspective view a switchable environmental lighting apparatus, in accordance with the present disclosure.

FIG. 29 is a schematic diagram illustrating in perspective view a switchable environmental lighting apparatus. The red, green and blue pixel micro-LEDs of FIG. 16 may be alternatively provided by white micro-LEDs 3, 103. In operation, a user may select a spotlight illumination mode with narrow directional light output distribution 122 to illuminate objects 230 in a narrow area or a diffuse illumination mode with wide directional light output distribution 122 to illuminate objects over a wider area, and change the nature of the illumination Mixing wide and narrow modes can provide tuning between the two modes. Further as described elsewhere herein the narrow mode may be controllable in one dimension. Advantageously users can adjust the illumination output of a luminaire.

In the present embodiments, the catadioptric optical elements 38 of the plurality of catadioptric optical elements comprise a material transparent to at least one operating wavelength of at least one element of the first plurality of micro-LEDs 3. Typically the catadioptric optical elements may be transparent in the visible spectrum.

The light guides 100 of the above embodiments reduce the fill factor of the catadioptric optical element array across the area of the backlight. Reduced fill factor may provide increased non-uniformities in a backlight application and reduces backlight or direct display resolution for a given light emitting element size. It would be desirable to increase the fill factor of catadioptric optical elements to increase backlight uniformity.

Figure 30:
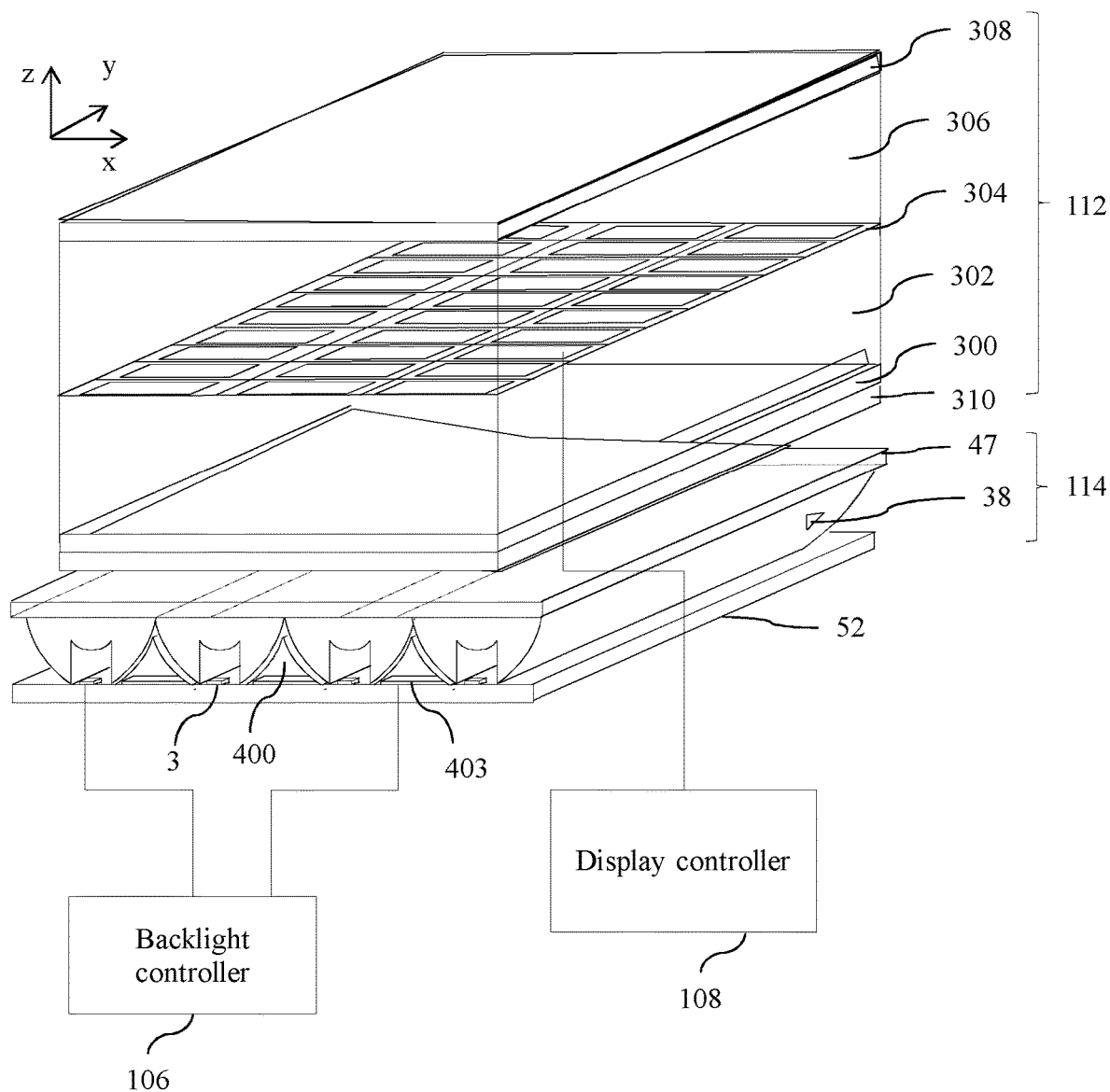
FIG. 30 is a schematic diagram illustrating in side perspective view a switchable directional display apparatus comprising a backlight with a one dimensional array of catadioptric optical elements and an array of light guides arranged to illuminate a spatial light modulator, in accordance with the present disclosure.

FIG. 30 is a schematic diagram illustrating in side perspective view a switchable directional display apparatus comprising a backlight 114 with a one dimensional array of catadioptric optical elements and a plurality of light guides 400 arranged to illuminate a spatial light modulator 112. LEDs 3, 403 are aligned with the catadioptric optical elements 38 and light guides 400 respectively.

Light guides 400 are arranged to direct light by refraction and total internal reflection. Light guides 400 are different from light guides 100 in that they are arranged to direct at least some light from the plurality of LEDs of the second plurality of LEDs into catadioptric optical elements 38. By way of comparison the light guides 100 are typically arranged to direct light between catadioptric optical elements 38. Both light guides direct at least some light by guiding that is typically total internal reflection at at least one surface of the light guide as will be described herein.

Figure 31:
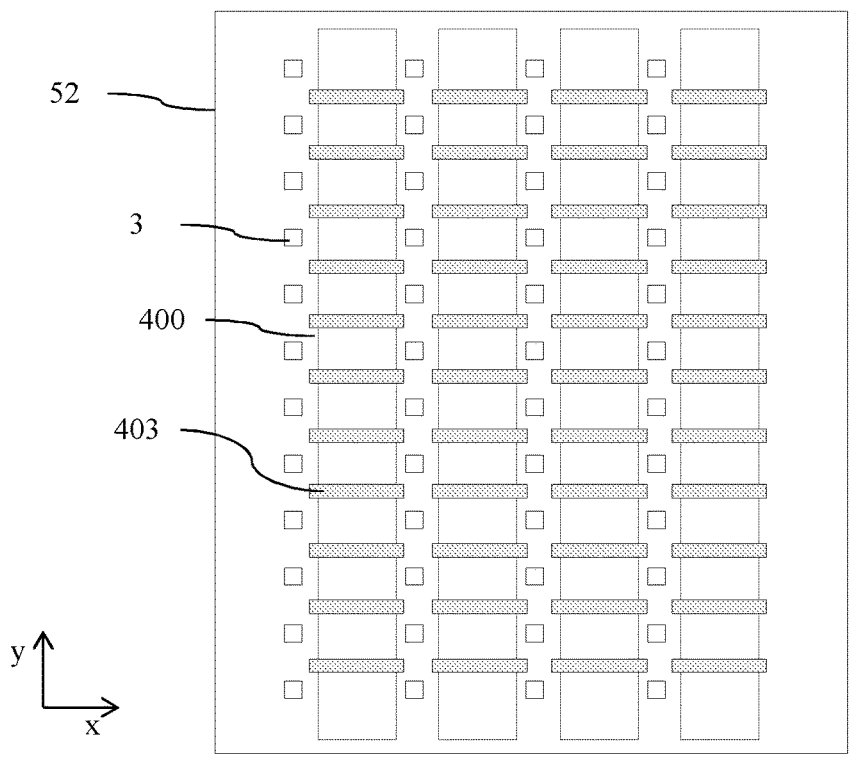
FIGS. 31-32 are schematic diagrams illustrating in top view an array of LEDs for the switchable directional display of FIG. 30, in accordance with the present disclosure.
Figure 32:
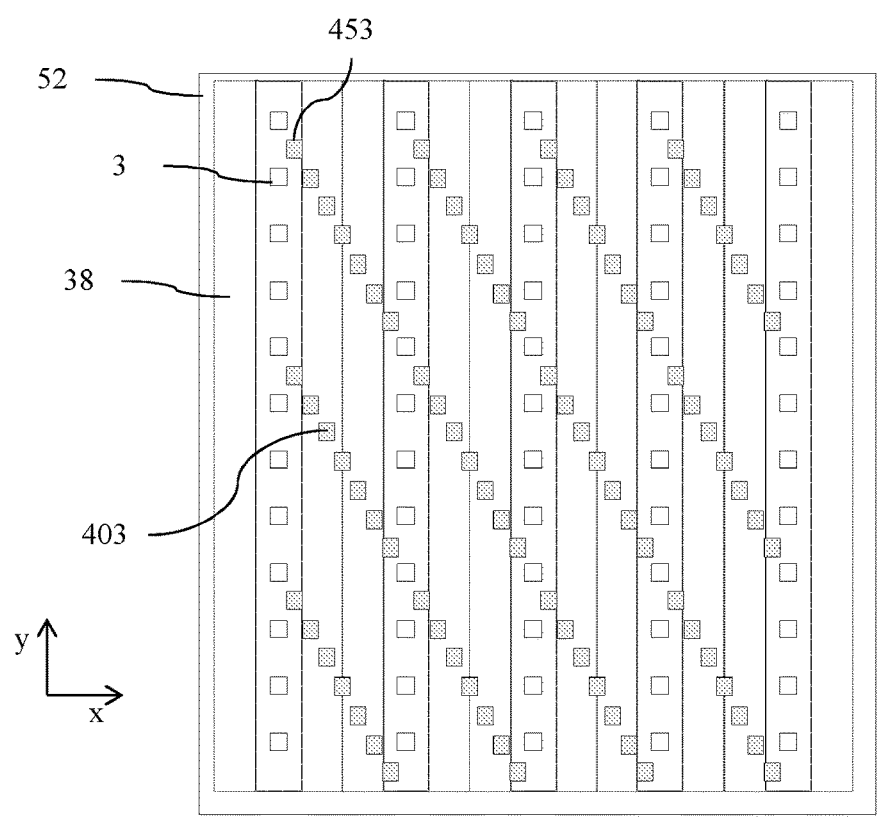

FIGS. 31-32 are schematic diagrams illustrating in top view a plurality of LEDs for the switchable directional display of FIG. 30. Backplane 52 may comprise first array of micro-LEDs 3 and second array of LEDs 403. Alignment with the light guides is shown. In FIG. 31, the LEDs 403 are provided as a single LED between each column of micro-LEDs 3. Such elements are arranged to substantially fill the area between the columns of micro-LEDs 3. FIG. 32 illustrates another embodiment wherein the LEDs 403 are arranged as staggered columns of pixels. Advantageously such an arrangement may provide more control of the luminance of the LEDs 403, to achieve control of the lateral directional light output distribution. Additionally LEDs 453 may be provided next to the micro-LEDs 3. Alternatively the LEDs 403 may extend to next to the micro-LEDs 3. Such arrangements may provide increased uniformity as will be described below.

Figure 33A:
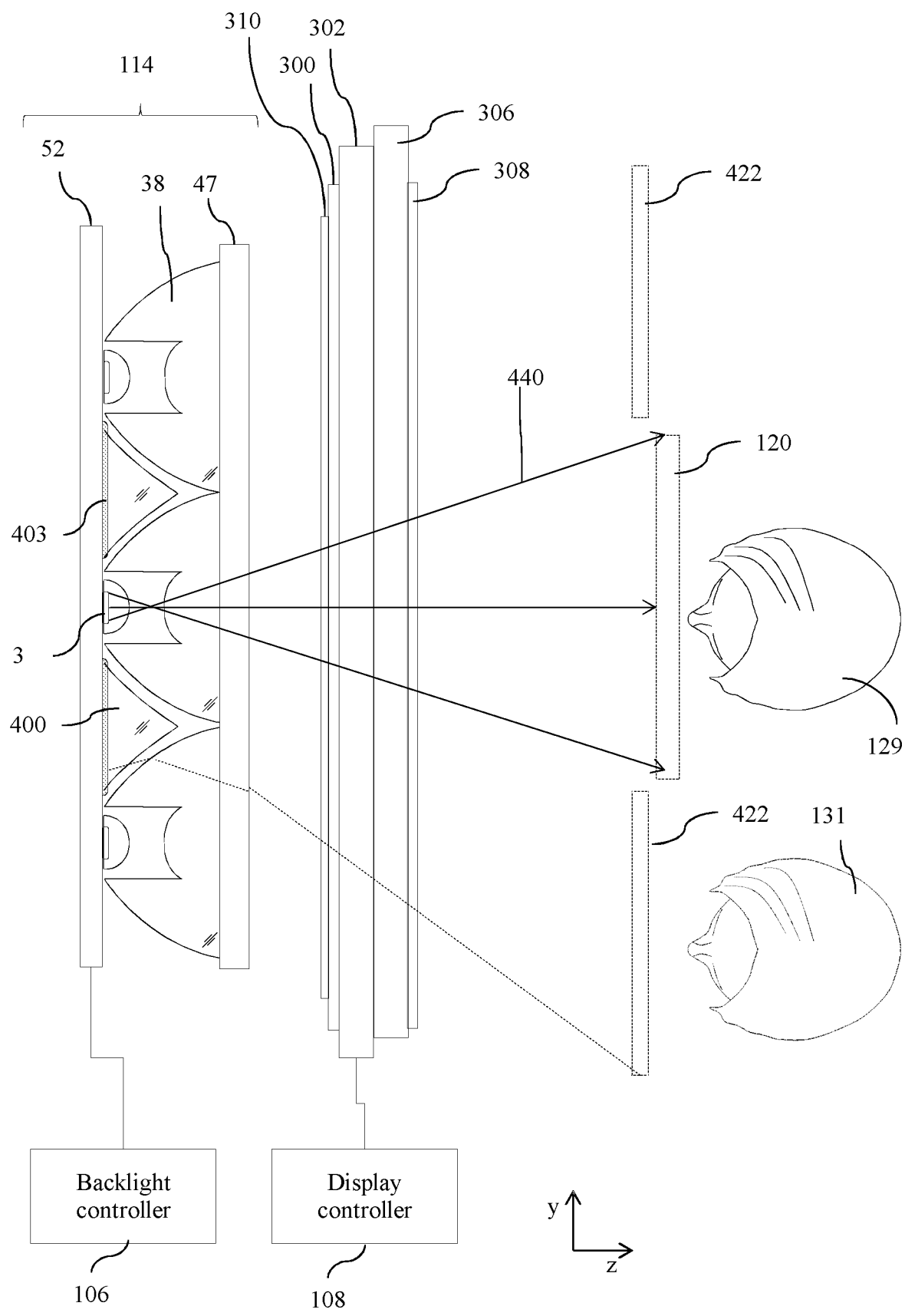
FIG. 33A is a schematic diagram illustrating in top view a switchable backlight apparatus, in accordance with the present disclosure.

FIG. 33A is a schematic diagram illustrating in top view a switchable backlight apparatus. Light rays 440 from LEDs are directed to first viewing window 420, whereas light windows 422 are provided by light from LEDs 403 as will be described below.

In comparison to the arrangement of FIG. 2B for example the viewing windows 120, 422 do not overlap substantially, however together they may provide a wide viewing freedom.

Figure 33B:
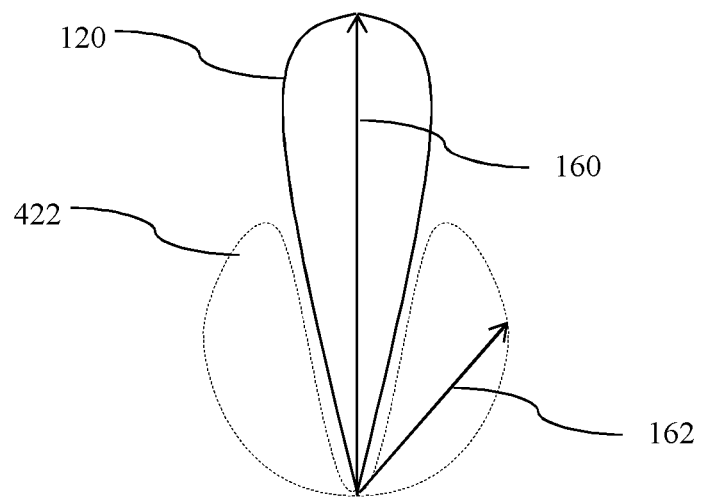
FIG. 33B is a schematic diagram illustrating directional light output distributions from a switchable directional display, in accordance with the present disclosure.

FIG. 33B is a schematic diagram illustrating directional light output distributions from a switchable directional display. Thus viewing window 120 is formed by micro-LEDs 3 and viewing windows 422 are formed by LEDs 403 and do not substantially overlap.

Figure 34:
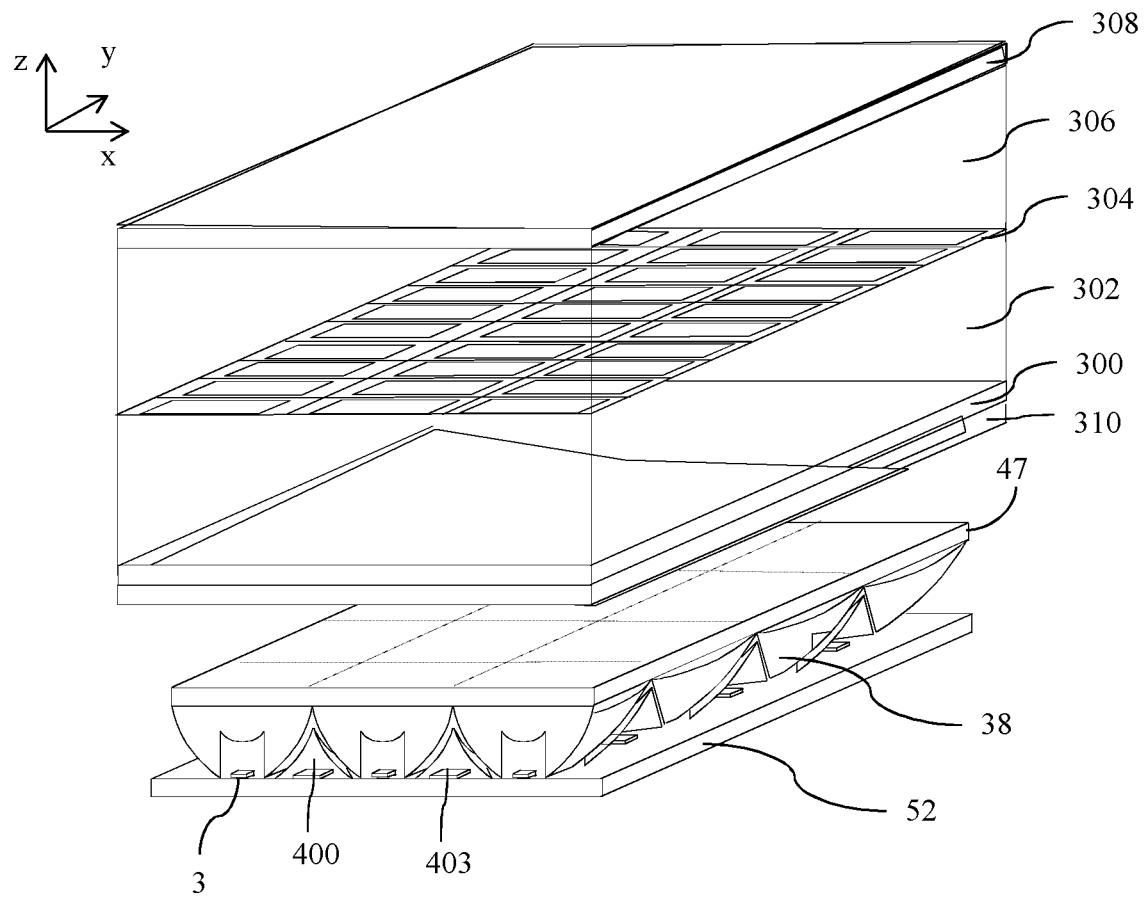
FIG. 34 is a schematic diagram illustrating in side perspective view a switchable directional display apparatus comprising a backlight with a two dimensional array of catadioptric optical elements and a two dimensional array of light guides arranged to illuminate a spatial light modulator, in accordance with the present disclosure.

FIG. 34 is a schematic diagram illustrating in side perspective view a switchable directional display apparatus comprising a backlight with a two dimensional array of catadioptric optical elements and a two dimensional array of light guides arranged to illuminate a spatial light modulator. The operation of the display may be similar to that illustrated in one dimension in FIG. 33A, however two dimensional viewing window control is achieved.

Two dimensional viewing window control may advantageously achieve increased light efficiency and reduced power consumption.

Figure 35A:
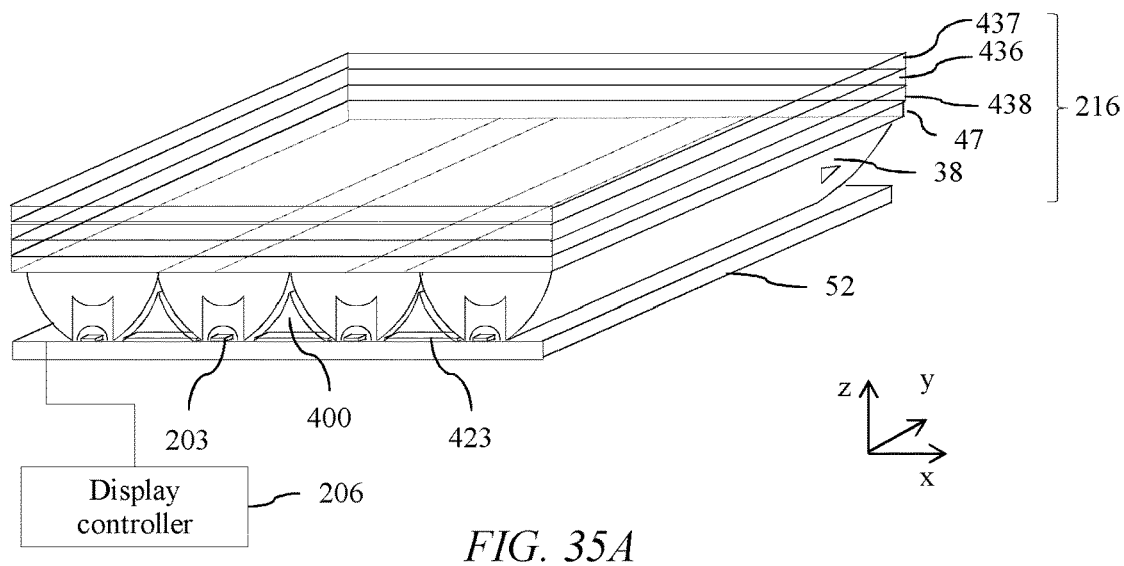
FIG. 35A is a schematic diagram illustrating in side perspective view a switchable directional display apparatus comprising a one dimensional array of catadioptric optical elements and a one dimensional array of light guides, in accordance with the present disclosure.
Figure 35B:
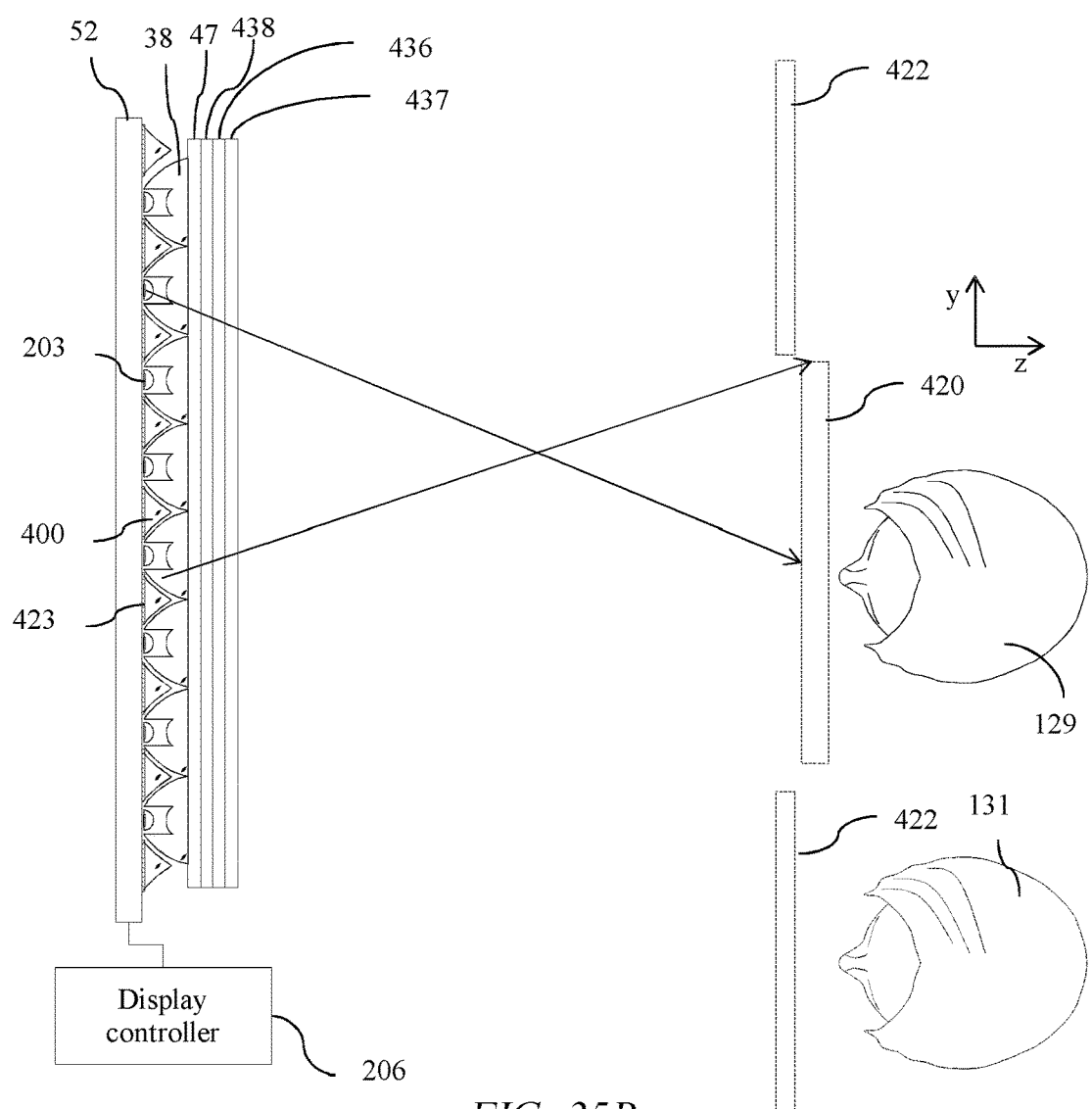
FIG. 35B is a schematic diagram illustrating in top view operation of the switchable directional display of FIG. 35A, in accordance with the present disclosure.

FIG. 35A is a schematic diagram illustrating in side perspective view a switchable directional display apparatus comprising a two dimensional array of catadioptric optical elements 38 and a one dimensional array of light guides 400, and FIG. 35B is a schematic diagram illustrating in top view operation of the switchable directional displays of FIG. 35A. Thus a switchable directional direct display 216 may be provided wherein pixel LEDs 203, 423 are aligned with catadioptric optical elements 38 and light guides 400 respectively. The display may include further layers to reduce reflection from the surface of the display as is known in the art, for example linear polariser 436 and retarder 438 may be provided in addition to output diffuser 437. Polariser 436 and retarder 438 that may be a quarter wave retarder or half wave retarder for example may be arranged to reduce reflections from the backplane substrate 52 by means of optical isolation.

In comparison to the arrangement of FIG. 33A, the array of pixel LEDs provides the display without an additional LCD display. Advantageously thickness may be reduced and efficiency may be increased.

Figure 35C:
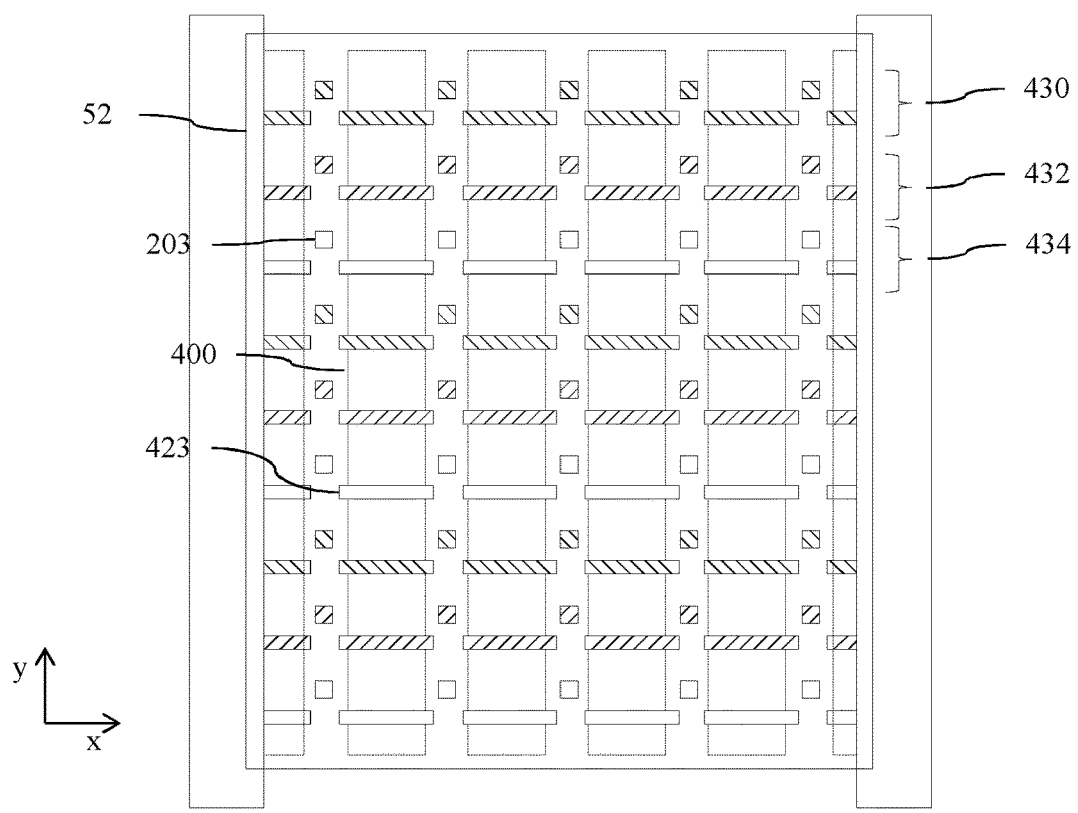
FIG. 35C is a schematic diagram illustrating in top view an arrangement of pixel LEDs on a backplane in correspondence with a correcting optical element wherein the pixel LEDs are formed from at least one inorganic semiconductor material, in accordance with the present disclosure.

FIG. 35C is a schematic diagram illustrating in top view an arrangement of pixel LEDs 203, 423 on a backplane substrate 52 wherein the pixel LEDs 203, 423 are formed from at least one inorganic semiconductor material arranged to emit light such as gallium nitride, and are further aligned with wavelength conversion material, for example phosphor or quantum dot material, to form rows 430, 432, 434 of coloured pixels. Thus the first and second plurality of LEDs 203, 423 are each arranged to provide light of more than one spectral band to the first and second optical systems 38, 400.

Advantageously a colour display apparatus with switchable directionality can be formed with high luminance and low thickness.

Figure 35D:
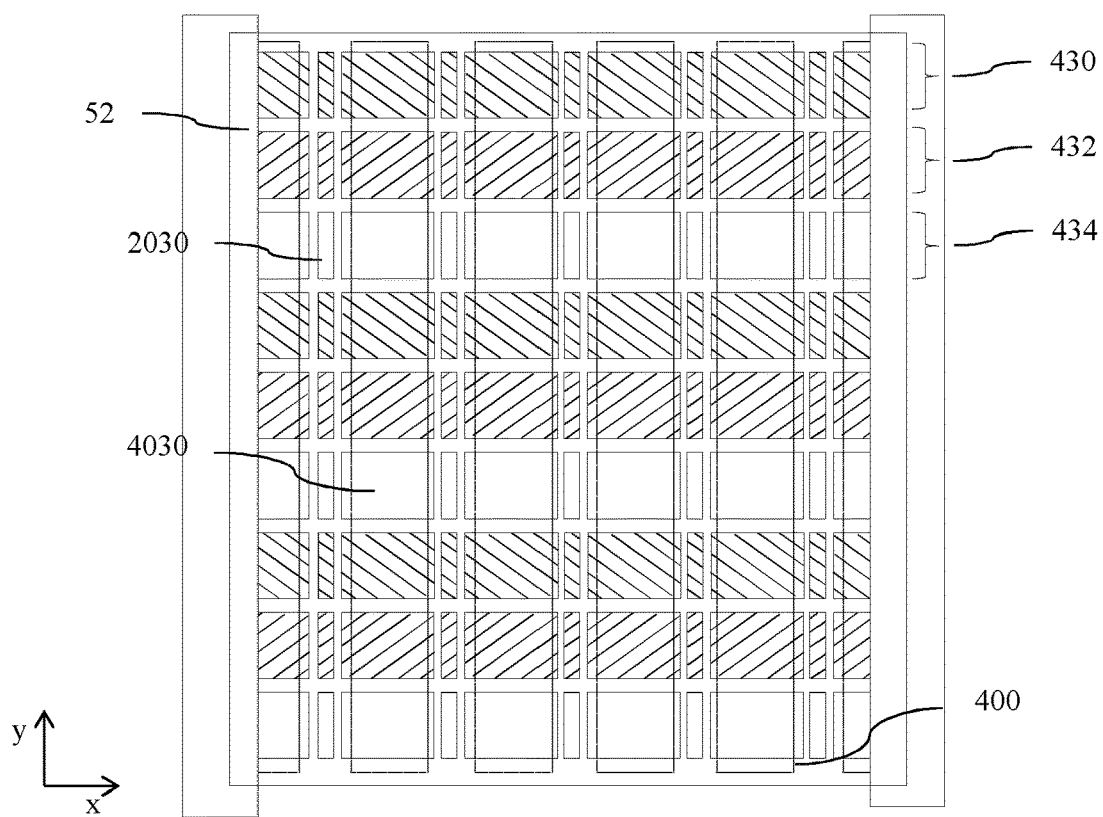
FIG. 35D is a schematic diagram illustrating in top view an arrangement of pixel LEDs on a backplane in correspondence with a correcting optical element wherein the pixel LEDs are formed from at least one organic semiconductor material and are OLEDs, in accordance with the present disclosure.

FIG. 35D is a schematic diagram illustrating in top view an arrangement of pixel LEDs 2030, 4030 on a backplane 52 wherein the pixel LEDs 2030, 4030 are formed from at least one organic semiconductor material and are OLEDs. Thus the second plurality of LEDs 403 may comprise organic LEDs. The pixel LEDs 2030, 4030 may be formed by patterning of an OLED material in locations corresponding to the correcting element 400 or catadioptric optical element 38. Advantageously the pixel LEDs 2030, 4030 may be formed by a precision (typically lithographic) masking process for reduced cost.

Figure 35E:
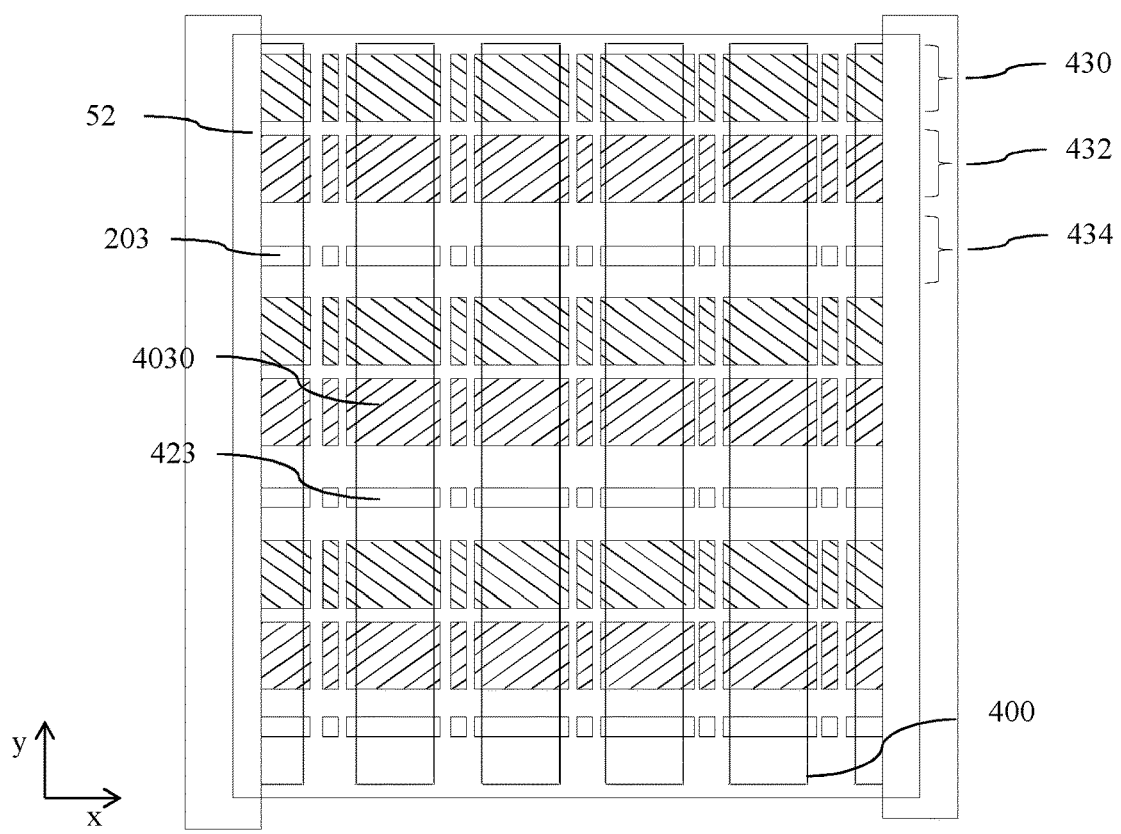
FIGS. 35E-F are schematic diagrams illustrating in top view an arrangement of pixel LEDs on a backplane in correspondence with a correcting optical element wherein the pixel LEDs are formed from at least one inorganic semiconductor material and at least one organic semiconductor material, in accordance with the present disclosure.
Figure 35F:
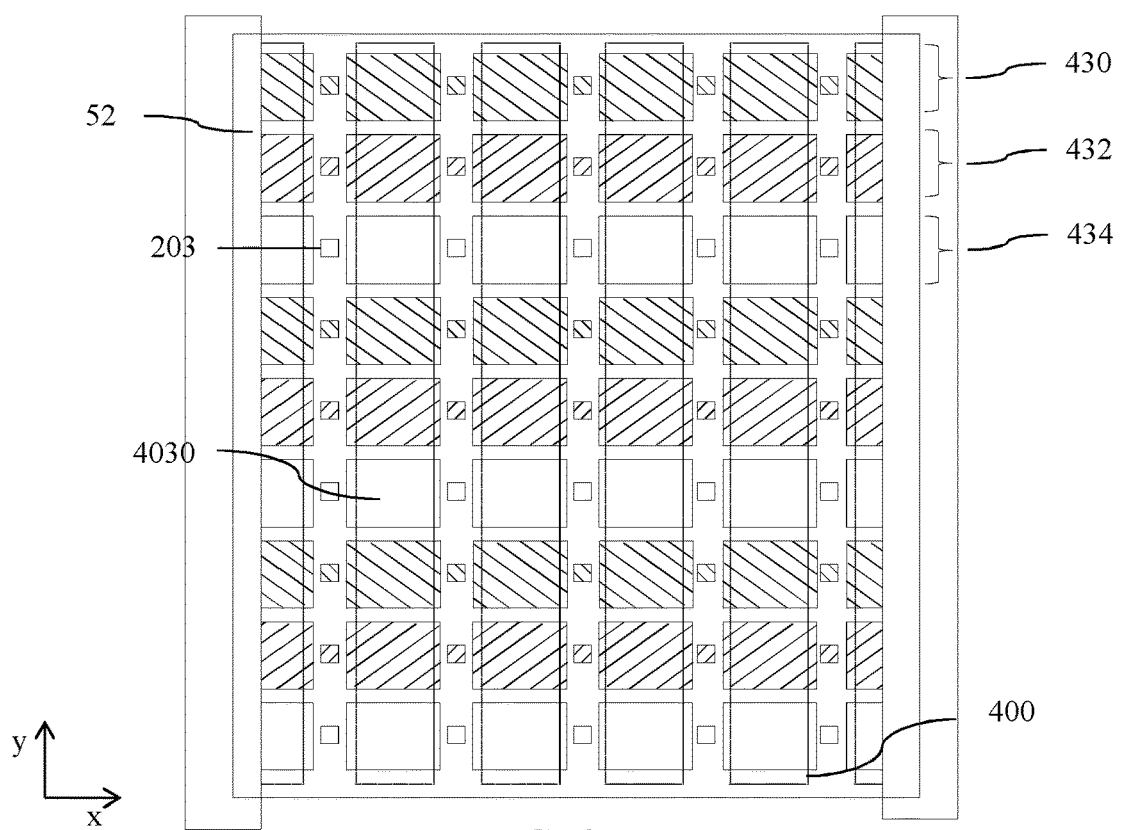

FIGS. 35E-F are schematic diagrams illustrating in top view an arrangement of pixel LEDs on a backplane 52 wherein the pixel micro-LEDs 203 are formed from at least one inorganic semiconductor material and the pixel LEDs 4030 are formed from at least one organic semiconductor material.

FIG. 35E illustrates that the blue colour pixels in row 434 may be formed from inorganic material whereas the red and green colour pixels in rows 430, 432 may be formed from organic materials. Advantageously the colour and lifetime of the display may be improved in comparison to the arrangement of FIG. 35D.

FIG. 35F illustrates that the pixel micro-LEDs 203 in correspondence with the catadioptric optical elements 38 may be formed from inorganic semiconductor material whereas the pixel LEDs 4030 in correspondence with the correcting optical elements 400 may be formed with organic semiconductor material. Advantageously the wide area coverage of the pixel LEDs 4030 is more readily achievable in comparison to the arrangement of FIG. 35C.

The operation of the array of light guides 400 will now be described.

Figure 36A:
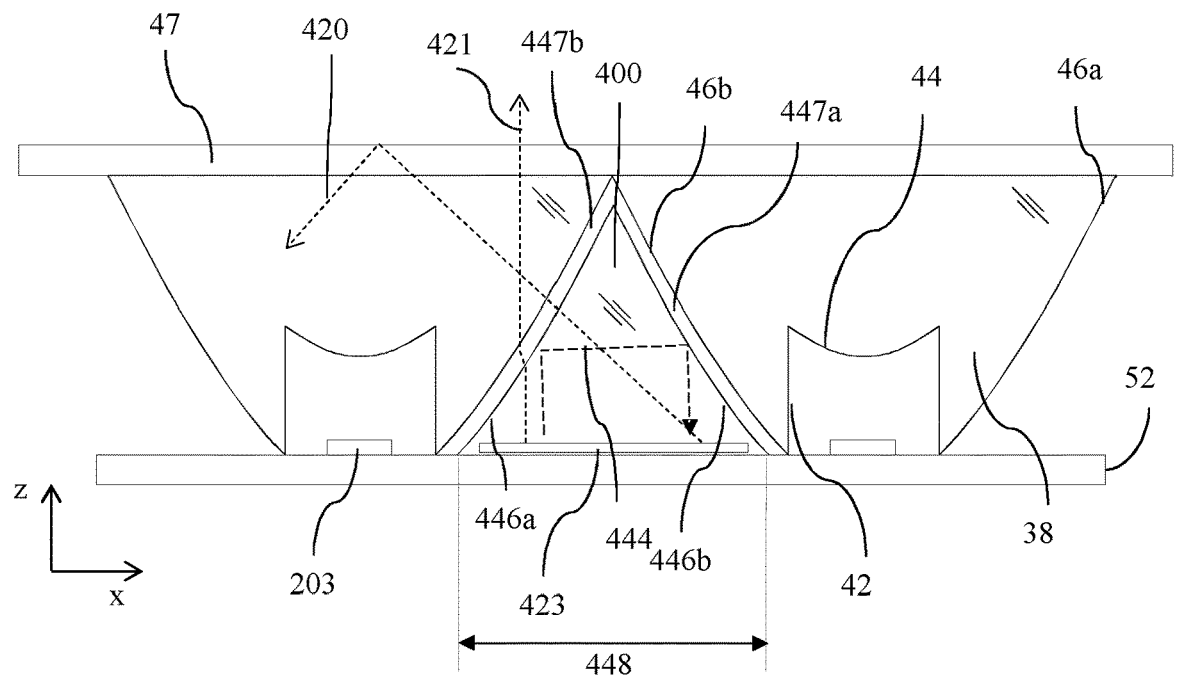
FIG. 36A is a schematic diagram illustrating in side view light ray propagation in a light guide that is optically coupled to an intermediate light emitting element, in accordance with the present disclosure.

FIG. 36A is a schematic diagram illustrating in side view light ray propagation in a light guide that is optically coupled to an intermediate light emitting element. The shape of the side 446 of the light guide 400 may be similar to the shape of the outer surfaces 46a, 46b of the catadioptric optical element 38. The first and second light guide outer surfaces 46a, 46b are transparent so that for example light rays 421 can pass through them.

In at least one light guide 400 cross-sectional plane, the first light guide outer surface 446a is shaped with substantially the same shape as the first outer surface 46a of a respective neighbouring catadioptric optical element 38. The second light guide outer surface 446b is also shaped with substantially the same shape as the second outer surface 46b of a respective neighbouring catadioptric optical element 38. The distance 448 between the first and second light guide outer surfaces 446a, 446b is greatest at the first end of the light guide 400.

The first light guide outer surface 446a is aligned to the first outer surface 46a of the neighbouring catadioptric optical element 38 with a gap 447a and the second light guide outer surface 446b is aligned to the second outer surface 46b of the neighbouring catadioptric optical element 38 with a gap 447b. The gap may be composed of a material of a lower refractive index than the materials of the catadioptric optical element 38 and light guide 400, and may be air.

Advantageously total internal reflection may be provided for light rays 444 in the light guide 400.

Light rays 420 that are emitted by the LEDs 420 may be reflected by the outer side of the transparent substrate 47. Such light may be recycled in the optical system.

Advantageously the recycled light may provide increased mixing between adjacent optical elements and provide increased uniformity of a backlight.

It may be desirable to reduce cross talk between adjacent corrective elements, for example when used in a switchable directional direct display application as illustrated in FIG. 35A.

Figure 36B:
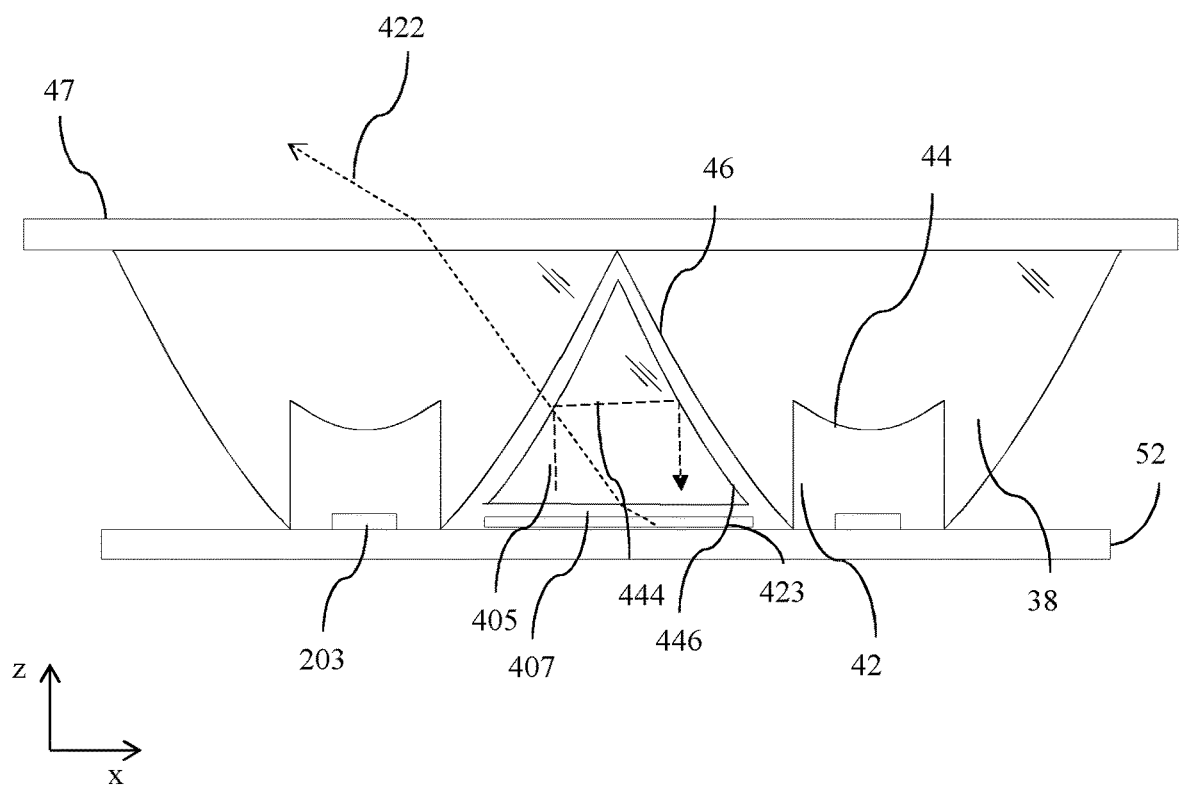
FIG. 36B is a schematic diagram illustrating in side view light ray propagation in a light guide that is provided with an air gap to an intermediate light emitting element, in accordance with the present disclosure.

FIG. 36B is a schematic diagram illustrating in side view light ray propagation in a light guide that is provided with an air gap 407 to an intermediate light emitting element 423.

At least part of the second directional light output distribution 122 may be provided by output light from LEDs 403 of the second plurality of LEDs that is transmitted through the first light guide outer surface 446a, and transmitted by an outer surface 46a of the catadioptric optical element 38.

Light rays 422 propagate within the medium of the light guide 400 at angles less than the critical angle and may be output into air after transmission through substrate 47. Light rays 444 that are emitted in a forward direction are reflected by the internal surfaces 446 of the light guides 400 and are directed towards the backplane where they may be scattered and reflected or may be absorbed.

Advantageously cross talk between adjacent light guides 400 is reduced. Thus the arrangement of FIG. 36B may be more appropriate for direct display whereas the arrangement of FIG. 36A may be more appropriate for backlighting.

Figure 36C:
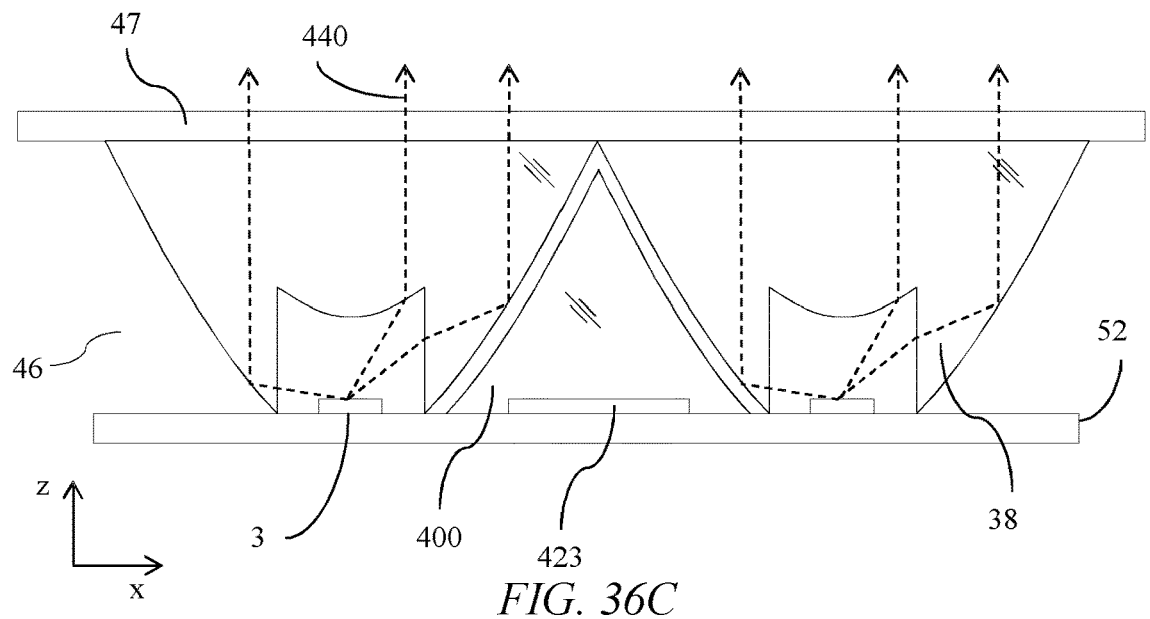
FIG. 36C is a schematic diagram illustrating in side view light ray propagation from LEDs aligned with catadioptric optical elements, in accordance with the present disclosure.

FIG. 36C is a schematic diagram illustrating in side view light ray propagation from LEDs aligned with catadioptric optical elements. Thus light rays 440 are provided independently of light guides 400.

Advantageously narrow angle directional illumination may be provided.

Ray propagation in the array of catadioptric optical elements 38 and light guides 400 will now be described by considering the origin of light rays for a given light ray propagation direction.

Figure 37:
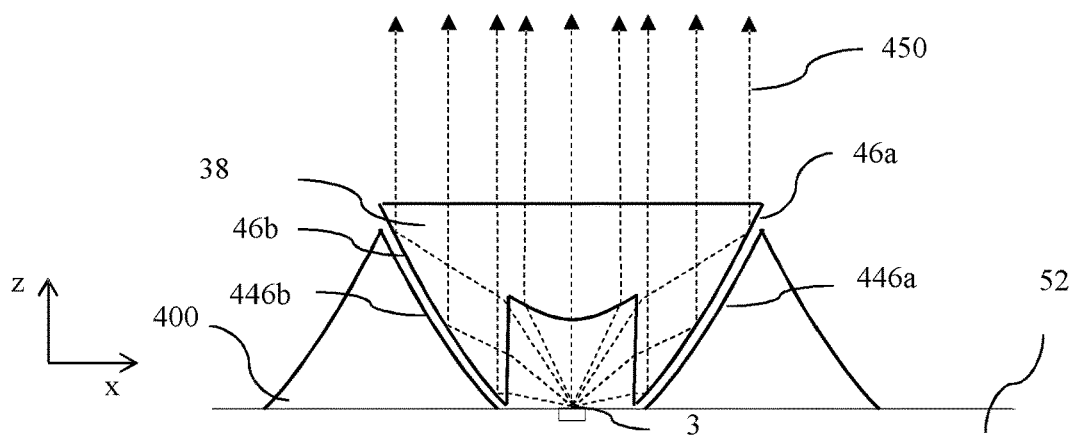
FIG. 37 is a schematic diagram illustrating in side view ray origin locations for a light output direction that is in the normal direction in a display comprising light guides, in accordance with the present disclosure.
Figure 38:
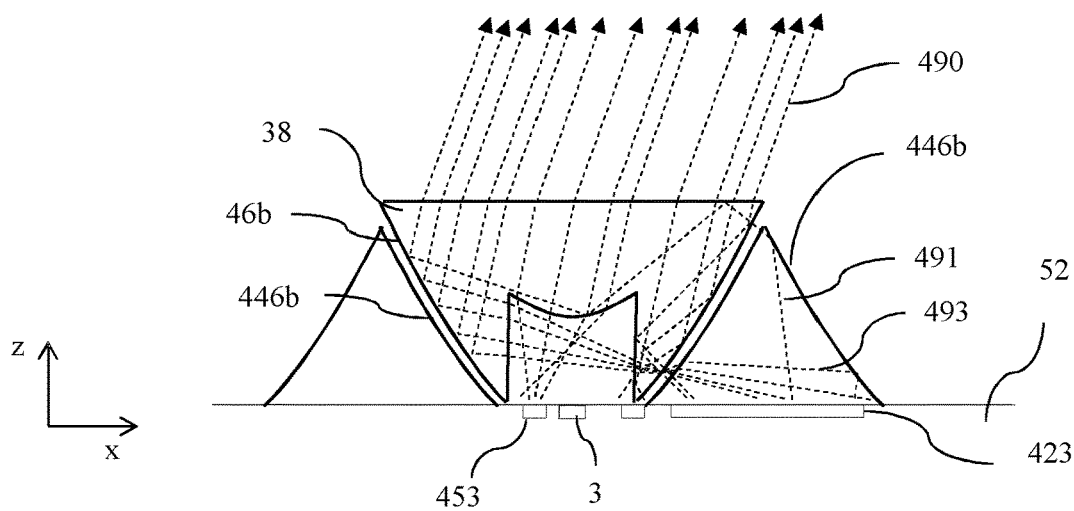
FIG. 38 is a schematic diagram illustrating in side view ray origin locations for a light output direction that is at 20 degrees to the normal direction in a display comprising light guides, in accordance with the present disclosure.

FIG. 37 is a schematic diagram illustrating in side view ray origin locations for a light output direction that is in the normal direction in a display comprising light guides. FIG. 38 is a schematic diagram illustrating in side view ray origin locations for a light output direction that is at 20 degrees to the normal direction in a display comprising light guides.

Thus at least part of the second directional light output distribution 122 is provided by output light rays 491, 493 from LEDs 423 of the second plurality of LEDs that is reflected by total internal reflection at the second light guide outer surface 446b. Further at least part of the second directional light output distribution 122 is provided by output light rays (not shown) from LEDs 423 of the second plurality of LEDs that is reflected by total internal reflection at the first light guide outer surface 446a.

Figure 39:
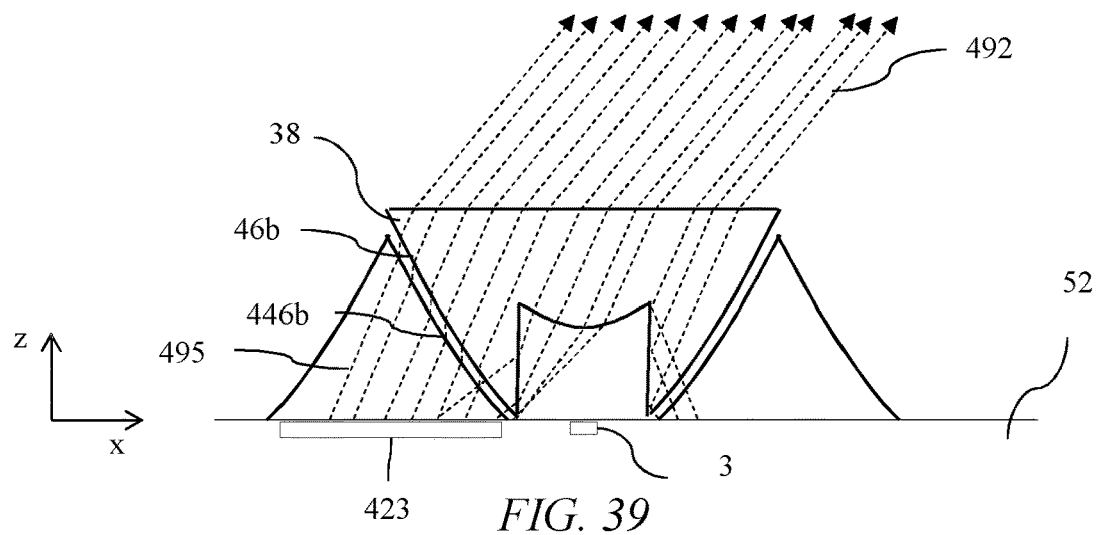
FIG. 39 is a schematic diagram illustrating in side view ray origin locations for a light output direction that is at 40 degrees to the normal direction in a display comprising light guides, in accordance with the present disclosure.

FIG. 39 is a schematic diagram illustrating in side view ray origin locations for a light output direction that is at 40 degrees to the normal direction in a display comprising light guides.

Thus for an observer at different viewing angles, light rays may originate from LEDs at varying positions including 3, 452 and 454. To achieve a full range of viewing angles (for example a Lambertian characteristic) the LEDs may be provided across the full lateral extent of the optical elements 38, 400, similar to that shown in FIGS. 31-32.

Further chromatic aberrations at refractive interfaces 46, 446 are compensated by the matching shaped interfaces, reducing colour changes with viewing angles.

By way of comparison, the origin of light rays at viewing angles of 20 degrees will be described when no corrective element is provided.

Figure 40:
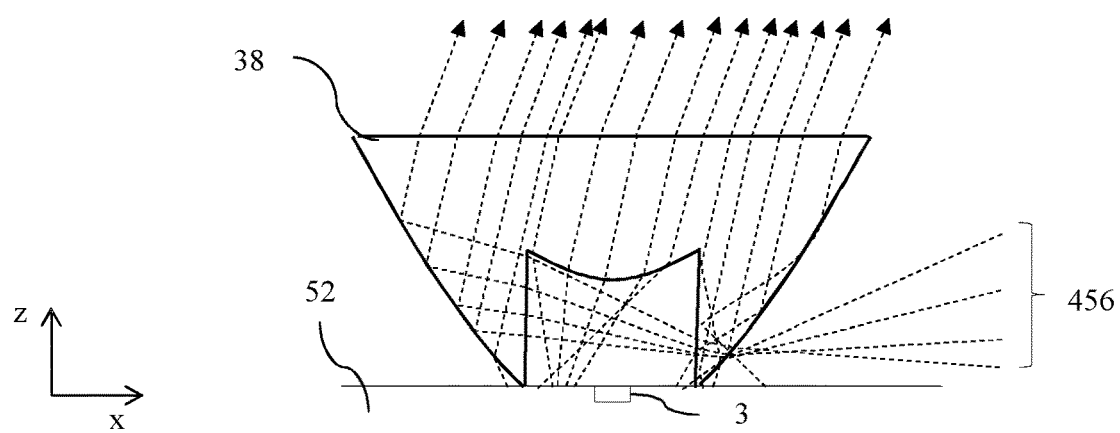
FIG. 40 is a schematic diagram illustrating in side view ray origin locations for a light output direction that is at 20 degrees to the normal direction in a display comprising no light guides, in accordance with the present disclosure.

FIG. 40 is a schematic diagram illustrating in side view ray origin locations for a light output direction that is at 20 degrees to the normal direction in a display comprising no light guides. Thus light rays in ray bundle 456 may be required to output light cones across the entire width of the catadioptric optical elements. Such light rays may not be conveniently provided by LEDs 403 that are on the backplane 52.

By way of comparison with the present embodiments the arrangement of FIG. 39 may not provide desirable illumination levels at angles around 20 degrees in this illustrative example. Thus luminance of viewing window 422 would be reduced and lateral non-uniformities in display luminance would be provided at these angles. Further, if stray light was to be provided into ray bundle 456 then cross talk between adjacent elements may be provided, reducing display contrast.

Advantageously the present embodiments achieve reduced cross talk, higher angular uniformity and higher efficiency than the arrangement of FIG. 40.

FIGS. 41A-D are schematic diagrams illustrating in side views a method to form a plurality of light guides. In a first step as shown in FIG. 40A, a plurality of micro-LEDs 3 is formed on a backplane substrate 52, each micro-LED 3 comprising a light emitting device 460 that may for example be a gallium nitride light emitting diode. The first or second plurality of LEDs may further comprise a wavelength converting layer so that optionally a colour conversion layer 462 may be formed on the device 460 that may be a phosphor or may comprise quantum dot or other conversion means. Electrodes (not shown) are further formed on the substrate 52 and arranged to provide electrical connectivity to the light emitting devices 460.

Figure 41A:
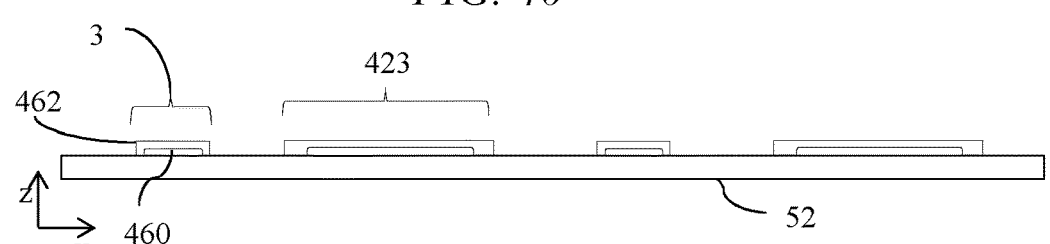
FIGS. 41A-D are schematic diagrams illustrating in side views a method to form an array of light guides, in accordance with the present disclosure.
Figure 41B:
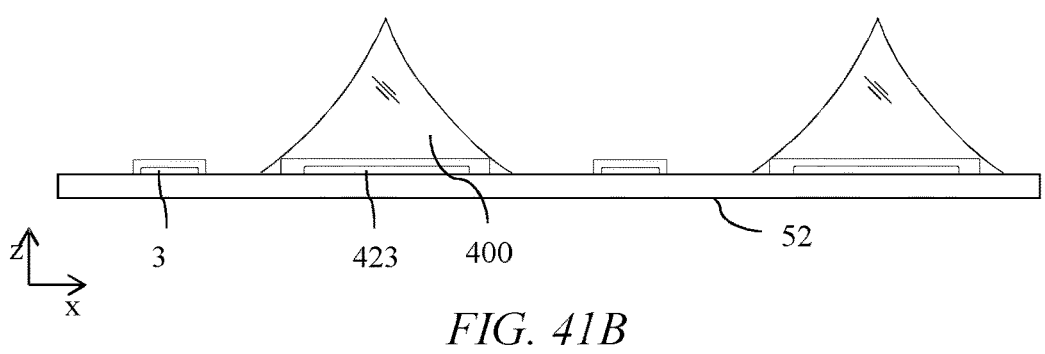
Figure 41C:
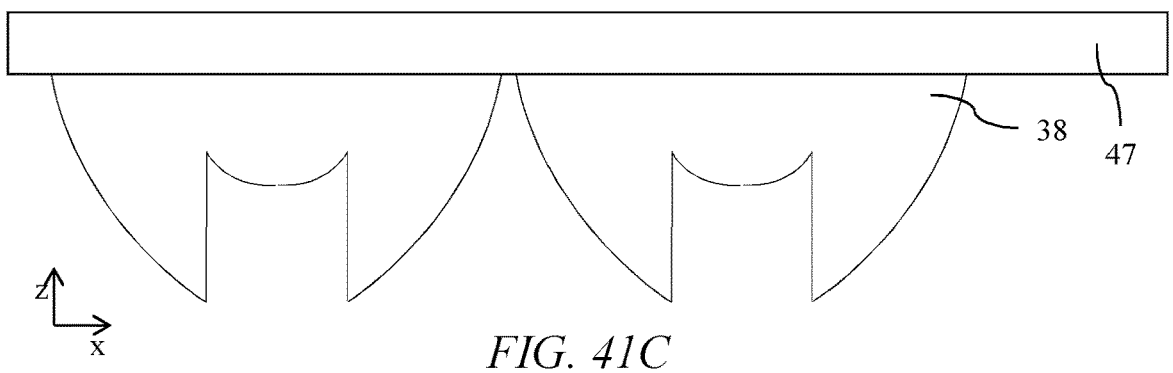
Figure 41D:
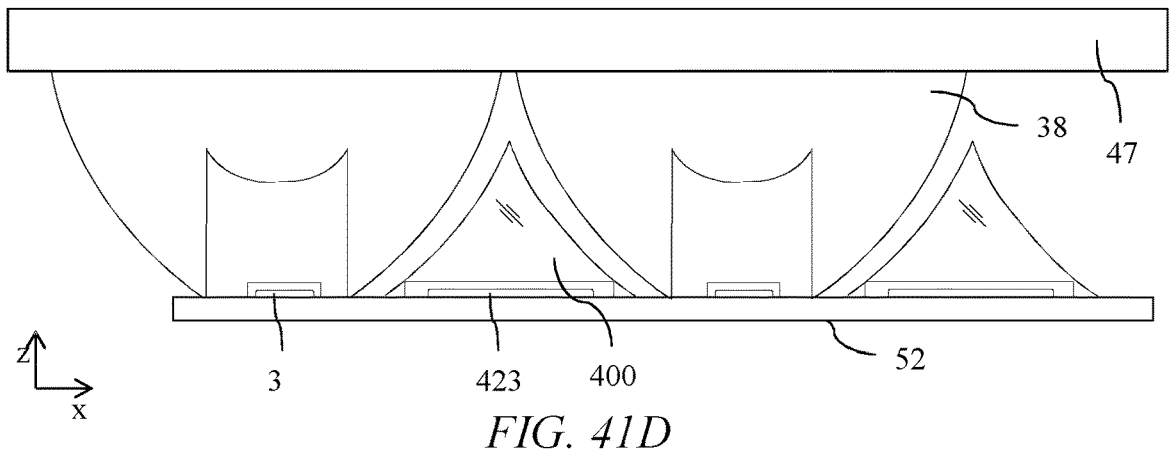

In a second step, as shown in FIG. 41B, a light guide 400 is formed over LEDs 403 by means of moulding onto the location of the LEDs 403. The material 400 may for example be a silicone material.

In a third step as shown in FIG. 40C a plurality of catadioptric optical elements 38 is formed, and may be arranged on a transparent substrate 47 during or after the moulding of the catadioptric optical elements 38.

In a fourth step the array of catadioptric optical elements 38 and substrate are aligned to the backplane substrate 52.

It may be desirable to reduce the area of the light emitting element 403.

Figure 42:
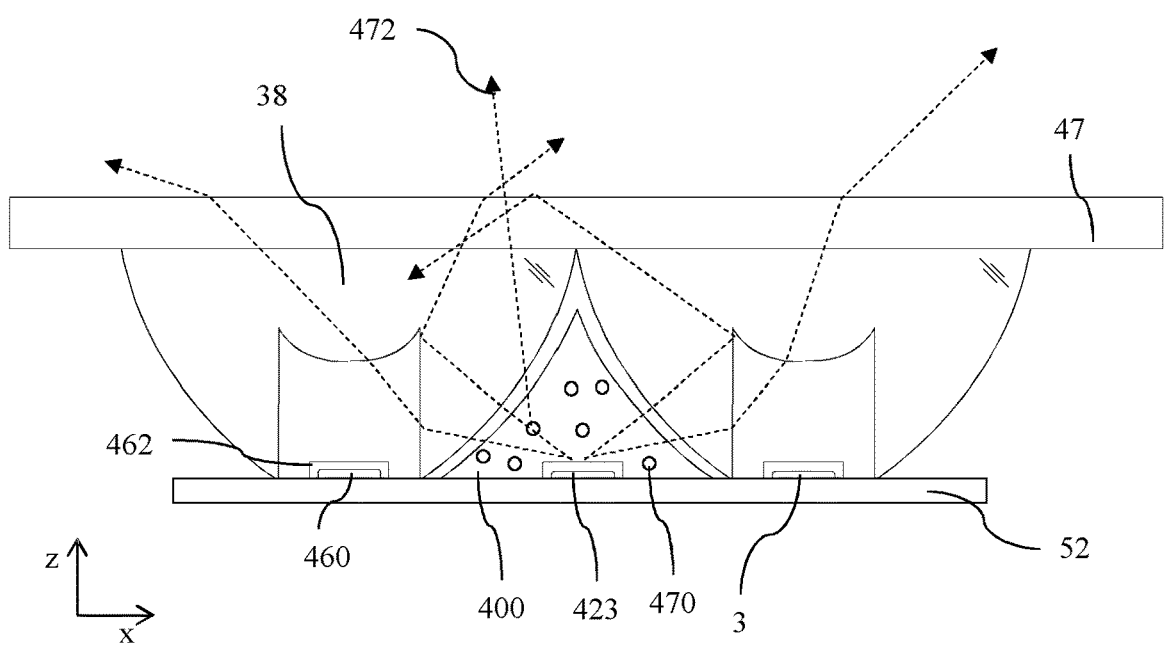
FIG. 42 is a schematic diagram illustrating in side view an alternative light guide further comprising bulk scattering material, in accordance with the present disclosure.

FIG. 42 is a schematic diagram illustrating in side view an alternative light guide 400 further comprising bulk scattering material 470. The light guides 400 of the plurality of light guides further comprise a light scattering material 470. Material 470 may comprise a filler material such as titanium dioxide that scatters light, or may be colour conversion material 462 such as phosphors or quantum dots to convert wavelength of light emitted by the light emitting device 460. The light guides 400 or light guides 100 of the plurality of light guides may thus further comprise a wavelength converting material 462.

In operation, light rays 472 that pass through the scattering material 470 in the light guide 400 may be scattered and thus increase the apparent area of the light emitting element 403, achieving wide viewing angle properties. Similarly for light guides 100, the area of apparent emission by the light guide may be increased by incorporation of scattering material that may be a wavelength conversion material.

Advantageously the size of the light emitting element 403 may be reduced, reducing cost of the array of LEDs 403 and further reducing complexity of the backplane 52 assembly.

It may be desirable to provide a display that has a narrow directional light output distribution in lateral direction and wide directional light output distribution in the orthogonal direction and further to achieve these modes in both landscape and portrait orientations of an illumination device or display device.

Figure 43:
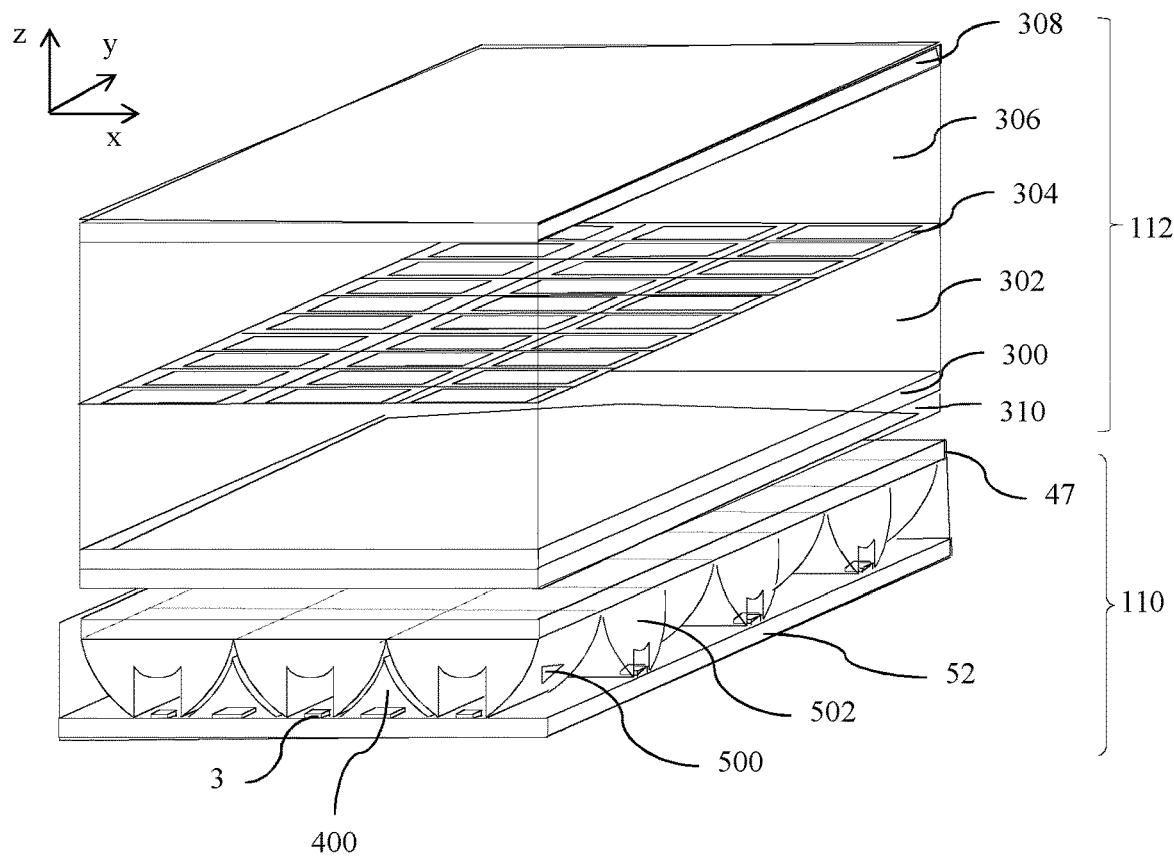
FIG. 43 is a schematic diagram illustrating in side perspective view a switchable directional display apparatus comprising a backlight comprising first and second arrays of catadioptric optical elements arranged to illuminate a spatial light modulator with first and second narrow directional light output distributions, in accordance with the present disclosure.
Figure 44:
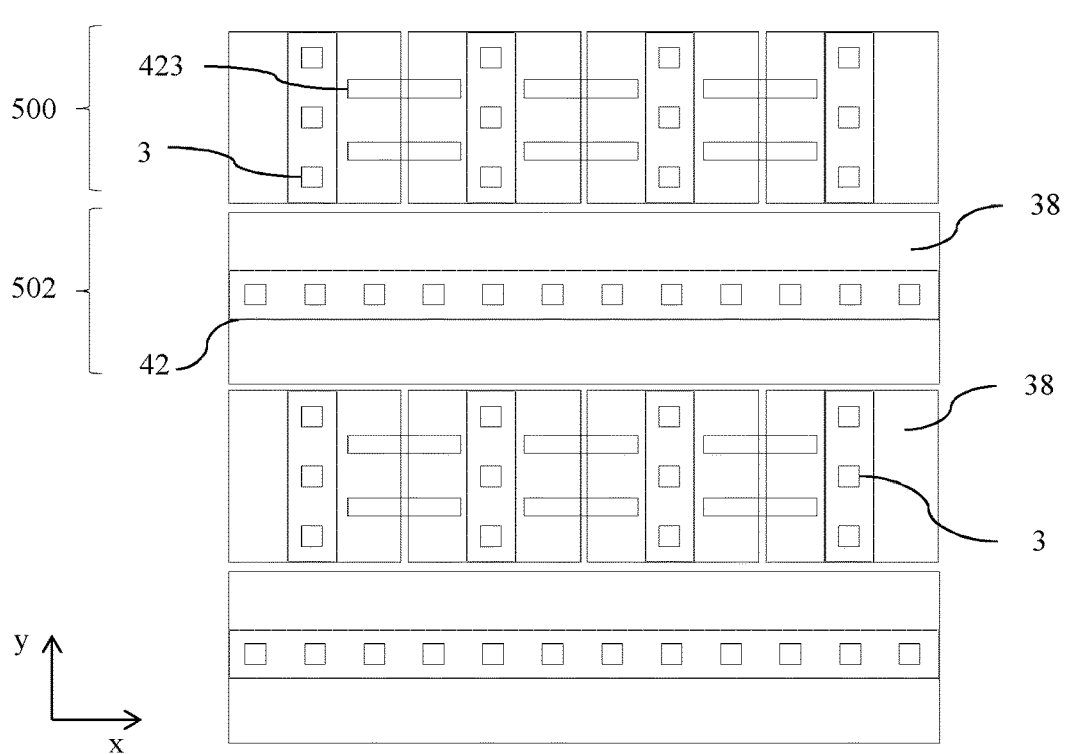
FIG. 44 is a schematic diagram illustrating in top view an array of LEDs and aligned catadioptric elements of FIG. 43, in accordance with the present disclosure.

FIG. 43 is a schematic diagram illustrating in side perspective view a switchable directional display apparatus comprising a backlight illumination apparatus 110 with first and second arrays 500, 502 of catadioptric optical elements 38 arranged to illuminate a transmissive spatial light modulator 112 with first and second narrow directional light output distributions and with a further wide directional light output distribution; and FIG. 44 is a schematic diagram illustrating in top view a plurality of LEDs 3, 403 and aligned catadioptric elements of FIG. 43.

The first array 500 of catadioptric optical elements 38 may be arranged to provide a narrow directional light output distribution in the lateral direction (x-axis direction). The second array 502 may be arranged to provide a narrow directional light output distribution in the orthogonal direction (y-axis direction). As shown in FIG. 44 for example, the first and second arrays 500, 502 may be arranged in repeating rows for example. Further light guides 400 and LEDs 403 may be arranged between the micro-LEDs 3 in the first array.

The operation of the display of FIG. 43 will now be described.

Figure 45:
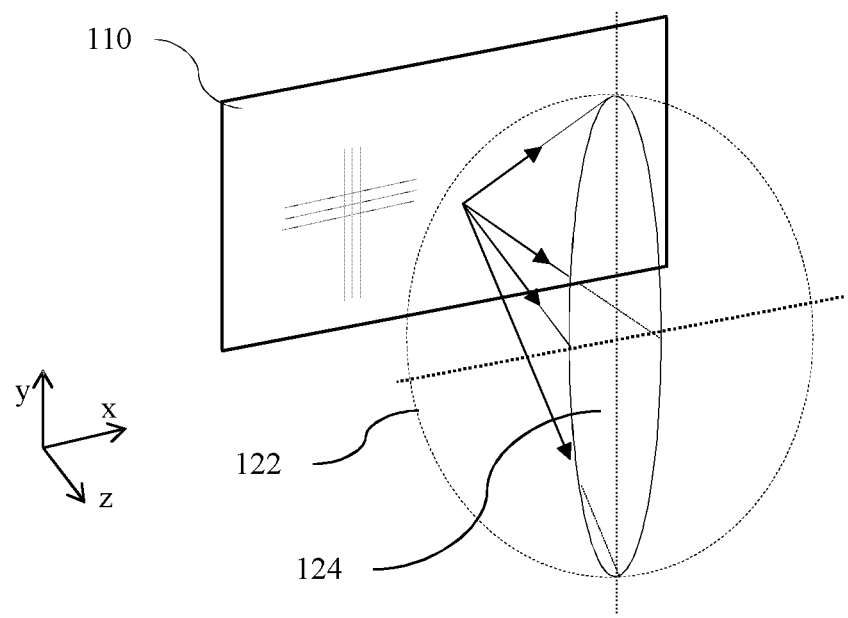
FIG. 45 is a schematic diagram illustrating in perspective front view operation of the directional display of FIG. 43 arranged to provide a switchable directional light output distribution in landscape orientation, in accordance with the present disclosure.
Figure 46:
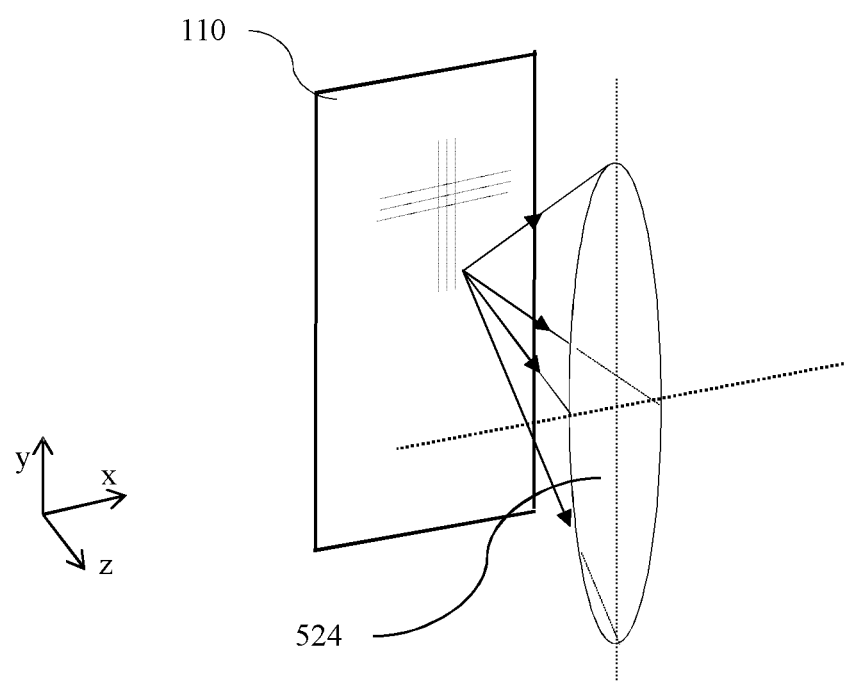
FIG. 46 is a schematic diagram illustrating in perspective front view operation of the directional display of FIG. 43 arranged to provide a switchable directional light output distribution in portrait orientation, in accordance with the present disclosure.

FIG. 45 is a schematic diagram illustrating in perspective front view operation of the directional display of FIG. 43 arranged to provide a switchable directional light output distribution in landscape orientation; and FIG. 46 is a schematic diagram illustrating in perspective front view operation of the directional display of FIG. 43 arranged to provide a switchable directional light output distribution in portrait orientation.

In a first mode of operation, as illustrated in FIG. 45, the display is arranged in landscape orientation (wherein a long edge is substantially parallel to the x-axis) micro-LEDs 3 in array 500 are illuminated to provide narrow directional light output distribution 124 in the lateral direction, with wide viewing freedom in the orthogonal direction.

In a second mode of operation further illumination of LEDs 403 arranged with light guides 400 with the first array 500 of catadioptric optical elements provides wide viewing freedom illustrated by directional light output distribution 122 as described elsewhere herein.

In a third mode of operation, as illustrated in FIG. 46, the display is arranged in portrait orientation (wherein a short edge is substantially parallel to the x-axis) micro-LEDs 3 in array 502 are illuminated to provide a second narrow directional light output distribution 524 in the lateral direction, with wide viewing freedom in the orthogonal direction.

Advantageously a display apparatus is provided that can achieve narrow directional light output distribution in the lateral direction in landscape and portrait orientations, while achieving wide viewing freedom in the orthogonal direction.

Optionally the light guides 400 and LEDs 403 may be omitted, and a wide directional light output distribution achieved by illumination of LEDs for both first and second arrays 500, 502 of catadioptric optical elements 38. Such an arrangement may provide reduced luminance in viewing quadrants achieving a look down privacy effect for viewers that are above and to the side of the display.

It would be desirable to increase the efficiency of a switchable landscape-portrait directional display apparatus and further to provide a switchable illumination apparatus.

Figure 47:
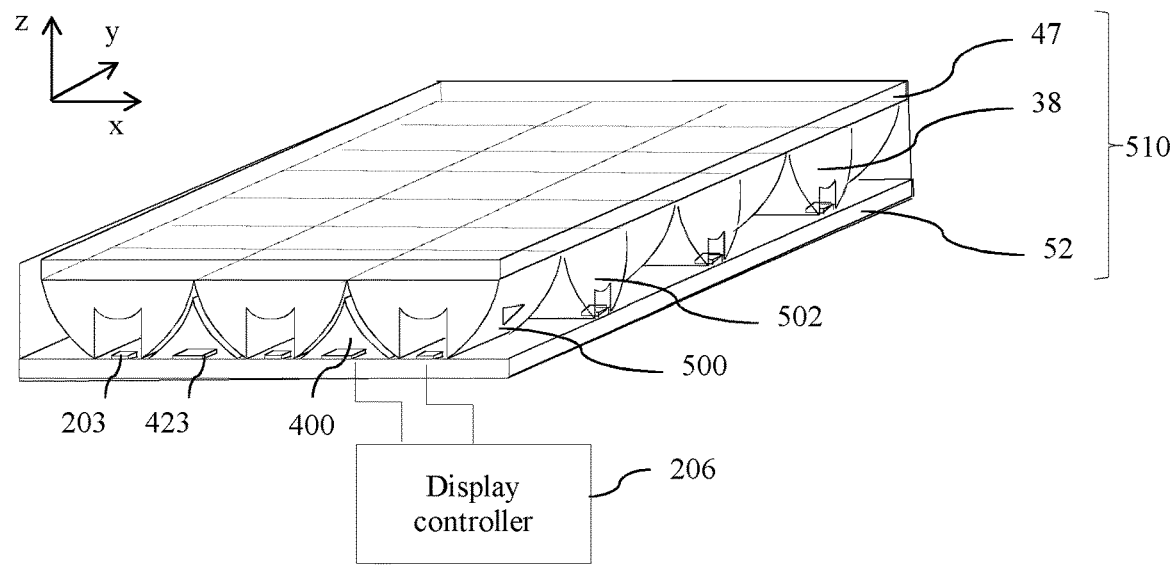
FIG. 47 is a schematic diagram illustrating in side perspective view a switchable directional display apparatus comprising first and second arrays of catadioptric optical elements and an array of light guides arranged to provide first and second narrow directional light output distributions, in accordance with the present disclosure.

FIG. 47 is a schematic diagram illustrating in side perspective view a switchable directional display 510 comprising first and second arrays 500, 502 of catadioptric optical elements 38 and a plurality of light guides 400 arranged to provide first and second narrow directional light output distributions 124, 524 and a wide directional light output distribution 122 as illustrated in FIGS. 44A-B. Operation of the display 510 is similar to the backlight illumination apparatus 110 of FIGS. 43A-B, however the LEDs may be provided by pixel LEDs 203, 423 with colour pixel data.

Advantageously a display apparatus is provided that can achieve narrow directional light output distribution in the lateral direction in landscape and portrait orientations, while achieving wide viewing freedom in the orthogonal direction. In comparison to the backlit display of FIG. 43 such a display is thinner and more efficient.

It may be desirable to provide a switchable directional illumination apparatus or switchable directional display apparatus and further to maximise the packing density of a plurality of catadioptric optical elements and further to provide an optical element array with reduced complexity and cost.

Figure 48:
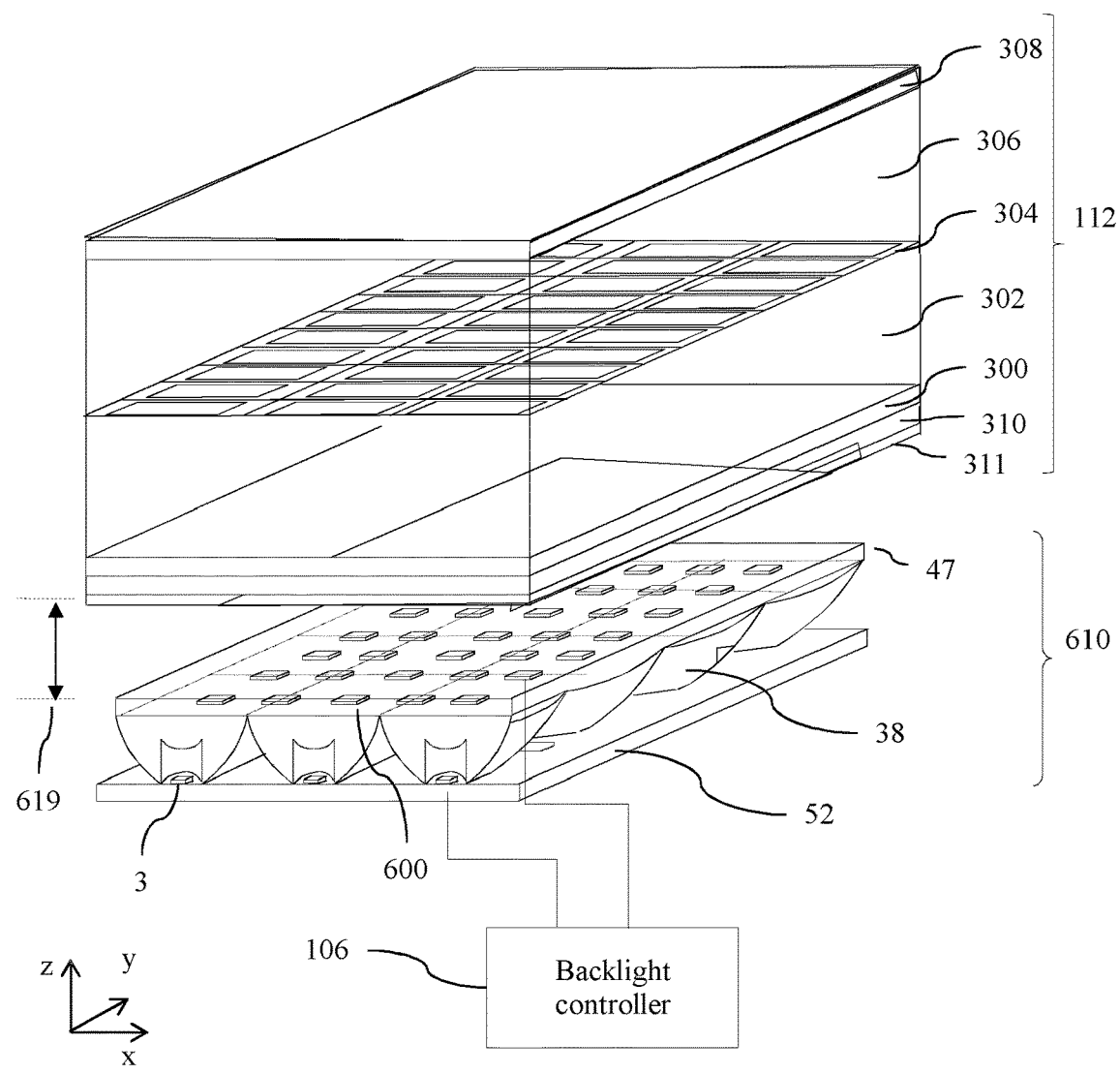
FIG. 48 is a schematic diagram illustrating in side perspective view a switchable directional display apparatus comprising a backlight with a two dimensional array of catadioptric optical elements and a first array of aligned LEDs on a first substrate, further comprising a second array of aligned LEDs on a second substrate arranged to illuminate a transmissive LCD, in accordance with the present disclosure.

FIG. 48 is a schematic diagram illustrating in side perspective view a switchable directional display apparatus comprising a backlight 610 with a two dimensional array of catadioptric optical elements 38 and a first array of micro-LEDs 3 on a first substrate 52 and aligned to the catadioptric optical elements 38, further comprising a second array of LEDs 600 on a second substrate arranged to illuminate a transmissive spatial light modulator 112.

Thus an illumination apparatus 610 may comprise a first plurality of micro-LEDs 3, the first plurality of micro-LEDs 3 being arranged in a first LED array, wherein the LEDs of the first plurality of LEDs are micro-LEDs; a second plurality of LEDs 600, the second plurality of LEDs 600 being arranged in a second LED array; and a plurality of catadioptric optical elements 38 arranged in a catadioptric optical element array.

Each of the catadioptric optical elements 38 may be arranged as illustrated in FIG. 2F. At least some of the LEDs 600 of the second plurality of LEDs may be arranged in positions other than positioned at the first end of and aligned with any catadioptric optical element 38 of the plurality of catadioptric optical elements, and in positions other than positioned between the first end 707 and the at least one transparent inner surface 42, 44 of and aligned with any catadioptric optical element 38 of the plurality of catadioptric optical elements 38. The illumination apparatus may further comprise control circuitry 106 and electrodes arranged such that they are operable to drive the first plurality of micro-LEDs 3 independently of the second plurality of LEDs 600.

At least some of the LEDs 600 of the second plurality of LEDs may be micro-LEDs. Advantageously the LEDs may reduce the shielding of light that is emitted by the micro-LEDs 3 of the first plurality of LEDs, increasing light transmission efficiency.

At least some of the LEDs of first plurality of micro-LEDs 3 are positioned on a first LED plane that may be on the surface of support substrate 52. At least some of the LEDs 600 of the second plurality of LEDs may be positioned on a second LED plane that is different to the first LED plane, for example on transparent substrate 47. Advantageously, the directional light output distribution output of the LEDs 600 of the second plurality of LEDs is not modified by the catadioptric optical elements 38. Further, in comparison to the arrangement of FIG. 1A, the resolution of catadioptric optical elements may be increased. Further, in comparison to the arrangement of FIG. 43 for example, cross talk between adjacent LEDs 600 of the second plurality of LEDs is reduced, achieving improved resolution.

Each of the catadioptric optical elements 38 of the plurality of catadioptric optical elements aligned in correspondence with a respective one or more of the micro-LEDs 3 of the first plurality of LEDs provides a first directional light output distribution 120 similar to that illustrated in FIG. 2A, the first directional light output distribution being of light output from the micro-LEDs 3 of the first plurality of LEDs. Further the LEDs 600 of the second plurality of LEDs may provide a second directional light output distribution 122, the second directional light output distribution being of light output from the LEDs 600 of the second plurality of LEDs. The first directional light output distribution 120 may have a solid angle 181 that is smaller than the solid angle 183 of the second directional light output distribution. The LEDs 600 of the second plurality of LEDs may have an optical output that is substantially Lambertian. Thus the second directional light output distribution may also be substantially Lambertian.

The second end 708 of at least one catadioptric optical element 38 of the plurality of catadioptric optical elements is arranged on the first side of an optical element support substrate such as transparent substrate 47 as illustrated elsewhere in the present disclosure.

In operation in a narrow angle mode as described elsewhere herein, micro-LEDs 3 of the first array may be illuminated. In operation in a wide angle mode, the second array of LEDs 600 may be illuminated, and optionally the micro-LEDs 3 of the first array. Light rays from the LEDs 600 may be substantially directed away from the catadioptric optical elements, and thus wide angle illumination may be unmodified by the catadioptric optical elements 38.

The packing density of the catadioptric optical elements may be increased in comparison to embodiments comprising light guides 100. The packing density of the LEDs 600 may be arranged to provide uniform illumination of the spatial light modulator 112 after diffusion by diffuser elements 311 arranged on the spatial light modulator and separated by gap 619.

Advantageously a switchable directional illumination apparatus is provided that achieves increased uniformity of illumination of the spatial light modulator 112 and has reduced complexity and cost of the optical element array in comparison to arrangements in which a light guide 100 or light guide 400 is provided.

Figure 49:
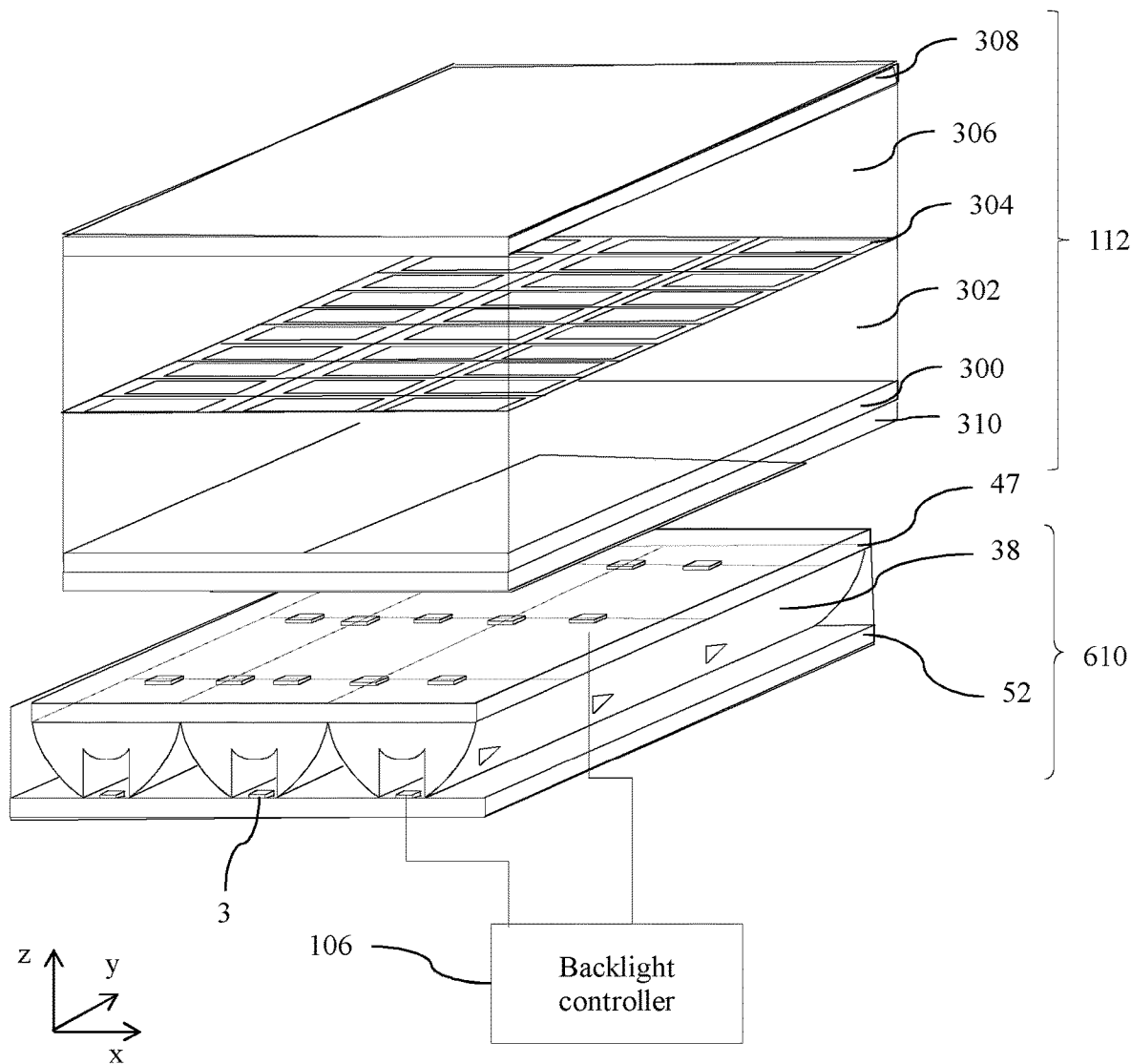
FIG. 49 is a schematic diagram illustrating in side perspective view a switchable directional display apparatus comprising a backlight with a one dimensional array of catadioptric optical elements and a first array of aligned LEDs on a first substrate, further comprising a second array of aligned LEDs on a second substrate arranged to illuminate a transmissive LCD, in accordance with the present disclosure.

FIG. 49 is a schematic diagram illustrating in side perspective view a switchable directional display apparatus comprising a backlight with a one dimensional array of catadioptric optical elements 38 and a first array of aligned micro-LEDs 3 on a first substrate 52, further comprising a plurality of LEDs 600 on a second substrate arranged to illuminate a transmissive LCD.

Advantageously a narrow directional light output distribution 124 may be achieved in the lateral direction while providing wide directional light output distribution 122 in the orthogonal direction as described elsewhere herein.

Figure 50A:
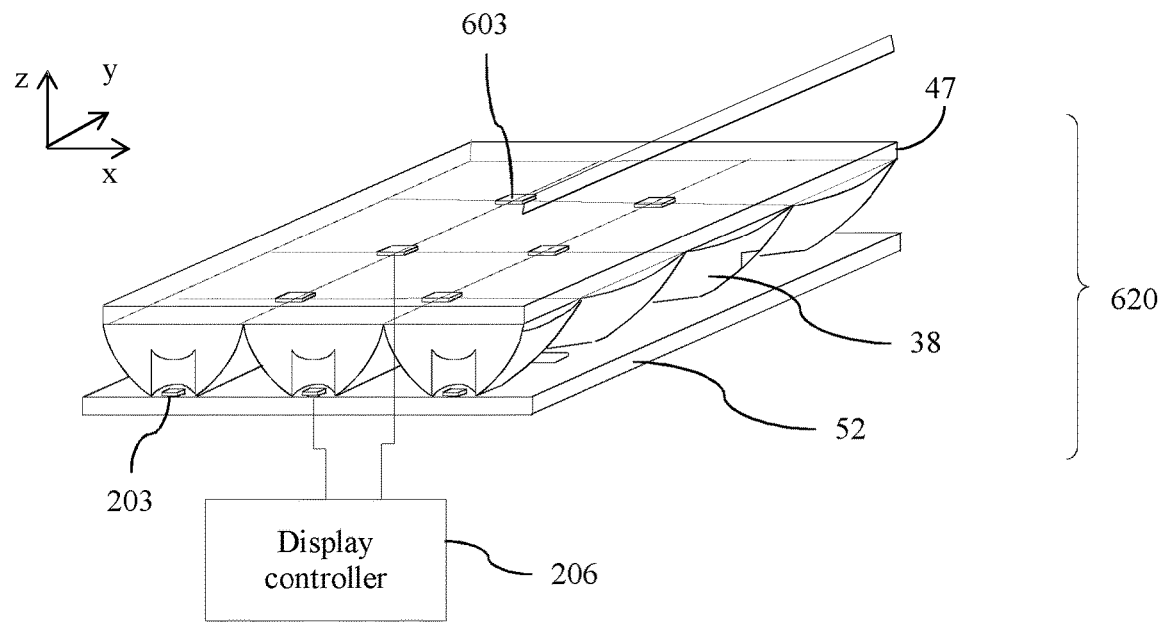
FIG. 50A is a schematic diagram illustrating in side perspective view a switchable directional display apparatus comprising a two dimensional array of catadioptric optical elements and a first array of aligned LEDs on a first substrate, further comprising a second array of aligned LEDs on a second substrate, in accordance with the present disclosure.
Figure 50B:
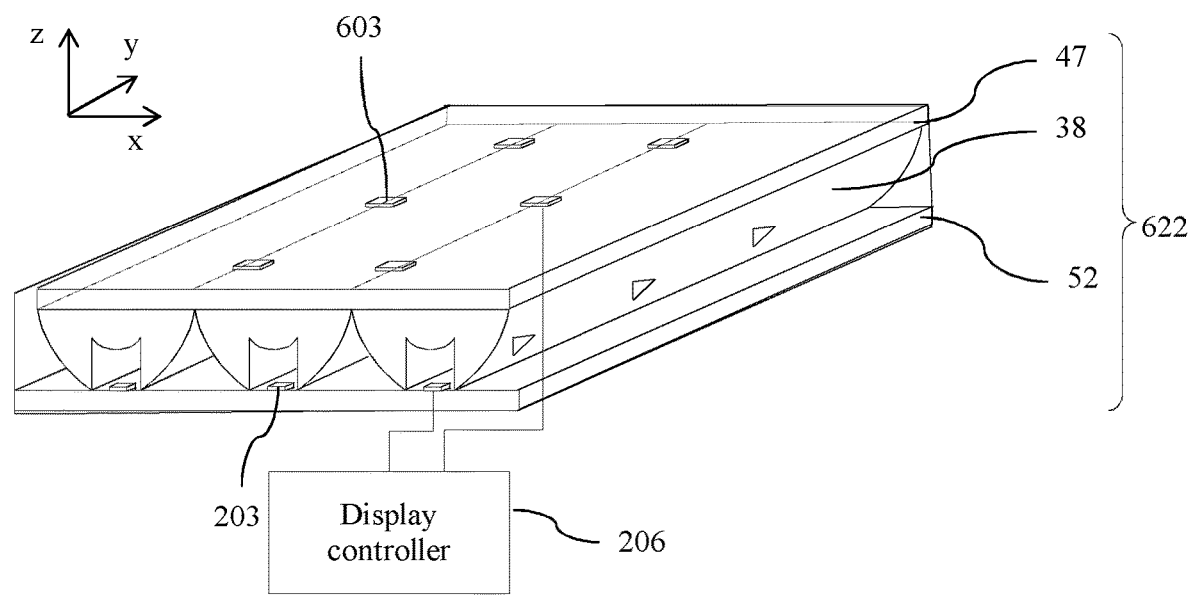
FIG. 50B is a schematic diagram illustrating in side perspective view a switchable directional display apparatus comprising a one dimensional array of catadioptric optical elements and a first array of aligned LEDs on a first substrate, further comprising a second array of aligned LEDs on a second substrate, in accordance with the present disclosure.

FIG. 50A is a schematic diagram illustrating in side perspective view a switchable directional display 620 comprising a two dimensional array of catadioptric optical elements 38 and a first array of aligned pixel micro-LEDs 203 on a first substrate 52, further comprising a second array of pixel LEDs 603 on a second substrate 47; and FIG. 50B is a schematic diagram illustrating in side perspective view a switchable directional display 622 comprising a one dimensional array of catadioptric optical elements 38 and a first array of aligned pixel micro-LEDs 203 on a first substrate 52, further comprising a second array of LEDs 603 on a second substrate 47. Thus a switchable illumination apparatus may comprise control circuitry 206 further comprises means to drive the first and second pluralities of LEDs 3, 600 with image pixel data. The control circuitry may further comprise means to drive the first and second pluralities of LEDs as an addressable matrix, in a similar manner to that illustrated in FIGS. 1D and 1E. The first plurality of pixel micro-LEDs 203 may be arranged to provide a first plurality of image pixels with the first directional light output distribution 120; and the LEDs 603 of the second plurality of pixel LEDs may be arranged to provide the first plurality of image pixels with the second directional light output distribution 122. Operation of the displays of FIGS. 50A-50B is similar to the operation of backlights 610 of FIGS. 48-49 respectively with pixel micro-LEDs 203 provided with colour pixel image data in comparison with white illumination Advantageously display efficiency is increased and thickness reduced.

Figure 51A:
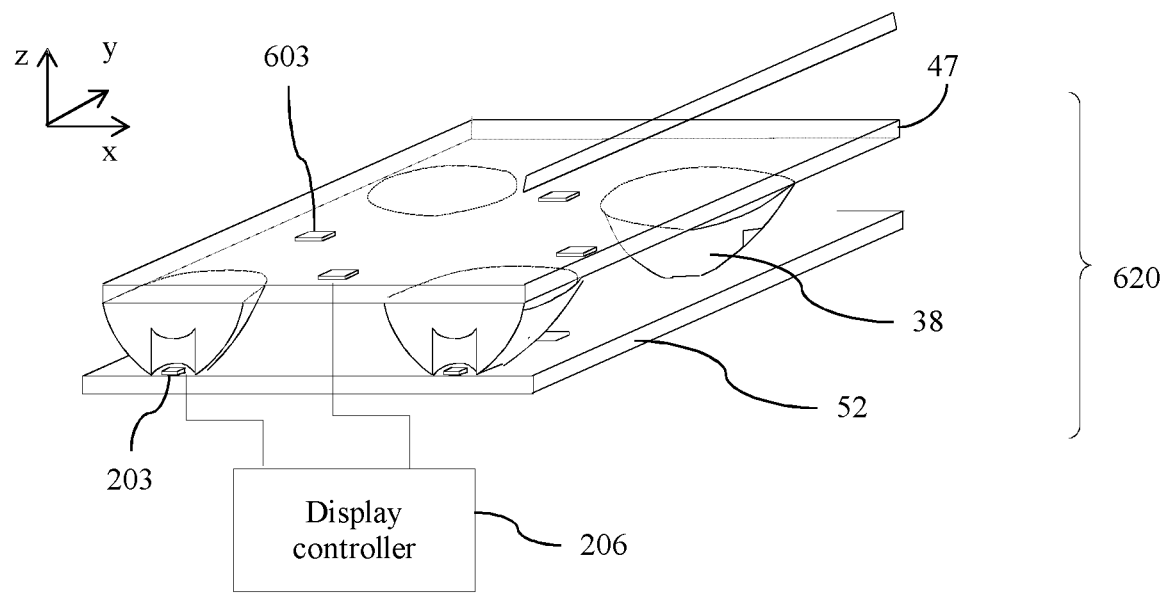
FIG. 51A is a schematic diagram illustrating in side perspective view a switchable directional display apparatus comprising a sparse array of catadioptric optical elements and a first array of aligned LEDs on a first substrate, further comprising a second array of aligned LEDs on a second substrate, in accordance with the present disclosure.
Figure 51B:
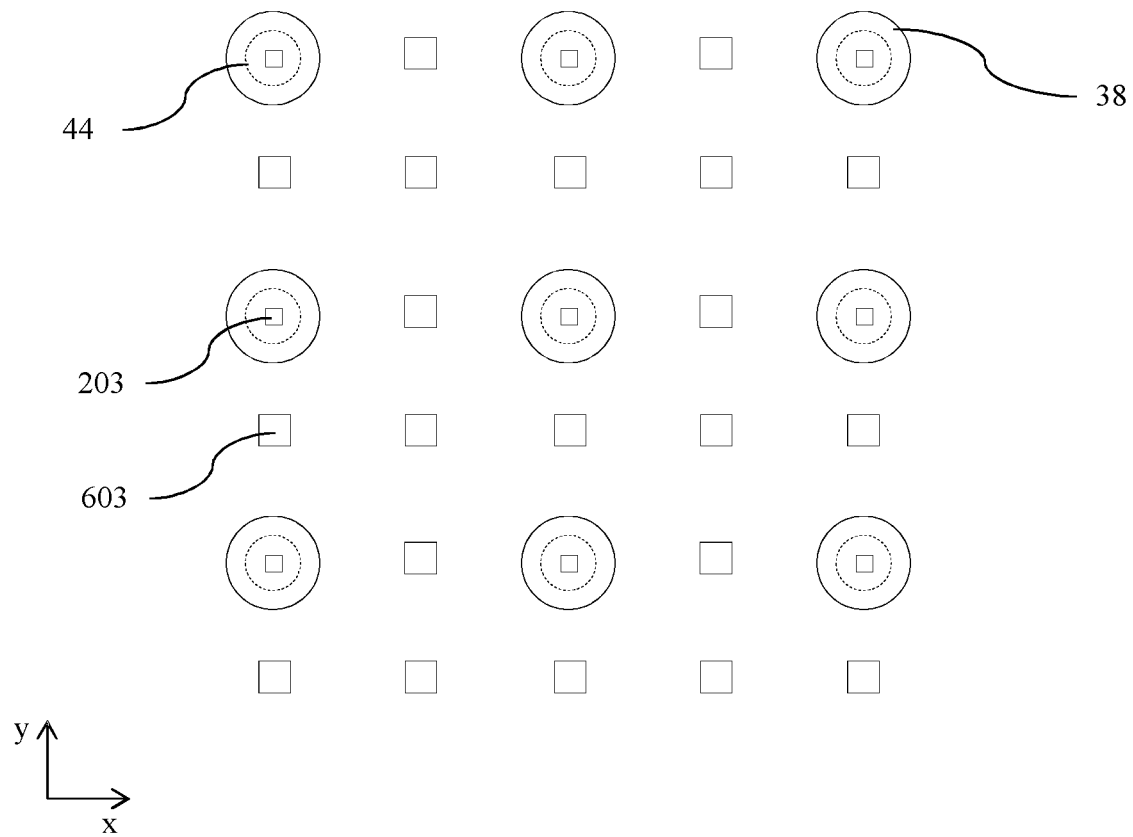
FIG. 51B is a schematic diagram illustrating in top view a switchable directional display apparatus comprising a sparse array of catadioptric optical elements and a first array of aligned LEDs on a first substrate, further comprising a second array of aligned LEDs on a second substrate, in accordance with the present disclosure.

FIG. 51A is a schematic diagram illustrating in side perspective view a switchable directional display apparatus comprising a sparse array of catadioptric optical elements and a first array of aligned LEDs on a first substrate, further comprising a second array of aligned LEDs on a second substrate; and FIG. 51B is a schematic diagram illustrating in top view a switchable directional display apparatus comprising a sparse array of catadioptric optical elements and a first array of aligned LEDs on a first substrate, further comprising a second array of aligned LEDs on a second substrate. Thus the catadioptric optical elements 38 may be arranged on a sparse array, and the LEDs 600 may be arranged between the second side 708 of the catadioptric optical elements to provide switchable directional illumination. Advantageously output efficiency may be improved.

The arrangement of the LEDs 600 in directional illumination apparatus will now be described.

Figure 52A:
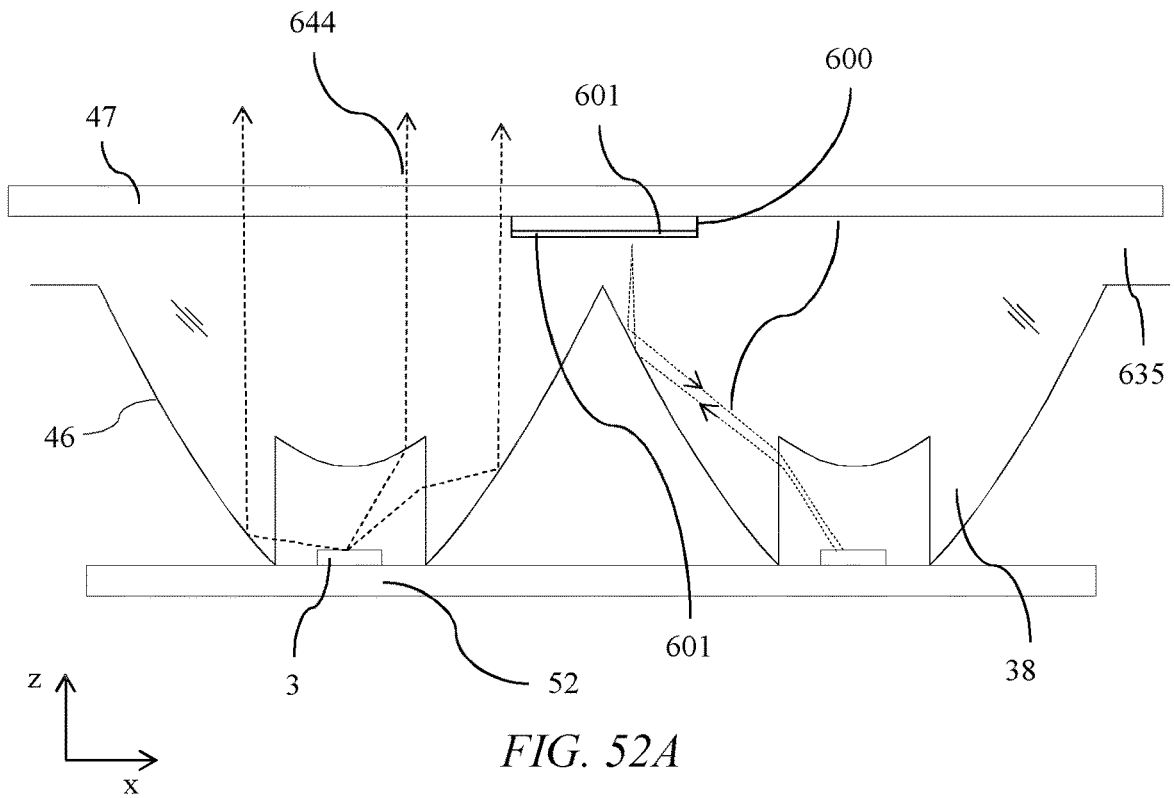
FIG. 52A is a schematic diagram illustrating in side view light propagation from the first array of LEDs and aligned catadioptric elements of FIG. 50B, in accordance with the present disclosure.

FIG. 52A is a schematic diagram illustrating in side view light propagation from the first array of micro-LEDs 3 and aligned catadioptric elements 38 of FIG. 50B wherein the second array of LEDs 600 arranged between the second substrate 47 and the first substrate 52. The LEDs 600 of the second plurality of LEDs may be arranged on the first side of the optical element support substrate that may be transparent substrate 47.

The area of the LEDs 600 may be small in comparison to the area of the output of the catadioptric optical elements 38, reducing light loss. Light rays 642 that are incident on the rear of the LEDs may be reflected by means of reflecting layers 601 arranged on the lower side of the LEDs 600. Such light rays may be recycled at the micro-LEDs 3 or in areas around the LEDs 203.

Advantageously the losses from the LEDs 600 for light from the micro-LEDs 3 may be reduced.

In one method to form the apparatus of FIG. 52A, LEDs 600 may be formed on substrate 47 and subsequently catadioptric optical elements 38 moulded onto the substrate 47, embedding the LEDs 600. Base layer 635 may be arranged to provide embedding of the LEDs when provided near adjacent cusps of the surfaces 46.

Figure 52B:
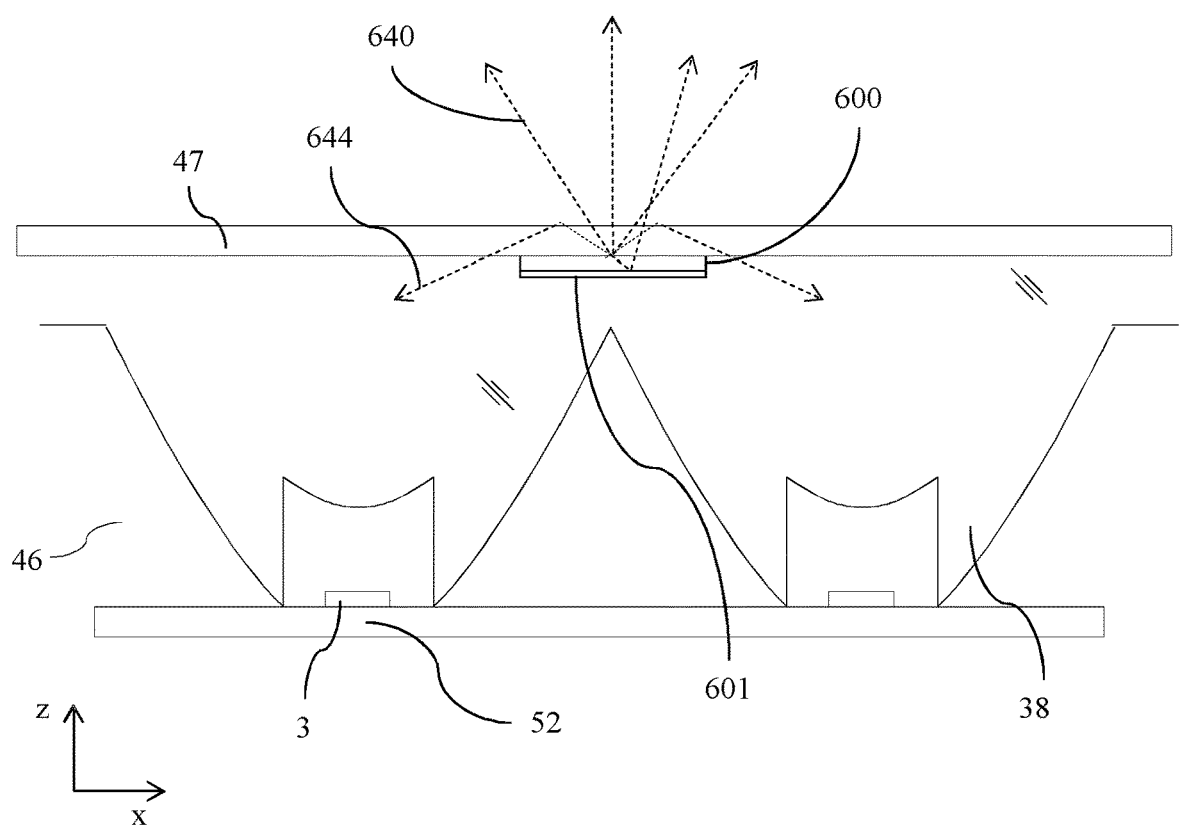
FIG. 52B is a schematic diagram illustrating in side view light propagation from the second array of LEDs arranged between the second substrate and the first substrate, in accordance with the present disclosure.

FIG. 52B is a schematic diagram illustrating in side view light propagation from the second array of LEDs 600 arranged between the second substrate 47 and the first substrate 52. Light rays 640 are emitted towards the transmissive spatial light modulator 112. Further light rays 644 may be guided within the substrate 47 and directed towards the first substrate 52 that may be a backplane substrate. Reflective elements on the substrate 52 may achieve recycling of light rays 644 increasing efficiency and improving uniformity of output by mixing of light from adjacent LEDs 3, 600.

It would be desirable to increase the uniformity of output of a directional backlight comprising catadioptric optical elements.

Figure 52C:
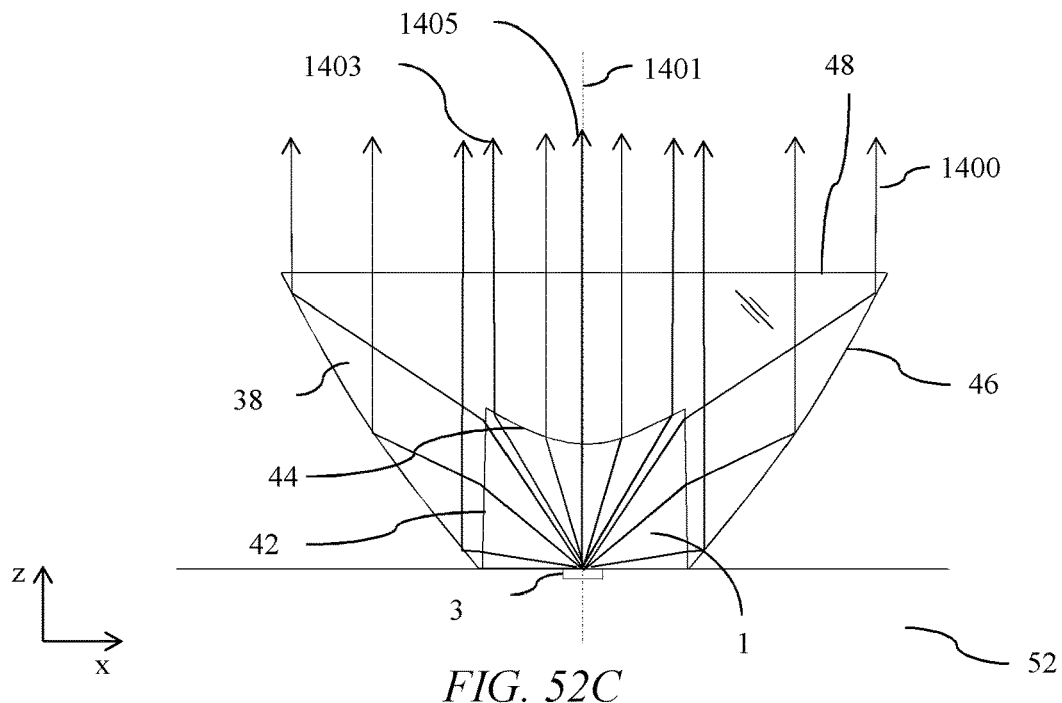
FIG. 52C is a schematic diagram illustrating a side view of a raytrace of light rays from the centre of a light emitting element through a catadioptric optical element, in accordance with the present disclosure.

FIG. 52C is a schematic diagram illustrating a side view of a raytrace of light rays from the centre of a micro-LED 3 through a catadioptric optical element 38 with optical axis 1401 that is aligned with the centre of the micro-LED 3 arranged on backplane substrate 52.

In an illustrative embodiment, light rays 1405 normal to the micro-LED 3 are emitted into air cavity 1 and directed along the optical axis, 1401 to the curved refractive surface 44 and transmitted through output surface 48 (that may be formed on transmissive substrate 47, not shown).

Light rays 1403 at angles near to the normal direction of the micro-LED 3 are refracted at the refractive surface 44 and output at substantially parallel to rays 1405.

Light rays 1400 at greater angles to the normal are incident on the side walls 42 and refracted to fall onto the outer surface 46 at which they are reflected by total internal reflection and output substantially parallel to rays 1405. The shape of the surface 46 is arranged to provide such collimation of light from the centre of the pixel.

Alternatively the shapes of surfaces 44, 46 and walls 42 may be arranged to provide some aberrational optimisation for positions across the width of the micro-LED 3.

The output spatial luminance of the output of the catadioptric element of FIG. 52C will now be described.

Figure 52D:
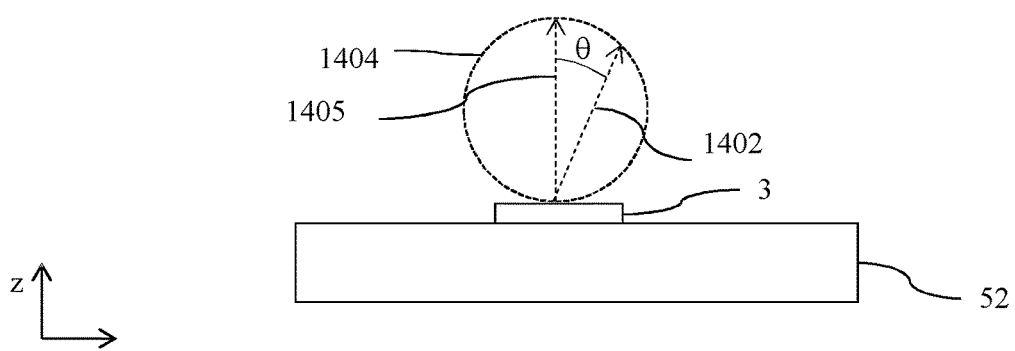
FIG. 52D is a schematic diagram illustrating a side view of the directional light output distribution from a light emitting element such as an LED, in accordance with the present disclosure.

FIG. 52D is a schematic diagram illustrating a side view of the directional light output distribution from a micro-LED 3 such as an LED in air. Emission from the upper surface of such an element is typically Lambertian; that is the luminance (luminous flux per unit solid angle per unit projected source area) is constant with viewing angle. Thus the luminous intensity (luminous flux per unit solid angle) of ray 1402 falls as cos θ where θ is the inclination angle of output ray 1402 to ray 1405. More generally, the ray luminous intensity distribution with angle can be represented by luminous intensity locus 1404 that is a circle for a Lambertian emitter.

Figure 53:
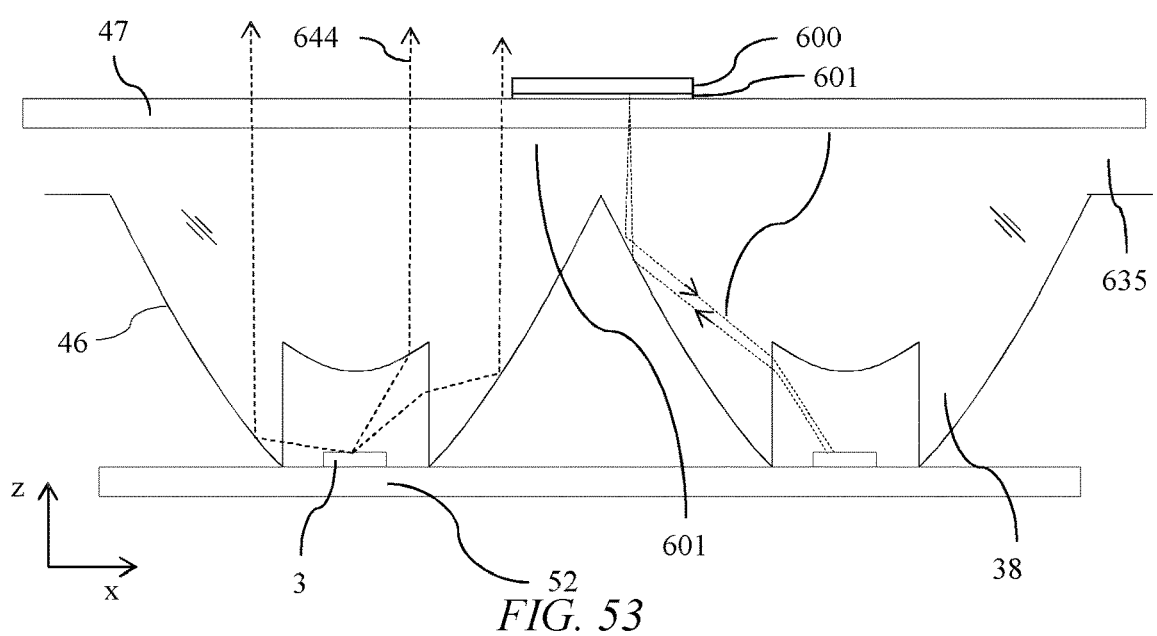
FIG. 53 is a schematic diagram illustrating in side view the arrangement of LEDs on the top side of the transparent substrate 47, in accordance with the present disclosure.

FIG. 53 is a schematic diagram illustrating in side view the arrangement of LEDs 600 on the top side of the transparent substrate 47. The first side of the optical element support substrate is arranged between the catadioptric optical elements 38 and the LEDs 600 of the second plurality of LEDs. The reflective layer 601 may be arranged under the light emitting element 600 and may be formed on the substrate 47, advantageously achieving a simpler and less complex method to form the reflective layer 601. The LEDs 600 of the second plurality of LEDs may be arranged on the second side opposite the first side of the optical element support substrate that may be transparent substrate 47.

Pixel LEDs 603 for switchable directional direct displays of FIGS. 50-51 will now be described.

Figure 54:
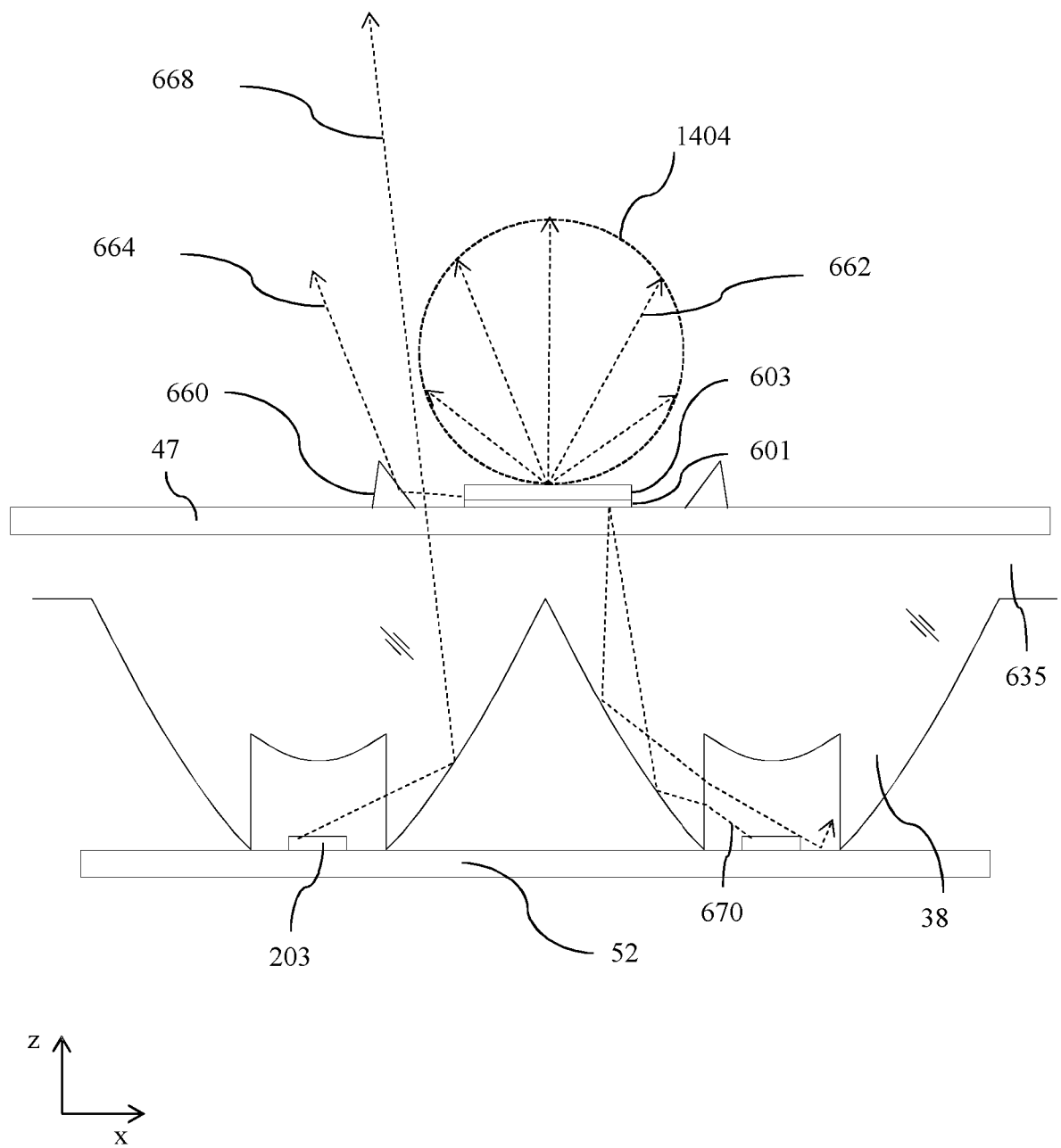
FIG. 54 is a schematic diagram illustrating in side view light propagation from the second array of LEDs arranged on the second substrate wherein the second substrate is between the second array of LEDs and the first substrate, in accordance with the present disclosure.

FIG. 54 is a schematic diagram illustrating in side view light propagation from the second array of LEDs arranged on the second substrate wherein the second substrate is between the second array of LEDs and the first substrate.

In comparison to the arrangement of FIG. 52B, emission from the pixel LEDs 600 is directly into air and a full emission cone 1404 may be provided to the observer in wide angle mode, achieving directional light output distribution of viewing window 122. The light cone may be modified by side emission from the pixel LED 600, which may be redirected by means of reflective angled optical elements 660. Further light rays 670 may be recycled by means of reflection from layer 601.

Advantageously a switchable directional direct display may be provided with high efficiency, low pixel cross talk, and low thickness.

Methods for forming illumination apparatus comprising arrays of LEDs 3, 203 in alignment with arrays of catadioptric optical elements 38 will now be described. Further a method to form an illumination apparatus is disclosed in WO2010038025, incorporated herein by reference. Methods to process arrays of micro-LEDs are further disclosed in WO2012052722, incorporated herein by reference.

FIGS. 55A-H are schematic diagrams illustrating in side views a method to form an illumination apparatus 110 comprising a plurality of micro-LEDs 3 and a plurality of catadioptric optical elements 38. Similar methods may be provided to form directional direct display apparatus 210, 211. The first plurality of micro-LEDs 3 or pixel micro-LEDs 203 may comprise inorganic LED and the second plurality of LEDs 103, 403, 600 or pixel LEDs 423, 603 may comprise inorganic LEDs. The LEDs of the first plurality of LEDs may be from a monolithic wafer arranged in an array with their original monolithic wafer positions and orientations relative to each other preserved; and wherein in at least one direction, for at least one pair of the plurality of LEDs in the at least one direction, for each respective pair there was at least one respective LED in the monolithic wafer that was positioned in the monolithic wafer between the pair of LEDs in the at least one direction and that is not positioned between them in the array of LEDs.

Figure 55A:
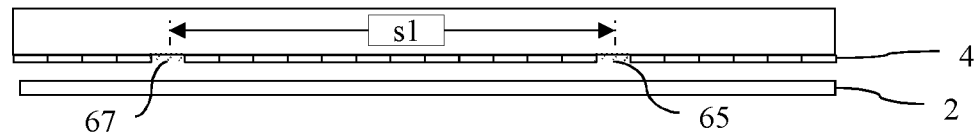
FIGS. 55A-H are schematic diagrams illustrating in side views a method to form an illumination apparatus comprising an array of LEDs and an array of catadioptric optical elements, in accordance with the present disclosure.

As illustrated in FIG. 55A, a monolithic light-emitting element wafer 2 may be provided. In an illustrative embodiment the monolithic wafer 2 may comprise a gallium nitride layer and may be formed on a sapphire substrate. For the purposes of the present specification, the term monolithic refers to consisting of one piece; solid or unbroken.

In a first step at least one mask 4 is used to illuminate the monolithic light-emitting element wafer 2, with spacing s1 between first and second regions 65, 67.

Figure 55B:
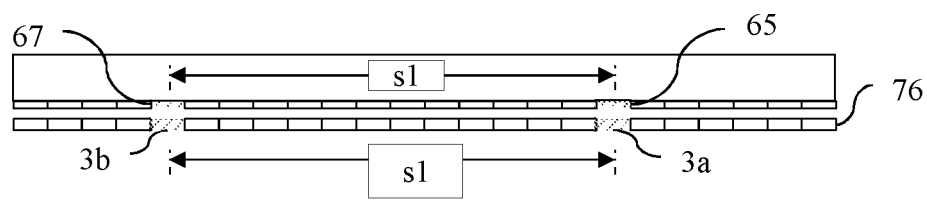

As illustrated in FIG. 55B in a second processing step, an array of light-emitting elements 3a, 3b is formed in the monolithic wafer 2. Each element has a position and orientation defined by the mask 4. The mask is composed of an array of regions 65, 67, each region defining the structure of at least one layer of an LED chip. Regions 65, 67 represent locations of first and second LED chips 3a, 3b and have separation s1 as shown. During exposure through the mask onto the wafer 2, elements 3a, 3b are formed at the positions defined by regions 65, 67 of the mask 4.

The separation s1 of the elements 3a, 3b is substantially the same as the separation s1 of the mask regions 65, 67 and the orientation of the elements 3a, 3b is the same as the orientation of the respective mask regions 65, 67.

The integrity of separation s1 and orientation of elements 3a, 3b is preserved through the subsequent processing steps. Multiple masks may be used to photo-lithographically form the complete LED structure in the manner described, each with regions with the separation s1.

Alternatively, the LED chips may be formed by means of nanoimprint lithography or other known lithography method. Such processes preserve a separation s1 and orientations of elements 3a and 3b.

Figure 55C:
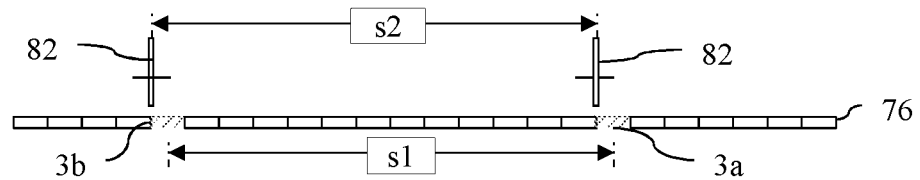

As illustrated in FIG. 55C in a third step, the light-emitting elements 3a, 3b are cut and scribed or broken by means of a cutting device 82, which may for example be a scribe, cutting wheel, laser beam or saw.

The separation s2 of the cut or break locations for a respective edge of elements 3a, 3b are provided to be substantially the same as the separation s1.

Figure 55D:
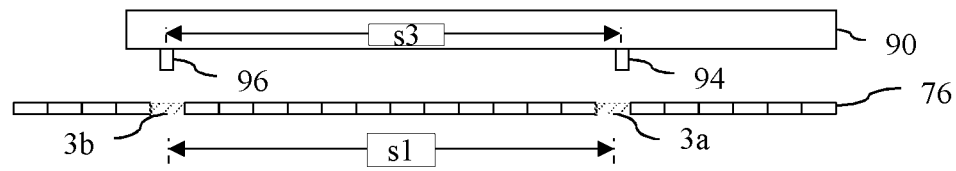

As illustrated in FIG. 55D in a fourth step, a tool 90 may have fingers 94, 96 with separation s3, and is aligned to the array of micro-LEDs 3a, b. The separation s3, orientation and placement of the fingers 94, 96 are provided as substantially the same as the separation s1, orientation and placement of the light-emitting elements of the array.

The separation s3 may not be precisely identical to the separation s1, or the orientation and placement of the fingers 94, 96 may not be identical to the orientation and placement of the light-emitting elements 3a, 3b. Advantageously the alignment tolerance and tool 90 fabrication tolerances are relaxed, reducing cost and complexity of the assembly method.

In an alternative method for the fourth step a laser may be arranged to illuminate the micro-LEDs 3a, 3b to provide cutting and separation. For example an excimer laser may illuminate the micro-LEDs 3a, 3b through the sapphire wafer. The gallium nitride material at the interface may decompose to nitrogen and gallium, providing a separation force and achieving a patterned laser lift off of the elements 3a, 3b. The separation of the illumination regions may be s1. The cutting or breaking step may further be eliminated, with breakage of the edges of the micro-LEDs 3a, 3b provided by the force of lift off and illumination structure at the gallium nitride layer during exposure to the excimer laser. The lifted off elements may be provided on tool 90 that may comprise fingers 94, 96 that may be provided as regions of an adhesive layer for example.

Figure 55E:
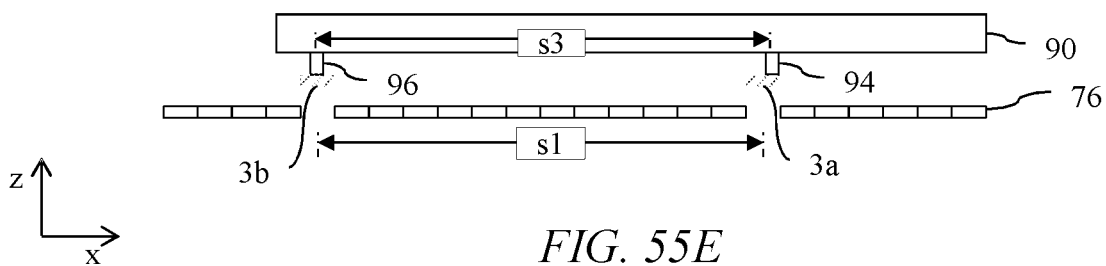

As illustrated in FIG. 55E in a fifth step the fingers 94, 96 are attached to the elements 3a, 3b respectively and used to extract the elements from the array of micro-LEDs 3a, 3b.

The separation s3 and orientation of the fingers 94, 96 may not be identical to the separation s1 and orientation of the elements 3a, 3b; however the integrity of the separation s1 and orientation of the elements 3a, 3b is nevertheless preserved in this extraction step.

Figure 55F:
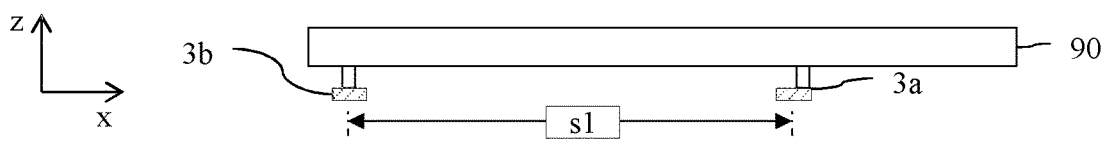
Figure 55G:
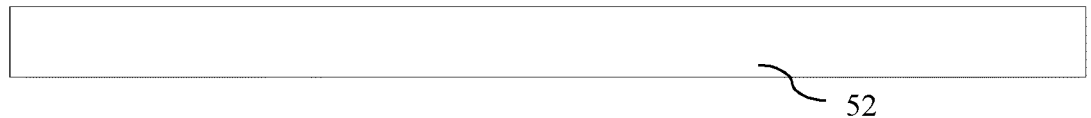

As illustrated in FIGS. 55F-G in a sixth step, the elements 3a, 3b may be transferred to backplane substrate 52. The separation of the elements 3a, 3b is the same as s1 on the monolithic substrate 2. This separation is preserved when the elements 3a, 3b are subsequently formed on substrate 52. Substrate 52 that may comprise light directing elements 200, 202 that have a separation s5 and that will typically be the same as separation s1. The elements 200, 202 may be provided by moulding methods for example.

Further electrical and thermal connections (not shown) to the micro-LEDs 3a, 3b may be provided with substantially the same separation s1 and may be provided by means of lithographic processing or printing for example.

In an alternative method, the micro-LEDs 3a, 3b may be separated from the monolithic wafer 2 without the first masking step. The electrodes and other structures may be formed on the elements 3a, 3b after forming on the substrate 52.

Figure 55H:
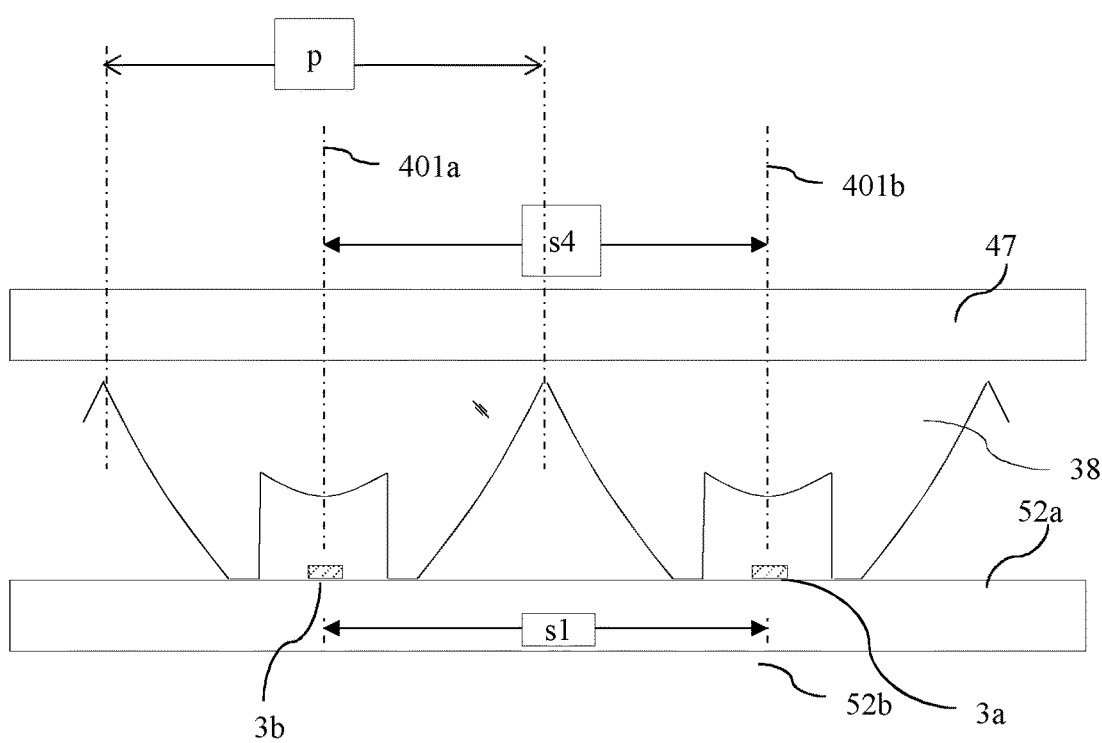

As illustrated in FIG. 55H in a seventh step the substrate 52 may be aligned to an array of catadioptric optical elements 38. The array of catadioptric optical elements 38 may be monolithic and/or may be formed on transparent substrate 47.

The relative spatial positions of the array of catadioptric optical elements 38 may be provided when the array of catadioptric optical elements 38 are formed. The separation s4 of the respective optical axes 401a, 401b may be the same as s1 to provide the same light output directional light output distribution from adjacent catadioptric optical elements. Alternatively the separation s4 may be different from s1 to provide different directional light output distributions from adjacent elements, for example to provide pupillation of the output of the illumination apparatus 110 across the area of the illumination apparatus.

Thus the non-monolithic light-emitting element array and the optical element array are aligned such that a given optical element is aligned with a respective light-emitting element. The light-emitting element is positioned substantially in the input aperture (entrance pupil) of the respective optical element 38.

The catadioptric optical elements 38 each have an output aperture (exit pupil), (illustrated with width p), and is greater in area than the area of the respective light-emitting element in the input aperture such that the respective catadioptric optical element 38 that is aligned with a light-emitting element 3a of the non-monolithic light-emitting element array directs light emitted by the light-emitting element 3a into a smaller solid angle than that at which the light is emitted by the light-emitting element 3a.

The step of selectively removing a plurality of light-emitting elements from the monolithic array in a manner that preserves the relative spatial position of the selectively removed light-emitting elements may further comprise removing the plurality of light-emitting elements from the monolithic array in a manner that preserves the relative orientation of the selectively removed light-emitting elements.

Advantageously this achieves an array of directional light output distributions that are substantially the same across the array of micro-LEDs 3a, 3b and respective aligned catadioptric optical elements 38. The illumination profile of the light output directional light output distribution can be substantially identical for respective elements with the same size and orientation of light-emitting elements 3a, 3b.

Advantageously the uniformity correction embodiments described elsewhere herein can be provided for each element of the array of micro-LEDs 3a, 3b, or pixel micro-LEDs 203 and respective aligned catadioptric optical elements 38. Thus a uniform illumination apparatus may be provided for backlighting, direct display or environmental lighting applications.

A method to form an illumination apparatus will now be further described.

FIGS. 56A-D are schematic diagrams illustrating in perspective views a method to form an illumination apparatus 110 comprising a plurality of micro-LEDs 3 and a plurality of catadioptric optical elements 38.

Figure 56A:
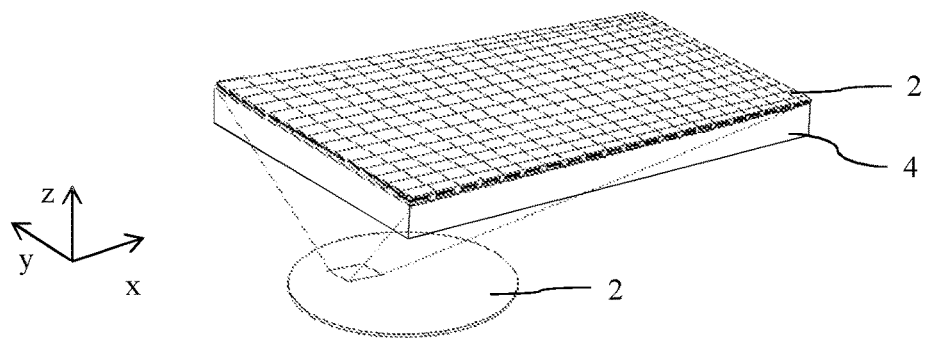
FIGS. 56A-D are schematic diagrams illustrating in perspective views a method to form an illumination apparatus comprising an array of LEDs and an array of catadioptric optical elements, in accordance with the present disclosure.

As illustrated in FIG. 56A, the monolithic wafer 2 that may be gallium nitride for example and may be formed on a substrate 4 that may be sapphire for example.

Figure 56B:
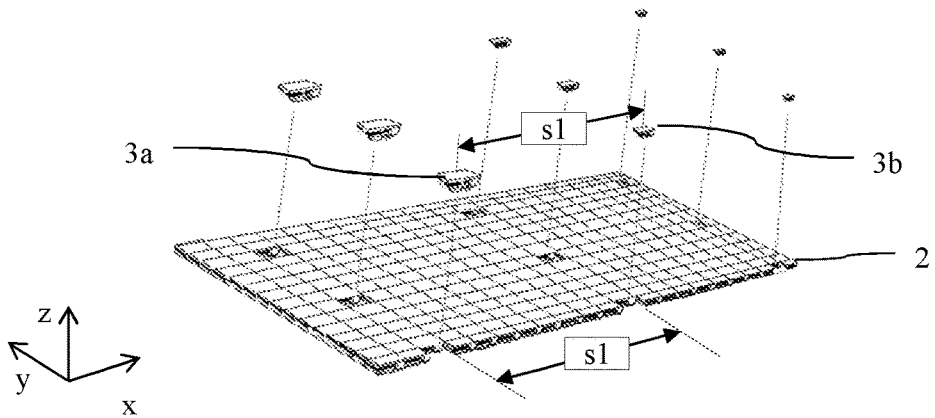

As illustrated in FIG. 56B, a non-monolithic array of micro-LEDs 3 may be extracted from the monolithic wafer 2 to provide micro-LEDs 3a, 3b with separation s1.

Figure 56C:
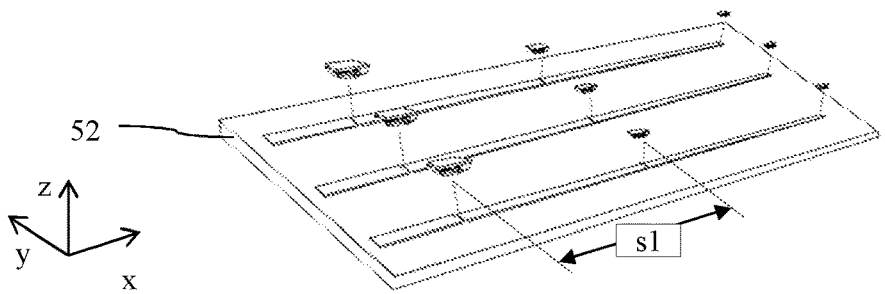

As illustrated in FIG. 56C, micro-LEDs 3a, 3b may be arranged on substrate 52 in alignment with electrodes and other optical elements (not shown).

Figure 56D:
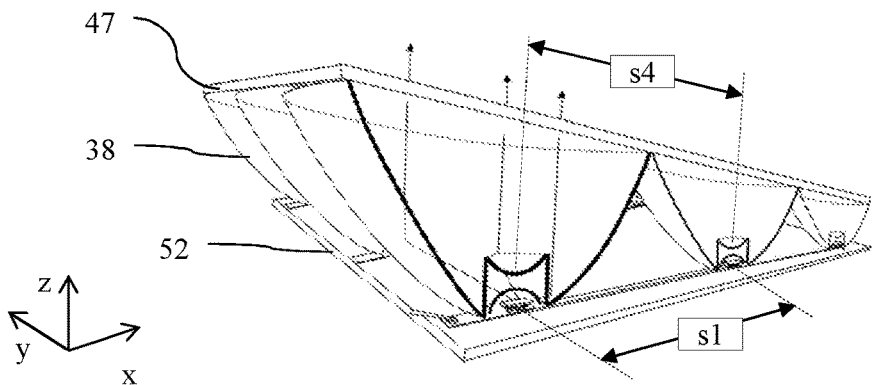

As illustrated in FIG. 56D, the substrate 52 may be aligned with a plurality of catadioptric optical elements 38 with separations s4 to provide an illumination apparatus, such that separation s4 may be the same as separation s1. Advantageously large numbers of elements may be formed over large areas using small numbers of extraction steps, while preserving alignment to a respective array of optical elements.

Figure 57A:
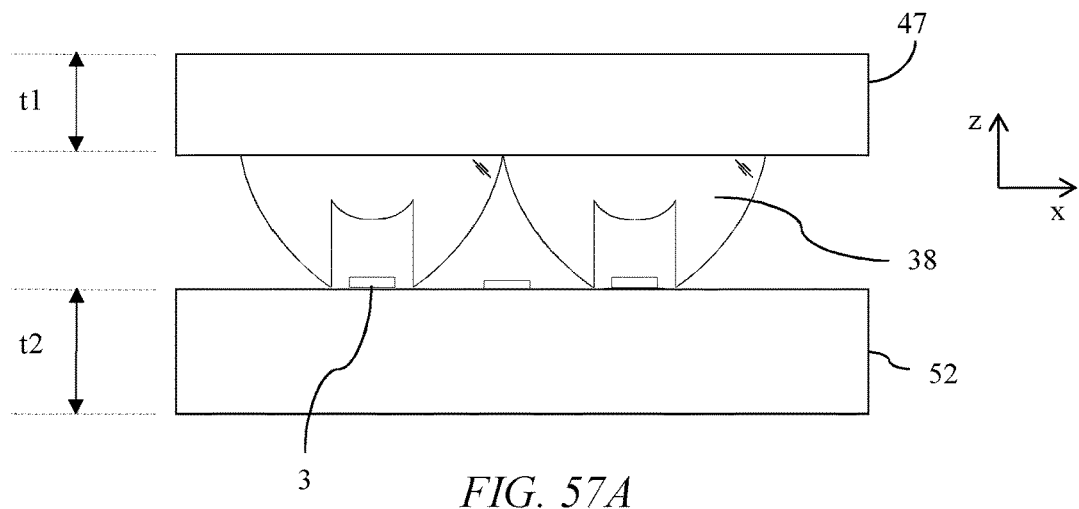
FIGS. 57A-B are schematic diagrams illustrating in side views thinning of an illumination apparatus, in accordance with the present disclosure.
Figure 57B:
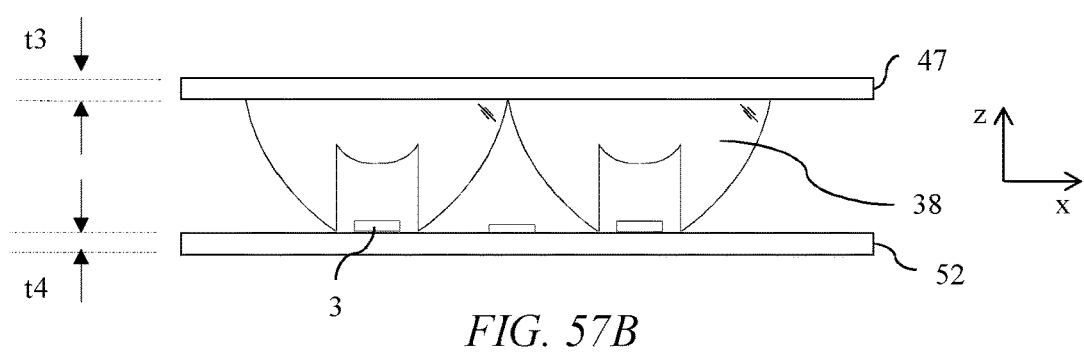

FIGS. 57A-B are schematic diagrams illustrating in side views thinning of an illumination apparatus. FIG. 57A illustrates that the thicknesses t1, t2 of substrates 52, 47 may be provided to achieve thermal and mechanical stability in the steps illustrated in FIGS. 56A-D. In operation, it may be desirable to provide reduced thicknesses t3, t4, that can be achieved for example by means of chemical-mechanical polishing of the illumination apparatus after alignment step of FIGS. 55I and 56D. Such a process is further disclosed in WO2012052723 and incorporated herein by reference. For example substrates of thickness 0.4 mm can be provided during manufacture and thinned to less than 0.1 mm to provide low device thickness and flexibility.

Advantageously manufacturing yield can be increased while achieving thin device profile and flexible applications.

It would be desirable to provide multiple illumination apparatuses from large areas of aligned optical elements.

Figure 58:
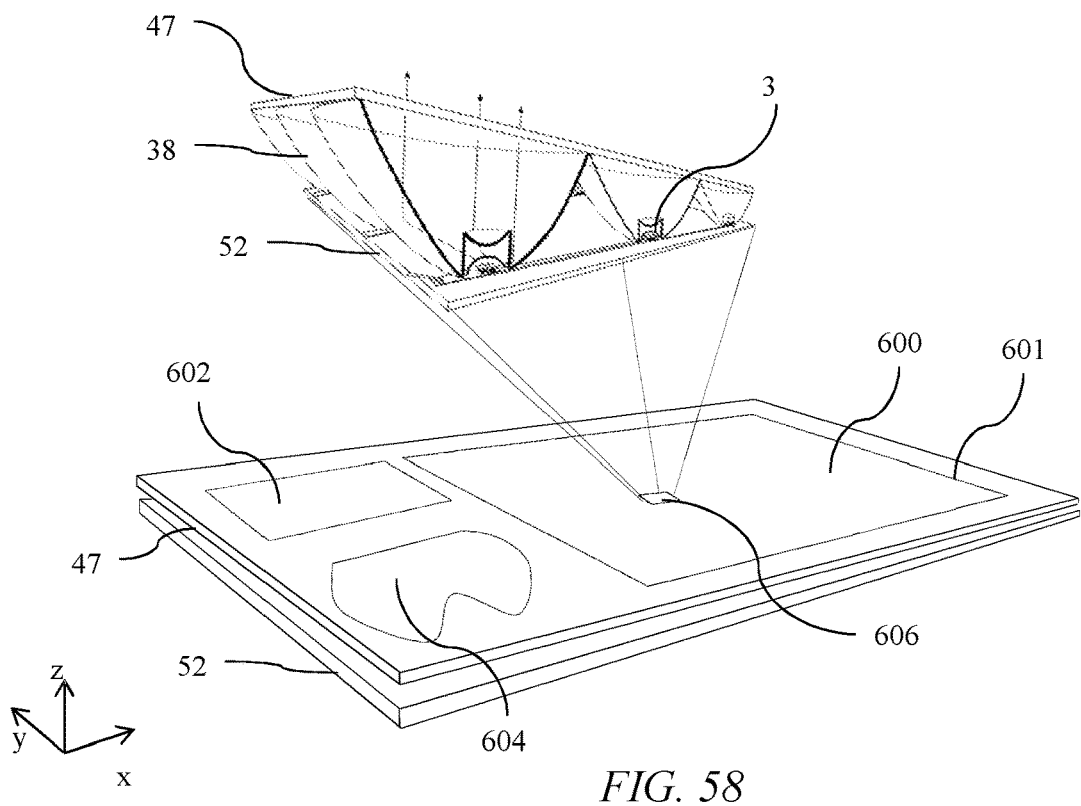
FIG. 58 is a schematic diagram illustrating in perspective view singulation of an illumination apparatus, in accordance with the present disclosure.

FIG. 58 is a schematic diagram illustrating in perspective view singulation of an illumination apparatus. FIG. 58 illustrates that illumination apparatuses with desirable directional light output distribution characteristics can be singulated from large area substrates 52, 47, for example to provide different size elements 600, 602 or different shape elements 604. Further device seal lines 601 may be provided at the edge of each element to provide hermetic sealing of the optical elements, and reduce dust and other material ingress into the optical elements during use.

Advantageously manufacturing cost and complexity can be reduced, and reliability during use increased.

FIG. 59 is a schematic diagram illustrating in side view a prior art LED device 31 as an example of a micro-LED 3. In this specification, the term LED is used to include semiconductor LEDs including inorganic LED, organic LEDs and polymer LEDs.

A substrate 4, such as sapphire has an n-type gallium nitride (GaN) layer 6 layer formed on its surface, typically with intermediate functional layer 5 such as a lattice matching layer or a release layer. A multiple quantum well layer 8 and p-type GaN layer 10 are formed over the layer 6. The active region 1 thus comprises the layers 6,8,10 and perhaps part of layer 5 and may further comprise electrode contacts and other functional elements as part of the LED device 31 structure.

The substrate 4 and functional layer 5 may be removed in the process of extraction of the LED device 31 for example by means of patterned laser lift off as described elsewhere herein. In the case of lifted off LED device 31, electrode 7 may alternatively be arranged on the layer 6.

When a voltage is applied across the LED device 31 by means of electrodes 7, 9, emission 12 occurs within the layer 8.

Light rays 16, 18 transmitted close to normal to the outer surface 14 are transmitted. However, light rays 20, 22, 24 are internally reflected due to the relatively high refractive indices within the LED device 31. Light rays 20, 22 can exit through the edge 26 of the device. Such devices have relatively high internal absorption coefficients to light passing through the layers 6,8,10, resulting in loss of efficiency and increased device heating. As the dimensions of the device increases, the path length of many of the internally reflected light rays 20, 22, 24 increases and so the proportion of light rays that can escape from the device decreases, resulting in decreasing external efficiency for larger devices as size increases. In order to improve the external efficiency, surface roughening or photonic bandgap structures are added to the top surface 14. This enables light that would otherwise have been guided in the device layers to be extracted from the top surface 14. In thin film flip chip devices, the substrate 4 is further removed so as to improve external light coupling. In this case, the surface 28 is modified. Further the edges of the device may be formed by an etching process prior to cutting to provide improved facet quality.

It may be desirable to increase the output coupling efficiency of micro-LED 3.

FIG. 60 is a schematic diagram illustrating in side view the mounting of the LED device 31 onto a substrate 52 to form a substantially Lambertian light output micro-LED 3. Electrical connections (not shown) are made and in the case of white emission devices, a phosphor or colour conversion layer 34 is added. Further, a hemispherical refractive structure 36, for example a moulded silicone material, may be added to increase the forward optical coupling efficiency of the device. Alternatively, in thin film flip-chip, structures, the device 1 may be used in which the substrate 4 has been removed. The structure 36 serves in particular to couple the light output from the light-emitting element into air by providing an index matching function, reducing Fresnel losses and total internal reflection losses at the surface of the light-emitting element and at the surface of the structure. The structure 36 does not serve to provide any substantial light directing function so that if the light emitting element has a Lambertian output then the output of the hemispherical structure will also be substantially Lambertian.

In the present embodiments the micro-LEDs 3 may be aligned to a plurality of refractive ancillary optics 36, such as hemispherical structures with separation s7, typically similar to the separation s4 so as to advantageously achieve efficient light extraction into air from the light-emitting elements 3a, 3b.

A pick and place alignment method for prior art macroscopic optical elements will now be described in comparison to the array extraction methods that are preferably provided for fabrication of the present embodiments.

FIG. 61 is a schematic diagram illustrating in side view a known macroscopic catadioptric light directing optical single element 40; and FIG. 62 is a schematic diagram illustrating in side view an arrangement of macroscopic light directing element 38 with the mounted device 30.

Surface 708 may comprise several features. For example, a lens surface 50, a diffuser, lenticular arrays or other optical function may be incorporated. Such an element operates by means of reflective and refractive optical structures (catadioptric). Further, some of the surfaces may be metallised so that reflections are by means of total internal reflection and/or metallised reflection. Typical structures may be compound parabolic collectors (CPC) or refractive-reflective-internal reflective (RXI) elements.

The input aperture 39 of the element 38 has a width or diameter 115 and the output aperture 40 has a width or diameter 117. Specifically the output aperture 40 has an area greater than the area of the input aperture 39 so that the width or diameter 117 is greater than the width or diameter 115. The optical element 38 thus provides a reduction in the solid angle of the output beam from the output aperture 40 compared to the solid angle of the input beam at the input aperture 39. In operation, the optical input aperture is defined by the size of the respective aligned light-emitting element and so the (effective) optical input aperture is smaller than the physical input aperture 115.

By way of comparison with the present embodiments, macroscopic catadioptric optical elements may be used with light-emitting elements such as 1 mm×1 mm LEDs are on a relatively large scale with output aperture sizes 117 and thickness of greater than 10 mm being typical. Such macroscopic optical elements may be mastered by means of diamond turning the form of a single element which is then replicated to produce individual macroscopic optical elements. Each of these is then aligned to at least one LED, typically using a pick-and-place process. Such techniques do not use lithographic level precision of placement of input and output apertures of the optical elements or of the light-emitting elements in the array. Such standard techniques are not adequately precise for use in microscopic array directional illumination systems described in this specification.

The device 30 is aligned centrally with the input aperture 39 and the optical axis 401. Light ray 54 passes through the surfaces 48, 50 and is directed parallel to the optical axis 52. Light ray 56 passes through the surface 42 and undergoes total internal reflection at the surface 46. Alternatively the surface 46 may be coated with a reflective material. In the case of a sideways displacement of the device 30 from the optical axis 401 of the element 38, the rays 54, 56 would no longer parallel to the optical axis 401, and the centre of the final output beam comprising rays 54, 56 may be angularly displaced with respect to the originally desired output directions 54, 56. Further, the final luminance structure of the angular output may be modified. In an array of such macroscopic optical elements it is desirable that the light-emitting elements are accurately aligned with the optical centre of the optical elements so that all the output beams are parallel. If this is not the case then the final output solid angle will be increased for the array compared to the solid angle for a single device.

The words "substantially" and "approximately", as may be used in this disclosure provide a tolerance which is accepted in the industry for its corresponding word and/or relativity between items. Such an industry-accepted tolerance ranges from zero to ten percent and corresponds to, but is not limited to, lengths, positions, angles, etc. Such relativity between items ranges between approximately zero to ten percent.

Embodiments of the present disclosure may be used in a variety of optical systems. The embodiment may include or work with a variety of lighting, backlighting, optical components, displays, tablets and smart phones for example. Aspects of the present disclosure may be used with practically any apparatus related to displays, environmental lighting, optical devices, optical systems, or any apparatus that may contain any type of optical system. Accordingly, embodiments of the present disclosure may be employed in displays, environmental lighting, optical systems and/or devices used in a number of consumer professional or industrial environments.

It should be understood that the disclosure is not limited in its application or creation to the details of particular arrangements illustrated, because the disclosure is capable of other embodiments. Moreover, aspects of the disclosure may be set forth in different combinations and arrangements to define embodiments unique in their own right. Also, the terminology used in this disclosure is for the purpose of description and not of limitation.

While embodiments in accordance with the principles that are disclosed herein have been described, it should be understood that they have been presented by way of example only, and not limitation. Therefore, the breadth and scope of this disclosure should not be limited by any of the exemplary embodiments described, but should be defined only in accordance with any claims and their equivalents issuing from this disclosure. In addition, the above advantages and features are provided in described embodiments, but shall not limit the application of such issued claims to processes and structures accomplishing any or all of the above advantages.

The section headings herein are included to provide organizational cues. These headings shall not limit or characterise the embodiments set out in any claims that may issue from this disclosure. To take a specific example, although the headings refer to a "Technical Field," the claims should not be limited by the language chosen under this heading to describe the field. Further, a description of technology in the "Background" is not to be construed as an admission that certain technology is prior art to any embodiment in this disclosure. Neither is the "Summary" to be considered as a characterization of the embodiments in issued claims. Furthermore, any reference in this disclosure to "invention" in the singular should not be used to argue that there is merely one point of novelty in this disclosure. Multiple embodiments may be set forth according to the limitations of the multiple claims issuing from this disclosure, and such claims define the embodiments, and their equivalents, that are protected by them. In all instances, the scope of claims shall be considered on their own merits in the light of this disclosure, and should not be constrained by the headings used in this disclosure.

The invention claimed is:

1. An illumination apparatus, comprising:
a first plurality of LEDs, the first plurality of LEDs being arranged in a first LED array,
wherein the LEDs of the first plurality of LEDs are micro-LEDs;
a second plurality of LEDs, the second plurality of LEDs being arranged in a second LED array;
a first optical system aligned with the LEDs of the first plurality of LEDs to provide a first directional light output distribution, the first directional light output distribution being of light output from the LEDs of the first plurality of LEDs;
wherein the first optical system comprises a first plurality of optical elements arranged in a first optical element array, each of the optical elements of the first plurality of optical elements aligned in correspondence with a respective one or more of the LEDs of the first plurality of LEDs, each of the LEDs of the first plurality of LEDs being aligned with only a respective one of the optical elements of the first optical system; and
a second optical system aligned with the LEDs of the second plurality of LEDs to provide a second directional light output distribution, the second directional light output distribution being of light output from the LEDs of the second plurality of LEDs;
wherein the first directional light output distribution has a solid angle that is smaller than the solid angle of the second directional light output distribution;
the illumination apparatus further comprising control circuitry and electrodes arranged such that they are operable to drive the first plurality of LEDs independently of the second plurality of LEDs.

2. An illumination apparatus according to claim 1, wherein at least some of the LEDs of the second plurality of LEDs are positioned between neighbouring LEDs of the first plurality of LEDs.

3. An illumination apparatus according to claim 1 wherein at least some of the LEDs of the second plurality of LEDs are positioned between neighbouring optical elements of the first optical element array.

4. An illumination apparatus according to claim 1, wherein at least some of the LEDs of the second plurality of LEDs are micro-LEDs.

5. An illumination apparatus according to claim 1, wherein at least some of the optical elements of the first plurality of optical elements are catadioptric optical elements.

6. An illumination apparatus according to claim 4 wherein the catadioptric optical element comprises in at least one catadioptric cross-sectional plane through its optical axis
a first outer surface and a second outer surface facing the first outer surface;
wherein the first and second outer surfaces comprise curved surfaces;
wherein the first and second outer surfaces extend from a first end of the catadioptric optical element to a second end of the catadioptric optical element, the second end of the catadioptric optical element facing the first end of the catadioptric element;
wherein the distance between the first and second outer surfaces at the first end of the catadioptric optical element is less than the distance between the first and second outer surfaces at the second end of the catadioptric optical element; and
at least one transparent inner surface arranged between the first and second ends and between the first and second outer surfaces.

7. An illumination apparatus according to claim 1, wherein the LEDs of the first plurality of LEDs are micro-LEDs of width or diameter less than 300 microns, preferably less than 200 microns and more preferably less than 100 microns.

8. An illumination apparatus according to claim 5, wherein in the at least one catadioptric cross-sectional plane the distance between the first and second outer surfaces at the second end of the catadioptric optical element is less than 3 mm, preferably less than 1.5 mm and more preferably less than 0.75 mm.

9. An illumination apparatus according to claim 5, wherein in the at least one catadioptric cross-sectional plane, the exterior angle between the first end and the first and second outer surfaces at the first end is less than the exterior angle between the first end and the first and second outer surface at the second end.

10. An illumination apparatus according to claim 5, wherein in the at least one catadioptric cross-sectional plane at least one of the transparent inner surfaces has positive optical power.

11. An illumination apparatus according to claim 5, wherein in the at least one catadioptric cross-sectional plane at least one of the transparent inner surfaces has zero optical power.

12. An illumination apparatus according to claim 5, wherein in the at least one catadioptric cross-sectional plane some of the light output of LEDs of the first plurality of LEDs is transmitted by the at least one transparent inner surface before it is reflected at the first or second outer surfaces and directed into the first directional light output distribution; and some of the light output of LEDs of the first plurality of LEDs is transmitted by the at least one transparent inner surface and directed into the first directional light output distribution without reflection at the first or second outer surfaces.

13. An illumination apparatus according to claim 6, wherein a refractive optical element is provided between the LEDs of the first plurality of LEDs and the at least one transparent inner surface.

14. An illumination apparatus according to claim 13 wherein the refractive optical element is a hemispherical lens.

15. An illumination apparatus according to claim 1, wherein the first plurality of LEDs comprises inorganic LEDs.

16. An illumination apparatus according to claim 1, wherein the second plurality of LEDs comprises inorganic LEDs.

17. An illumination apparatus according to claim 1, wherein at least one of the first and second plurality of LEDs further comprises a wavelength converting layer.

18. An illumination apparatus according to claim 17 wherein the wavelength converting layer comprises a phosphor material or a quantum dot material.

19. An illumination apparatus according to claim 1, wherein the first and second plurality of LEDs are each arranged to provide light of substantially the same white point to the first and second optical elements.

20. An illumination apparatus according to claim 1, wherein the total light output area of the LEDs of the second plurality of LEDs is greater than the total light output area of the LEDs of the first plurality of LEDs.

21. An illumination apparatus according to claim 1, wherein
    the LEDs of the first plurality of LEDs are from a monolithic wafer arranged in an array with their original monolithic wafer positions and orientations relative to each other preserved; and
    wherein in at least one direction, for at least one pair of the plurality of LEDs in the at least one direction, for each respective pair there was at least one respective LED in the monolithic wafer that was positioned in the monolithic wafer between the pair of LEDs in the at least one direction and that is not positioned between them in the array of LEDs.

22. An illumination apparatus according to claim 6, wherein the second optical system comprises one or more light guides.

23. An illumination apparatus according to claim 22, wherein the one or more light guides are respectively aligned in correspondence with a respective one or more LEDs of the second plurality of LEDs.

24. An illumination apparatus according to claim 23 wherein each of the LEDs of the second plurality of LEDs are aligned with only a respective one of the light guides.

25. An illumination apparatus according to claim 22, wherein at least one of the light guides comprises in at least one light guide cross-sectional plane through its optical axis:
    a first light guide outer surface and a second light guide outer surface facing the first light guide outer surface; wherein the first and second light guide outer surfaces extend from a first end of the light guide to a second end of the light guide, the second end of the light guide facing the first end of the light guide; and
    a transparent light guide input surface at the first end of the light guide.

26. An illumination apparatus according to claim 25, wherein in at least one light guide cross-sectional plane through its optical axis the transparent input surface is linear.

27. An illumination apparatus according to claim 25, wherein in at least one light guide cross-sectional plane through its optical axis the first and second outer surfaces of the light guide are linear.

28. An illumination apparatus according to claim 22, wherein the first ends of the light guides of the plurality of light guides are interspersed with the first ends of the catadioptric optical elements of the plurality of catadioptric optical elements.

29. An illumination apparatus according to claim 22, wherein at least some of the catadioptric optical elements of the plurality of catadioptric optical elements are extended in a direction that is normal to the catadioptric cross sectional plane.

30. An illumination apparatus according to claim 29 wherein at least some of the light guides of the plurality of light guides are extended in the direction that is normal to the catadioptric cross sectional plane.

31. An illumination apparatus according to claim 25, wherein the first and second light guide outer surfaces are transparent.

32. An illumination apparatus according to claim 25, wherein in at least one light guide cross-sectional plane through its optical axis the distance between the first and second outer surfaces at the first end of the light guide is the same as the distance between the first and second outer surfaces at the second end of the light guide; and wherein the solid angle of the second directional light output distribution is substantially the same as the solid angle of the directional light output distribution of the LEDs of the second plurality of LEDs.

33. An illumination apparatus according to claim 25, wherein in at least one light guide cross-sectional plane through its optical axis the distance between the first and second outer surfaces at the first end of the light guide is less than the distance between the first and second outer surfaces at the second end of the light guide; and wherein the solid angle of the second directional light output distribution is less than the solid angle of the directional light output distribution of the LEDs of the second plurality of LEDs.

34. An illumination apparatus according to claim 25, wherein the second ends of the light guides of the plurality of light guides are interspersed with the second ends of the catadioptric optical elements of the plurality of catadioptric elements.

35. An illumination apparatus according to claim 30, wherein at least some of the light guides of the plurality of light guides are extended in a direction that is orthogonal to the direction in which the catadioptric optical elements are extended.

36. An illumination apparatus according to claim 25, wherein the second end of at least one catadioptric optical element of the plurality of catadioptric optical elements is arranged on the first side of an optical element support substrate and the second end of at least one of the plurality of light guides is arranged on the same side of the optical element support substrate.

37. An illumination apparatus according to claim 25, wherein in at least one light guide cross-sectional plane through its optical axis, the first light guide outer surface is shaped with substantially the same shape as the first outer surface of a respective neighbouring catadioptric optical element; and the second light guide outer surface is shaped with substantially the same shape as the second outer surface of a respective neighbouring catadioptric optical element; wherein the distance between the first and second light guide outer surfaces is greatest at the first end of the light guide.

38. An illumination apparatus according to claim 37 wherein the first light guide outer surface is aligned to the first outer surface of the neighbouring catadioptric optical element with a gap;
and the second light guide outer surface is aligned to the second outer surface of the neighbouring catadioptric optical element with a gap.

39. An illumination apparatus according to claim 37 wherein at least part of the second directional light output distribution is provided by output light from LEDs of the second plurality of LEDs that is transmitted through the first light guide outer surface, and transmitted by an outer surface of the catadioptric optical element.

40. An illumination apparatus according to claim 37, wherein at least part of the second directional light output distribution is provided by output light from LEDs of the second plurality of LEDs that is reflected by total internal reflection at the second light guide outer surface.

41. An illumination apparatus according to claim 22, wherein the catadioptric optical elements of the plurality of catadioptric optical elements comprise a material transparent to at least one operating wavelength of at least one element of the first plurality of LEDs.

42. An illumination apparatus according to claim 41 wherein the catadioptric optical elements of the plurality of catadioptric optical elements comprise a transparent polymeric material.

43. An illumination apparatus according to claim 42 wherein the light guides of the plurality of light guides further comprise a light scattering material.

44. An illumination apparatus according to claim 42 wherein the light guides of the plurality of light guides further comprise a wavelength converting material.

45. An illumination apparatus according to claim 44 wherein the wavelength converting material comprises a phosphor or quantum dot material.

46. An illumination apparatus according to claim 1, wherein the LEDs of the first and second pluralities of LEDs are arranged on a common substrate.

47. An illumination apparatus according to claim 1, wherein the control circuitry comprises row and column electrode intersections and at each row and column electrode intersection, a data value store for providing at least two data values wherein one of the at least two data values is supplied to at least one LED of the first plurality of LEDs and one other of the at least two data values is supplied to at least one LED of the second plurality of LEDs.

48. An illumination apparatus according to claim 1, wherein the control circuitry comprises row and column electrode intersections and at each row and column electrode intersection, an electrode connected to an LED of the first plurality of LEDs and connected to an LED of the second plurality of LEDs; and further comprises first and second control electrodes connected to the respective first and second pluralities of LEDs; wherein the control electrodes are connected to a plurality of electrode intersections.

49. A backlight for a display apparatus comprising the illumination apparatus of claim 1.

50. A display apparatus comprising the backlight apparatus of claim 49 and a spatial light modulator.

51. A display apparatus according to claim 50, wherein the control system comprises a backlight controller arranged to drive at least one of the first and second plurality of LEDs in a first region of the backlight apparatus with a higher light output than the light output in a second region of the backlight apparatus.

52. A display apparatus according to claim 51, wherein the backlight control system is arranged to drive regions of at least one of the first and second pluralities of LEDs in correspondence with image data provided to the transmissive spatial light modulator by a display controller.

53. A direct display apparatus comprising a switchable illumination apparatus of claim 6, wherein the control circuitry further comprises means to drive the first and second pluralities of LEDs with image pixel data.

54. A direct display apparatus according to claim 53 wherein the LEDs of the first plurality of LEDs are arranged to provide a first plurality of image pixels with the first directional light output distribution;
wherein the LEDs of the second plurality of LEDs are arranged to provide the first plurality of image pixels with the second directional light output distribution.

55. A direct display apparatus according to claim 53 wherein in the at least one catadioptric cross-sectional plane the distance between the first and second outer surfaces at the second end of the catadioptric optical element is less than 0.5 mm, preferably less than 0.25 mm and more preferably less than 0.1 mm.

56. A direct display apparatus according to claim 53, wherein the second plurality of LEDs comprise organic LEDs.

57. A direct display apparatus according to claim 53, wherein the first and second plurality of LEDs are arranged to provide light of at least three different spectral bands to the first and second optical systems.

58. A direct display apparatus according to claim 53, wherein the LEDs of the first plurality of LEDs are micro-LEDs of width or diameter less than 100 microns, preferably less than 50 microns and more preferably less than 25 microns.

59. An illumination apparatus, comprising:
a first plurality of LEDs, the first plurality of LEDs being arranged in a first LED array, wherein the LEDs of the first plurality of LEDs are micro-LEDs;
a second plurality of LEDs, the second plurality of LEDs being arranged in a second LED array; and
a plurality of catadioptric optical elements arranged in a catadioptric optical element array, wherein each of the catadioptric optical elements of the plurality of catadioptric optical elements comprises, in at least one cross-sectional plane through its optical axis:
a first outer surface and a second outer surface facing the first outer surface;
wherein the first and second outer surfaces extend from a first end of the catadioptric optical element to a second end of the catadioptric optical element, the second end of the catadioptric optical element facing the first end of the catadioptric element;
wherein the distance between the first and second outer surfaces at the first end of the catadioptric optical element is less than the distance between the first and second outer surfaces at the second end of the catadioptric optical element; and
at least one transparent inner surface arranged between the first and second ends and between the first and second outer surfaces;

wherein each of the catadioptric optical elements of the plurality of catadioptric optical elements is aligned in correspondence with a respective one or more of the LEDs of the first plurality of LEDs, each of the LEDs of the first plurality of LEDs being aligned with only a respective one of the catadioptric optical elements of the first plurality of catadioptric optical elements, the alignment in correspondence between a catadioptric optical element of the plurality of catadioptric elements and its respective one or more of the LEDs of the first plurality of LEDs comprising the respective one or more of the LEDs of the first plurality of LEDs being positioned at the first end of the catadioptric optical element and aligned with the catadioptric optical element or positioned between the first end of the catadioptric optical element and the at least one transparent inner surface of the catadioptric optical element and aligned with the catadioptric optical element; and at least some of the LEDs of the second plurality of LEDs being arranged in positions other than positioned at the first end of and aligned with any catadioptric optical element of the plurality of catadioptric optical elements, and in positions other than positioned between the first end and the at least one transparent inner surface of and aligned with any catadioptric optical element of the plurality of catadioptric optical elements;

the illumination apparatus further comprising control circuitry and electrodes arranged such that they are operable to drive the first plurality of LEDs independently of the second plurality of LEDs.

60. An illumination apparatus according to claim 59, wherein at least some of the LEDs of the second plurality of LEDs are micro-LEDs.

61. An illumination apparatus according to claim 59, wherein the LEDs of the first plurality of LEDs are micro-LEDs of width or diameter less than 300 microns, preferably less than 200 microns and more preferably less than 100 microns.

62. An illumination apparatus according to claim 59, wherein at least some of the LEDs of the second plurality of LEDs are positioned between neighbouring LEDs of the first plurality of LEDs.

63. An illumination apparatus according to claim 59, wherein at least some of the LEDs of the second plurality of LEDs are positioned between neighbouring catadioptric optical elements of the catadioptric optical element array.

64. An illumination apparatus according to claim 59, wherein at least some of the LEDs of the second plurality of LEDs are positioned between respective first ends of neighbouring catadioptric optical elements of the catadioptric optical element array.

65. An illumination apparatus according to claim 59, further comprising one or more light guides.

66. An illumination apparatus according to claim 65, wherein the one or more light guides are respectively aligned in correspondence with a respective one or more LEDs of the second plurality of LEDs.

67. An illumination apparatus according to claim 65, wherein at least some of the one or more light guides are positioned between respective second ends of neighbouring catadioptric optical elements of the catadioptric optical element array.

68. An illumination apparatus according to claim 59, wherein the distance between the first and second outer surfaces at the second end of the catadioptric optical element is less than 6 mm.

69. An illumination apparatus according to claim 59, wherein the cross-section from one side to the other side of the micro-LED is aligned within the first end of the catadioptric optical element.

70. An illumination apparatus according to claim 59, wherein at least some of the LEDs of first plurality of LEDs are positioned on a first LED plane and at least some of the LEDs of the second plurality of LEDs are positioned on a second LED plane that is different to the first LED plane.

71. An illumination apparatus according to claim 59,
wherein each of the catadioptric optical elements of the plurality of catadioptric optical elements aligned in correspondence with a respective one or more of the LEDs of the first plurality of LEDs provides a first directional light output distribution, the first directional light output distribution being of light output from the LEDs of the first plurality of LEDs;

the LEDs of the second plurality of LEDs provide a second directional light output distribution, the second directional light output distribution being of light output from the LEDs of the second plurality of LEDs;

wherein the first directional light output distribution has a solid angle that is smaller than the solid angle of the second directional light output distribution.

72. An illumination apparatus according to claim 59, wherein the second end of at least one catadioptric optical element of the plurality of catadioptric optical elements is arranged on the first side of an optical element support substrate.

73. An illumination apparatus according to claim 72, wherein the first side of the optical element support substrate is arranged between the catadioptric optical elements and the LEDs of the second plurality of LEDs.

74. An illumination apparatus according to claim 72, wherein the LEDs of the second plurality of LEDs are arranged on the second side opposite the first side of the optical element support substrate.

75. An illumination apparatus according to claim 72, wherein the LEDs of the second plurality of LEDs are arranged on the first side of the optical element support substrate.

76. A backlight for a display apparatus comprising the illumination apparatus of claim 59.

77. A display apparatus comprising the backlight apparatus of claim 76 and a spatial light modulator.

78. A direct display apparatus comprising a switchable illumination apparatus of claim 59, wherein the control circuitry further comprises means to drive the first and second pluralities of LEDs as at least one addressable matrix with image pixel data.

79. A direct display apparatus according to claim 78 wherein the LEDs of the first plurality of LEDs are arranged to provide a first plurality of image pixels with the first directional light output distribution;

wherein the LEDs of the second plurality of LEDs are arranged to provide the first plurality of image pixels with the second directional light output distribution.

80. A direct display apparatus according to claim 78 wherein the LEDs of the first plurality of LEDs are micro-LEDs of width or diameter less than 100 microns, preferably less than 50 microns and more preferably less than 25 microns.

81. A direct display apparatus according to claim 79, wherein in the at least one catadioptric cross-sectional plane the distance between the first and second outer surfaces at the second end of the catadioptric optical element is less than 0.5 mm, preferably less than 0.25 mm and more preferably less than 0.1 mm.

* * * * *